(12) United States Patent
Yang et al.

(10) Patent No.: US 8,304,308 B2
(45) Date of Patent: Nov. 6, 2012

(54) CONFIGURATION AND FABRICATION OF SEMICONDUCTOR STRUCTURE HAVING BIPOLAR JUNCTION TRANSISTOR IN WHICH NON-MONOCRYSTALLINE SEMICONDUCTOR SPACING PORTION CONTROLS BASE-LINK LENGTH

(75) Inventors: Jeng-Jiun Yang, Sunnyvale, CA (US); Constantin Bulucea, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/198,601

(22) Filed: Aug. 4, 2011

(65) Prior Publication Data
US 2012/0181619 A1 Jul. 19, 2012

Related U.S. Application Data

(63) Continuation of application No. 12/382,966, filed on Mar. 27, 2009, now Pat. No. 8,030,151.

(51) Int. Cl.
*H01L 27/06* (2006.01)

(52) U.S. Cl. ........... 438/234; 257/370; 257/E27.015

(58) Field of Classification Search .......... 438/234; 257/370, E27.015
See application file for complete search history.

(56) References Cited

U.S. PATENT DOCUMENTS

| | | | |
|---|---|---|---|
| 5,719,422 A | 2/1998 | Burr et al. | |
| 5,780,912 A | 7/1998 | Burr et al. | |
| 6,071,767 A * | 6/2000 | Monkowski et al. | ......... 438/202 |
| 6,548,842 B1 | 4/2003 | Bulucea et al. | |
| 6,570,242 B1 | 5/2003 | Johnson | |
| 6,803,634 B2 | 10/2004 | Okuno et al. | |
| 7,211,863 B2 | 5/2007 | Williams et al. | |
| 7,419,863 B1 | 9/2008 | Bulucea | |
| 7,642,574 B2 | 1/2010 | Bulucea | |
| 7,838,369 B2 | 11/2010 | Bulucea | |
| 2007/0187795 A1 | 8/2007 | Langguth et al. | |

OTHER PUBLICATIONS

Alvarez, *BiCMOS Technology and Applications* (2d ed., Kluwer Acad. Publishers), 1993, pp. 75-78.

(Continued)

*Primary Examiner* — Zandra Smith
*Assistant Examiner* — Paul Patton
(74) *Attorney, Agent, or Firm* — Warren L. Franz; Wade J. Brady, III; Frederick J. Telecky, Jr.

(57) ABSTRACT

A semiconductor structure contains a bipolar transistor (101) and a spacing structure (265-1 or 265-2). The transistor has an emitter (241), a base (243), and a collector (245). The base is formed with an intrinsic base portion (243I), a base link portion (243L), and a base contact portion (245C). The intrinsic base portion is situated below the emitter and above material of the collector. The base link portion extends between the intrinsic base portion and the base contact portions. The spacing structure includes an isolating dielectric layer (267-1 or 267-2) and a spacing component. The dielectric layer extends along the upper semiconductor surface. The spacing component includes a lateral spacing portion (269-1 or 269-2) of largely non-monocrystalline semiconductor material, preferably polycrystalline semiconductor material, situated on the dielectric layer above the base link portion. Opposite first and second upper edges of the lateral spacing portion (275-1 and 277-1) laterally conform to opposite first and second lower edges (297-1 and 299-1) of the base link portion so as to determine, and thereby control, its length.

9 Claims, 64 Drawing Sheets

OTHER PUBLICATIONS

Chai et al., "A Cost-Effective 0.25μm Leff BiCMOS Technology Featuring Graded-Channel CMOS (GCMOS) and a Quasi-Self Aligned (QSA) NPN for RF Wireless Applications", *Procs. 2000 Bipolar/BiCMOS Circs. and Tech. Meeting*, Sep. 24-26, 2000, pp. 110-113.

Tsui et al., "A Versatile Half-Micron Complementary BiCMOS Technology for Microprocessor-Based Smart Power Applications", *IEEE Trans. Elec. Devs.*, Mar. 1995, pp. 564-570.

* cited by examiner

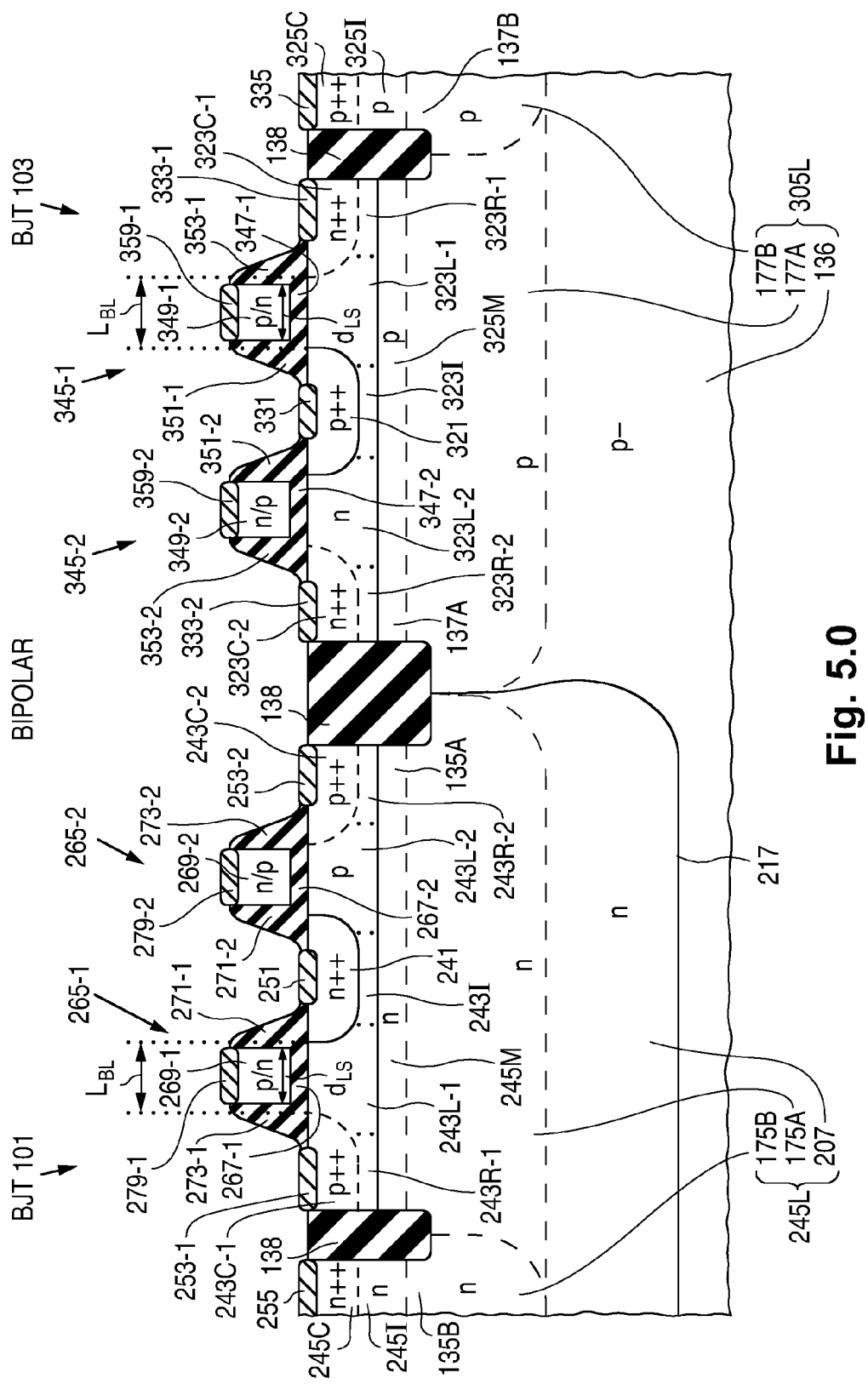
Fig. 5.0

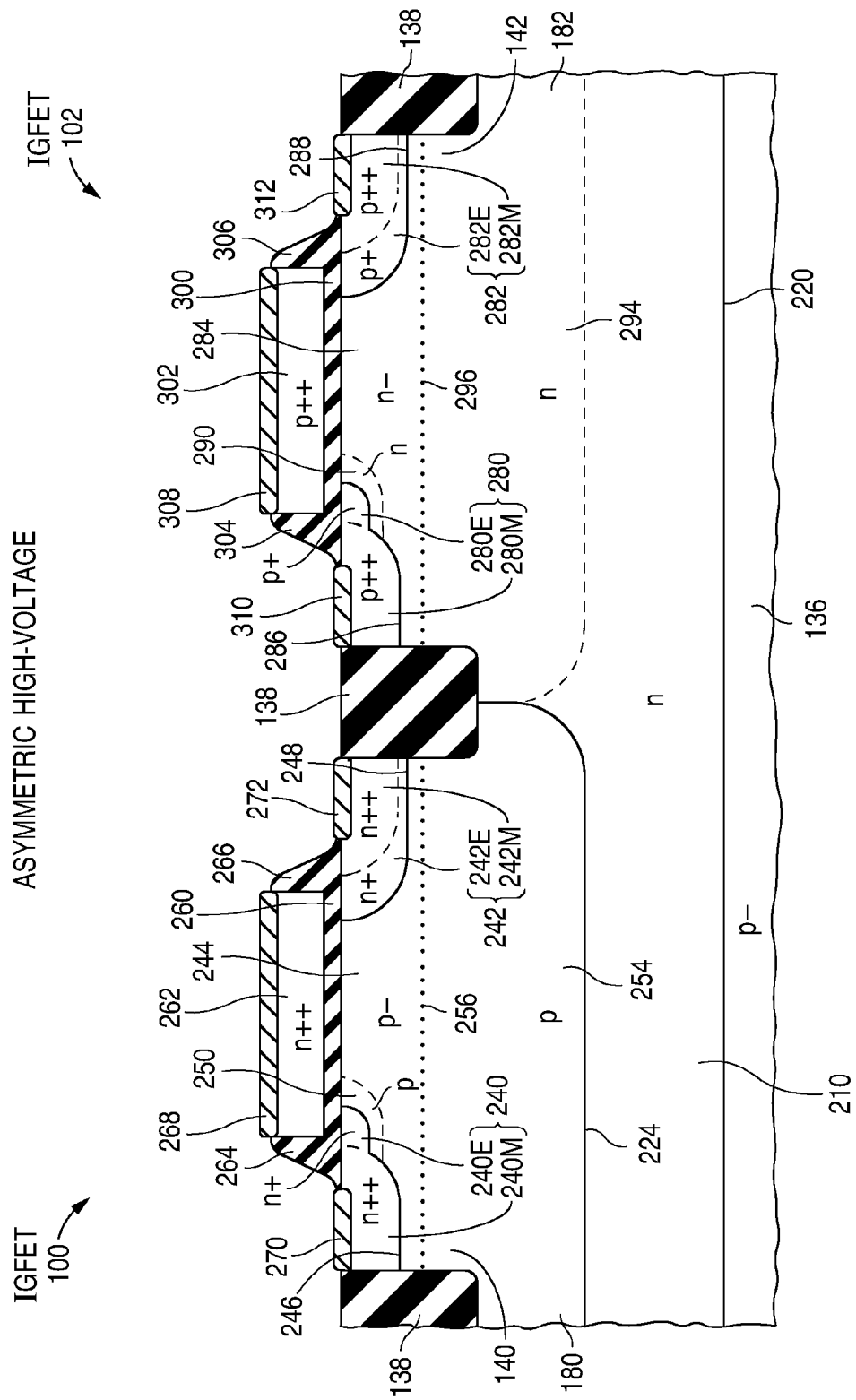
Fig. 5.1

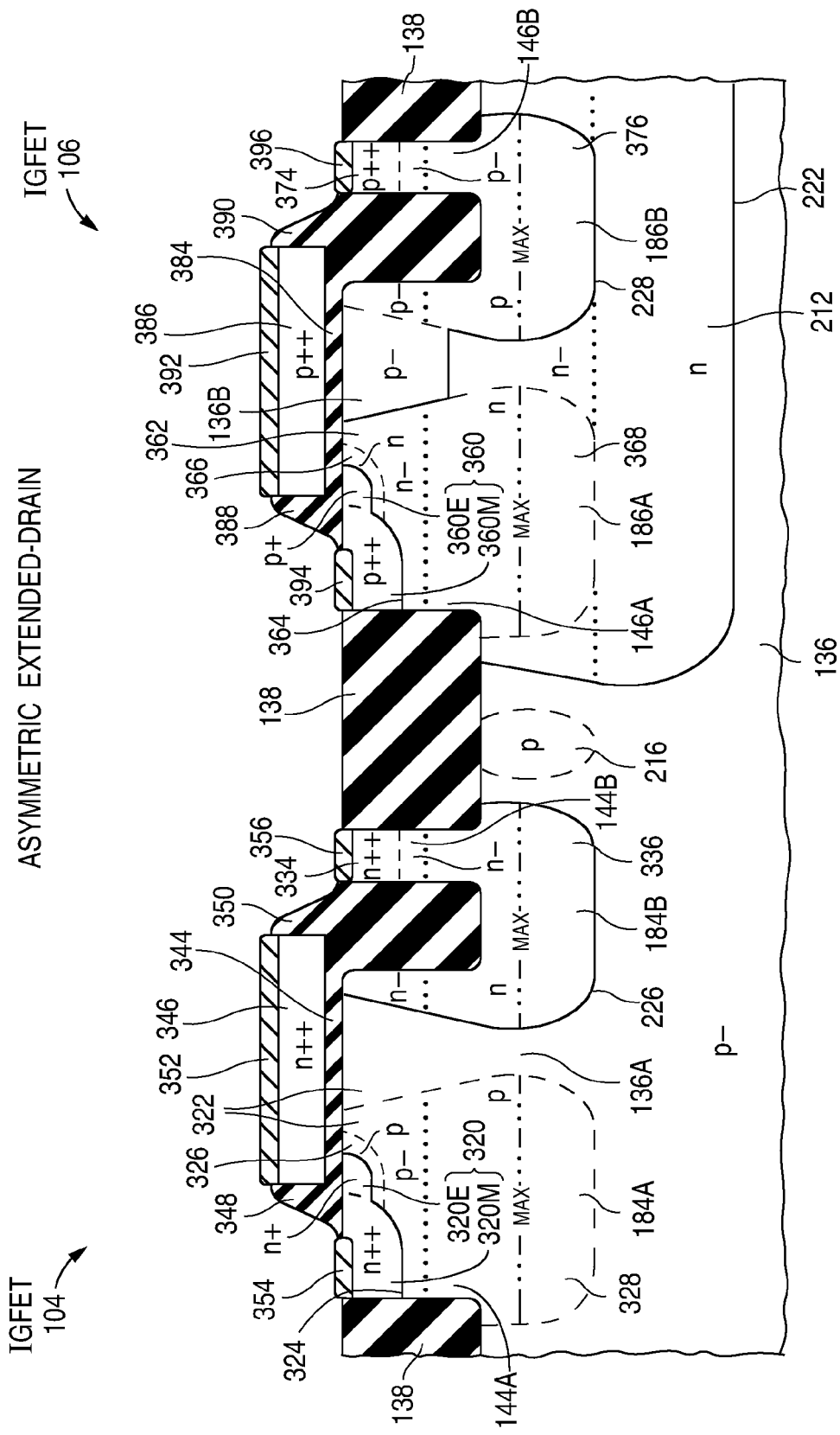
Fig. 5.2

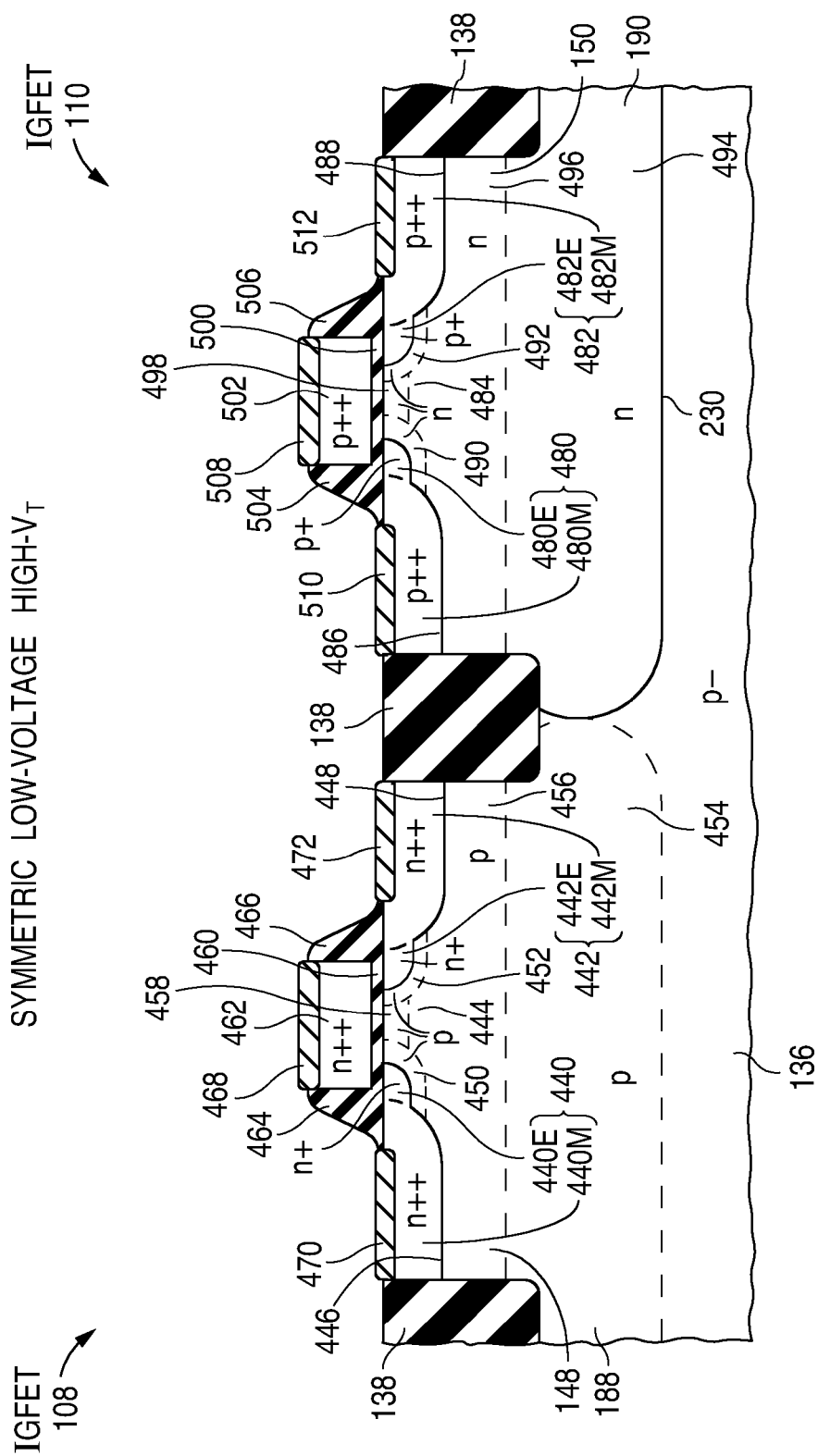
Fig. 5.3

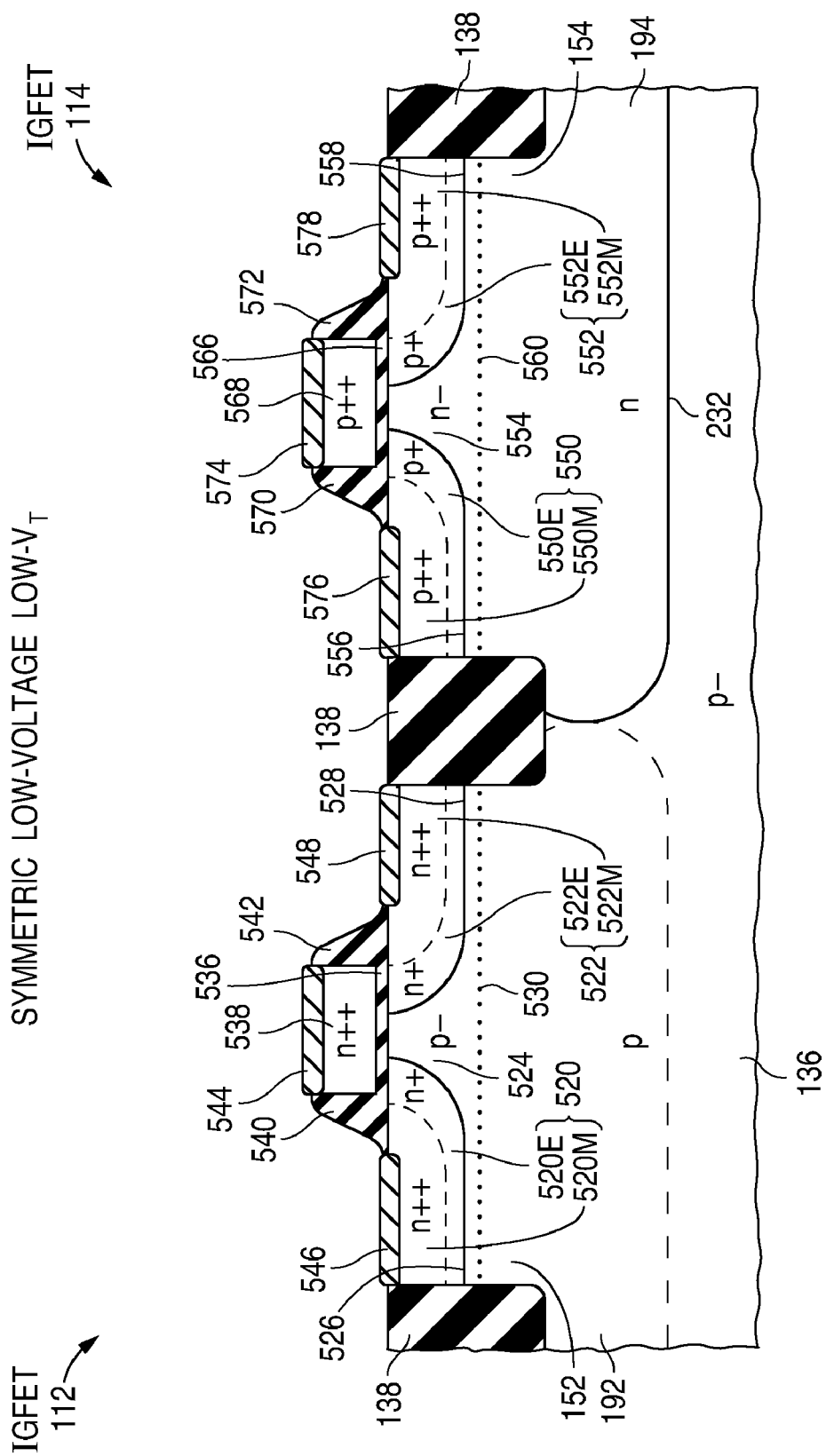
Fig. 5.4

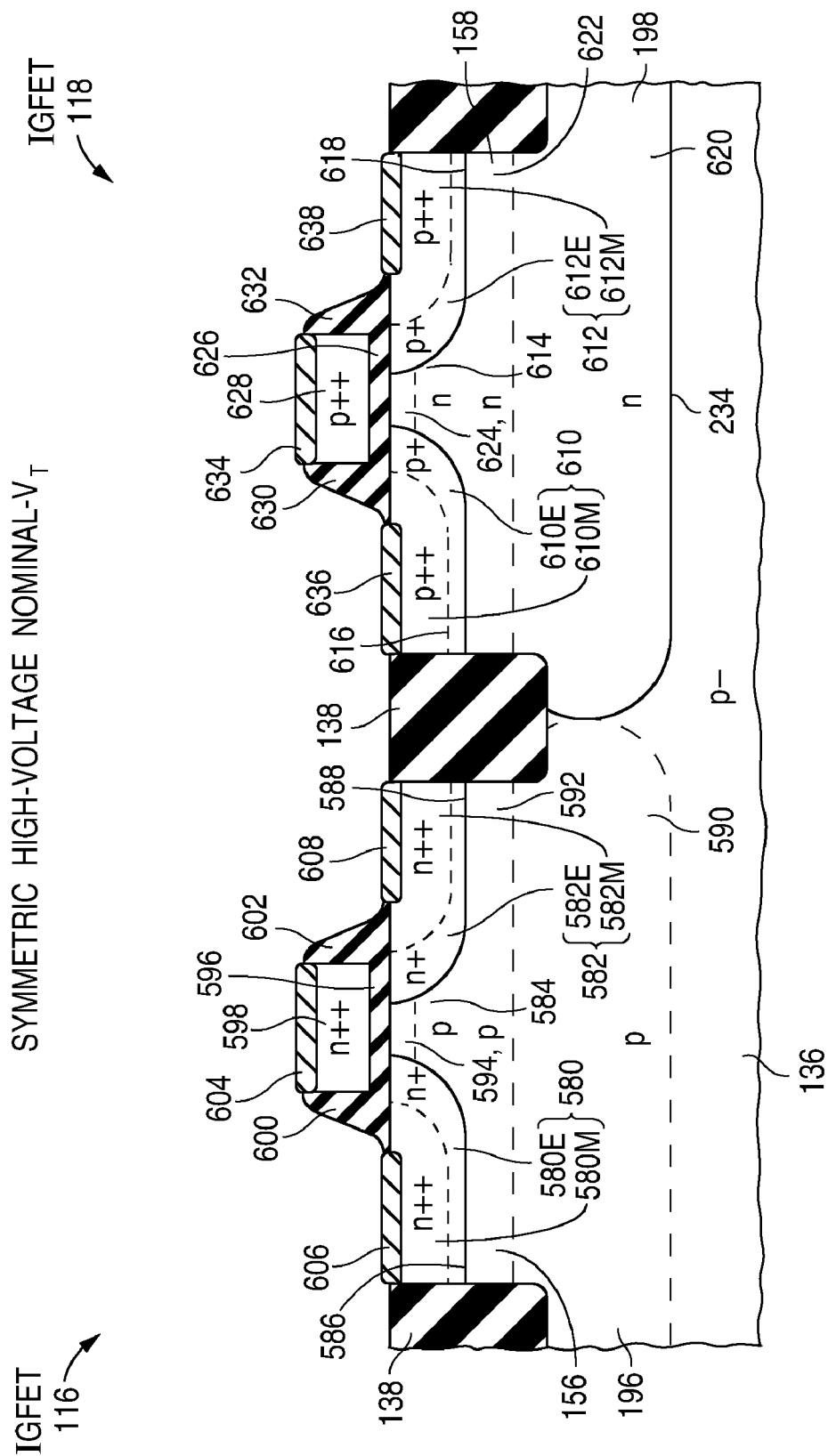
Fig. 5.5

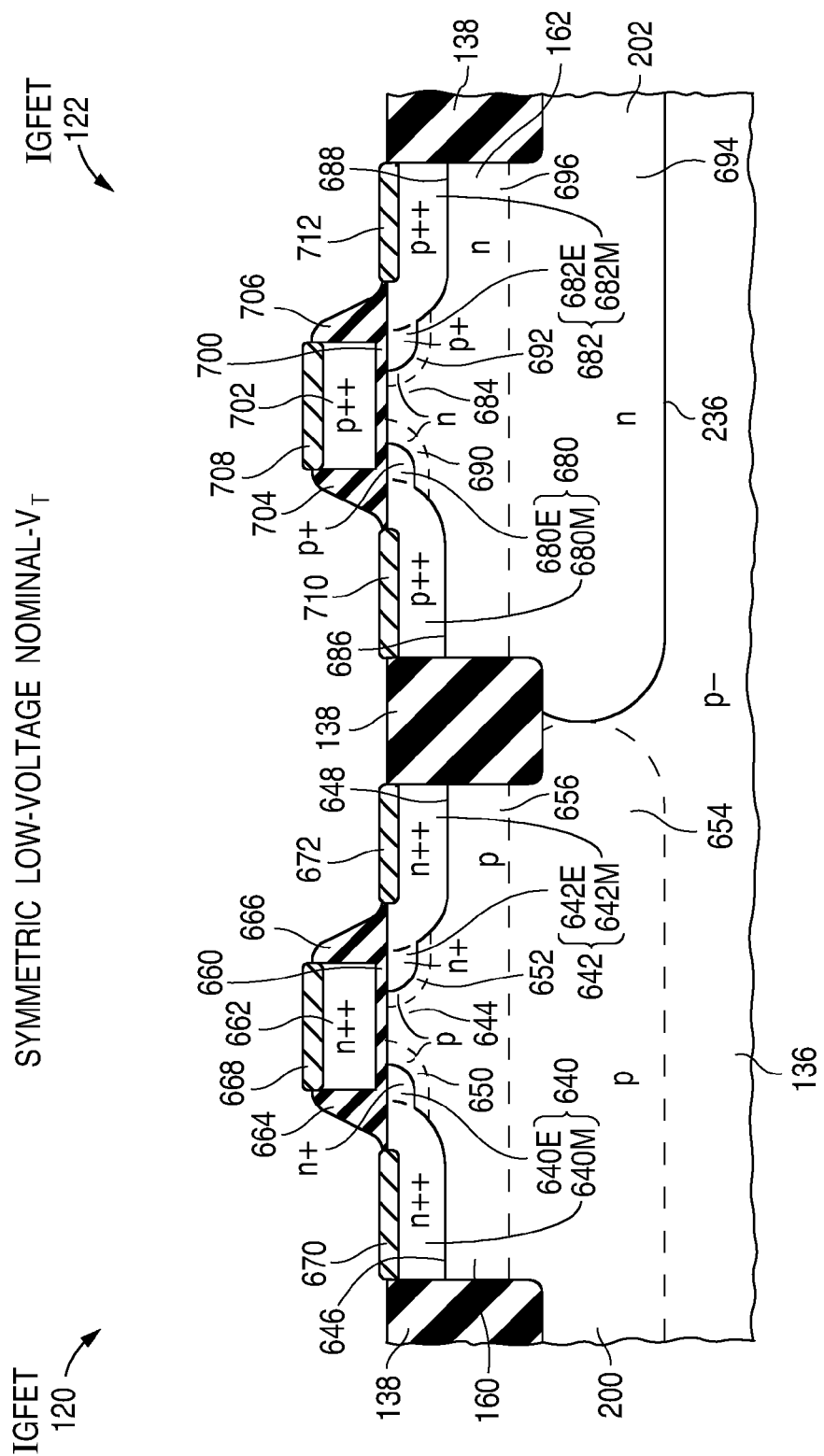
Fig. 5.6

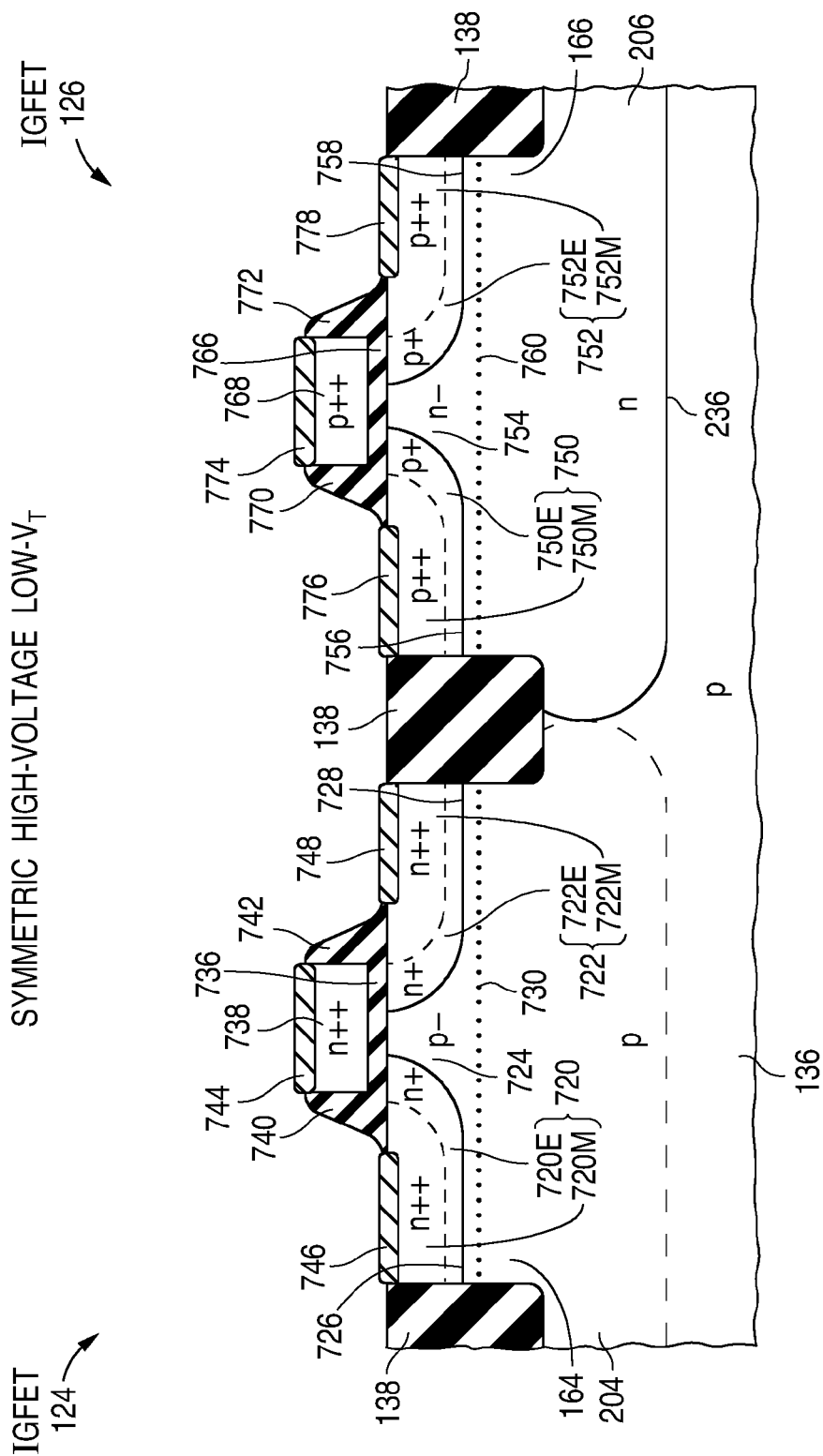
Fig. 5.7

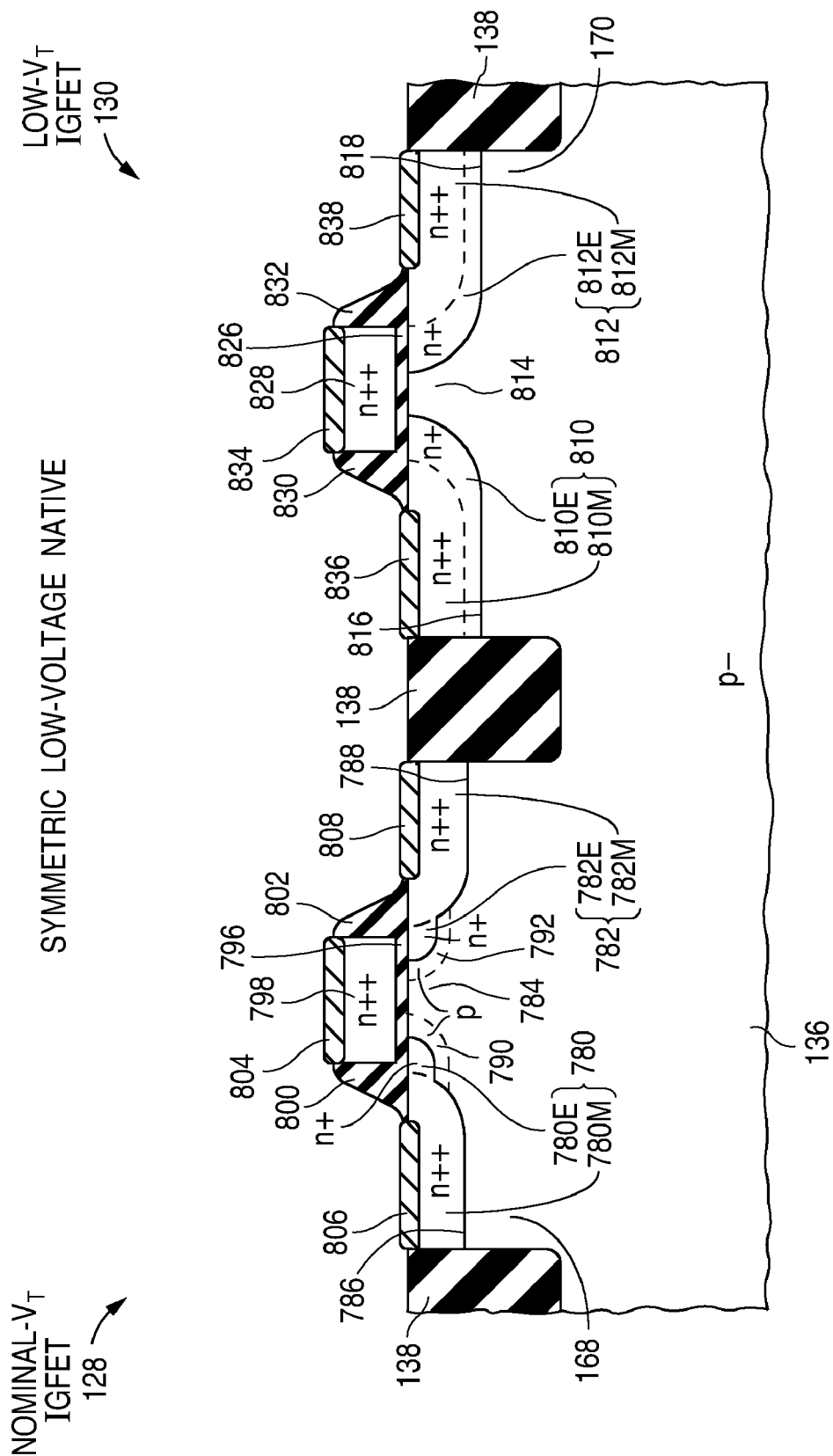
Fig. 5.8

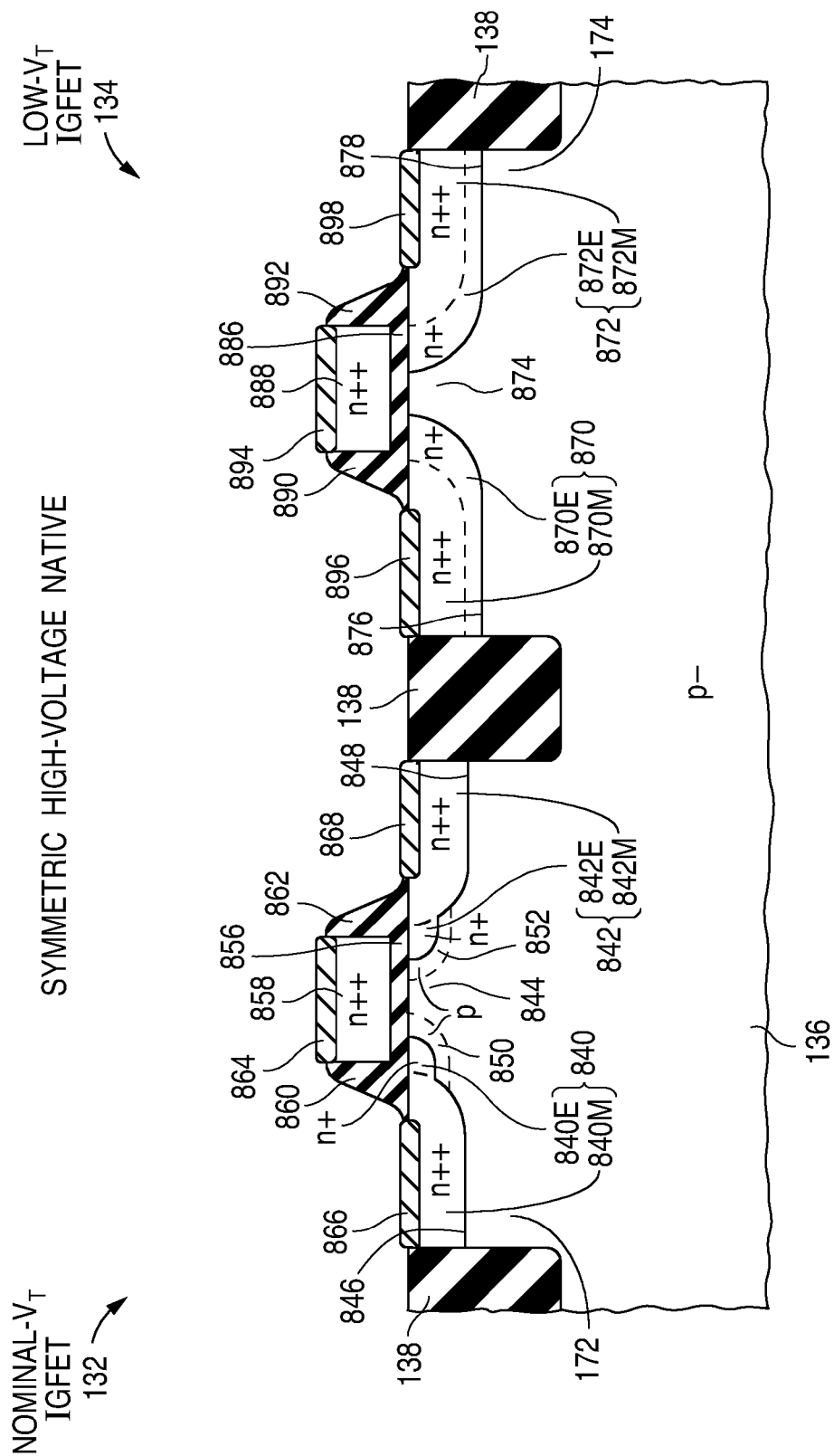
Fig. 5.9

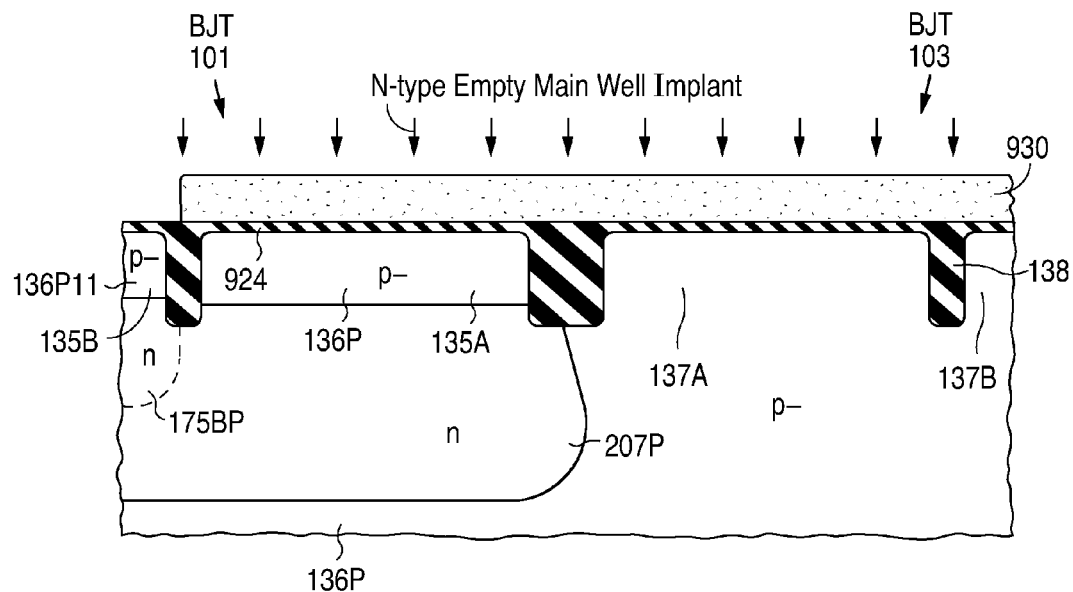
Fig. 18d.0
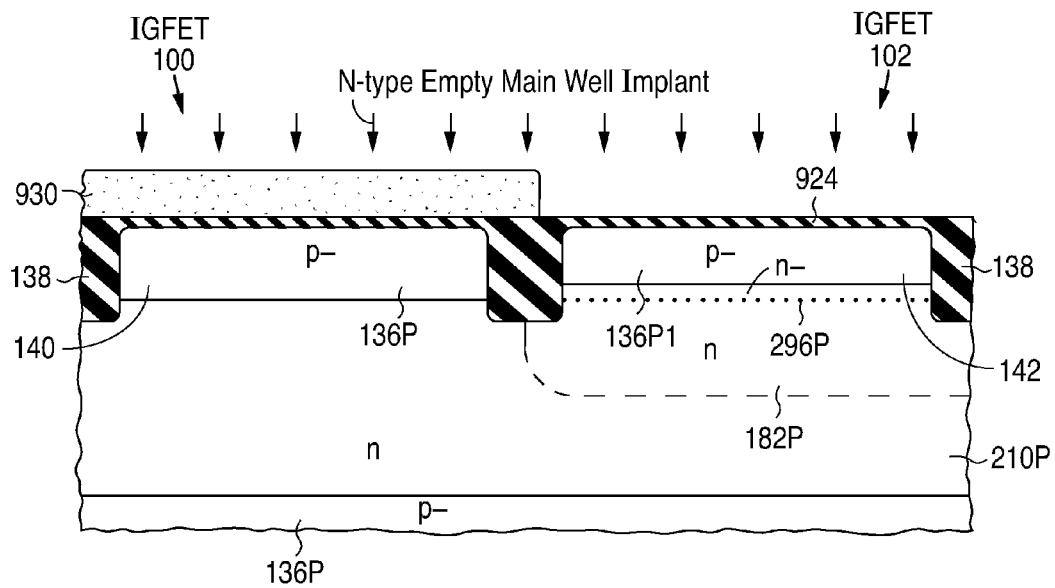
Fig. 18d.1

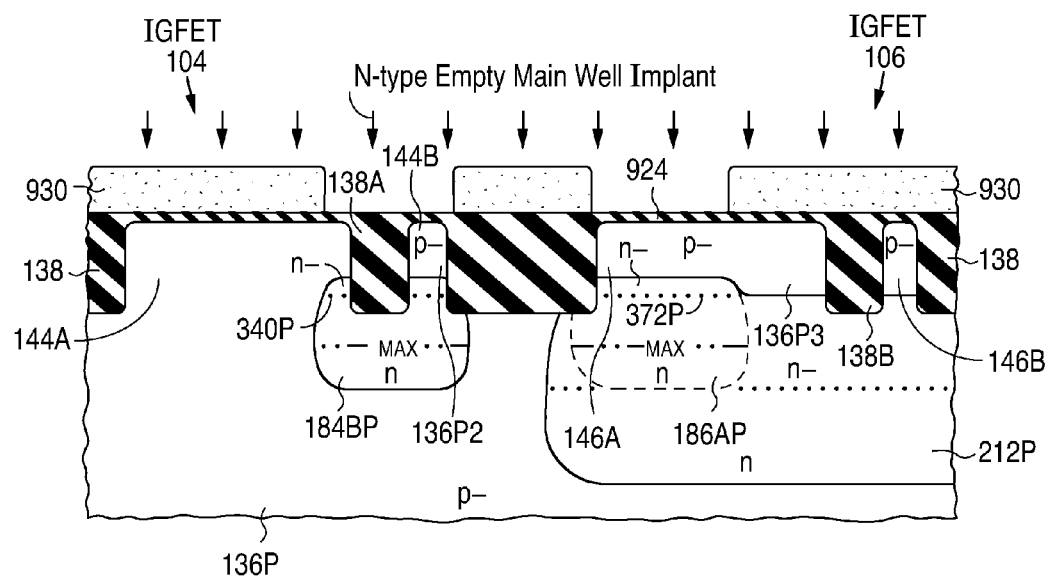
Fig. 18d.2
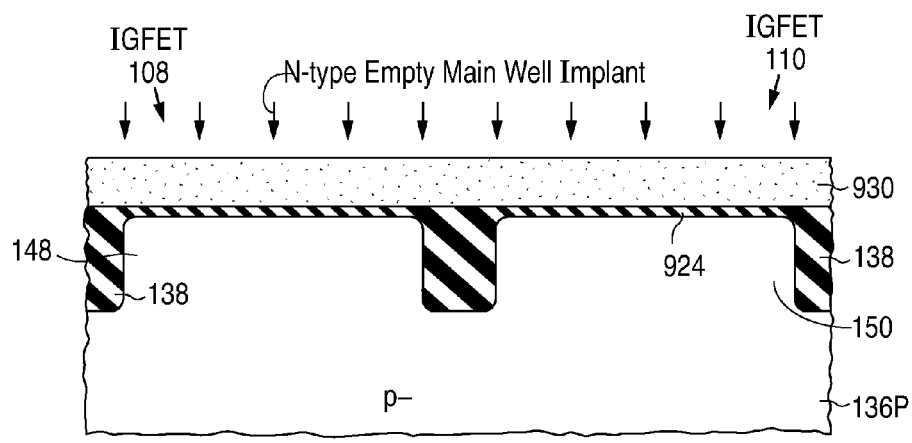
Fig. 18d.3

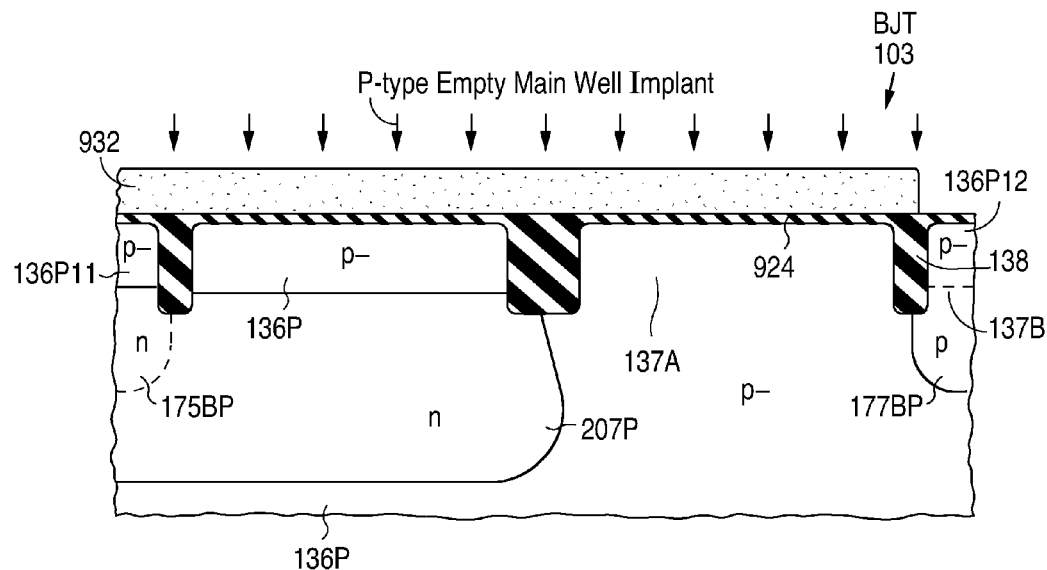
Fig. 18e.0
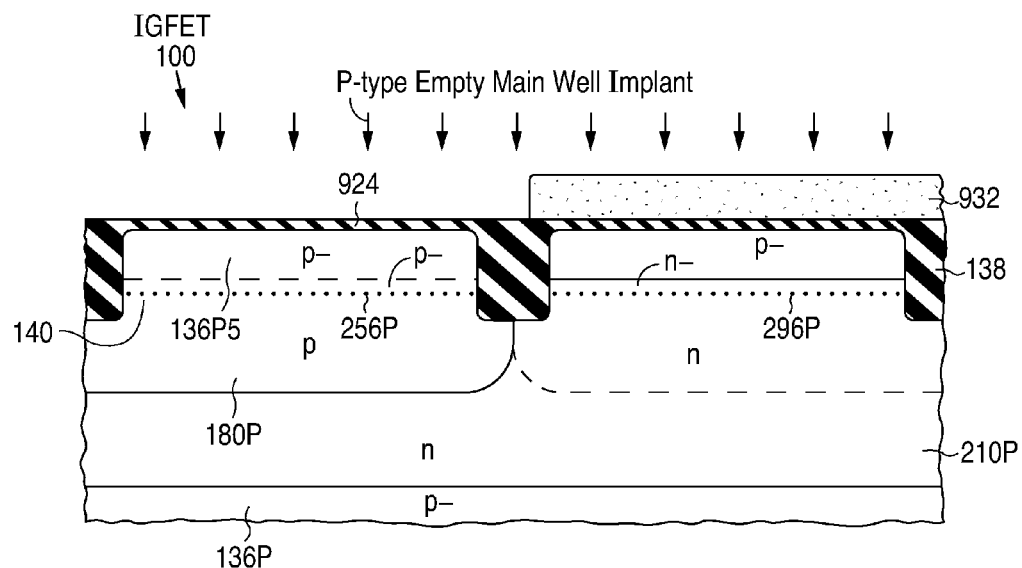
Fig. 18e.1

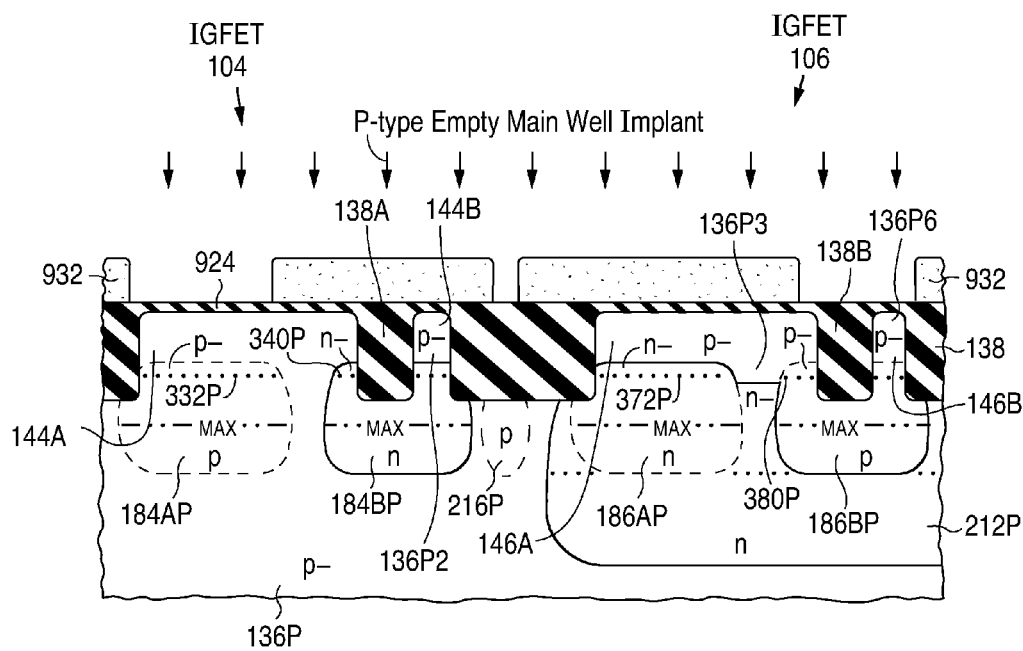
Fig. 18e.2
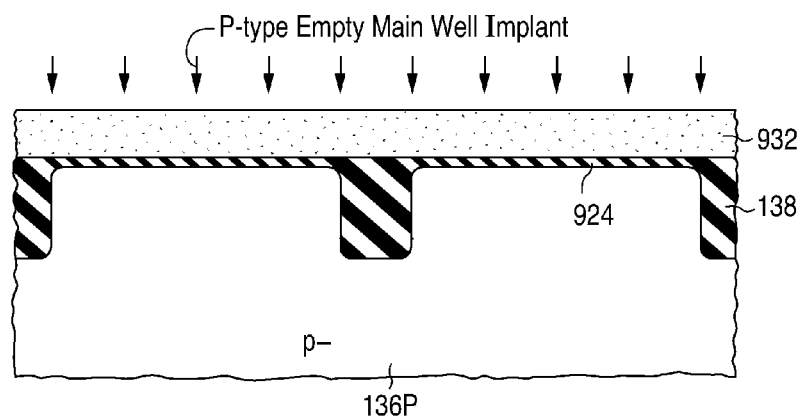
Fig. 18e.3

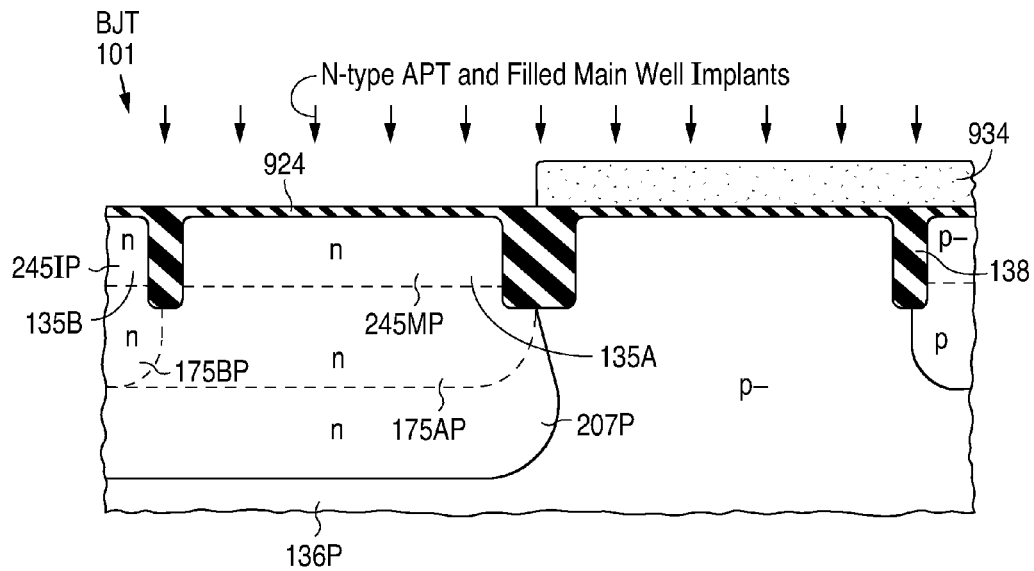
Fig. 18f.0
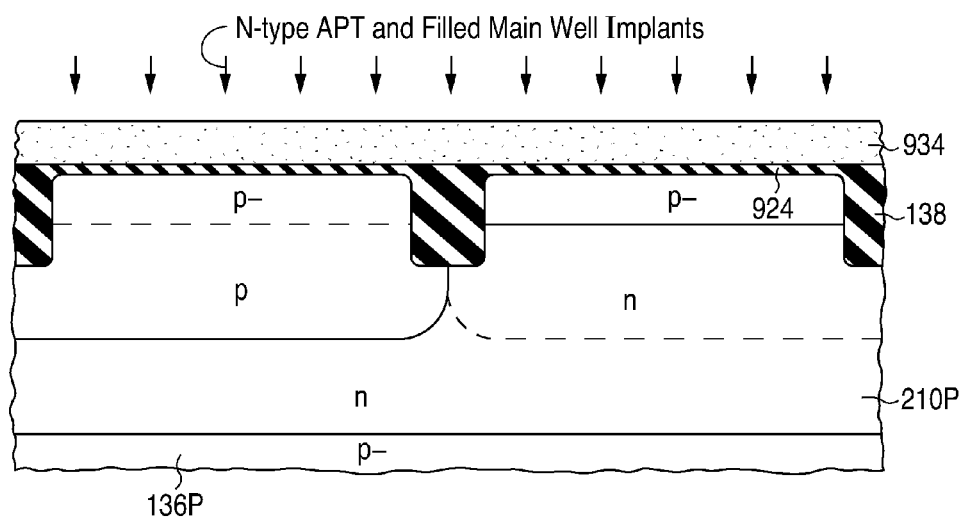
Fig. 18f.1

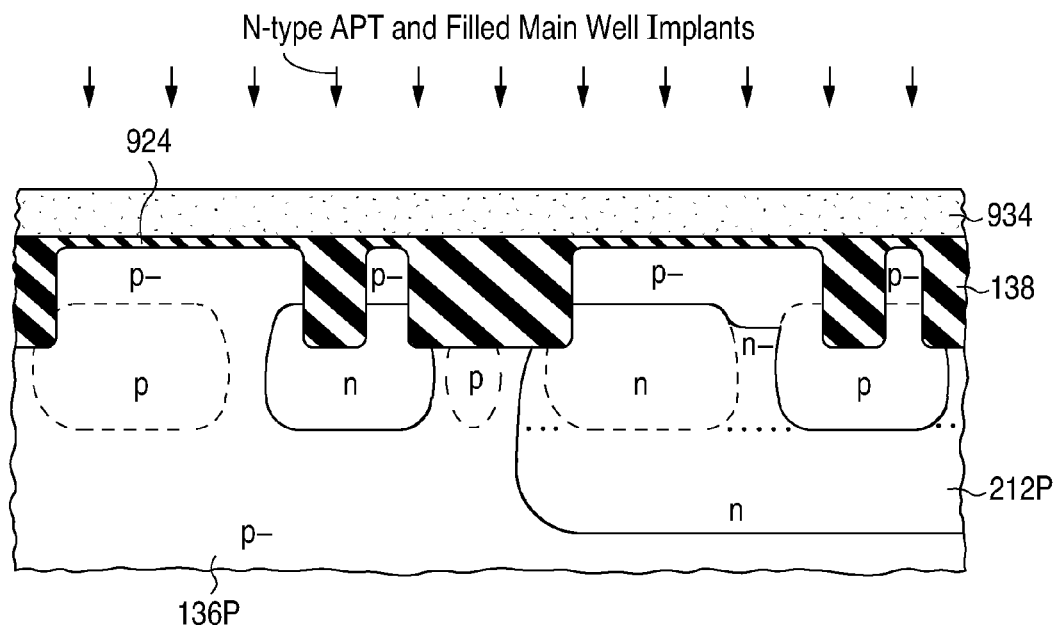
Fig. 18f.2
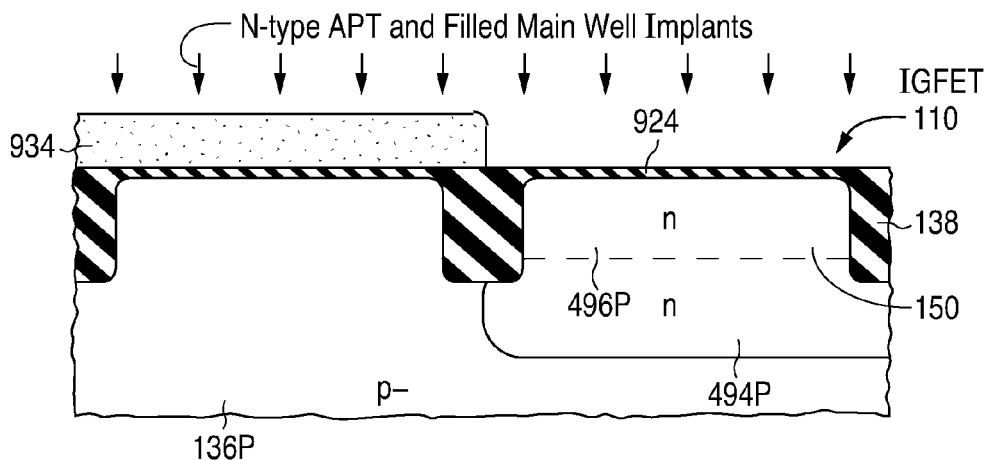
Fig. 18f.3

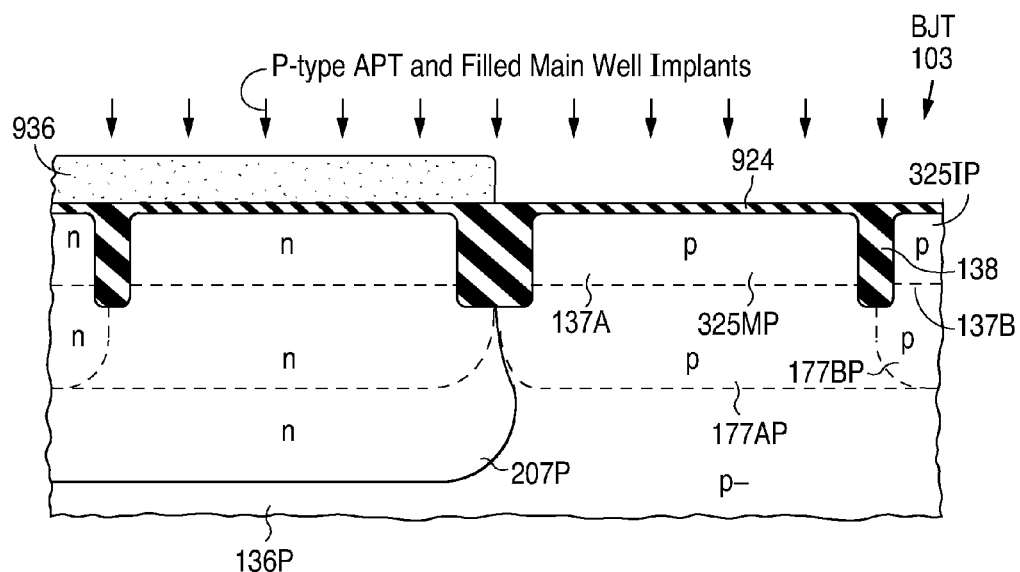
Fig. 18g.0
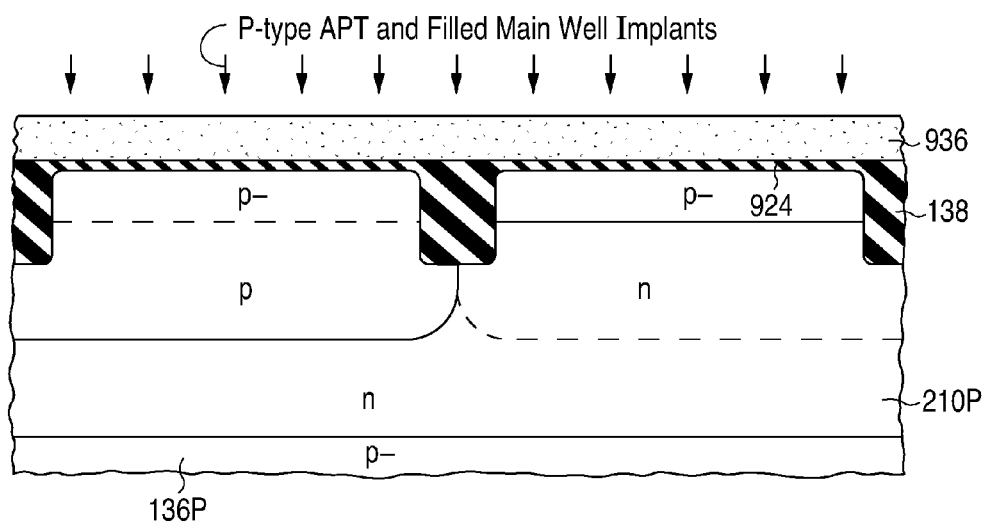
Fig. 18g.1

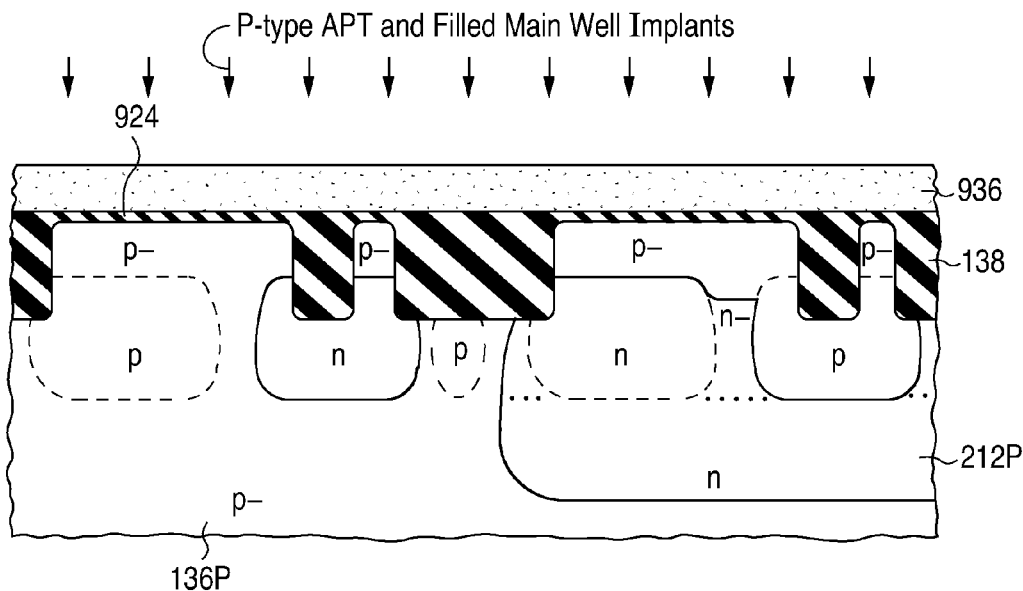
Fig. 18g.2
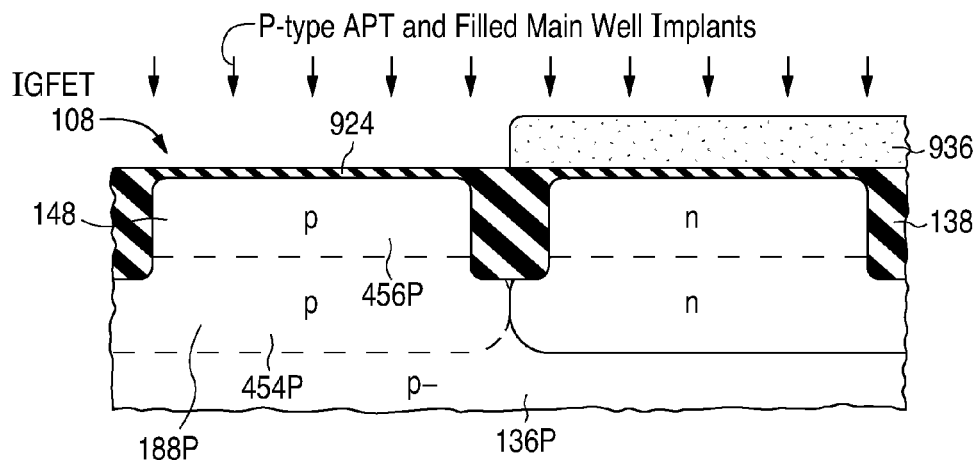
Fig. 18g.3

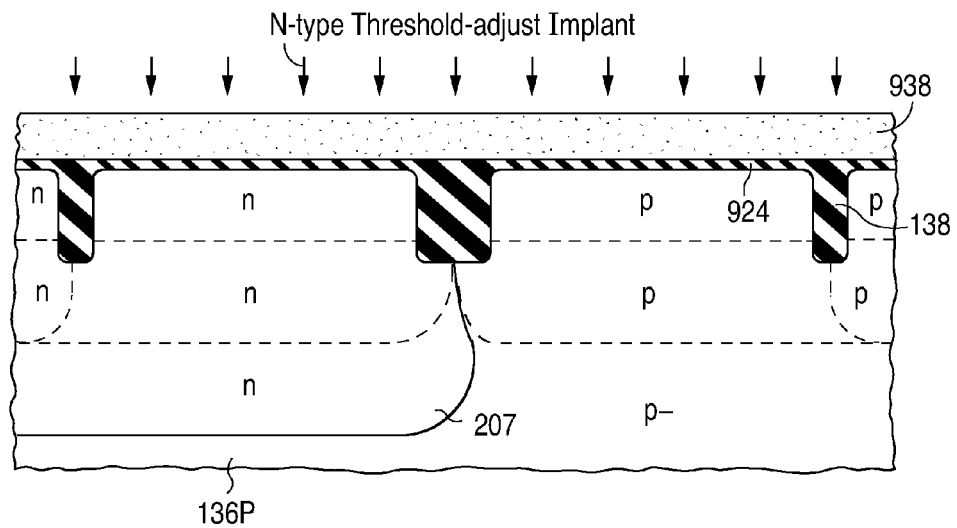
Fig. 18h.0
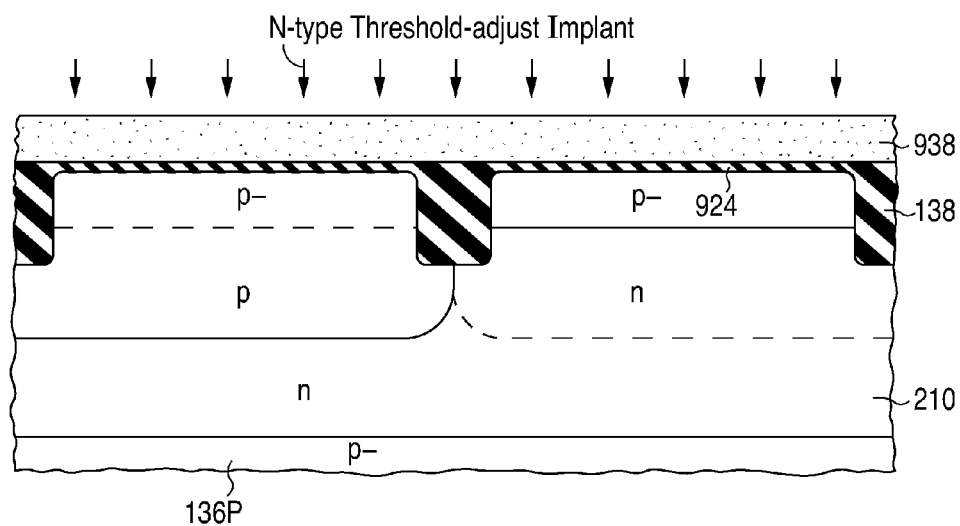
Fig. 18h.1

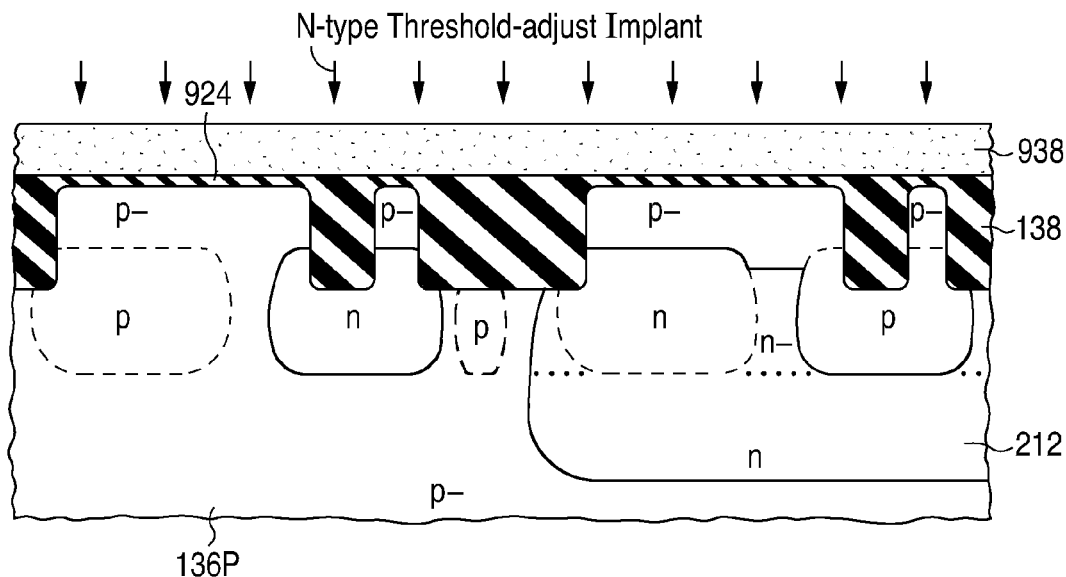
Fig. 18h.2
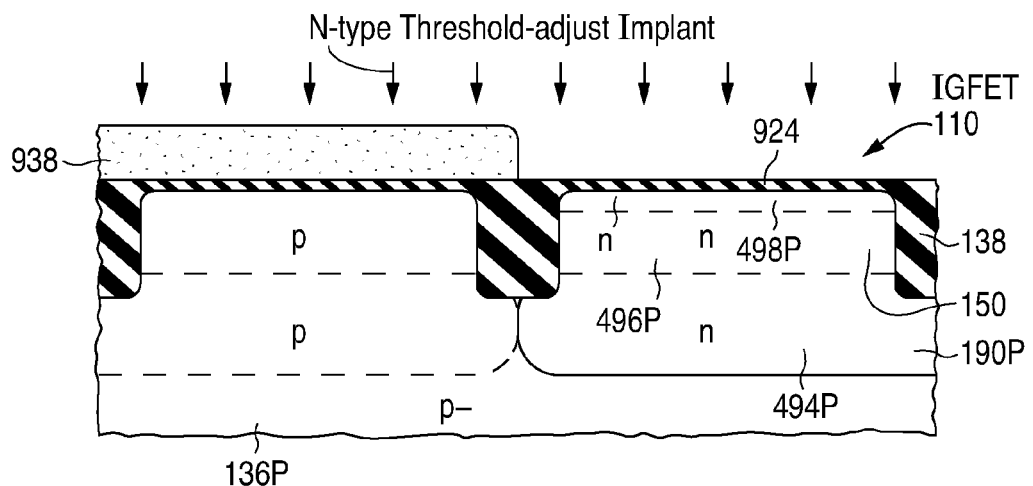
Fig. 18h.3

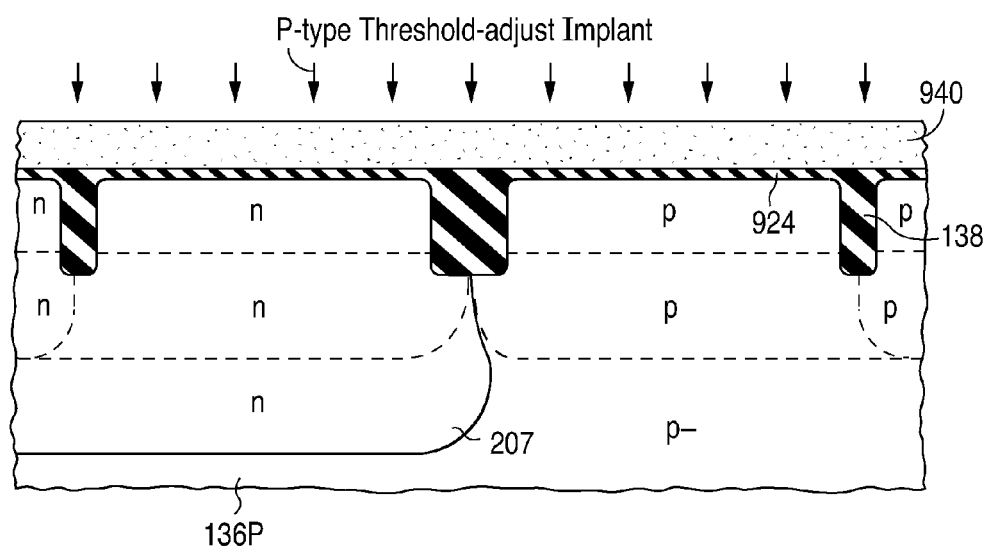
Fig. 18i.0
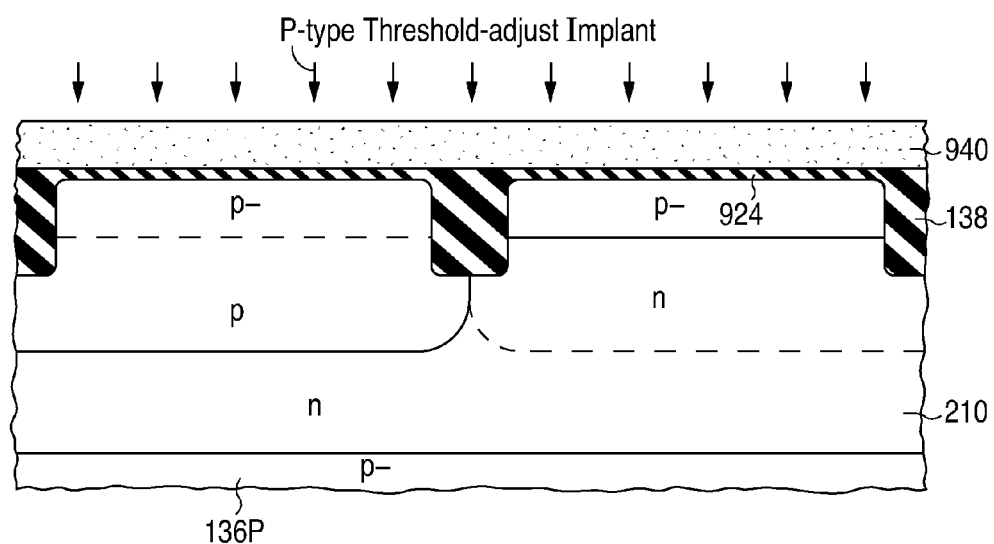
Fig. 18i.1

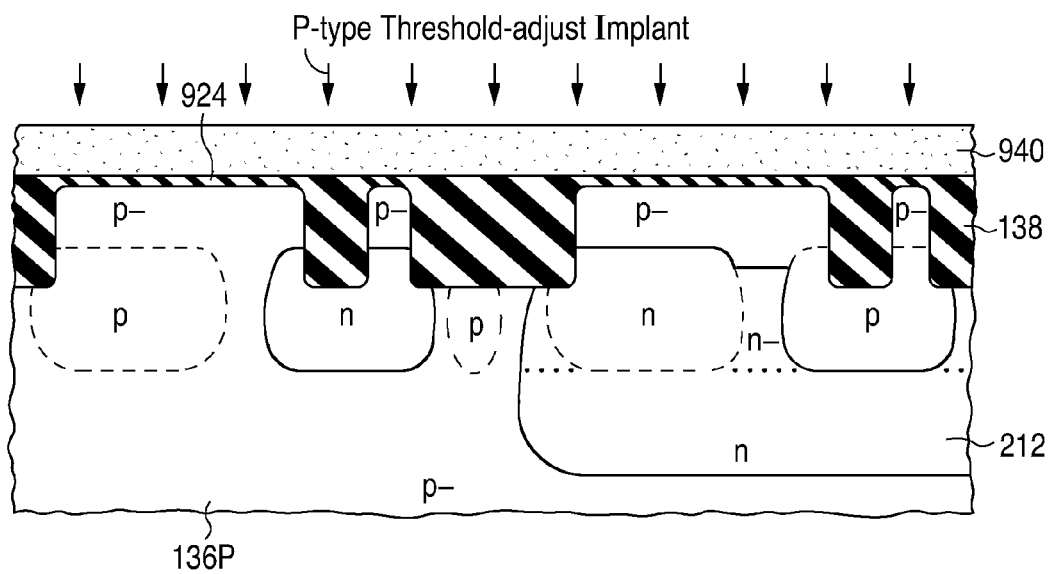
Fig. 18i.2
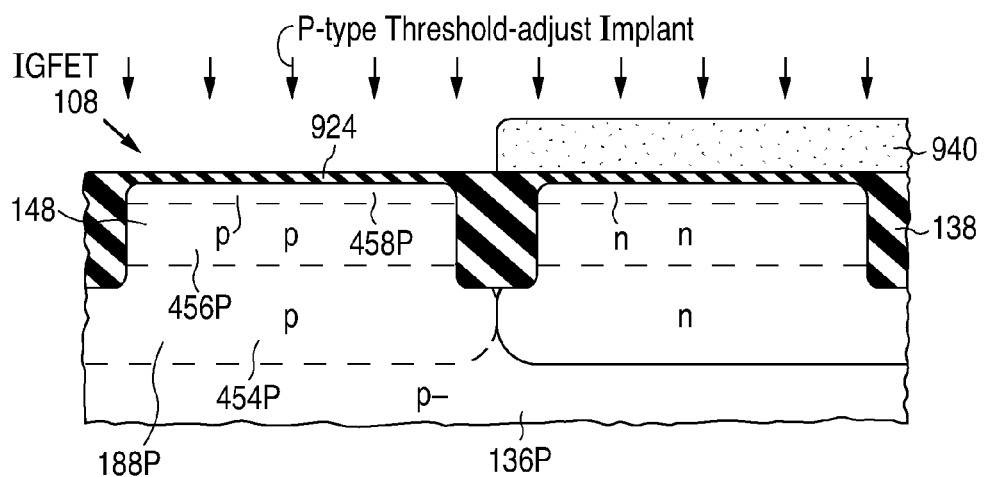
Fig. 18i.3

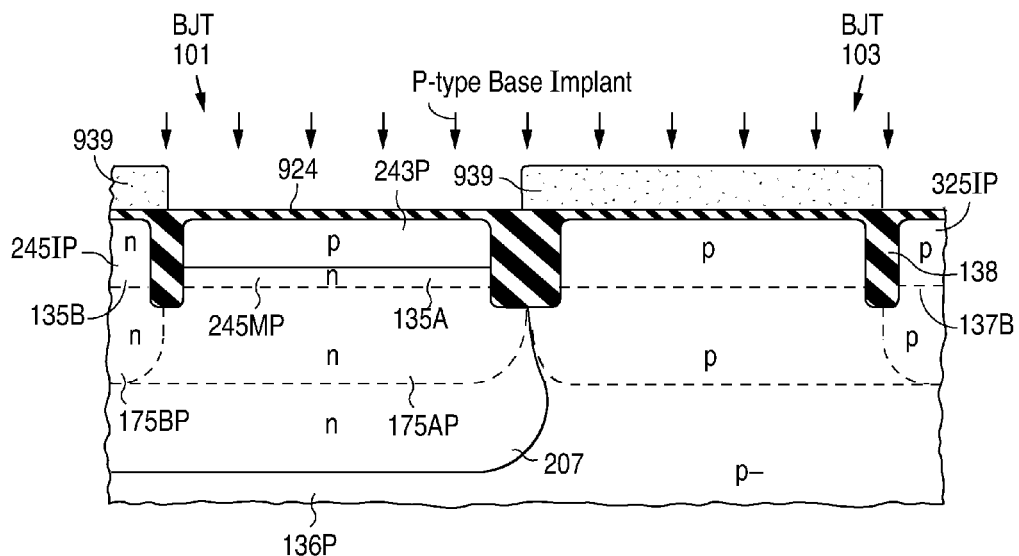
Fig. 18j.0
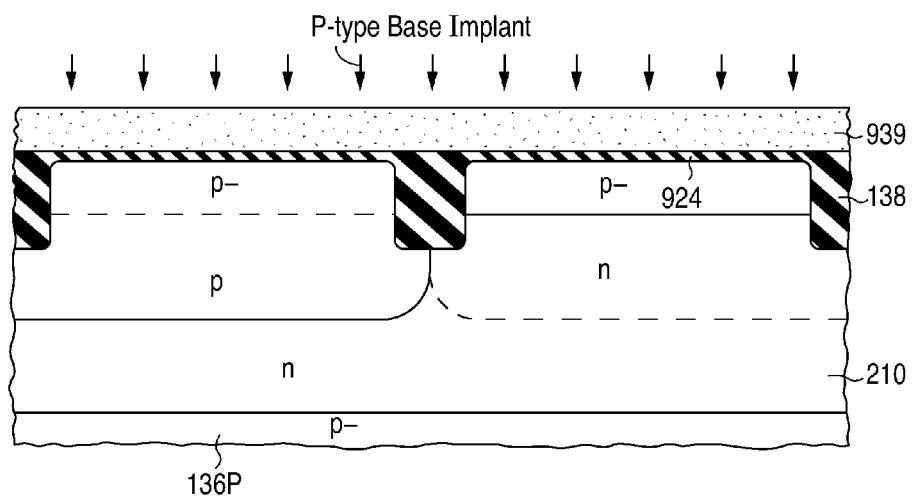
Fig. 18j.1

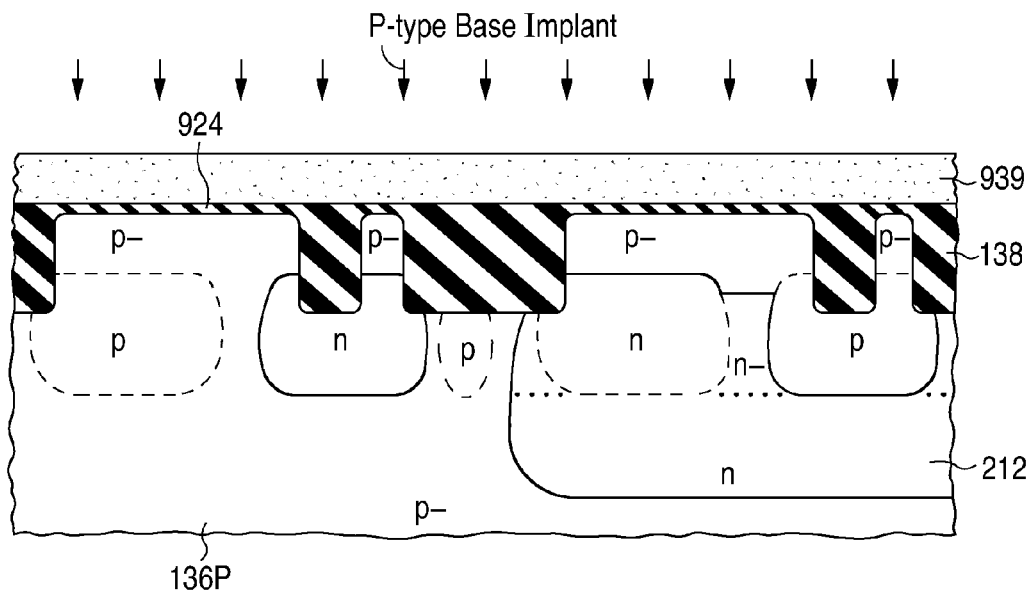
Fig. 18j.2
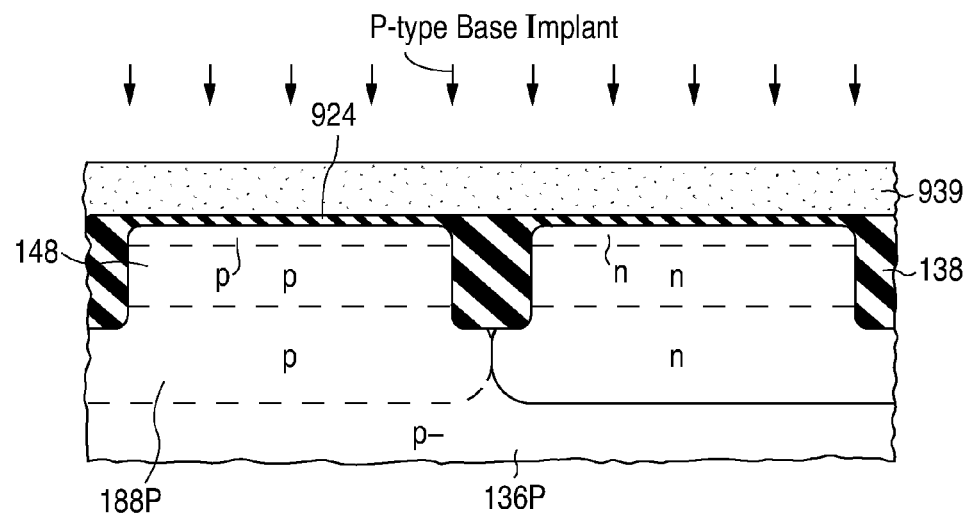
Fig. 18j.3

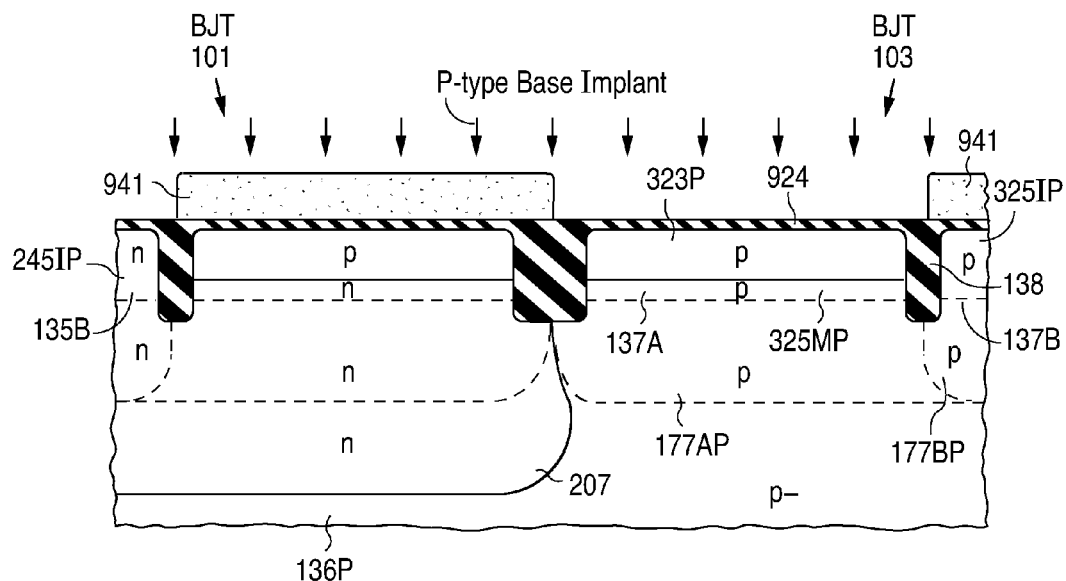
Fig. 18k.0
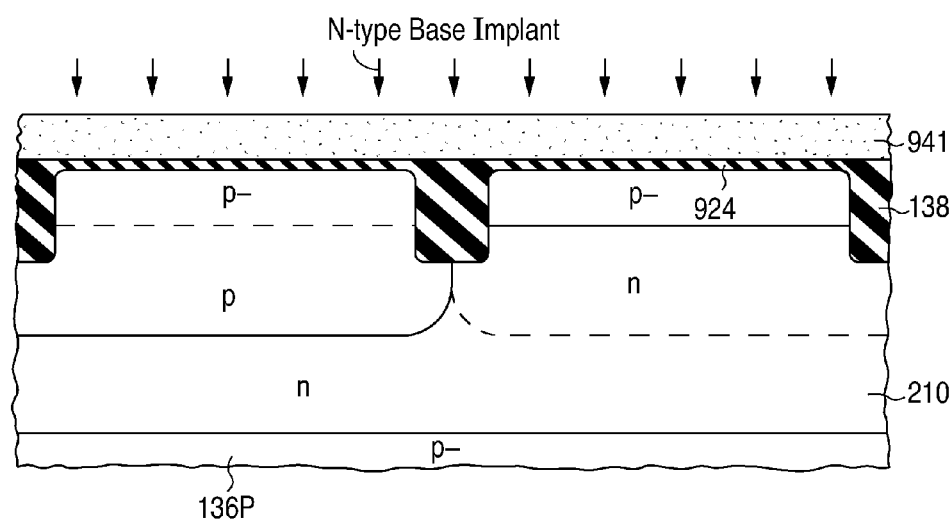
Fig. 18k.1

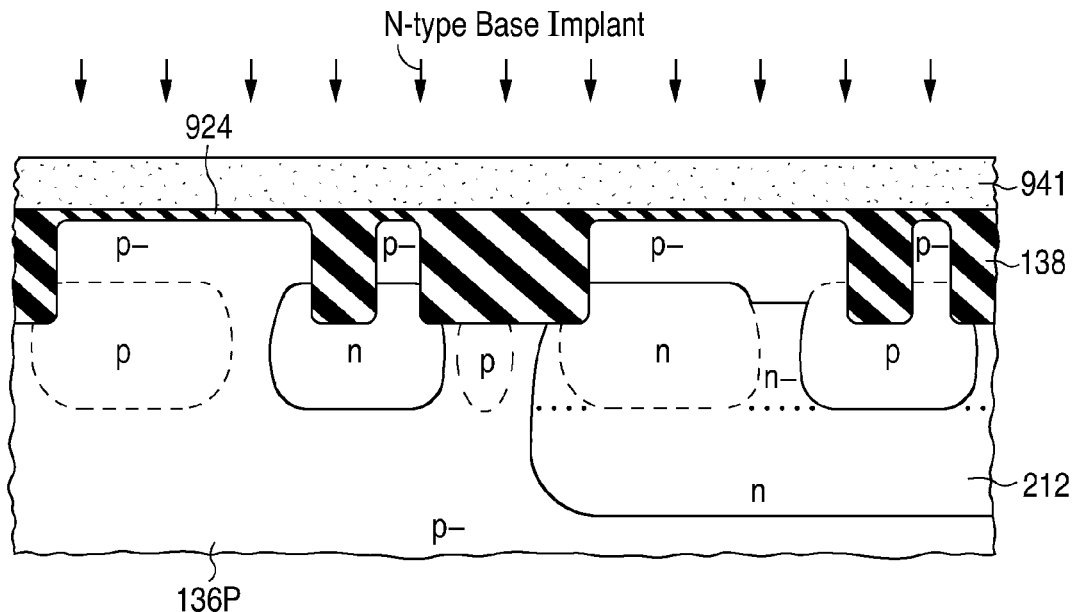
Fig. 18k.2
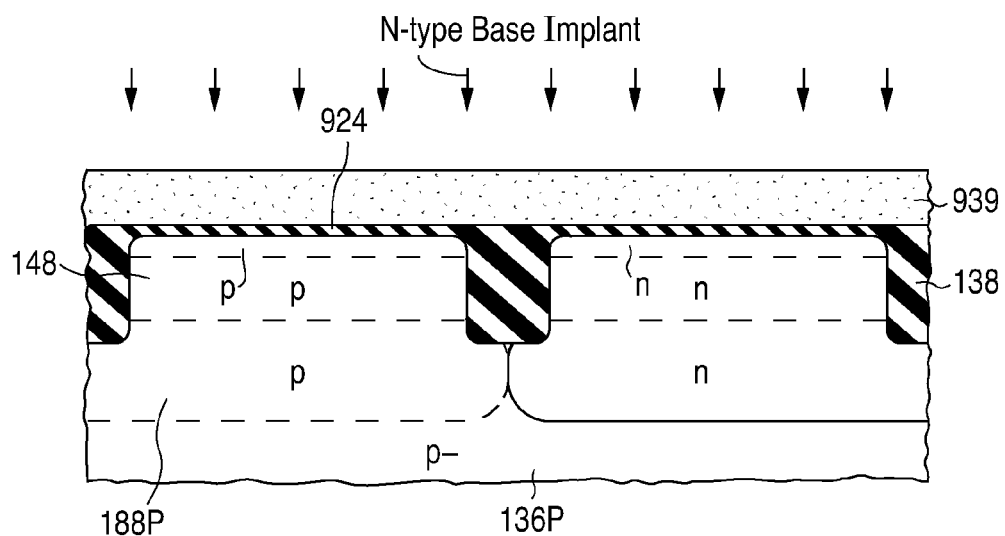
Fig. 18k.3

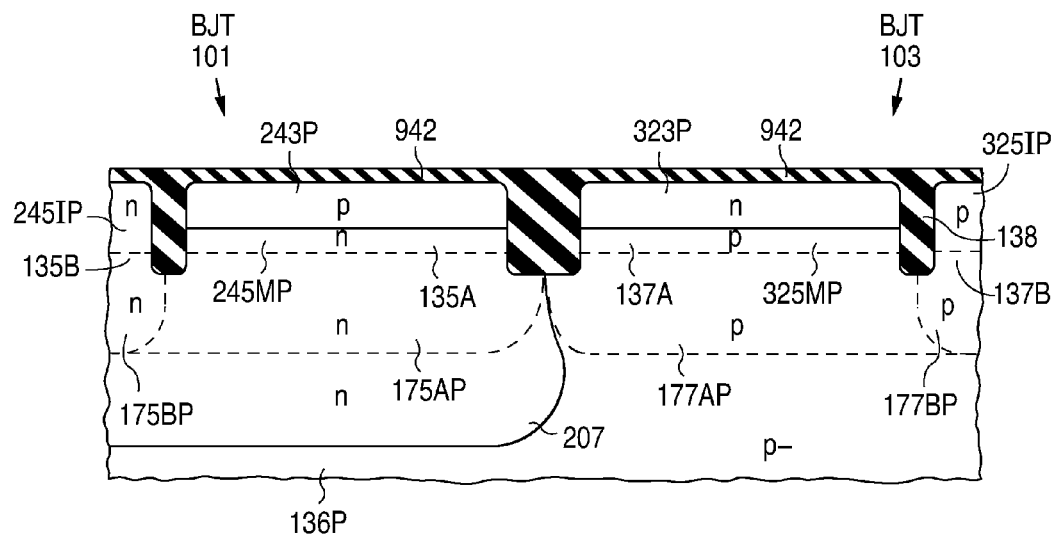
Fig. 18I.0
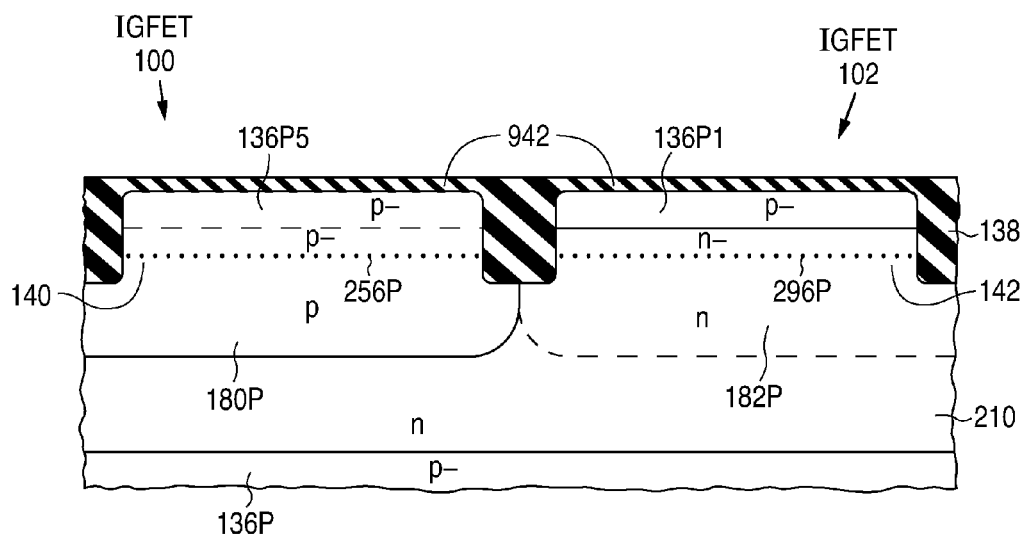
Fig. 18I.1

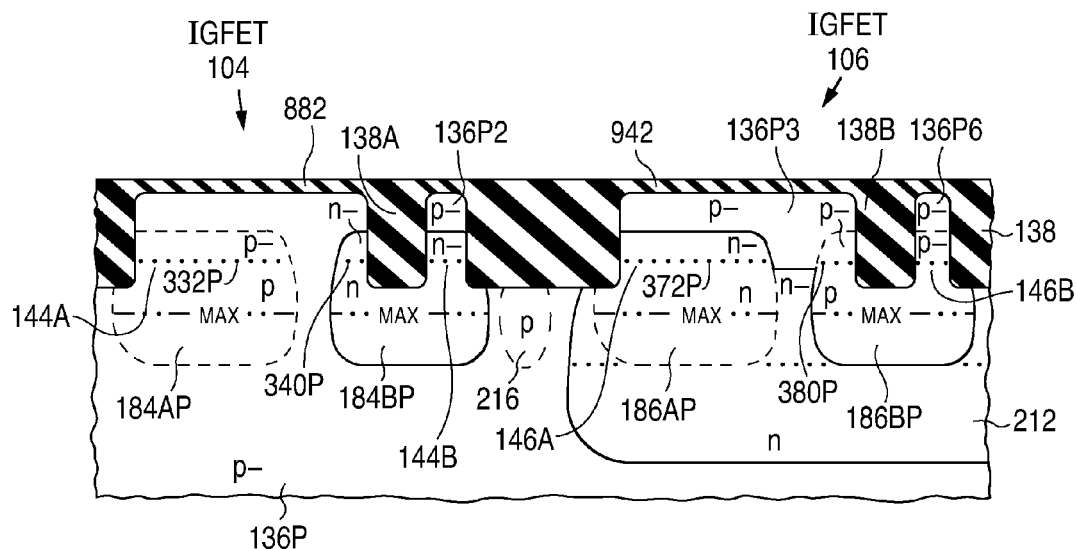
Fig. 18I.2
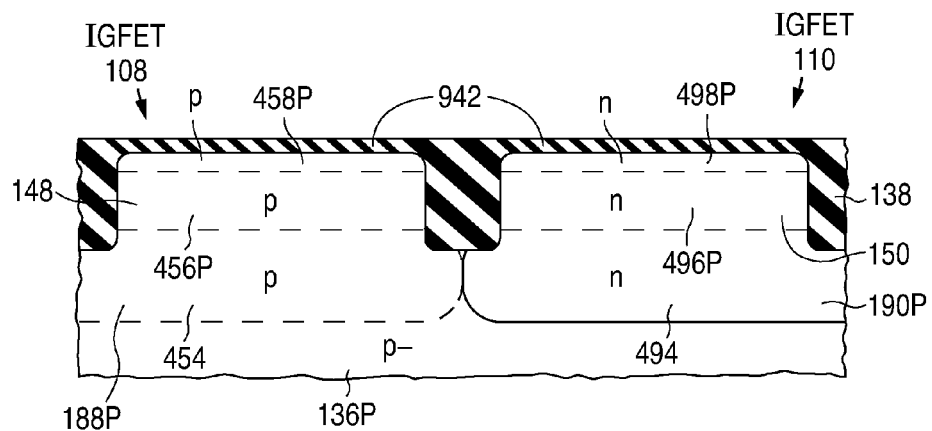
Fig. 18I.3

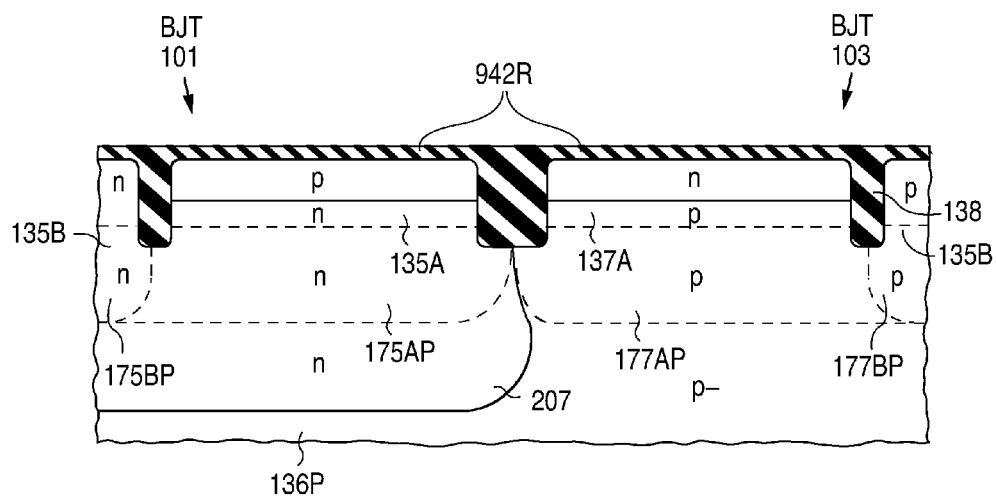
Fig. 18m.0
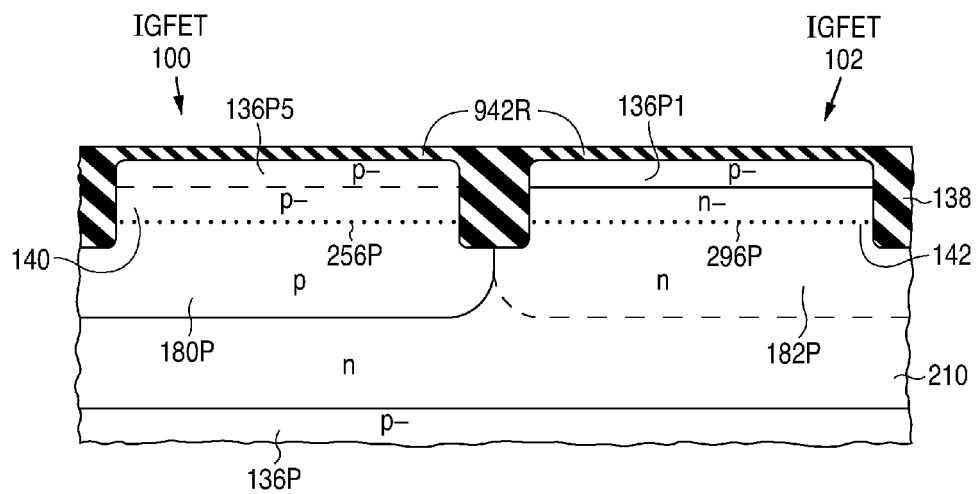
Fig. 18m.1

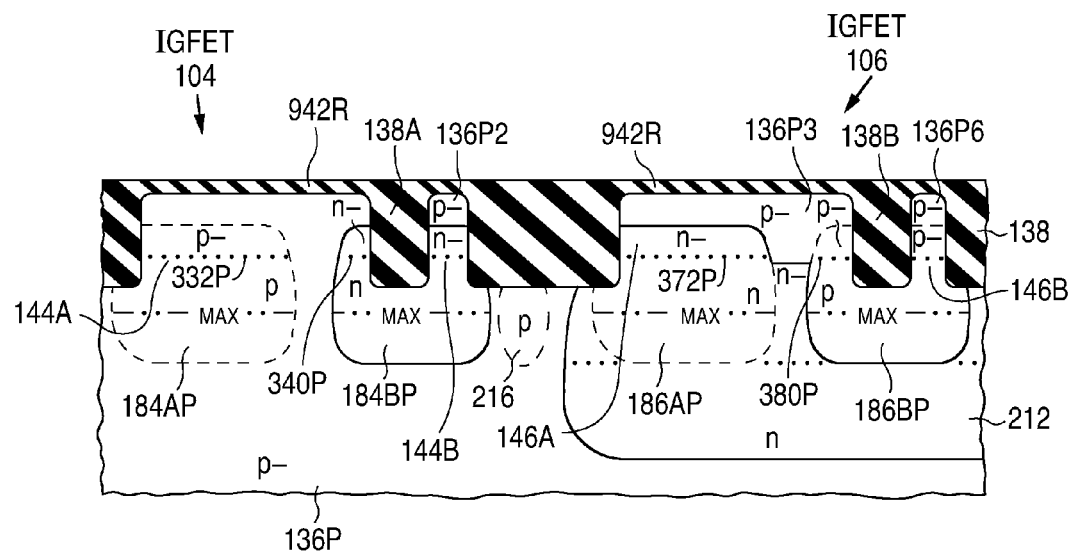
Fig. 18m.2
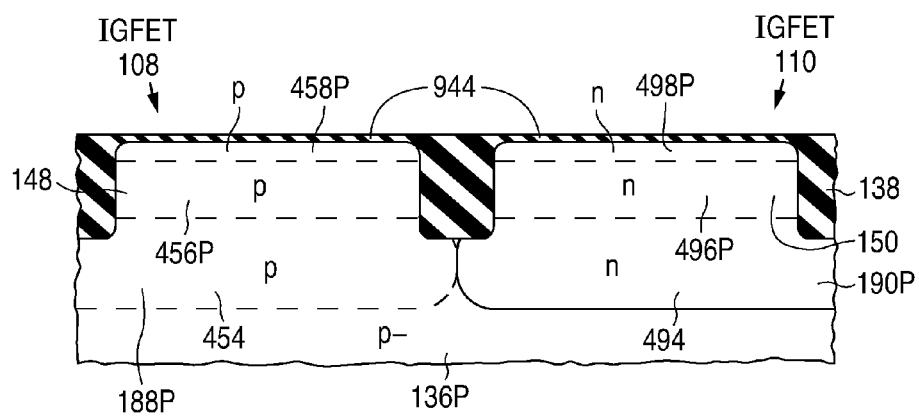
Fig. 18m.3

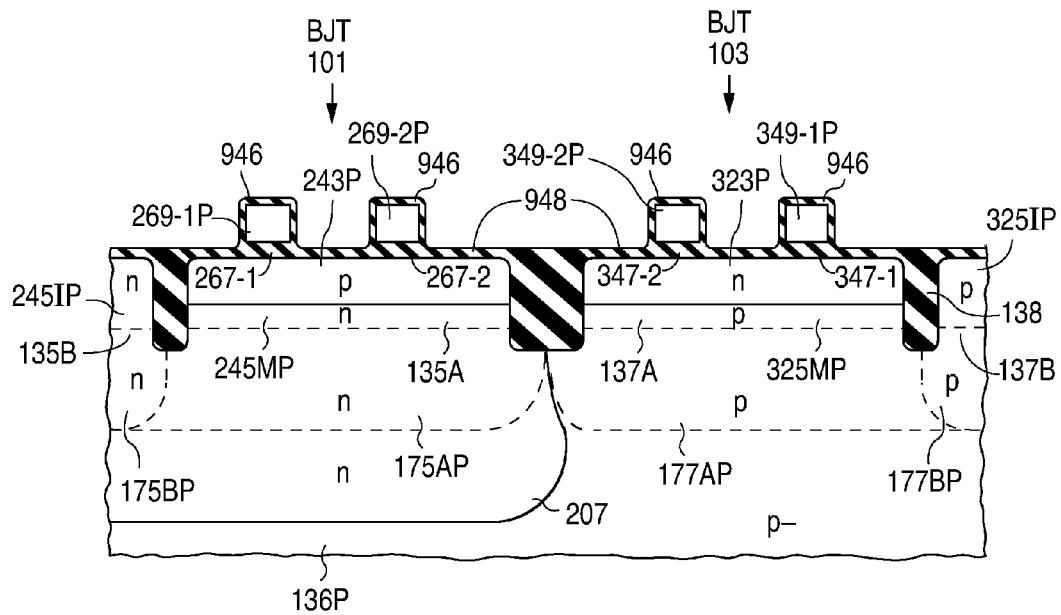
Fig. 18n.0
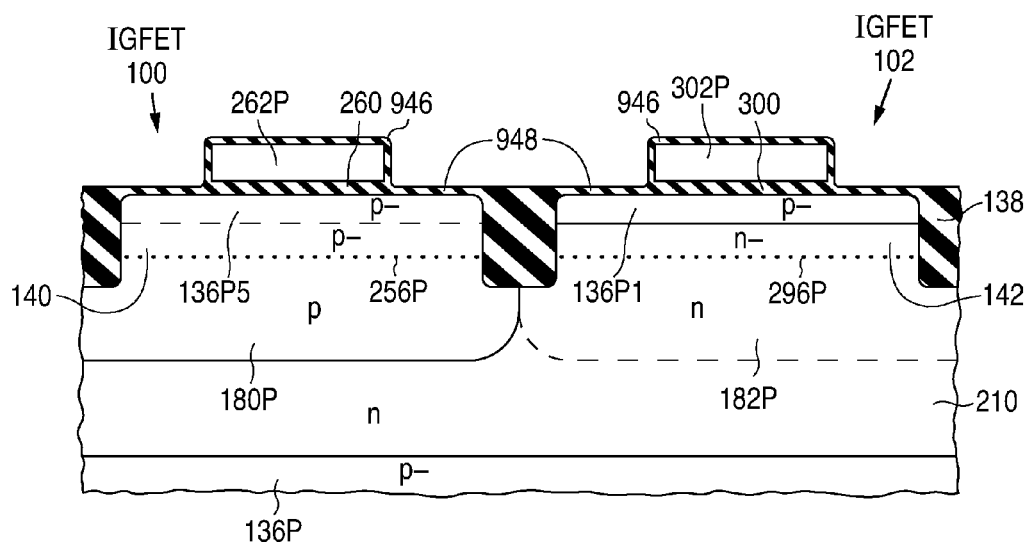
Fig. 18n.1

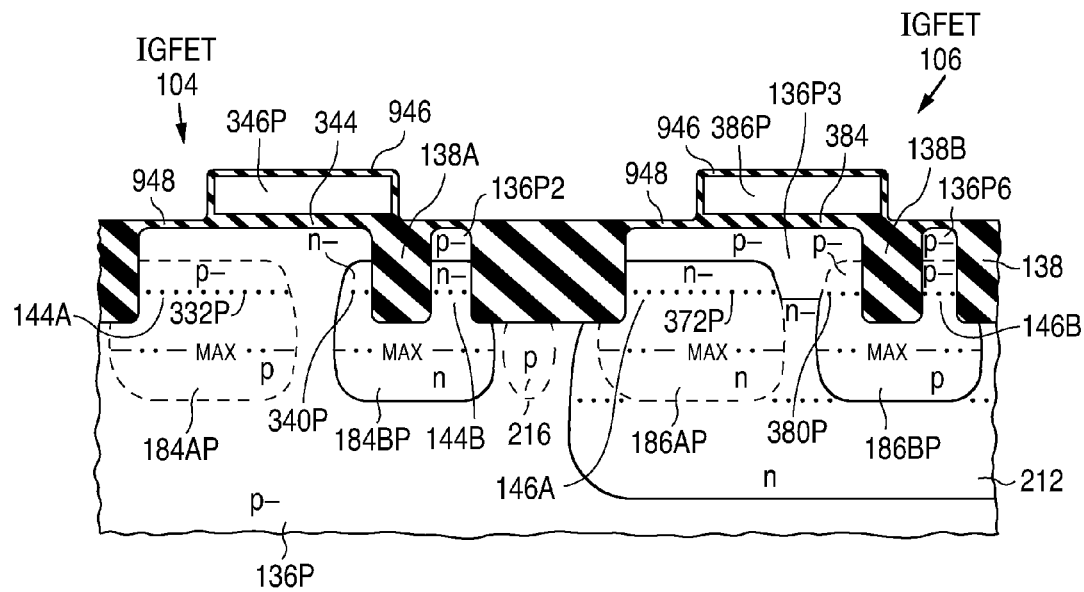
Fig. 18n.2
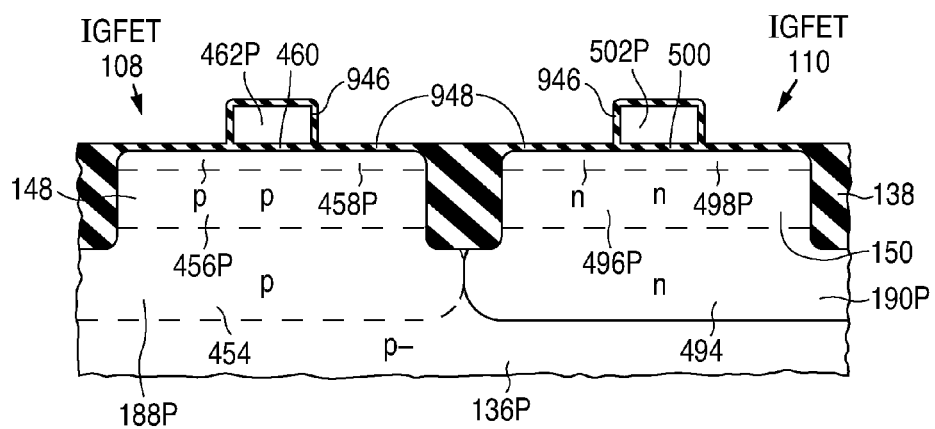
Fig. 18n.3

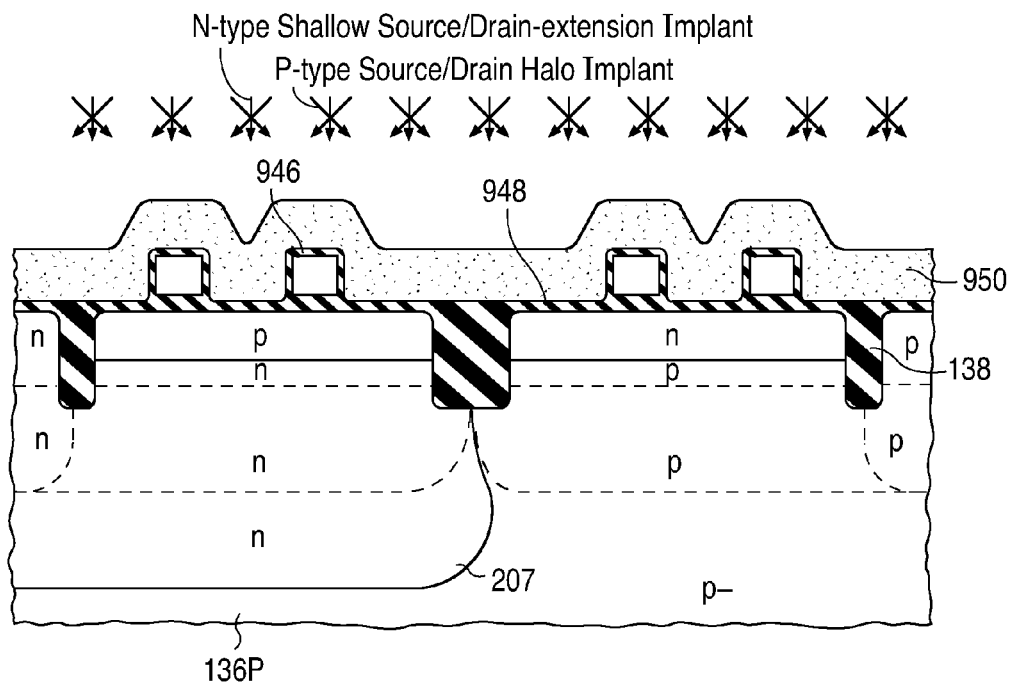
Fig. 18o.0
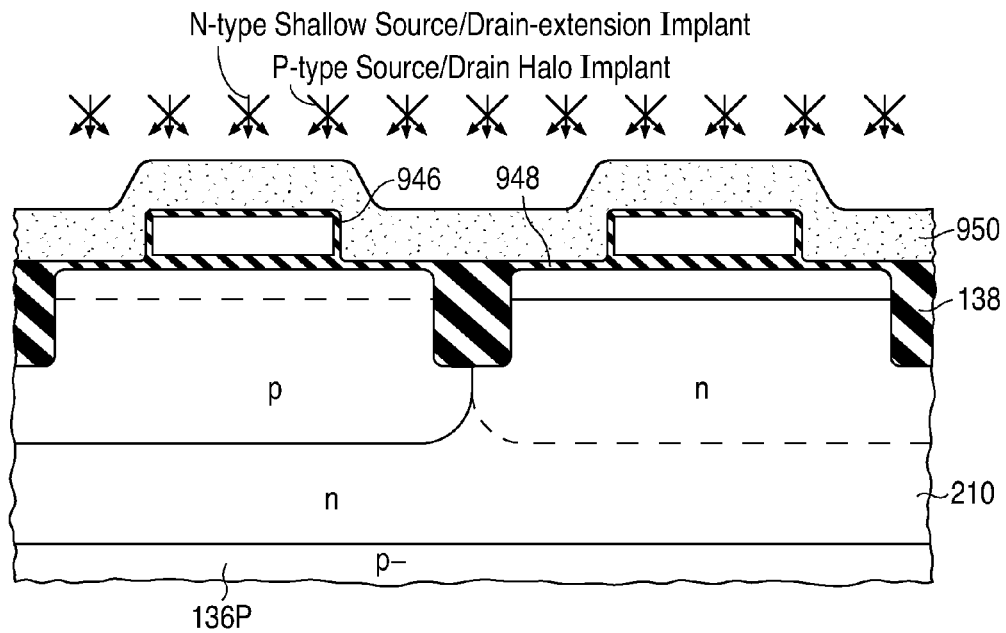
Fig. 18o.1

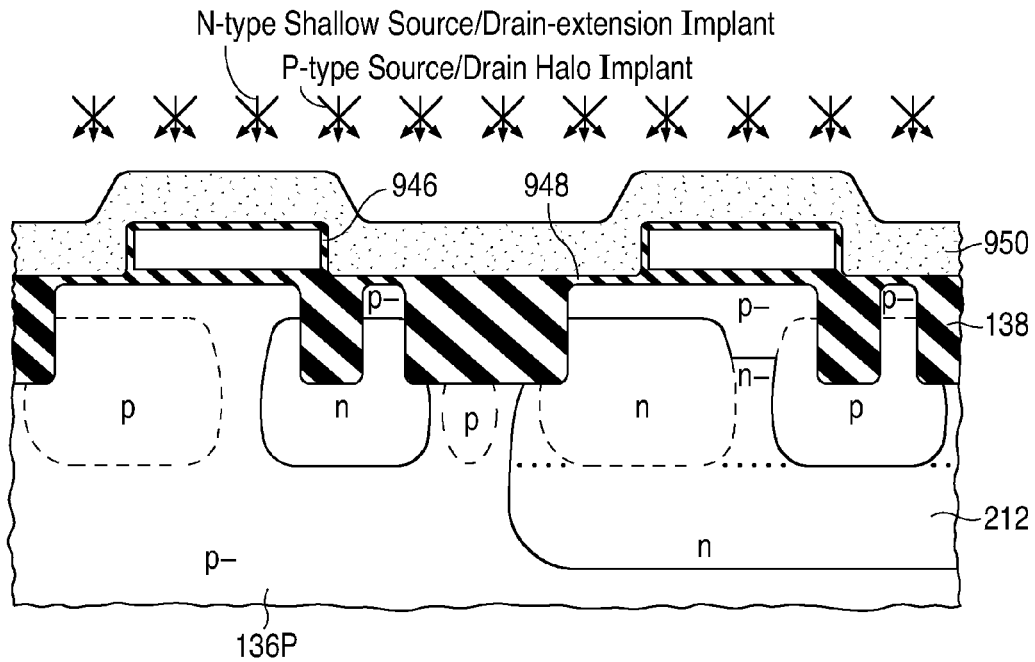
Fig. 18o.2
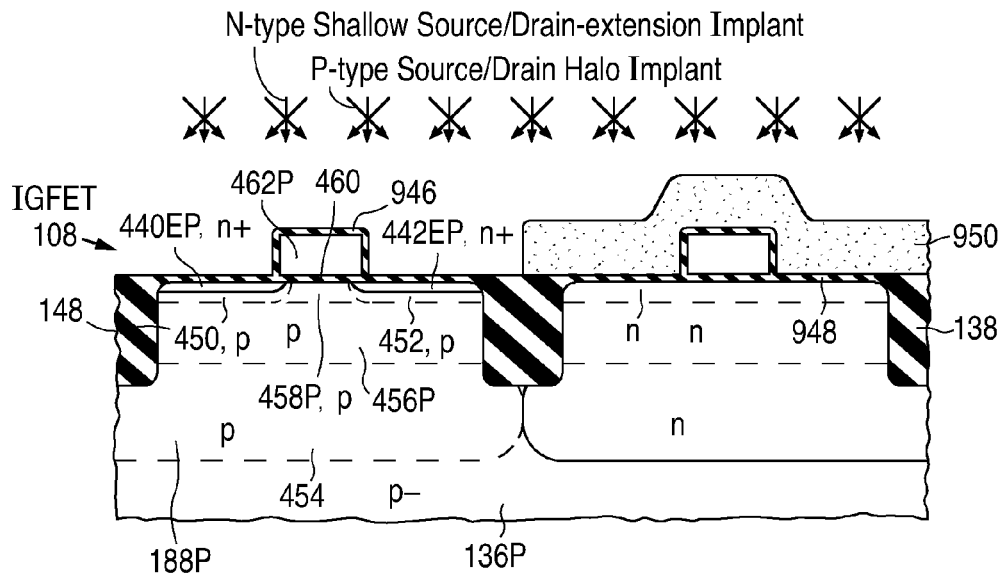
Fig. 18o.3

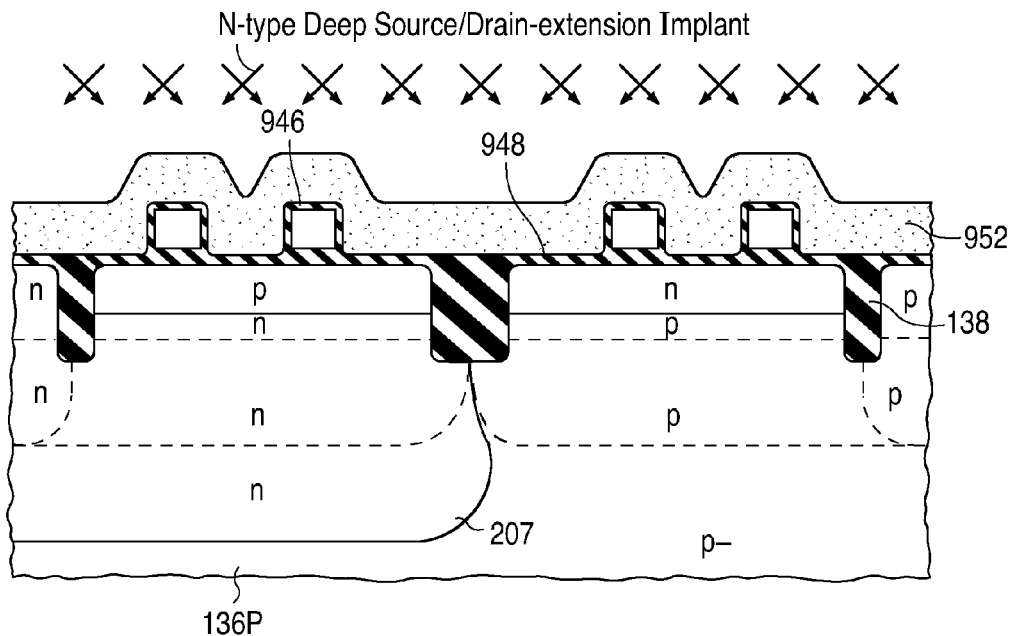
Fig. 18p.0
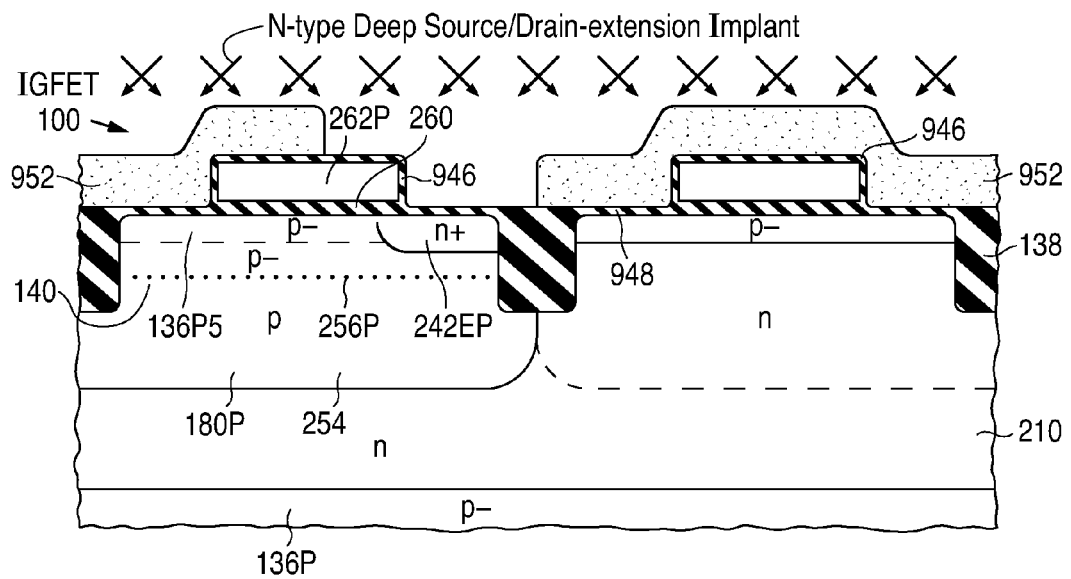
Fig. 18p.1

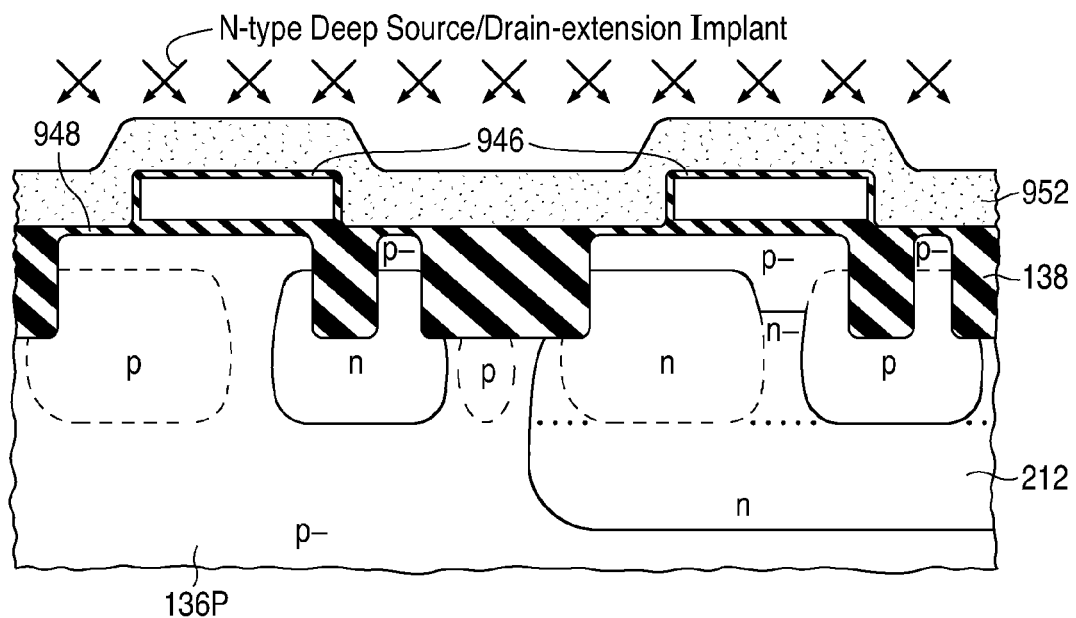
Fig. 18p.2
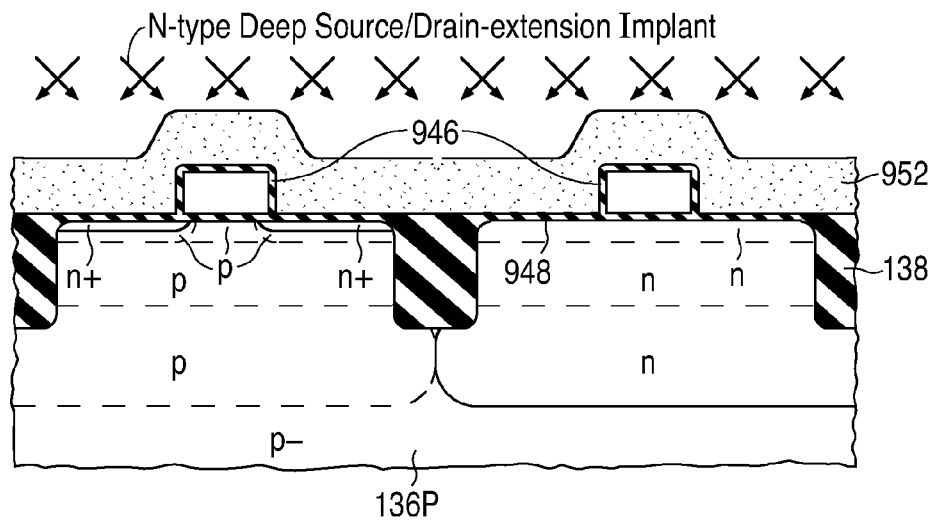
Fig. 18p.3

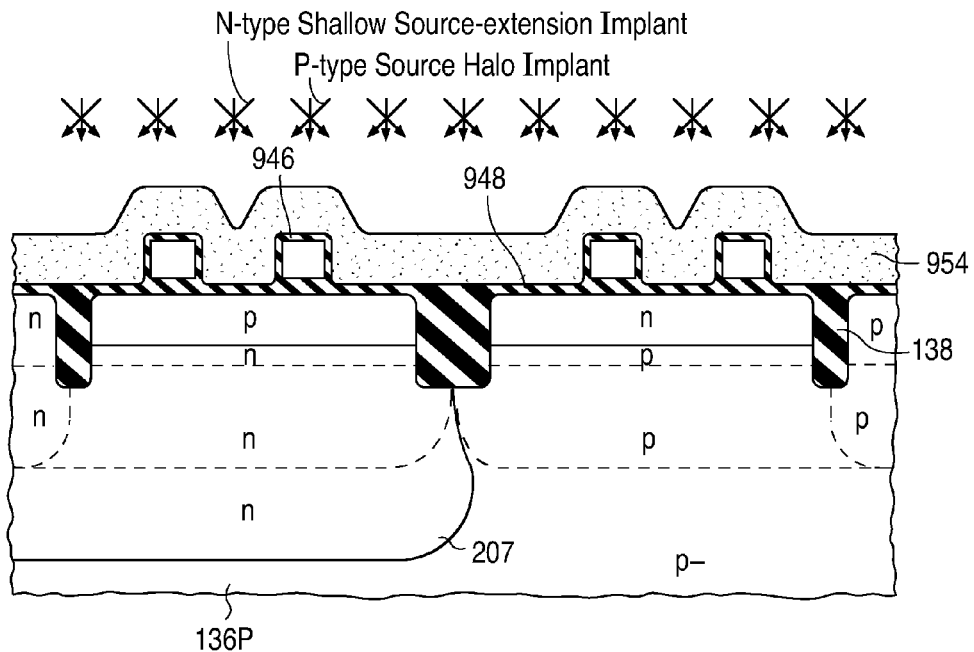
Fig. 18q.0
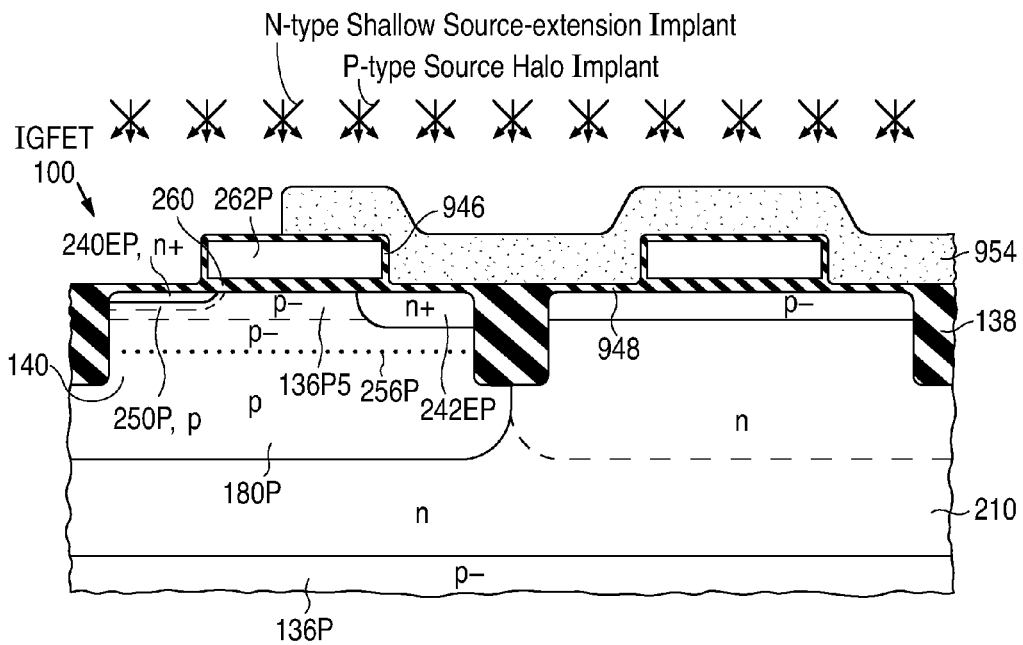
Fig. 18q.1

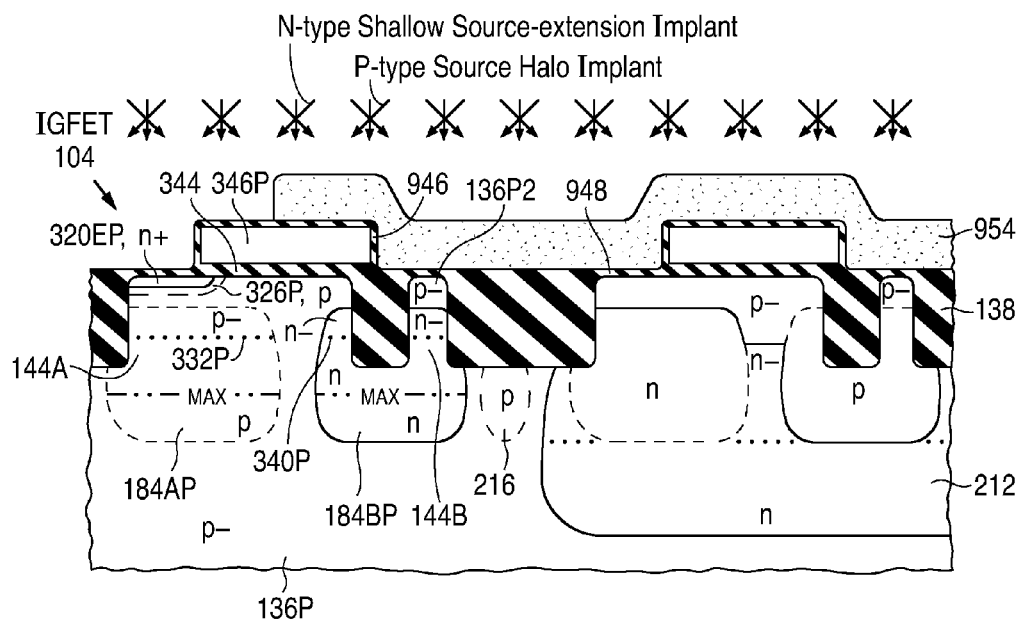
Fig. 18q.2
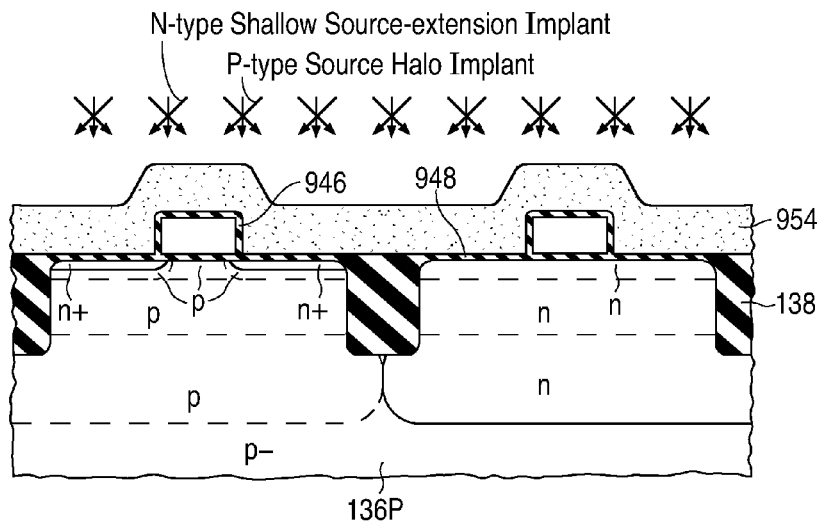
Fig. 18q.3

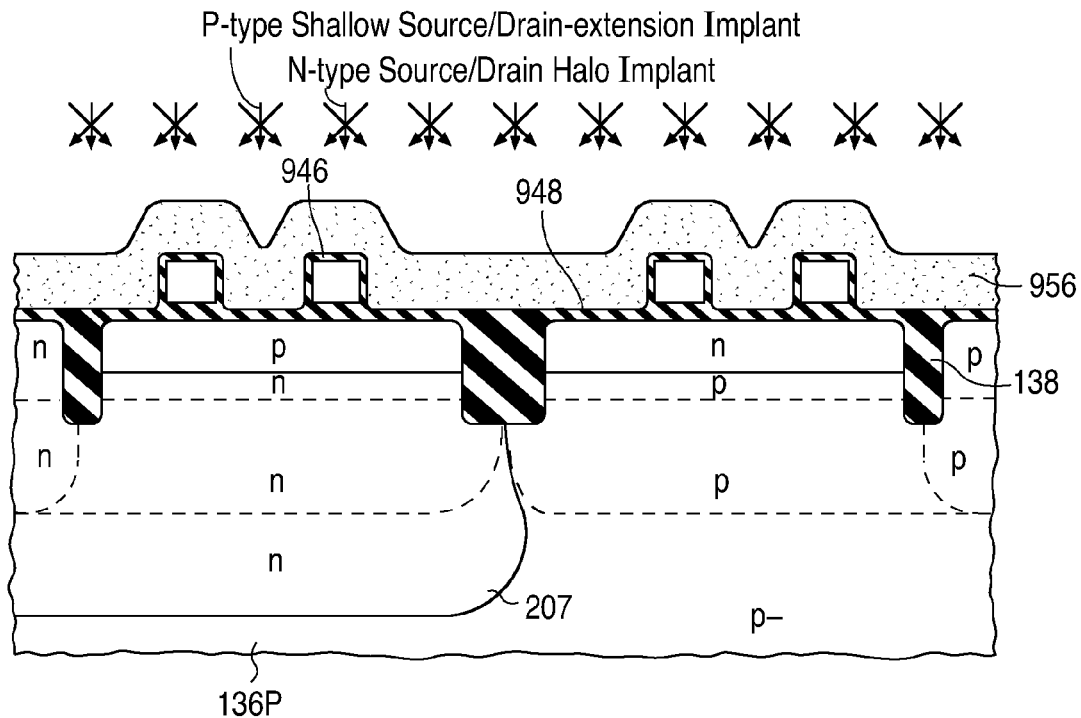
Fig. 18r.0
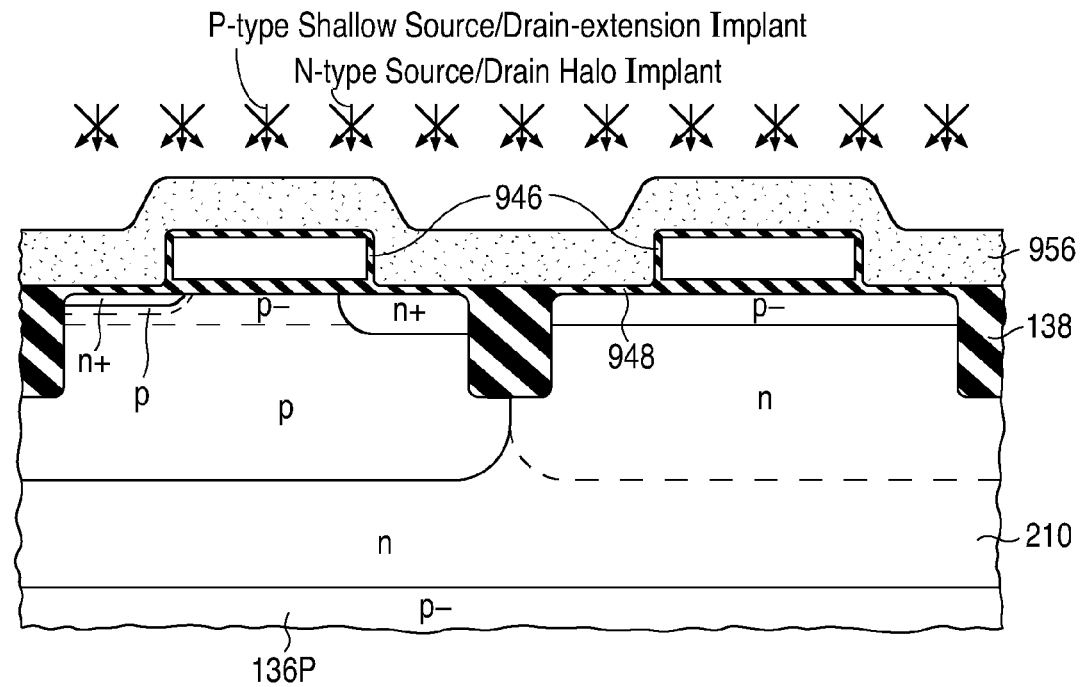
Fig. 18r.1

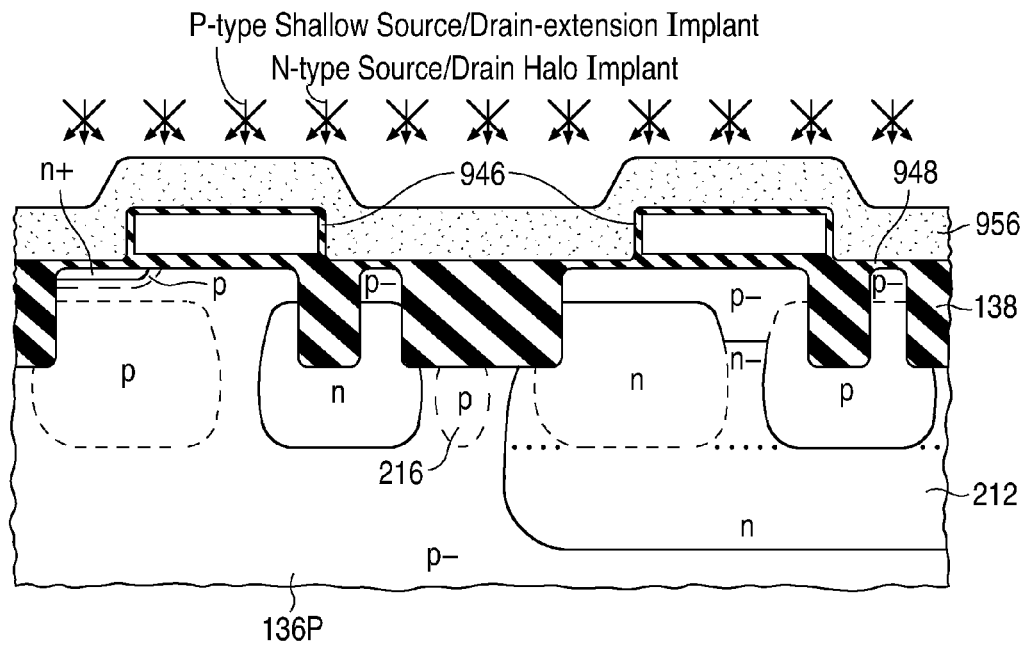
Fig. 18r.2
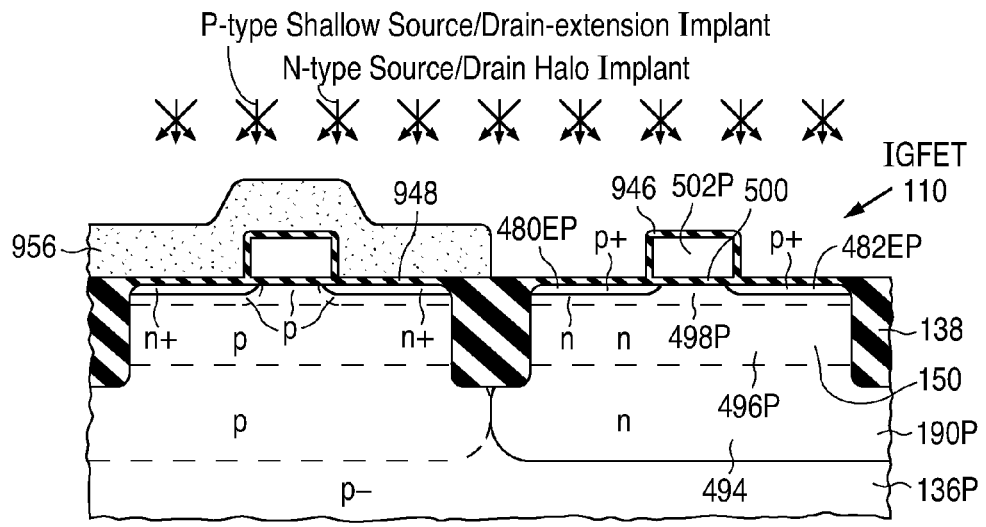
Fig. 18r.3

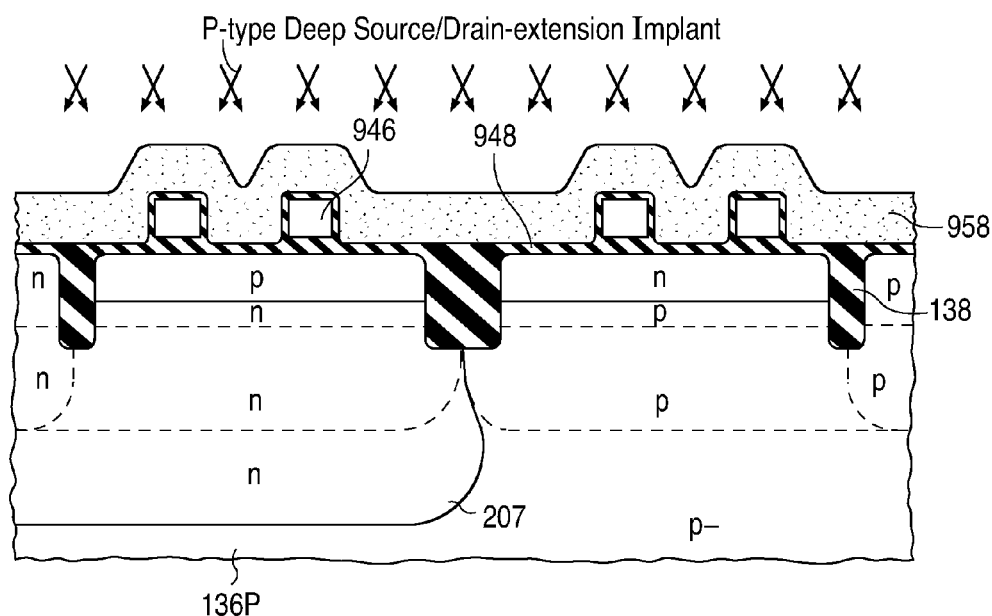
Fig. 18s.0
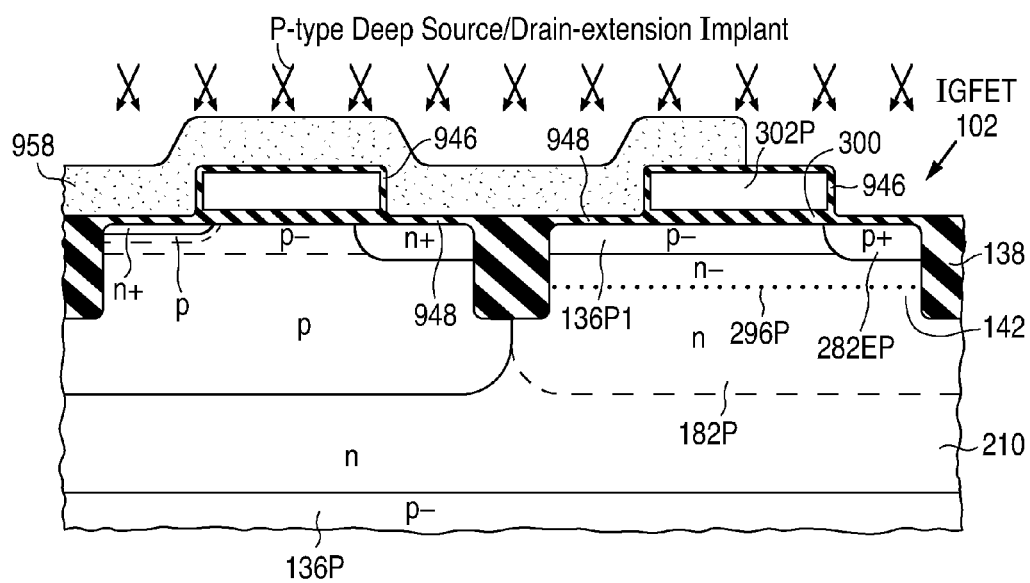
Fig. 18s.1

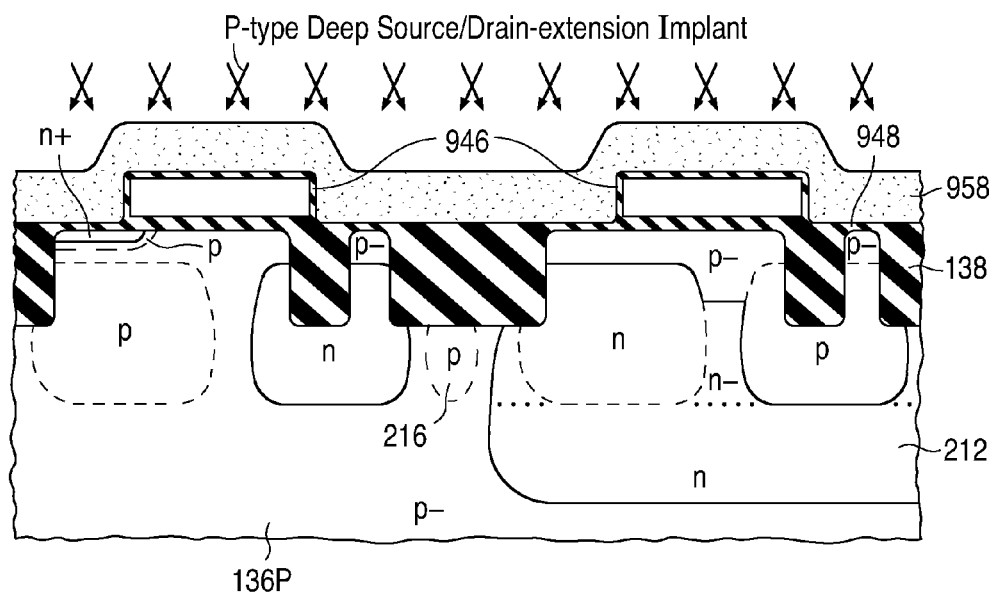
Fig. 18s.2
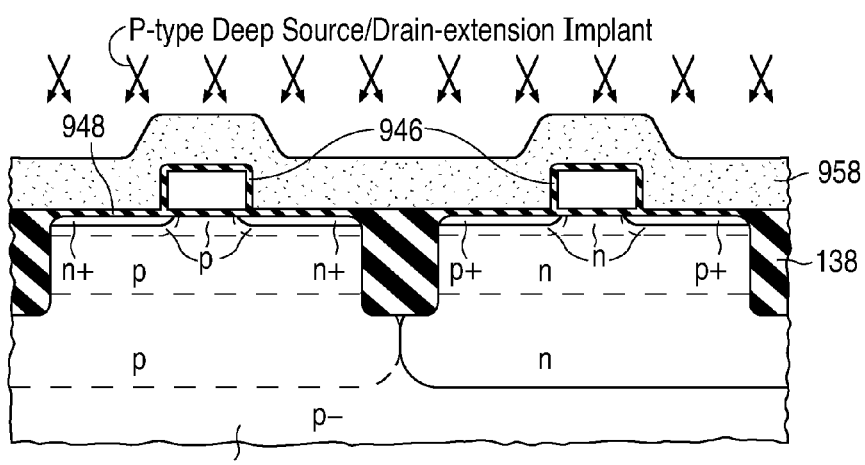
Fig. 18s.3

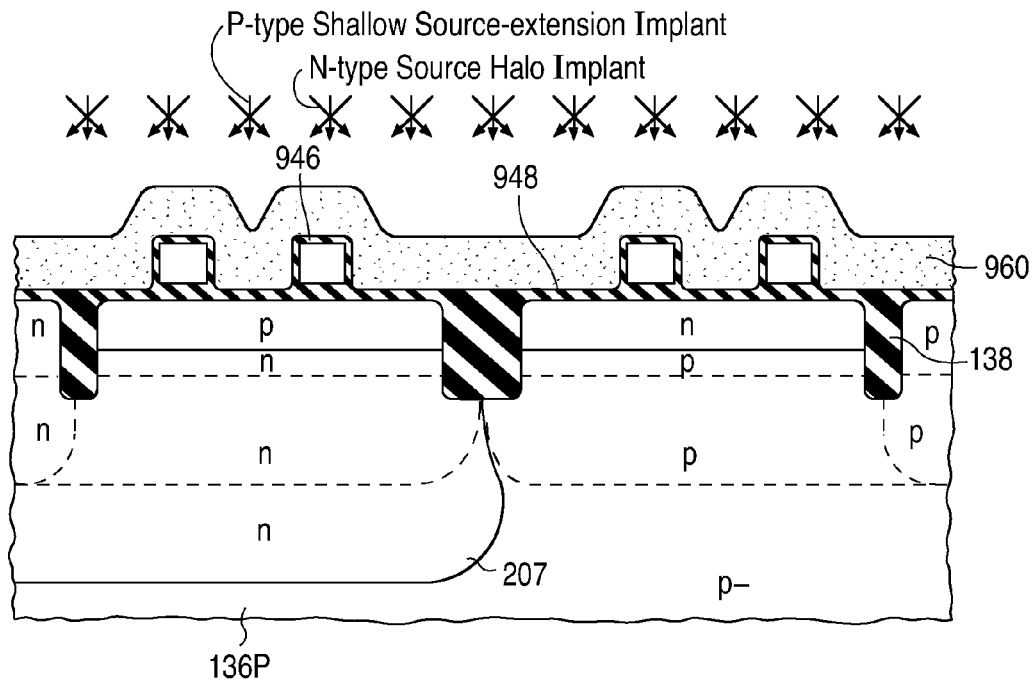
Fig. 18t.0
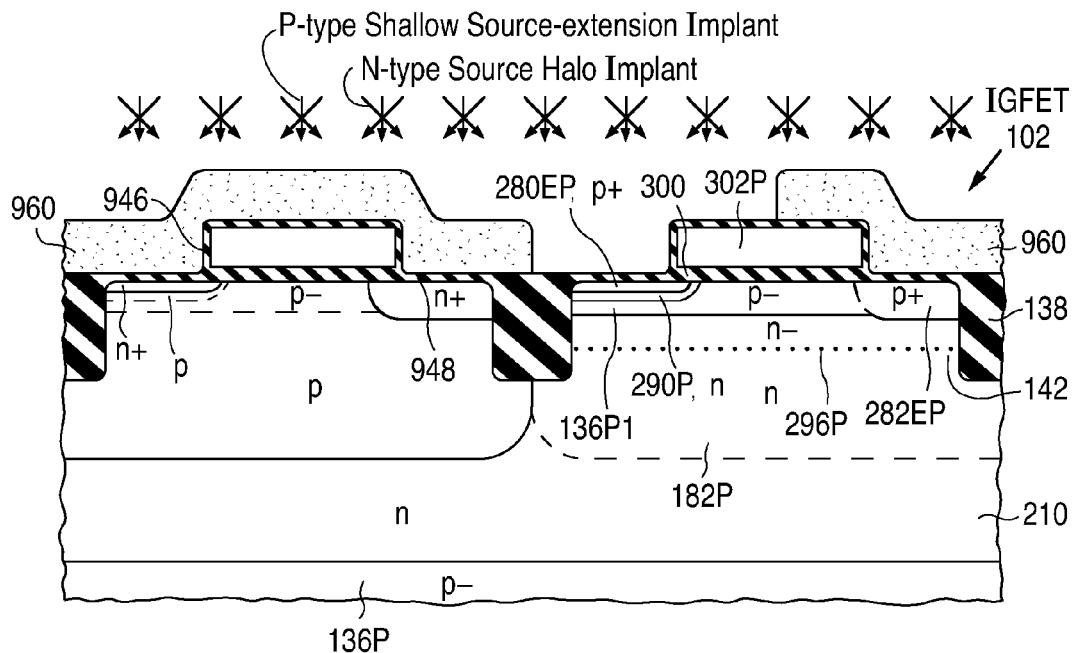
Fig. 18t.1

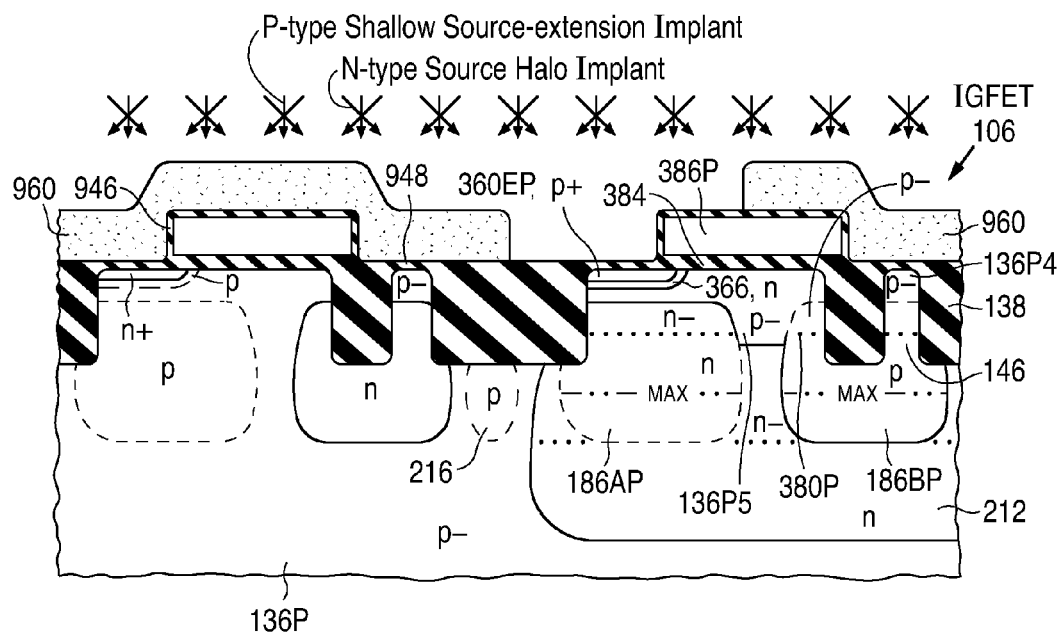
Fig. 18t.2
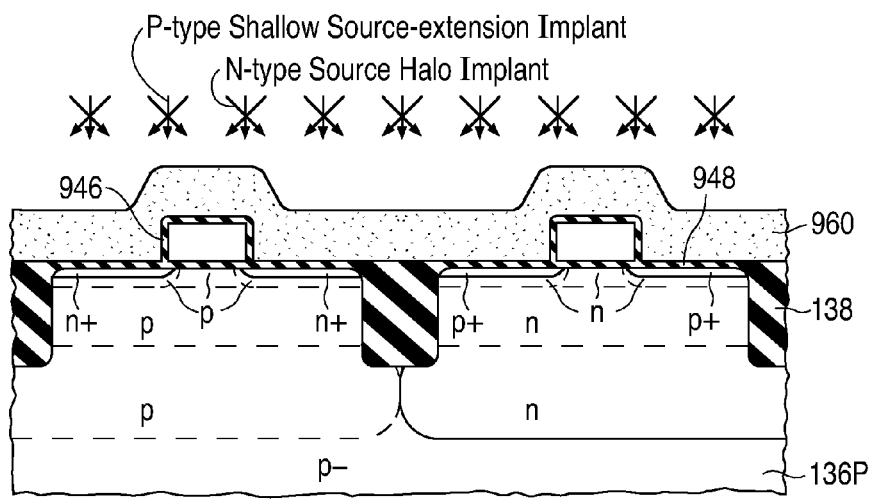
Fig. 18t.3

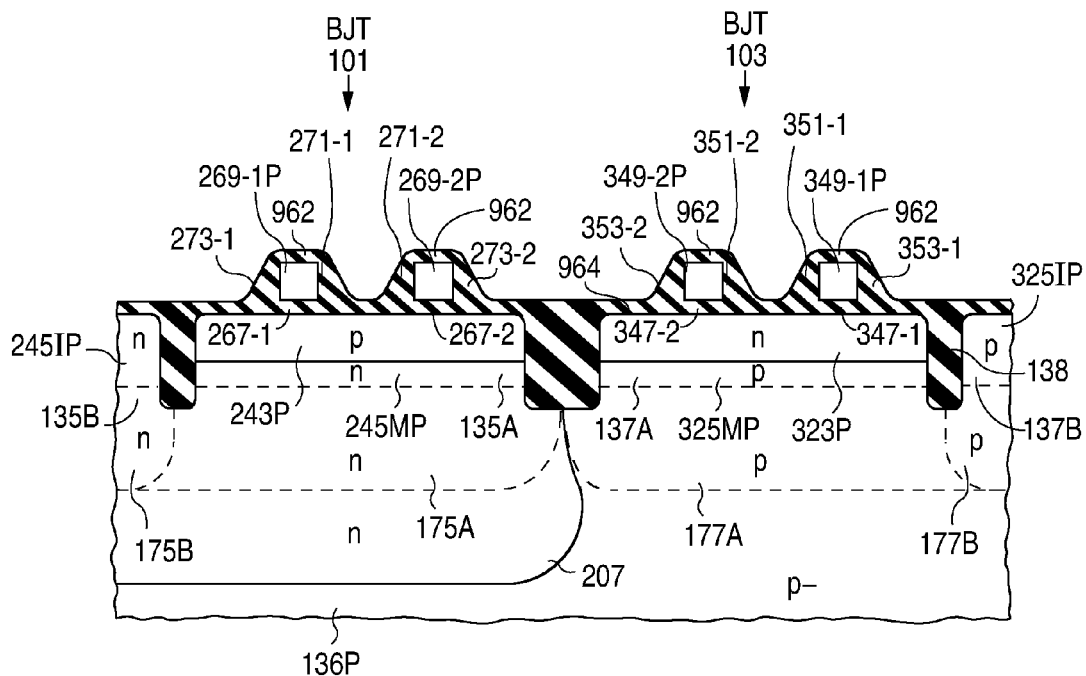
Fig. 18u.0
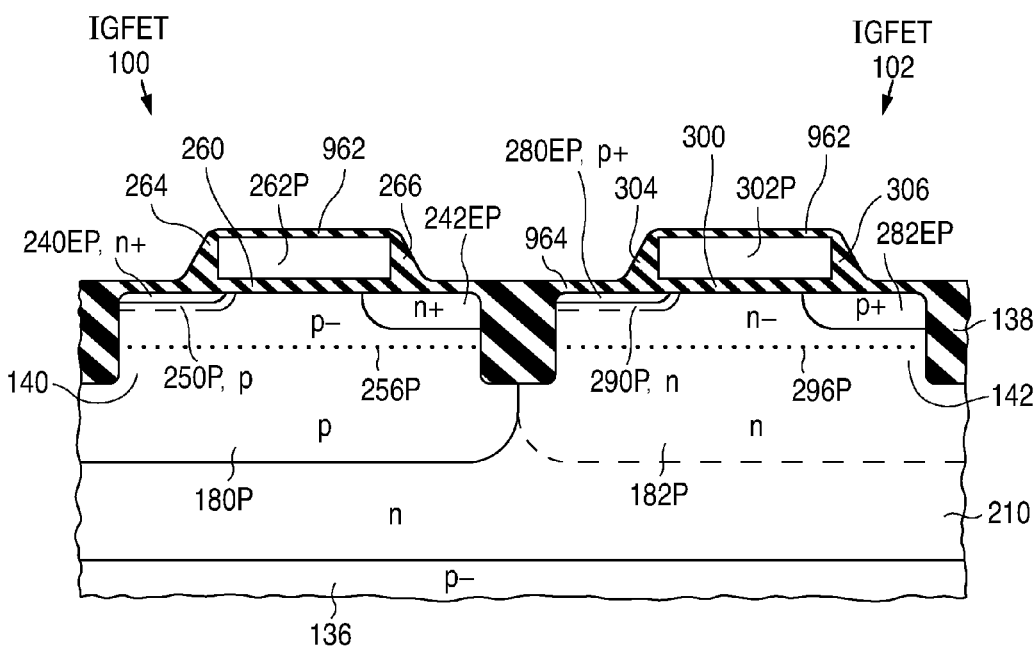
Fig. 18u.1

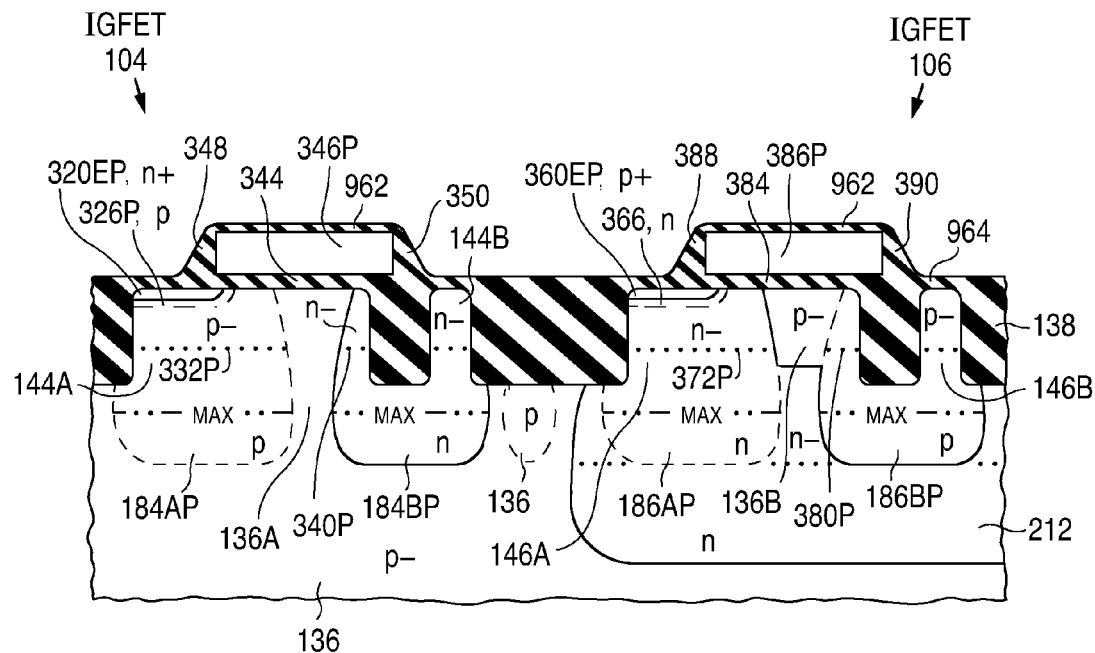
Fig. 18u.2
Fig. 18u.3

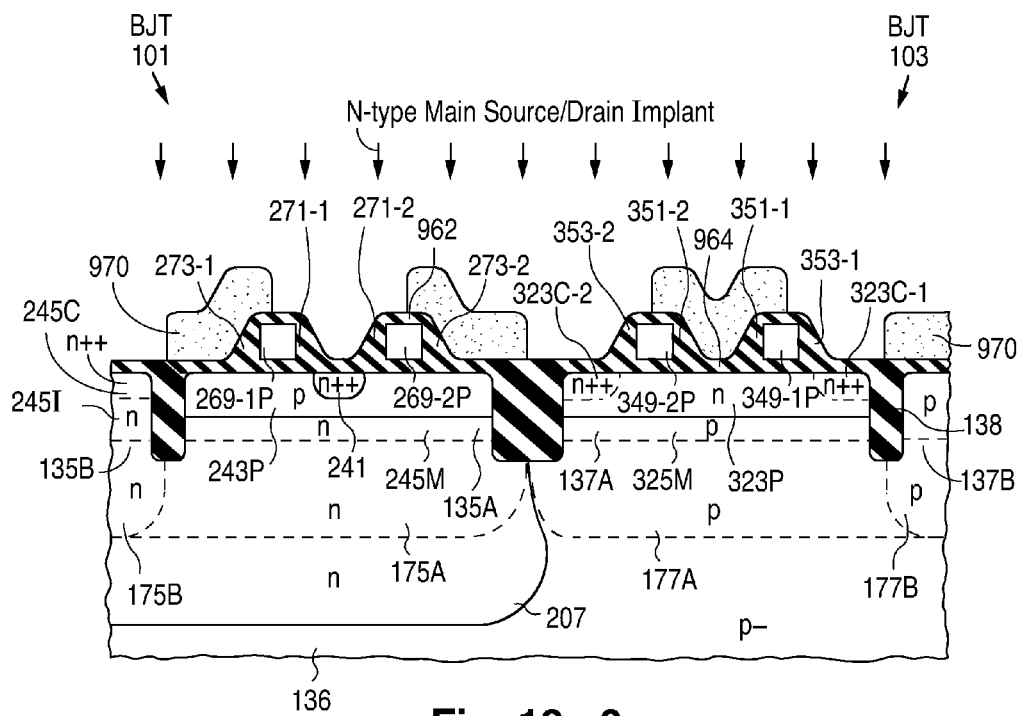
Fig. 18v.0
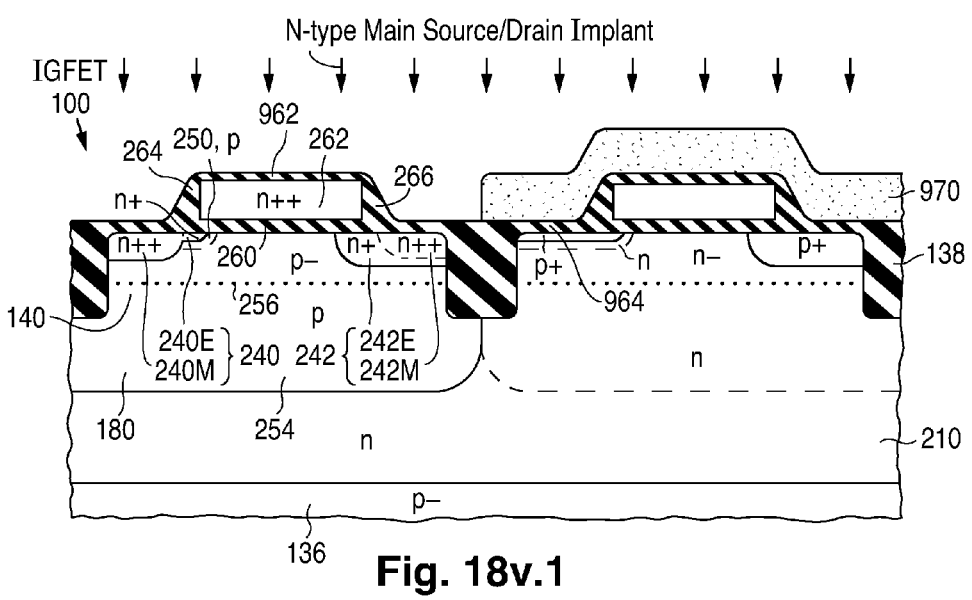
Fig. 18v.1

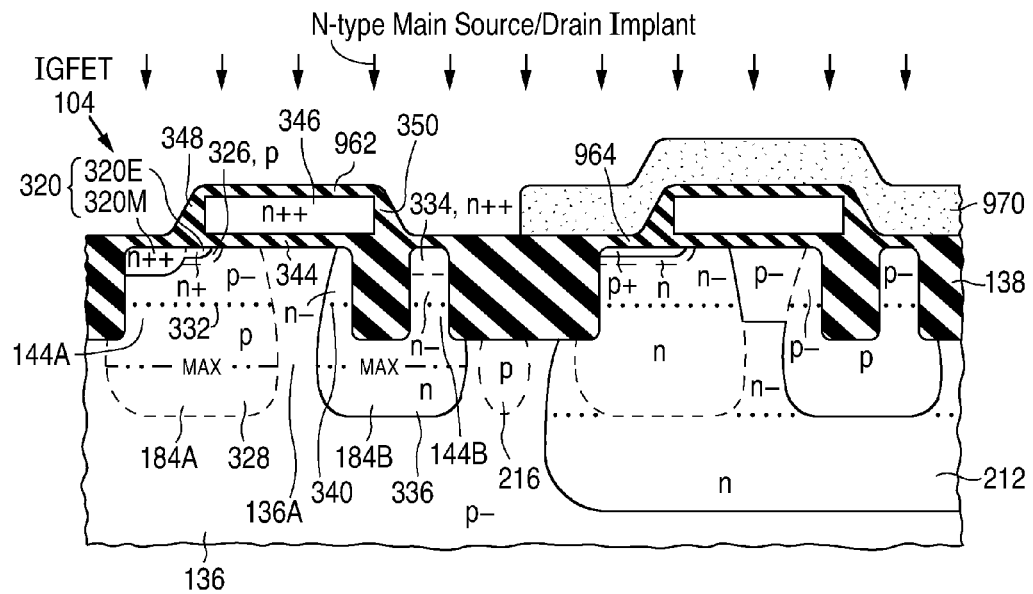
Fig. 18v.2
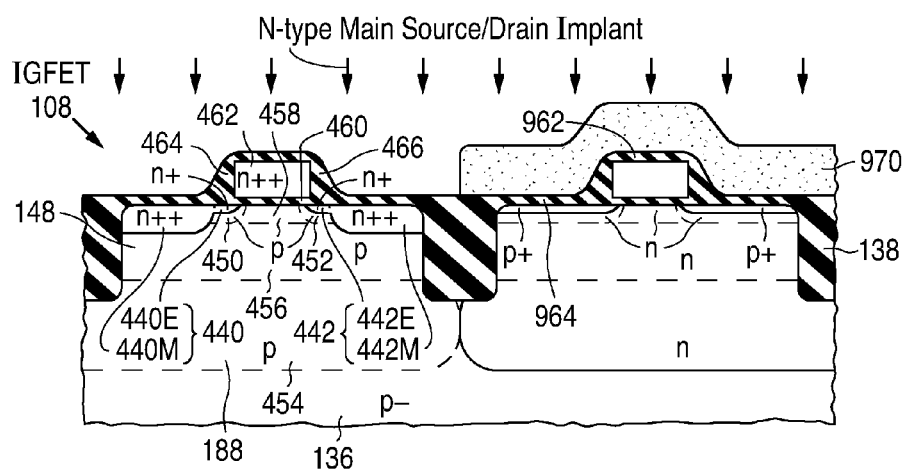
Fig. 18v.3

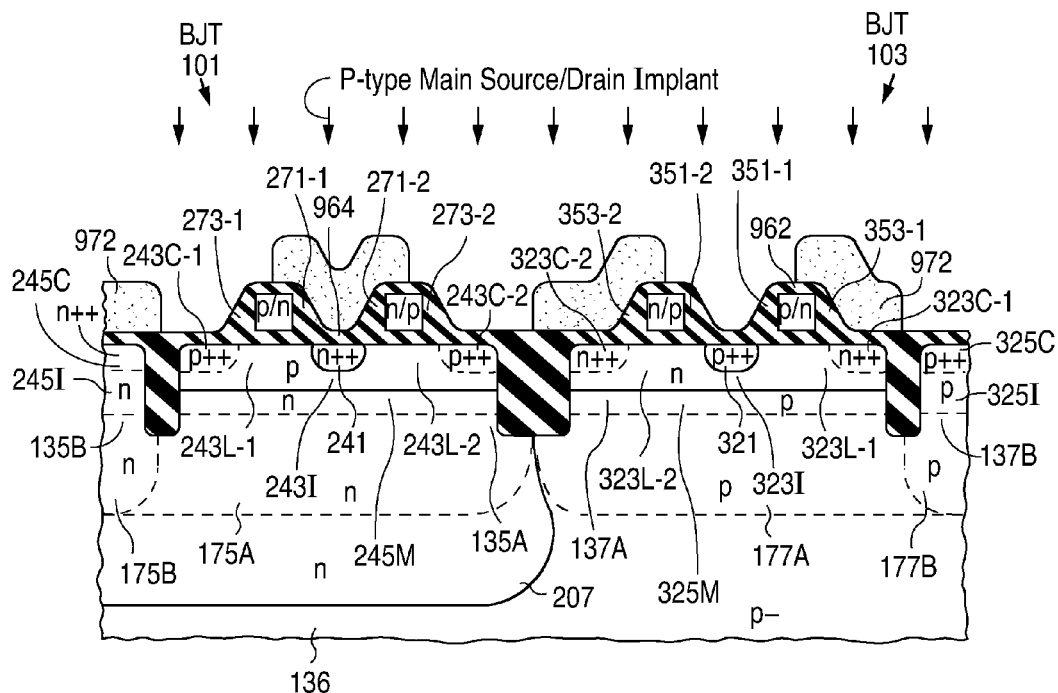
Fig. 18w.0
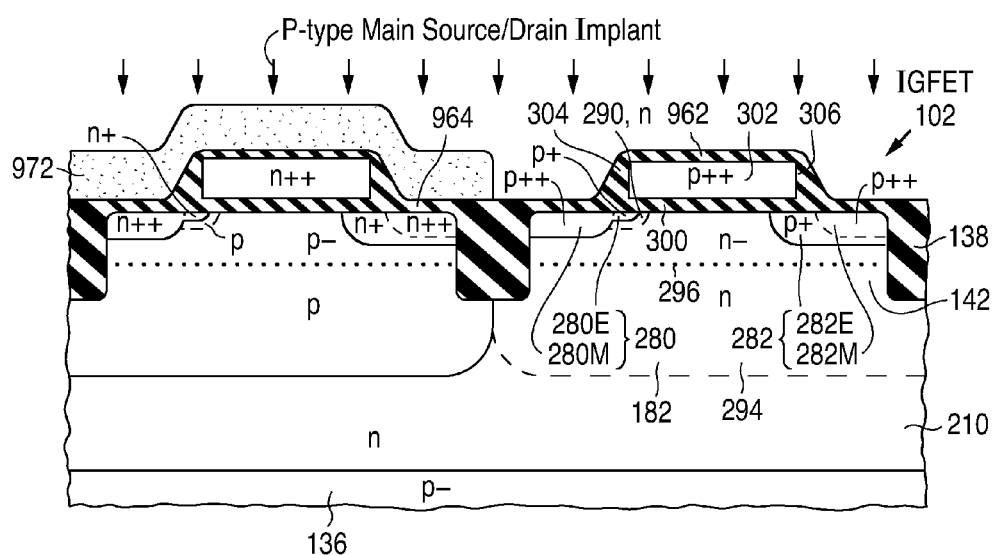
Fig. 18w.1

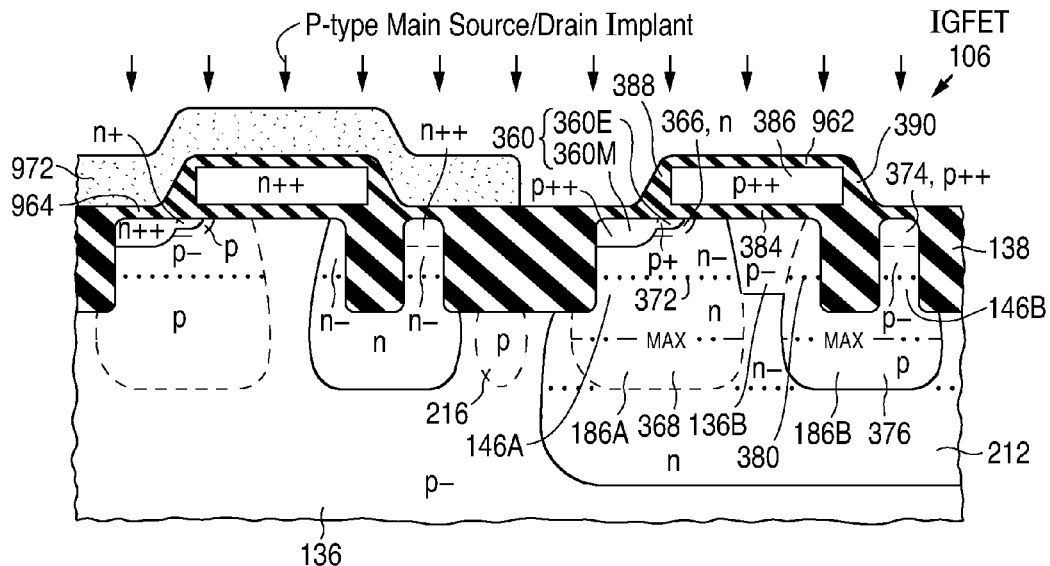
Fig. 18w.2
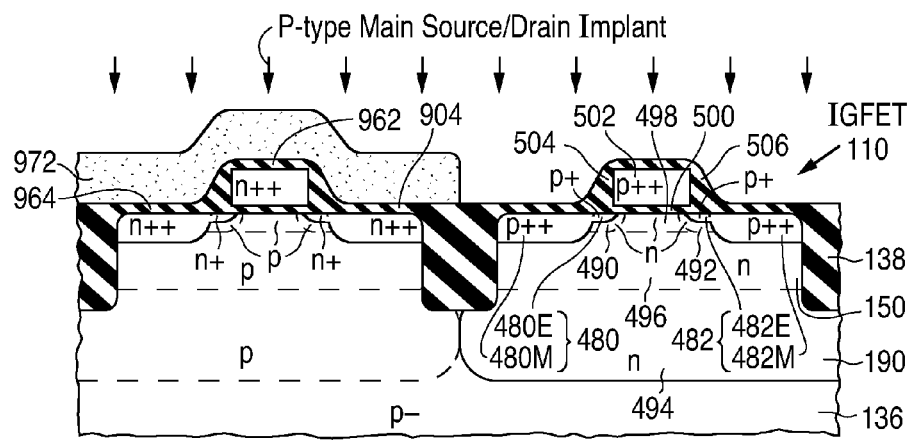
Fig. 18w.3

CONFIGURATION AND FABRICATION OF SEMICONDUCTOR STRUCTURE HAVING BIPOLAR JUNCTION TRANSISTOR IN WHICH NON-MONOCRYSTALLINE SEMICONDUCTOR SPACING PORTION CONTROLS BASE-LINK LENGTH

CROSS-REFERENCE TO RELATED APPLICATIONS

This is a continuation of U.S. patent application Ser. No. 12/382,966, filed 27 Mar. 2009, now U.S. Pat. No. 8,030,151. This application is related to the following U.S. patent applications all filed 27 Mar. 2009: U.S. patent application Ser. No. 12/382,973 (Bulucea et al.), U.S. patent application Ser. No. 12/382,976 (Bahl et al.), U.S. patent application Ser. No. 12/382,977 (Parker et al.), now U.S. Pat. No. 8,101,479 B2, U.S. patent application Ser. No. 12/382,972 (Bahl et al.), now U.S. Pat. No. 7,973,372 B2, U.S. patent application Ser. No. 12/382,967 (Yang et al.), now U.S. Pat. No. 8,163,619, U.S. patent application Ser. No. 12/382,968 (Bulucea et al.), U.S. patent application Ser. No. 12/382,969 (Bulucea et al.), now U.S. Pat. No. 7,968,921 B2, U.S. patent application Ser. No. 12/382,974 (French et al.), U.S. patent application Ser. No. 12/382,971 (Bulucea et al.), now U.S. Pat. No. 8,084,827 B2, and U.S. patent application Ser. No. 12/382,970 (Chaparala et al.). To the extent not repeated herein, the contents of these other applications are incorporated by reference herein.

FIELD OF USE

This invention relates to semiconductor technology and, in particular, to bipolar junction transistors especially when they are combined with field-effect transistors ("FETs") of the insulated-gate type. All of the insulated-gate FETs ("IGFETs") described below are surface-channel enhancement-mode IGFETs except as otherwise indicated.

BACKGROUND

A bipolar junction transistor ("BJT"), often referred to simply as a bipolar transistor, is a semiconductor device in which a base extends between an emitter and a collector. The base is formed with semiconductor material of one conductivity type, namely p-type for an npn BJT and n-type for a pnp BJT where the middle letter of the acronym "npn" or "pnp" identifies the conductivity type of the base. The emitter and collector are formed with semiconductor material of the opposite conductivity type, i.e., n-type for the npn BJT and p-type for the pnp BJT. Current flows through an npn BJT when its base-to-emitter voltage $V_{BE}$ reaches a positive threshold value $V_{BE0}$ typically in the vicinity of 0.7 V. Similarly, current flows through a pnp BJT when its base-to-emitter voltage $V_{BE}$ reaches a negative threshold value $V_{BE0}$ typically in the vicinity of −0.7 V.

An IGFET is a semiconductor device in which a gate dielectric layer electrically insulates a gate electrode from a channel zone extending between a source zone and a drain zone. The channel zone in an enhancement-mode IGFET is part of a body region, often termed the substrate or substrate region, which forms respective pn junctions with the source and drain. In an enhancement-mode IGFET, the channel zone consists of all the semiconductor material between the source and drain. During IGFET operation, charge carriers move from the source to the drain through a channel induced in the channel zone along the upper semiconductor surface. The threshold voltage is the value of the gate-to-source voltage at which the IGFET starts to conduct current for a given definition of the threshold (minimum) conduction current. The channel length is the distance between the source and drain along the upper semiconductor surface.

The term "mixed signal" refers to integrated circuits ("ICs") containing both digital and analog circuitry blocks. The digital circuitry typically employs the most aggressively scaled n-channel and p-channel IGFETs for obtaining the maximum potential digital speed at given current leakage specifications. The analog circuitry utilizes IGFETs and/or BJTs subjected to different performance requirements than the digital IGFETs. Requirements for the analog IGFETs commonly include high linear voltage gain, good small-signal and large-signal frequency response at high frequency, good parameter matching, low input noise, well controlled electrical parameters for active and passive components, and reduced parasitics, especially reduced parasitic capacitances. Although it would be economically attractive to utilize the same transistors for the analog and digital blocks, doing so would typically lead to weakened analog performance. Many requirements imposed on analog IGFET performance conflict with the results of digital scaling.

Digital circuitry blocks predominantly use the smallest IGFETs that can be fabricated. Because the resultant dimensional spreads are inherently large, parameter matching in digital circuitry is often relatively poor. In contrast, good parameter matching is usually needed in analog circuitry to achieve the requisite performance. This typically requires that analog transistors be fabricated at greater dimensions than digital IGFETs subject to making analog IGFETS as short as possible in order to have source-to-drain propagation delay as low as possible.

IGFETs are the predominate type of transistors in current ICs. As a result, fabrication of an IC containing IGFETs and BJTs is typically directed primarily toward optimizing the IGFET characteristics. Optimization of the BJT characteristics is then performed subject to substantially maintaining the optimized characteristics of the IGFETs. Alvarez, *BiCMOS Technology and Applications* (2d ed., Kluwer Acad. Publishers), 1993, pages 75-78, describes this IC fabrication approach.

FIG. 1 illustrates a conventional single-well complementary-IGFET ("CIGFET") semiconductor structure as described in Alvarez. This CIGFET semiconductor structure, commonly referred to as "CMOS", serves as a basis for more advanced semiconductor structures that contain complementary IGFETs and BJTs. The single-well CIGFET structure of FIG. 1 contains symmetric n-channel IGFET 20 and symmetric p-channel IGFET 22 fabricated from a semiconductor body consisting of heavily doped p-type monocrystalline silicon ("monosilicon") substrate 24 and overlying lightly doped p-type monosilicon epitaxial layer 26. Recessed field region 28 of electrically insulating material, primarily silicon oxide, extends along the upper surface of p-epitaxial layer 26 to define laterally separated semiconductor islands 30 and 32.

N-channel IGFET 20 contains surface-adjoining heavily doped n-type source/drain ("S/D") zones 34 and 36 situated in island 32 and laterally separated by a channel zone of p-type body material that includes p− epitaxial layer 26. Gate dielectric layer 40 vertically separates the p-type channel zone from doped polycrystalline silicon ("polysilicon") gate electrode 42 of IGFET 20. P-channel IGFET 22 contains surface-adjoining heavily doped p-type S/D zones 44 and 46 situated in island 32 and laterally separated by a channel zone of n-type body material consisting of moderately doped n-type well region 48 formed in p− epitaxial layer 26. Gate dielectric layer 50 vertically separates the n-type channel zone from doped polysilicon gate electrode 52 of IGFET 22.

Monosilicon regions 34, 36, 44, 46, and 48 are defined by a series of photoresist masking/doping operations. These processing operations could also be utilized to form lateral and vertical BJTs. For instance, the p-type emitter of a vertical pnp transistor could be defined by the masking/doping operation used to form p+ S/D zones 44 and 46 of p-channel IGFET 22. The masking/doping operation used to form n well region 52 of IGFET 22 in combination with the masking/doping operations used to form p+ S/D zones 44 and 46 would then be employed to define the n-type base of the vertical pnp transistor. P+ substrate 24 and p− epitaxial layer 26 would serve as the transistor's collector. However, the vertical pnp transistor would generally have relatively weak operating characteristics. The same applies to lateral BJTs defined only with the processing steps employed to form IGFETs 20 and 22.

FIG. 2 illustrates, as generally described in Alvarez, how the single-well CIGFET structure of FIG. 1 is extended in a conventional rudimentary manner to include vertical npn BJT 33, thereby forming a single-well BJT/CIGFET semiconductor structure. Recessed field-oxide layer 30 in this semiconductor structure, commonly referred to as "BiCMOS", defines laterally separated semiconductor islands 35 and 37. Npn transistor 33 consists of (a) surface-adjoining heavily doped n-type emitter 39 situated in island 35, (b) a p-type base largely situated in island 35 so as to underlie and laterally surround n+ emitter 39, and (c) an n-type collector formed in p− epitaxial layer 26 so as to extend from the base, below field oxide 28, and into island 37 up to the upper semiconductor surface.

The p-type base includes moderately doped intrinsic base portion 41I and an extrinsic base zone formed with moderately doped base link portion 41L and surface-adjoining heavily doped base contact portion 41C. P base link portion 41L is continuous with p intrinsic base portion 41I and extends between n+ emitter 39 and p+ base contact portion 41C. The n-type collector consists of heavily doped collector contact portion 43C and moderately doped main collector portion 43M which extends from n+ collector contact portion 43C to the p-type base, particularly to intrinsic portion 41I.

Voltages for controlling npn transistor 31 are variously applied to emitter 39, base contact portion 41C, and collector contact portion 43C through suitable electrical contacts (not shown). The voltage at base contact portion 41C is transmitted through base link portion 41L to intrinsic base portion 41I. During operation, current in the form of electrons flows from emitter 39, vertically downward through intrinsic base portion 41I, laterally through main collector portion 43M, and upward to collector contact portion 43C.

During the fabrication of the BJT/CIGFET structure of FIG. 2, n+ emitter 39 and n+ collector contact portion 43C are formed with the same steps as n+ S/D zones 36 and 38 of re-channel IGFET 20. P+ base contact portion 41C is formed with the same steps as p+ S/D zones 46 and 48 of p-channel IGFET 22. N main collector portion 43M is formed with the same steps as n well region 48 of IGFET 22. The only additional processing needed to convert the CMOS structure of FIG. 1 into the BJT/CIGFET structure of FIG. 2 is a masking/doping operation to create the combination of p intrinsic base portion 41I and p base link portion 41L.

The length $L_{BL}$ of base link portion 41L, i.e., the distance between n+ emitter 39 and p+ base contact portion 41C along the upper semiconductor surface, is defined by the edges of the photoresist masks utilized in defining emitter 39 and base contact portion 41C. The photoresist mask used in forming emitter 39 is also used in forming n+ S/D zones 34 and 36 of n-channel IGFET 20 and is non-critical with respect to S/D zones 34 and 36 because their lateral extents are determined by lateral edges of recessed field-oxide region 28 and gate electrode 42. Similarly, the photoresist mask used in forming base contact portion 41C is also used in forming p+ S/D zones 44 and 46 of p-channel IGFET 22 and is non-critical with respect to S/D zones 44 and 46 because their lateral extents are determined by lateral edges of field oxide 28 and gate electrode 52.

The additional masking/doping operation employed to form intrinsic base portion 41I and base link portion 41L enables the operating characteristics of npn transistor 33 to be improved. However, the n-type doping in main collector portion 43M is normally so low that the collector resistance is relatively high. This limits the usefulness of npn transistor 33.

FIG. 3 illustrates, again as generally described in Alvarez, a conventional single-well BJT/CIGFET semiconductor structure that overcomes the high collector resistance problem. The BJT/CIGFET structure of FIG. 3 contains n-channel IGFET 20V, p-channel IGFET 22V, and npn BJT 33V configured respectively the same as transistors 20, 22, and 33 except as described below. P+ substrate 24 and p− epitaxial layer 26 in the BJT/CIGFET structure of FIG. 2 are replaced here with lightly doped p-type monosilicon substrate 54 and overlying moderately doped n-type monosilicon epitaxial layer 56. The p-type body material for n-channel IGFET 20V includes moderately doped well region 58 formed largely in n epitaxial layer 56. The n-type body material for p-channel IGFET 22V consists of (a) segment 60M of epitaxial layer 56 and (b) heavily doped buried layer 60B formed the along the interface between p− substrate 54 and epitaxial layer 56.

The n-type collector of npn transistor 33V is constituted with (a) segment 61M of epitaxial layer 56, (b) heavily doped buried collector layer 61B formed along the interface (indicated in dashed line in FIG. 3) between substrate 54 and epitaxial layer 56, and (c) heavily doped collector contact portion 61C which extends from n+ buried layer 61B through semiconductor island 37 to the upper semiconductor surface. The heavy dopings of n+ buried collector layer 61B and n+ collector contact portion 61C substantially reduce the collector resistance. Additionally, moderately doped p-type well region 62 is situated between n epitaxial segments 60M and 61M so as to laterally isolate npn transistor 33V from p-channel IGFET 22V.

During the fabrication of the BJT/CIGFET structure of FIG. 3, n+ buried collector layer 61B is formed with the same steps as n+ buried layer 60B for IGFET 22V. Isolating p well 62 is formed with the same steps as p well 58 for IGFET 20V. The change from n well region 48 and simultaneously formed main collector portion 43M in the BJT/CIGFET structure of FIG. 2 to simultaneously formed p wells 58 and 62 in the BJT/CIGFET structure of FIG. 3 does not involve any significant additional fabrication steps. However, the formation of n+ buried layers 61B and 60B requires an additional masking/doping operation. The formation of n+ collector contact portion 61C requires another additional masking/doping operation. Consequently, the reduction in the collector resistance in the BJT/CIGFET structure of FIG. 3 is achieved at the expense of two additional masking/doping operations.

A further advanced conventional BJT/CIGFET semiconductor structure, once again as generally described in Alvarez, is illustrated in FIG. 4. This BJT/CIGFET structure is a twin-well structure containing n-channel IGFET 20W, p-channel IGFET 22W, and npn BJT 33W configured respectively the same as transistors 20V, 22V, and 33V except as described below. N-epitaxial layer 58 in the BJT/CIGFET structure of FIG. 3 is replaced here with near intrinsic monosilicon epitaxial layer 63. Recessed field-oxide region 28 in the BJT/CIGFET structure of FIG. 3 is replaced here with recessed field-oxide region 28W of reduced height above the upper semiconductor surface.

The p-type body material for n-channel IGFET 20W includes (a) moderately doped well region 64W formed in intrinsic epitaxial layer 63, (b) moderately doped buried layer 64B formed along the interface (not indicated in FIG. 4) between p− substrate 54 and epitaxial layer 63, and (c) surface-adjoining heavily doped body contact portion 64C. Each n+ S/D zone 34 or 36 in the BJT/CIGFET structure of FIG. 3 is replaced here with an n-type S/D zone 34W or 36W consisting of a heavily doped main portion and a more lightly doped lateral extension. Dielectric spacers 66 and 68 are situated along the sidewalls of polysilicon gate electrode 42.

The n-type body material for p-channel IGFET 22W is formed with (a) moderately doped well region 70W formed in epitaxial layer 63, (b) moderately doped buried layer 70B formed along the interface between substrate 54 and epitaxial layer 63, and (c) surface-adjoining heavily doped body contact portion 70C. Channel portion 72, apparently of p-type conductivity, extends between p-type S/D zones 44W and 46W. IGFET 22W therefore appears to be a depletion-mode device. Dielectric spacers 76 and 78 are situated along the sidewalls of polysilicon gate electrode 52.

The n-type collector of npn transistor 33W consists of (a) segment 65M of epitaxial layer 63, (b) heavily doped buried collector layer 65B formed along the interface between substrate 54 and epitaxial layer 63, and (c) heavily doped collector contact portion 65C which extends from n+ buried collector layer 65B through semiconductor island 37 to the upper semiconductor surface. As with n+ buried collector layer 61B and n+ collector contact portion 61C in the BJT/CIGFET structure of FIG. 3, the heavy dopings of n+ buried collector layer 65B and n+ collector contact portion 65C here substantially reduce the collector resistance. The combination of polysilicon-filled deep trench 67 and underlying heavily doped p-type anti-inversion region 69 laterally isolates npn transistor 33 from p-channel IGFET 22.

Electrically insulating layer 71 extends over n+ monosilicon portion 39 of the n-type emitter of npn transistor 33W. Doped n-type polysilicon portion 73 of the emitter contacts monosilicon emitter portion 39 through an access opening in insulating layer 71. Dielectric spacers 75 and 77 are situated along the sidewalls of polysilicon emitter portion 73. Finally, metal silicide layers, indicated in slanted-line shading but (to avoid further illustration complexity) lacking reference notation, are situated along the tops of base contact portion 41C, collector contact portion 43C, polysilicon emitter portion 73, S/D zones 34W, 36W, 44W, and 46W, and gate electrodes 42 and 52.

The BJT/CIGFET structure of FIG. 4 provides considerably better operating characteristics for transistors 20W, 22W, and 33W in exchange for additional processing complexity. Of note, n+ monosilicon emitter portion 39 is formed by dopant outdiffusion from polysilicon emitter portion 73 subsequent to performing a masking/etching operation to create the emitter access opening through insulating layer 71 and forming polysilicon emitter portion 73. After forming emitter-adjoining sidewall spacers 75 and 77, base contact portion 41C is created with the same steps as S/D zones 44 and 46 of p-channel IGFET 22W. In particular, a masking/doping operation is performed utilizing emitter-contact spacer 75 as part of the overall mask. Base-link length $L_{BL}$, again the distance between monosilicon emitter portion 39 and base contact portion 41C, is therefore defined here by the combination of (a) the lateral thickness of emitter-contact spacer 75 and the closest edge of the opening in the photoresist mask used in forming the emitter access opening through insulating layer 71.

Base-link length $L_{BL}$ needs to be well controlled. The emitter-base junction of a BJT can break down prematurely during transistor operation if base-link length $L_{BL}$ is too small. Since base-link length $L_{BL}$ in the BJT/CIGFET structures of FIGS. 2 and 3 is defined by photoresist masks which are non-critically used in forming S/D zones 34, 36, 44, and 46, the ability to control base-link length $L_{BL}$ is dependent on the lithographic alignment capability of photoresist masks that are non-critical from a CIGFET aspect. This raises a significant reliability concern. While this reliability concern is somewhat alleviated in fabricating the BJT/CIGFET structure of FIG. 4, the BJT/CIGFET structure of FIG. 4 is considerably more specialized than those of FIGS. 2 and 3.

It would be desirable to have a semiconductor technology that includes a technique for precisely controlling base-link length $L_{BL}$ in a manner independent of lithographic masking capability differences between IGFETs and BJTs. In particular, the technique for controlling base-link length $L_{BL}$ should be critical in the fabrication of both IGFETs and BJTs. It would also be desirable for the semiconductor technology to provide transistors with good analog characteristics as well as transistors for high-performance digital applications.

GENERAL DISCLOSURE OF THE INVENTION

The present invention provides such a semiconductor technology. More particularly, a semiconductor structure configured in accordance with the invention contains a bipolar junction transistor having a base of a first conductivity type and an emitter and collector of a second conductivity type opposite to the first conductivity type. The base, emitter, and collector constitute respective zones of a semiconductor body having an upper surface.

The base includes an intrinsic base portion, a base contact portion, and a base link portion. The intrinsic base portion is situated below the emitter and above material of the collector. The base contact portion extends to the upper semiconductor surface. The base link portion extends between the intrinsic base and base contact portions. The emitter and collector are separated from each other by the base zone so as to form respective primary pn junctions with the base. The emitter extends to the upper semiconductor surface and is laterally separated from the base contact portion by the base link portion.

The present semiconductor structure further contains a spacing structure formed with an isolating dielectric layer and a spacing component that defines the length $L_{BL}$ of the base link portion. The dielectric layer is situated along the upper semiconductor surface. A lateral spacing portion of non-monocrystalline semiconductor material of the spacing component is situated over the dielectric layer above the base link portion.

The base link portion has opposite first and second upper edges whose separation constitutes base-link length $L_{BL}$. The first and second upper edges of the base link portion laterally conform to respective opposite first and second lower edges of the lateral spacing portion. In this way, the lateral spacing portion of non-monocrystalline semiconductor material, typically polycrystalline semiconductor material, controls base-link length $L_{BL}$. A change in the dimension of the lateral spacing portion in the direction of base-link length $L_{BL}$ thereby leads to a corresponding, typically largely equal, change in base-link length $L_{BL}$.

In fabricating the present semiconductor structure according to the invention so as to control base-link length $L_{BL}$, first semiconductor dopant of a first conductivity type is introduced into material of the semiconductor body intended to be the base link and intrinsic base portions of the base. First semiconductor dopant of a second conductivity type opposite to the first conductivity type is introduced into material of the semiconductor body intended to be at least part of the collector. The semiconductor body is then provided with the spacing structure constituted with the isolating dielectric layer and the spacing component, including the lateral spacing portion of non-monocrystalline semiconductor material.

Second semiconductor dopant of the first conductivity type is subsequently introduced into the semiconductor body to define the base contact portion using the lateral spacing portion and any material along its sides as a dopant-blocking shield. Second semiconductor dopant of the second conductivity type is similarly introduced into the semiconductor body to define the emitter likewise using the lateral spacing portion and any material along its sides as a dopant-blocking shield. Because each of these dopant-blocking shields includes the lateral spacing portion, the first and second upper edges of the base link portion laterally conform to the first and second lower edges of the lateral spacing portion. As a result, the lateral spacing portion of non-monocrystalline semiconductor material, typically polycrystalline semiconductor material at the end of transistor fabrication, controls base-link length $L_{BL}$.

The spacing component typically includes first and second dielectric spacers situated respectively along opposite first and second sides of the lateral spacing portion in such a manner that the first and second sides of the lateral spacing portion respectively include its first and second lower edges. The dopant-blocking shield used during the doping of the base contact portion with the second dopant of the first conductivity type then includes the dielectric spacers. The dopant-blocking shield used during the doping of the emitter with the second dopant of the second conductivity type similarly includes the dielectric spacers. Consequently, the first and second dielectric spacers are typically situated respectively above the first and second upper edges of the base link portion. When the dielectric spacers are present in the spacing component, base-link length $L_{BL}$ is determined by the total composite dimension of the lateral spacing portion and the dielectric spacers in the direction of base-link length $L_{BL}$ along the upper semiconductor surface.

The semiconductor structure of the invention normally includes a primary IGFET for which the semiconductor body has body material of the first conductivity type. The IGFET has a channel zone of the body material, a pair of source/drain (again "S/D") zones of the second conductivity type, a gate dielectric layer overlying the channel zone, and a gate electrode overlying the gate dielectric layer above the channel zone. The S/D zones are situated in the semiconductor body along the upper semiconductor surface and are laterally separated by the channel zone. During the doping of the emitter of the BJT, the second dopant of the second conductivity type used for the emitter is also preferably introduced into the semiconductor body to at least partially define the S/D zones. The gate electrode contains doped non-monocrystalline semiconductor material.

A further IGFET complementary to the primary IGFET is normally incorporated into the present semiconductor structure to convert it into a BJT/CIGFET structure. For this purpose, the semiconductor body has body material of the second conductivity type. The further IGFET has a channel zone of the body material of the second conductivity type, a pair of S/D zones of the first conductivity type, a gate dielectric layer overlying the channel zone, and a gate electrode overlying the gate dielectric layer above the channel zone. The S/D zones of the further IGFET are situated in the semiconductor body along the upper semiconductor surface and are laterally separated by the channel zone. During the doping of the base contact portion of the BJT, the second dopant of the first conductivity type used for the base contact portion is also preferably introduced into the semiconductor body to at least partially define the S/D zones of the further IGFET. The gate electrode of the further IGFET contains doped non-monocrystalline semiconductor material.

The lateral spacing portion of the BJT and the gate electrodes of the complementary IGFETs are normally defined by a procedure in which the semiconductor body is first provided with a surface dielectric layer that includes material of the insulating and gate dielectric layers. A layer of non-monocrystalline semiconductor material is deposited on the surface dielectric layer. The layer of non-monocrystalline semiconductor material is then patterned to define the lateral spacing portion and the gate electrodes. The patterning of the non-monocrystalline semiconductor layer typically entails forming a photoresist mask on the layer and removing non-monocrystalline semiconductor material exposed through openings in the mask.

The procedure for defining the lateral spacing portion and the gate electrodes is economical because the non-monocrystalline semiconductor layer employed for the gate electrodes is also utilized for the lateral spacing portion that controls base-link length $L_{BL}$. There is no need for an extra operation to form the lateral spacing portion. In addition, the thickness of the gate electrodes produced from the non-monocrystalline semiconductor layer is sufficiently great to prevent any significant amount of semiconductor dopant from passing, e.g., by ion implantation, through the gate electrodes into the underlying material of the semiconductor body. Consequently, the thickness of the lateral spacing portion is inherently thick enough to prevent any significant amount of semiconductor dopant from passing through the lateral spacing portion and damaging the underlying base link portion.

The lateral shapes of the gate electrodes, particularly their lengths, generally need to be controlled well for the IGFETs to operate properly. Inasmuch as the lateral shapes of the gate electrodes are defined by the patterning of the non-monocrystalline semiconductor layer, the patterning operation, specifically the formation of the photoresist mask, is invariably done in a critical manner according to tight alignment tolerances. Because the lateral shape of the lateral spacing portion that controls base-link length $L_{BL}$ for the BJT is also defined by the critically controlled patterning of the non-monocrystalline semiconductor layer, base-link length $L_{BL}$ is inherently controlled tightly without imposing any further control requirement on the transistor fabrication process. The repeatability of the BJT characteristics from fabrication lot to fabrication lot is significantly enhanced.

Additionally, the tighter control of base-link length $L_{BL}$ enables the base resistance of the BJT to be reduced. This further improves the BJT operating characteristics.

Each of the S/D zones of each of the complementary IGFETs normally includes a main portion and a more lightly doped lateral extension. The lateral extensions of the S/D zones of each IGFET terminate its channel zone below its gate dielectric layer, i.e., along the upper semiconductor surface. Also, a pair of dielectric sidewall spacers are normally situated respectively along the transverse sides of the gate electrode of each IGFET.

Formation of the complementary IGFETs in the preceding manner entails performing two doping operations prior to the doping operations with the second dopants of the first and second conductivity types. Firstly, additional semiconductor dopant of the second conductivity type is introduced into at least a pair of portions of the semiconductor body intended for the lateral extensions of the S/D zones of the primary IGFET using its gate electrode and any material along the electrode's sides as a dopant-blocking shield. Secondly, additional semiconductor dopant of the first conductivity type is similarly introduced into at least a pair of portions of the semiconductor body intended for the lateral extensions of the S/D zones of the further IGFET using its gate electrode and any material along the electrode's sides as a dopant-blocking shield.

The dielectric spacers, i.e., the gate sidewall spacers and the spacers along the sides of the lateral spacing portion, are then formed. The main portions of the S/D zones of the primary IGFET are subsequently defined by the doping operation with the second dopant of the second conductivity type using the gate electrode of the primary IGFET and its sidewall spacers as a dopant-blocking shield. The main portions of the S/D zones of the further IGFET are similarly defined by the doping operation with the second dopant of the first conductivity type using the gate electrode of the further IGFET and its sidewall spacers as a dopant-blocking shield. As mentioned above, the base contact portion and the emitter of the BJT are respectively defined by the doping operations with the first and second dopants of the second conductivity type. The formation of the emitter and the base contact portion is thus achieved without any extra fabrication processing beyond that needed for the two IGFETs.

The body material of the second conductivity type normally includes a well region for the further IGFET. In performing the collector doping for the BJT, the first dopant of the second conductivity type used for the collector is also introduced into material of the semiconductor body intended for the well region.

The net result of all the operations used in creating the BJT and the complementary IGFETs is that the BJT formation normally requires only one extra operation, namely the doping with the first dopant of the first conductivity type for the intrinsic base and base link portions, beyond the operations needed for the IGFETs. The present invention thus enables the BJT to be formed very economically with its base-link length $L_{BL}$ controlled so that the BJT performs well.

The BJT can be modified to perform even better at the expense of another extra doping operation. With a main collector portion of the collector being defined at least partially by the first dopant of the second conductivity type, this modification can be implemented in various ways. In one implementation, the second extra doping operation entails introducing additional semiconductor dopant of the second conductivity type into the semiconductor body to define a deep collector layer which underlies, and is more heavily doped than, the main collector portion.

The present semiconductor structure typically includes a further BJT complementary to the primary BJT. The further BJT is configured essentially the same as the primary BJT with the conductivity types reversed. Base-link length $L_{BL}$ of the further BJT is thus controlled with another lateral spacing portion of non-monocrystalline semiconductor material. The further BJT is created in essentially the same way as the primary BJT using respectively corresponding doping operations with the conductivity types of the semiconductor dopants reversed.

With both complementary IGFETs present in the semiconductor structure so that it is a complementary-BJT/complementary-IGFET ("CBJT/CIGFET") structure, the doping operations for the IGFETs are variously used for the further BJT in a manner complementary to how the IGFET doping operations are variously used for the primary BJT. Accordingly, the formation of the further BJT normally requires only one extra operation, namely doping with additional dopant of the second conductivity type for the further BJT's intrinsic base and base link portions, beyond the operations needed for the IGFETs. Since the formation of the primary BJT also normally requires one extra doping operation, the complementary BJTs are normally provided with well-controlled base-link lengths $L_{BL}$ at the small expense of two extra doping operations.

The further BJT can be modified in the same manner as the primary BJT to perform even better at the expense of a further extra doping operation. With a main collector portion of the further collector being defined at least partially by semiconductor dopant of the first conductivity type, this additional modification can be implemented in various ways. In one implementation, the further extra doping operation entails introducing additional semiconductor dopant of the first conductivity type into the semiconductor body to define a further deep collector layer which underlies, and is more heavily doped than, the main collector portion of the further collector. A total of only four extra doping operations needed to form this pair of enhanced complementary BJTs in the course of forming the complementary IGFETs.

In short, the present invention furnishes BJTs with well-controlled base-link length $L_{BL}$. The lot-to-lot repeatability of the BJT characteristics is significantly enhanced. The stronger control of base-link length $L_{BL}$ enables the base resistance to be significantly reduced. The fabrication of the BJT can be integrated into the fabrication of complementary IGFETs with little extra processing operations. The BJTs are fabricated very economically. The invention thereby provides a significant advance over the prior art.

BRIEF DESCRIPTION OF THE DRAWINGS

FIGS. 5.0-5.9 are respective front cross-sectional views of ten portions of a CBJT/CIGFET semiconductor structure configured according to the invention.

FIGS. 18a-18c, 18d.0-18w.0, 18d.1-18w.1, 18d.2-18w.2, and 18d.3-18w.3 are front cross-sectional views representing steps in manufacturing the four portions illustrated in FIGS. 5.0-5.3 of the CBJT/CIGFET semiconductor structure of FIGS. 5.0-5.9 in accordance with the invention. The steps of FIGS. 18a-18c apply to the structural portions illustrated in all of FIGS. 5.0-5.3. FIGS. 18d.0-18w.0 present further steps leading to the structural portion of FIG. 5.0. FIGS. 18d.1-18w.1 present further steps leading to the structural portion of FIG. 5.1. FIGS. 18d.2-18w.2 present further steps leading to the structural portion of FIG. 5.2. FIGS. 18d.3-18w.3 present further steps leading to the structural portion of FIG. 5.3.

Figure 1:
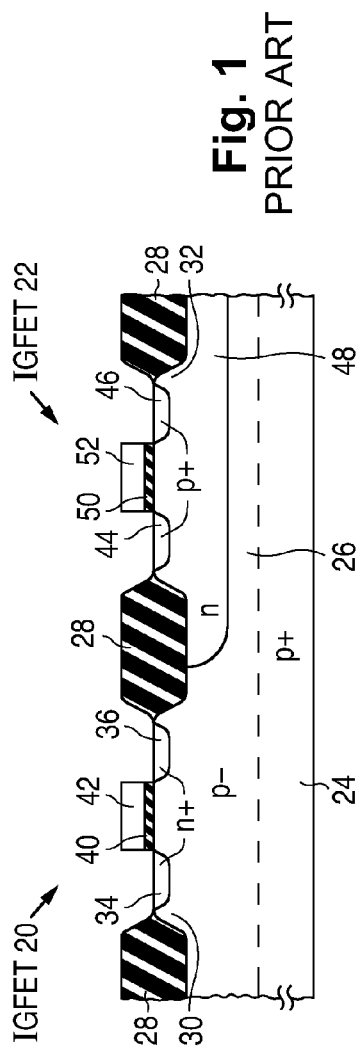
FIG. 1 is a front cross-sectional view of a prior art CIGFET structure.
Figure 2:
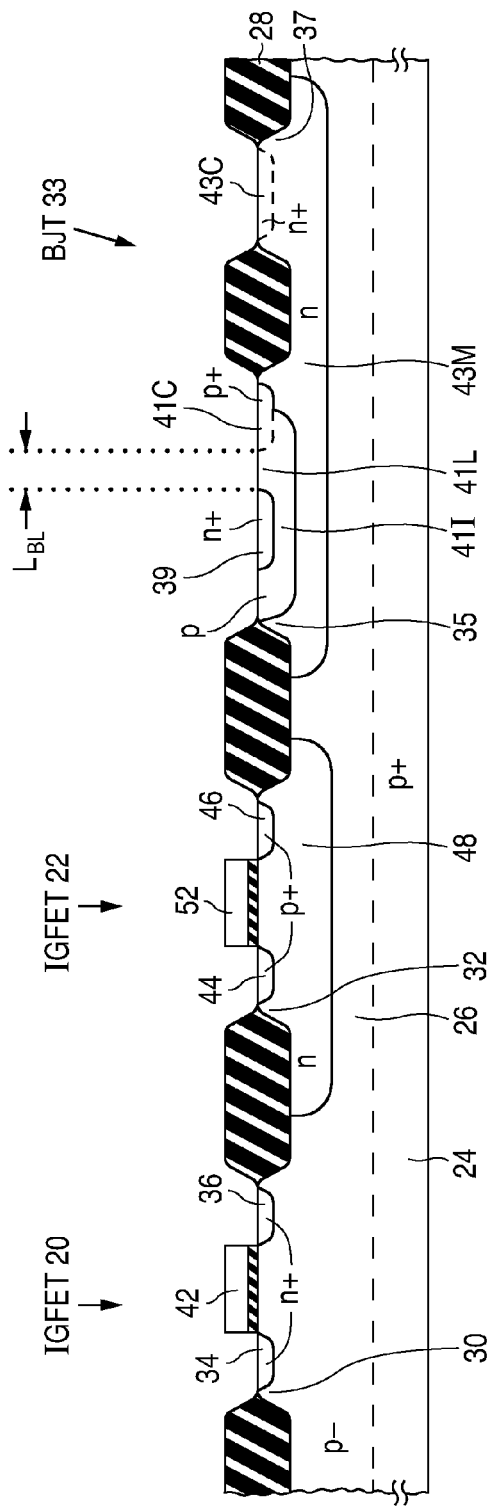
FIGS. 2-4 are respective front cross-sectional views of three prior art BJT/CIGFET semiconductor structures.
Figure 3:
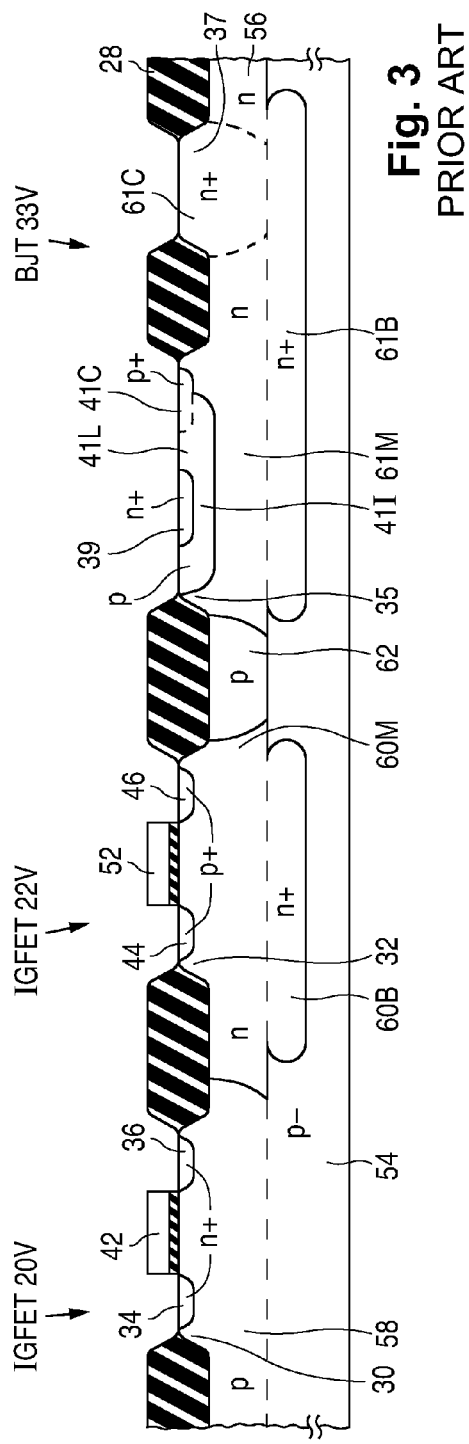
Figure 4:
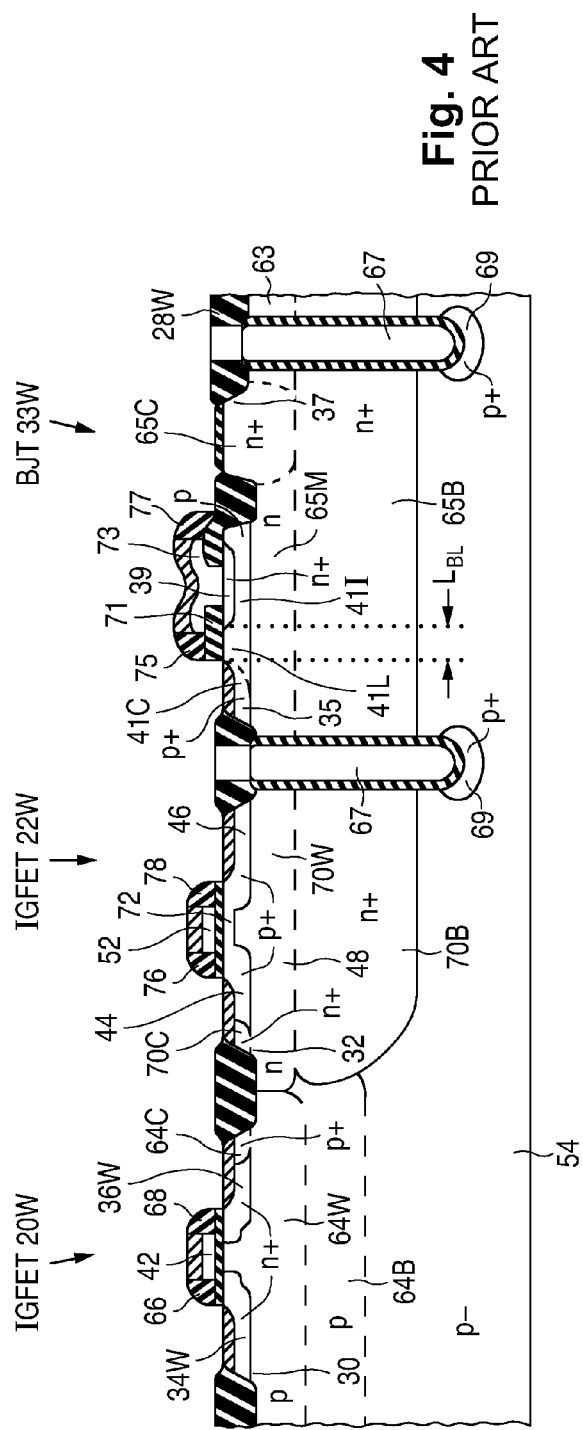

Like reference symbols are employed in the drawings and in the description of the preferred embodiment to represent the same, or very similar, item or items. The letter "P" at the end of a reference symbol in a drawing representing a step in a fabrication process indicates a precursor to a region which is shown in a drawing representing a later stage, including the end, of the fabrication process and which is identified in that later-stage drawing by the portion of the reference symbol preceding "P".

In instances where the conductivity type of a semiconductor region is determined by semiconductor dopant introduced into the region at a single set of dopant-introduction conditions, i.e., in essentially a single doping operation, and in which the concentration of the dopant varies from one general doping level, e.g., moderate indicated by "p" or "n", to another general dopant level, e.g., light indicated by "p–" or "n–", across the region, the portions of the region at the two doping levels are generally indicated by a dotted line. Dot-and-dash lines in cross-sectional views of IGFETs represent locations for dopant distributions in the vertical dopant-distribution graphs. Maximum dopant concentrations in cross-sectional views of IGFETs are indicated by dash- and double-dot lines containing the abbreviation "MAX".

The thicknesses of dielectric layers, especially isolation and gate dielectric layers, are much less than the dimensions of many other BJT/IGFET elements and regions. To clearly indicate dielectric layers, their thicknesses are generally exaggerated in the cross-sectional views of the BJTs and IGFETs.

The gate electrodes of the symmetric IGFETs shown in FIGS. 5.3-5.9 are, for convenience, all illustrated as being of the same length even though, as indicated by the channel-length values given below, the IGFETs of FIGS. 5.4, 5.5, and 5.7-5.9 are typically of considerably greater channel length than the IGFETs of FIGS. 5.3 and 5.6.

DESCRIPTION OF THE PREFERRED EMBODIMENTS

List of Contents

A. Reference Notation and Other Preliminary Information
B. Complementary-BJT/Complementary-IGFET Structures Suitable for Mixed-signal Applications
C. Well Architecture and Doping Characteristics
D. Bipolar Junction Transistors
D1. Structure of Npn Transistor
D2. Control of Base-link Length in Npn Transistor
D3. Pnp Transistor
D4. BJT Variations
E. Asymmetric High-voltage IGFETs
E1. Structure of Asymmetric High-voltage N-channel IGFET
E2. Source/Drain Extensions of Asymmetric High-voltage N-channel IGFET
E3. Structure of Asymmetric High-voltage P-channel IGFET
E4. Source/Drain Extensions of Asymmetric High-voltage P-channel IGFET
F. Extended-drain IGFETs
F1. Structure of Extended-drain N-channel IGFET
F2. Operational Physics of Extended-drain N-channel IGFET
F3. Structure of Extended-drain P-channel IGFET
F4. Operational Physics of Extended-drain P-channel IGFET
G. Symmetric Low-voltage Low-leakage IGFETs
H. Symmetric Low-voltage Low-threshold-voltage IGFETs
I. Symmetric High-voltage IGFETs of Nominal Threshold-voltage Magnitude
J. Symmetric Low-voltage IGFETs of Nominal Threshold-voltage Magnitude
K. Symmetric High-voltage Low-threshold-voltage IGFETs
L. Symmetric Native Low-voltage N-channel IGFETs
M. Symmetric Native High-voltage N-channel IGFETs
N. Dopant Distributions in Symmetric IGFETs
O. Information Generally Applicable to All of BJTs and Present IGFETs
P. Fabrication of Complementary-BJT/Complementary-IGFET Semiconductor Structure
P1. General Fabrication Information
P2. Well Formation
P3. Base Formation
P4. Formation of Lateral Spacing Portions and Gate Electrodes
P5. Formation of Source/Drain Extensions and Halo Pocket Portions
P6. Formation of Spacers, Emitters, Contact Portions, and Main Source/Drain Portions
P7. Final Processing
P8. Formation of BJT Variations
Q. Other Variations A. Reference Notation and Other Preliminary Information The reference symbols employed below and in the drawings have the following meanings:

$d_a$=lateral distance from emitter-side upper transverse edge of base link portion to emitter-side lower transverse edge of lateral spacing portion in the direction of the base-link length $d_b$=lateral distance from base-contact-side upper transverse edge of base link portion to base-contact-side lower transverse edge of lateral spacing portion in the direction of the base-link length $d_{LS}$=lateral distance between lower transverse edges of lateral spacing portion in the direction of the base-link length $d_{SB}$=dimension of base-contact-side isolating dielectric spacer along the upper semiconductor surface in the direction of base-link length $d_{SE}$=dimension of emitter-side isolating dielectric spacer along the upper semiconductor surface in the direction of base-link length L=channel length along upper semiconductor surface $L_{BL}$=length of base link portion of base of BJT along upper semiconductor surface
$L_{DR}$=drawn value of channel length as given by drawn value of gate length
$L_{WW}$=well-to-well separation distance for extended-drain IGFET
N'=dosage of ions received by ion-implanted material
N'$_{max}$=maximum dosage of ions received by ion-implanted material in approximate one-quadrant implantation
N'$_1$=minimum dosage of ions received by ion-implanted material in one-quadrant implantation
$t_{GdH}$=high value of average gate dielectric thickness
$t_{GdL}$=low value of average gate dielectric thickness
$t_{Sd}$=average thickness of surface dielectric layer
$V_{BD}$=breakdown voltage
$V_{BE}$=base-to-emitter voltage
$V_{BE0}$=threshold value of base-to-emitter voltage
$V_{DS}$=drain-to-source voltage
$V_{GS}$=gate-to-source voltage
$V_T$=threshold voltage
$x_{DEOL}$=amount by which by which gate electrode overlaps drain extension
$x_{SEOL}$=amount by which by which gate electrode overlaps source extension
y=depth or vertical distance
$y_D$=maximum depth of drain
$y_{DE}$=maximum depth of drain extension
$y_{DEPK}$=average depth at location, in lateral drain extension, of maximum (peak) concentration of semiconductor dopant of same conductivity type as lateral drain extension
$y_{DM}$=maximum depth of main drain portion
$y_{DNWPK}$=average depth at location of maximum (peak) concentration of deep n well semiconductor dopant
$y_{NWPK}$=average depth at location of maximum (peak) concentration of n-type empty main well semiconductor dopant
$y_{PWPK}$=average depth at location of maximum (peak) concentration of p-type empty main well semiconductor dopant
$y_S$=maximum depth of source
$y_{SD}$=maximum depth of source/drain zone
$y_{SE}$=maximum depth of source extension
$y_{SEPK}$=average depth at location, in lateral source extension, of maximum (peak) concentration of semiconductor dopant of same conductivity type as lateral source extension
$y_{SM}$=maximum depth of main source portion
α=tilt angle from vertical for ion implanting semiconductor dopant
β=azimuthal angle relative to one principal lateral direction of semiconductor body
$β_0$=base value of azimuthal angle increased in three 90° increments As used below, the term "surface-adjoining" means adjoining (or extending to) the upper semiconductor surface, i.e., the upper surface of a semiconductor body consisting of monocrystalline, or largely monocrystalline, semiconductor material. All references to depths into doped monocrystalline semiconductor material mean depths below the upper semiconductor surface except as otherwise indicated. Similarly, all references to one item extending deeper into monocrystalline semiconductor material than another item mean deeper in relation to the upper semiconductor surface except as otherwise indicated. Each depth or average depth of a doped monocrystalline region of a BJT or IGFET is, except as otherwise indicated, measured from a plane extending generally through the bottom of the BJT's isolation dielectric layer or the IGFET's gate dielectric layer.

The boundary between two contiguous (or continuous) semiconductor regions of the same conductivity type is somewhat imprecise. Dashed lines are generally used in the drawings to indicate such boundaries. For quantitative purposes, the boundary between a semiconductor substrate region at the background dopant concentration and an adjoining semiconductor region formed by a doping operation to be of the same conductivity type as the substrate region is considered to be the location where the total dopant concentration is twice the background dopant concentration. The boundary between two contiguous semiconductor regions formed by doping operations to be of the same conductivity type is similarly considered to be the location where the total concentrations of the dopants used to form the two regions are equal.

Except as otherwise indicated, each reference to a semiconductor dopant or impurity means a p-type semiconductor dopant (formed with acceptor atoms) or an n-type semiconductor dopant (formed with donor atoms). The "atomic species" of a semiconductor dopant means the element which forms the dopant. In some case, a semiconductor dopant may consist of two or more different atomic species.

In regard to ion implantation of semiconductor dopant, the "dopant-containing particle species" means the particle (atom or molecule) which contain the dopant to be implanted and which is directed by the ion implantation equipment toward the implantation site. For example, elemental boron or boron difluoride can serve as the dopant-containing particle species for ion implanting the p-type dopant boron. The "particle ionization charge state" means the charge state, i.e., singly ionized, doubly ionized, and so on, of the dopant-containing particle species during the ion implantation.

The channel length L of an IGFET is the minimum distance between the IGFET's source/drain zones along the upper semiconductor surface. The drawn channel length $L_{DR}$ of an IGFET here is the drawn value of the IGFET's gate length. Inasmuch as the IGFET's source/drain zones invariably extend below the IGFET's gate electrode, the IGFET's channel length L is less than the IGFET's drawn channel $L_{DR}$.

An IGFET is characterized by two orthogonal lateral (horizontal) directions, i.e., two directions extending perpendicular to each other in a plane extending generally parallel to the upper (or lower) semiconductor surface. These two lateral directions are referred to here as the longitudinal and transverse directions. The longitudinal direction is the direction of the length of the IGFET, i.e., the direction from either of its S/D zones to the other of its S/D zones. The transverse direction is the direction of the IGFET's width.

The semiconductor body containing the IGFETs has two principal orthogonal lateral (horizontal) directions, i.e., two directions extending perpendicular to each other in a plane extending generally parallel to the upper (or lower) semiconductor surface. The IGFETs in an implementation of any of the present CBJT/CIGFET structures are normally laid out on the semiconductor body so that the longitudinal direction of each IGFET extends in one of the semiconductor body's principal lateral directions. For instance, the longitudinal directions of some of the IGFETs can extend in one of the semiconductor body's principal lateral directions while the longitudinal directions of the other IGFETs extend in the other of the semiconductor body's principal lateral directions.

An IGFET is described below as symmetric when it is configured in largely a mirror-image manner along both of its source/drain zones and into the intervening channel zone. For instance, an IGFET having a separate halo pocket portion along each source/drain zone is typically described here as symmetric provided that the source/drain zones are, except possibly for their lengths, largely mirror images of each other. However, due to factors such as partial shadowing during ion implantation into the location of one of the halo pockets, the dopant profiles in the halo pockets along the upper semiconductor surface may not largely be mirror images. In such cases, there is typically some asymmetry in the IGFET's actual structure even though the IGFET is described as a symmetric device.

An IGFET, whether symmetric or asymmetric, has two biased states (or conditions) referred to as the "biased-on" and "biased-off" states in which a driving potential (voltage) is present between the S/D zone acting as the source and the S/D zone acting as the drain. For simplicity in explaining the two biased states, the source-acting and drain-acting S/D zones are respectively referred to here as the source and drain. In the biased-on state, the IGFET is conductive with voltage $V_{GS}$ between the IGFET's gate electrode and source at such a value that charge carriers flow freely from the source through the channel to the drain under the influence of the driving voltage. The charge carriers are electrons when the IGFET is of n-channel type and holes when the IGFET is of p-channel type.

The IGFET is non-conductive in the biased-off with gate-to-source voltage $V_{GS}$ at such a value that charge carriers do not significantly flow from the source through the channel to the drain despite the presence of the driving potential between the source and the drain as long as the magnitude (absolute value) of the driving potential is not high enough to cause IGFET breakdown. The charge carriers again are electrons for an n-channel IGFET and holes for a p-channel IGFET. In the biased-off state, the source and drain are thus biased so that the charge carriers would flow freely from the source through the channel to the drain if gate-to-source voltage $V_{GS}$ were at such a value as to place the IGFET in the biased-on state.

More specifically, an n-channel IGFET is in the biased-on state when (a) its drain is at a suitable positive potential relative to its source and (b) its gate-to-source voltage $V_{GS}$ equals or exceeds its threshold voltage $V_T$. Electrons then flow from the source through the channel to the drain. Since electrons are negative charge carriers, positive current flow is from the drain to the source. An n-channel IGFET is in the biased-off state when its drain is at a positive driving potential relative to its source but its gate-to-source voltage $V_{GS}$ is less than its threshold voltage $V_T$ so that there is no significant electron flow from the source through the channel to the drain as long as the positive driving potential is not high enough to cause drain-to-source breakdown. Threshold voltage $V_T$ is generally positive for an enhancement-mode n-channel IGFET and negative for a depletion-mode n-channel IGFET.

In a complementary manner, a p-channel IGFET is in the biased-on state when (a) its drain is at a suitable negative potential relative to its source and (b) its gate-to-source voltage $V_{GS}$ is less than or equals its threshold voltage $V_T$. Holes flow from the source through the channel to the drain. Inasmuch as holes are positive charge carriers, positive current flow is from the source to the drain. A p-channel IGFET is in the biased-off state when its drain is at a negative potential relative to its source but its gate-to-source voltage $V_{GS}$ is greater than its threshold voltage $V_T$ so that there is no significant flow of holes from the source through the channel to the drain as long as the magnitude of the negative driving potential is not high enough to cause drain-to-source breakdown. Threshold voltage $V_T$ is generally negative for an enhancement-mode p-channel IGFET and positive for a depletion-mode p-channel IGFET.

Charge carriers in semiconductor material generally mean both electrons and holes. References to charge carriers traveling in the direction of the local electric field mean that holes travel generally in the direction of the local electric field vector and that electrons travel in the opposite direction to the local electric field vector.

The expressions "maximum concentration" and "concentration maximum", as used here in singular or plural form, are generally interchangeable, i.e., have the same meaning except as otherwise indicated.

The semiconductor dopant which determines the conductivity type of the body material of an IGFET is conveniently denominated as the body-material dopant. When the IGFET employs a well region, the body-material dopant includes the semiconductor well dopant or dopants. The vertical dopant profile below a S/D zone of an IGFET is referred to as "hypoabrupt" when the concentration of the body-material dopant reaches a subsurface maximum along an underlying body-material location no more than 10 times deeper below the upper semiconductor surface than that S/D zone and decreases by at least a factor of 10 in moving from the subsurface location of the maximum concentration of the body-material dopant upward to that S/D zone, i.e., to the pn junction for that S/D zone, along an imaginary vertical line extending from the subsurface location of the maximum concentration of the body-material dopant through that S/D zone. See any of U.S. Pat. No. 7,419,863 B1 and U.S. Patent Publications 20080311717 and 20080308878 (all Bulucea). The pn junction for an S/D zone having an underlying hypoabrupt vertical dopant profile is, for simplicity, sometimes termed a hypoabrupt junction.

In a complementary manner, the vertical dopant profile below a S/D zone of an IGFET is referred to as "non-hypoabrupt" when the concentration of the body-material dopant reaches a subsurface maximum along an underlying body-material location no more than 10 times deeper below the upper semiconductor surface than that S/D zone but decreases by less than a factor of 10 in moving from the subsurface location of the maximum concentration of the body-material dopant upward to the pn junction for that S/D zone along an imaginary vertical line extending from the subsurface location of the maximum concentration of the body-material dopant through that S/D zone. The pn junction for an S/D zone having an underlying non-hypoabrupt vertical dopant profile is, for simplicity, sometimes referred to as a non-hypoabrupt junction.

B. Complementary-BJT/Complementary-IGFET Structures Suitable for Mixed-Signal Applications FIGS. 5.0-5.9 (collectively "FIG. 5") illustrate ten portions of a complementary-BJT/complementary-IGFET ("CBJT/CIGFET") semiconductor structure configured according to the invention so as to be especially suitable for mixed-signal applications. The transistors in the CBJT/CIGFET structure of FIG. 5 are designed to operate in three different voltage regimes. The BJTs and some of the IGFETs operate across a voltage range of several volts, e.g., a nominal operational range of 3.0 V. The IGFETs operating across the several-volt range are often referred to here as "high-voltage" IGFETs. Other IGFETs operate across a lower voltage range, e.g., a nominal operational range of 1.2 V, and are analogously often referred to here as "low-voltage" IGFETs. The remaining IGFETs operate across a greater voltage range than the high-voltage and low-voltage IGFETs, and are generally referred to here as "extended-voltage" IGFETs. The operational range for the extended-voltage IGFETs is normally at least 10 V, e.g., nominally 12 V.

The IGFETs in FIG. 5 use gate dielectric layers of two different average nominal thicknesses, a high value $t_{GdH}$ and a low value $t_{GdL}$. The gate dielectric thickness for each of the high-voltage and extended-voltage IGFETs is high value $t_{GdH}$. For 3.0-V operation, high gate dielectric thickness $t_{GdH}$ is 4-8 nm, preferably 5-7 nm, typically 6-6.5 nm, when the gate dielectric material is silicon oxide or largely silicon oxide. The gate dielectric thickness for each of the low-voltage IGFETs is low value $t_{GdL}$. For 1.2-V operation, low gate dielectric thickness $t_{GdL}$ is 1-3 nm, preferably 1.5-2.5 nm, typically 2 nm, likewise when the gate dielectric material is silicon oxide or largely silicon oxide. All of the typical numerical values given below for the parameters of the IGFETs of FIG. 5 generally apply to an implementation of the present CBJT/CIGFET semiconductor structure in which the gate dielectric layers have the preceding typical thickness values.

The BJTs in FIG. 5 use isolating dielectric layers formed with the same steps as the thicker gate dielectric layers so as to be of high thickness value $t_{GdH}$ and to consist of the same material, normally silicon oxide or largely silicon oxide, as the thicker gate dielectric layers.

BJTs appear in FIG. 5.0 while IGFETs appear in the remainder of FIG. 5. The BJTs in FIG. 5.0 consist of a vertical npn BJT 101 and a vertical pnp BJT 103. The IGFETs in FIGS. 5.1 and 5.2 are asymmetric devices. The IGFETs in FIGS. 5.3-5.9 are symmetric devices.

More particularly, FIG. 5.1 depicts an asymmetric high-voltage n-channel IGFET 100 and a similarly configured asymmetric high-voltage p-channel IGFET 102. Asymmetric IGFETs 100 and 102 are designed for unidirectional-current applications. An asymmetric extended-drain n-channel IGFET 104 and a similarly configured asymmetric extended-drain p-channel IGFET 106 are pictured in FIG. 5.2. Extended-drain IGFETs 104 and 106 constitute extended-voltage devices especially suitable for applications, such as power devices, high-voltage switches, electrically erasable programmable read-only memory ("EEPROM") programming circuitry, and electrostatic discharge ("ESD") protection devices, which utilize voltages greater than several volts. Due to its asymmetry, each IGFET 100, 102, 104, or 106 is normally used in situations where its channel-zone current flow is always in the same direction.

Moving to the symmetric IGFETs, FIG. 5.3 depicts a symmetric low-voltage low-leakage n-channel IGFET 108 and a similarly configured symmetric low-voltage low-leakage p-channel IGFET 110. The term "low-leakage" here means that IGFETs 108 and 110 are designed to have very low current leakage. A symmetric low-voltage n-channel IGFET 112 of low threshold-voltage magnitude and a similarly configured symmetric low-voltage p-channel IGFET 114 of low threshold-voltage magnitude are pictured in FIG. 5.4. Inasmuch as $V_T$ serves here as the symbol for threshold voltage, IGFETs 112 and 114 are often referred to as low-$V_T$ devices.

FIG. 5.5 depicts a symmetric high-voltage n-channel IGFET 116 of nominal $V_T$ magnitude and a similarly configured symmetric high-voltage p-channel IGFET 118 of nominal $V_T$ magnitude. A symmetric low-voltage n-channel IGFET 120 of nominal $V_T$ magnitude and a similarly configured symmetric low-voltage p-channel IGFET 122 of nominal $V_T$ magnitude are pictured in FIG. 5.6. FIG. 5.7 depicts a symmetric high-voltage low-$V_T$ n-channel IGFET 124 and a similarly configured symmetric high-voltage low-$V_T$ p-channel IGFET 126.

As described further below, BJTs 101 and 103, asymmetric IGFETs 100 and 102, and symmetric IGFETs 108, 110, 112, 114, 116, 118, 120, 122, 124, and 126 all variously use p-type and n-type wells. Some of the regions of extended-drain IGFETs 104 and 106 are defined by the dopant introductions used to form the p-type and n-type wells. Consequently, extended-drain IGFETs 104 and 106 effectively use p-type and n-type wells.

FIG. 5.8 depicts a pair of symmetric native low-voltage n-channel IGFETs 128 and 130. A pair of respectively corresponding symmetric native high-voltage n-channel IGFETs 132 and 134 are pictured in FIG. 5.9. The term "native" here means that n-channel IGFETs 128, 130, 132, and 134 do not use any wells. In particular, native n-channel IGFETs 128, 130, 132, and 134 are created directly from lightly doped p-type monosilicon that forms a starting region for the CBJT/CIGFET structure of FIG. 5. IGFETs 128 and 132 are nominal-$V_T$ devices. IGFETs 130 and 134 are low-$V_T$ devices.

Threshold voltage $V_T$ of each of symmetric IGFETs 112, 114, 124, and 130 can be positive or negative. Accordingly, IGFETs 112, 114, 124, and 130 can be enhancement-mode or depletion-mode devices. IGFET 112 is typically an enhancement-mode device. IGFETs 114, 124, and 130 are typically depletion-mode devices. In addition, symmetric IGFETs 126 and 134 are depletion-mode devices.

In order to reduce the number of long chains of reference symbols, the group of IGFETs 100, 102, 104, 106, 108, 110, 112, 114, 116, 118, 120, 122, 124, 126, 128, 130, 132, and 134 illustrated in FIG. 5 is often referred to collectively here as the "illustrated" IGFETs without a listing of their reference symbols. A subgroup of the illustrated IGFETs is similarly often further identified here by a term that characterizes the subgroup. For instance, symmetric IGFETs 108, 110, 112, 114, 116, 118, 120, 122, 124, 126, 128, 130, 132, and 134 are often referred to simply as the illustrated symmetric IGFETs. Components of the illustrated IGFETs are similarly often referred to here as the components of the illustrated IGFETs without a listing of the reference symbols for the components. The same procedure is employed with components of subgroups of the illustrated IGFETs.

With the foregoing identification convention in mind, the illustrated symmetric IGFETs are all suitable for digital circuitry applications. Any of the illustrated symmetric IGFETs can, as appropriate, be employed in analog circuitry applications. The different features provided by the illustrated symmetric IGFETs enable circuit designers to choose the BJTs and IGFETs that best accommodates the needs of particular circuits.

Asymmetric IGFETs 100 and 102 and the illustrated symmetric IGFETs are, for convenience, all depicted as long-channel devices. However, any of these IGFETs can be implemented in short-channel versions, especially low-leakage IGFETs 108, 110, 120, and 122. In that event, the halo pocket portions (discussed further below) of the short-channel versions of symmetric IGFET 108, 110, 120, or 122 can merge together as described in U.S. Pat. No. 6,548,842, cited above.

No particular channel-length value generally separates the short-channel and long-channel regimes of IGFET operation or generally distinguishes a short-channel IGFET from a long-channel IGFET. A short-channel IGFET, or an IGFET operating in the short-channel regime, is simply an IGFET whose characteristics are significantly affected by short-channel effects. A long-channel IGFET, or an IGFET operating in the long-channel regime, is the converse of a short-channel IGFET. While the channel length value of approximately 0.4 µm roughly constitutes the boundary between the short-channel and long-channel regimes for the background art in U.S. Pat. No. 6,548,642, the long-channel/ short-channel boundary can occur at a higher or lower value of channel length depending on various factors such as gate dielectric thickness, minimum printable feature size, channel zone dopant concentration, and source/drain-body junction depth.

Asymmetric IGFETs 100 and 102 are depicted in FIG. 5 as using a common deep n well (discussed further below) formed in a starting region of lightly doped p-type monosilicon. Alternatively, each IGFET 100 or 102 can be provided in a version that lacks a deep n well. In a preferred implementation, n-channel IGFET 100 uses a deep n well while p-channel IGFET 102 lacks a deep n well. Although none of the illustrated symmetric IGFETs is shown as using a deep n well, each of the illustrated non-native symmetric IGFETs can alternatively be provided in a version using a deep n well. When used for one of the illustrated non-native n-channel IGFETs, the deep n well electrically isolates the p-type body region of the n-channel IGFET from the underlying p-monosilicon. This enables that n-channel IGFET to be electrically isolated from each other n-channel IGFET. Extending a deep n well used for a non-native n-channel IGFET, such as IGFET 100, below an adjacent p-channel IGFET, such as IGFET 102 in the example of FIG. 5, typically enables the IGFET packing density to be increased.

The illustrated non-native IGFETs can alternatively be created from a starting region of lightly doped n-type monosilicon. In that event, the deep n wells can be replaced with corresponding deep p wells that perform the complementary functions to the deep n wells. The illustrated native n-channel IGFETs require a p-type starting monosilicon region and thus will not be present in the resulting CBJT/CIGFET structure that uses an n– starting monosilicon region. However, each of the illustrated native n-channel IGFETs can be replaced with a corresponding native p-channel IGFET formed in the n– starting monosilicon.

The CBJT/CIGFET structure of FIG. 5 may include lower-voltage versions of asymmetric high-voltage IGFETs 100 and 102 achieved primarily by suitably reducing the gate dielectric thickness and/or adjusting the doping conditions. All of the preceding comments about changing from a p– starting monosilicon region to an n– starting monosilicon region and using, or not using, deep p and n wells apply to these variations of IGFETs 100, 102, 104, and 106.

Circuit elements other than the illustrated IGFETs and the above-described variations of the illustrated IGFETs may be provided in other parts (not shown) of the CBJT/CIGFET structure of FIG. 5. For instance, diodes and various types of resistors, capacitors, and/or inductors may be provided in the present CBJT/CIGFET structure. The resistors may be mono-silicon or polysilicon elements. Depending on the characteristics of the additional circuit elements, the CBJT/CIGFET structure also contains suitable electrical isolation for the additional elements. Selected ones of the illustrated IGFETs and their above-described variations are typically present in any particular implementation of the CBJT/CIGFET structure of FIG. 5. In short, the architecture of the CBJT/CIGFET structure of FIG. 5 provides IGFETs and other circuit elements suitable for mixed-signal IC applications.

C. Well Architecture and Doping Characteristics

The monosilicon elements of BJTs 101 and 103 and the illustrated IGFETs constitute parts of a doped monosilicon semiconductor body having a lightly doped p-type substrate region 136. A patterned field region 138 of electrically insulating material, typically consisting primarily of silicon oxide, is recessed into the upper surface of the semiconductor body. Field-insulation region 138 is depicted as being of the shallow trench isolation type in FIG. 5 but can be configured in other ways.

The recession of field-insulation region 138 into the upper semiconductor surface defines a group of laterally separated active semiconductor islands. Twenty-four such active islands 135A, 135B, 137A, 137B, 140, 142, 144A, 144B, 146A, 146B, 148, 150, 152, 154, 156, 158, 160, 162, 164, 166, 168, 170, 172, and 174 appear in FIG. 5. Npn BJT 101 uses islands 135A and 135B. Pnp BJT 103 uses islands 137A and 137B.

Non-extended drain IGFETs 100, 102, 108, 110, 112, 114, 116, 118, 120, 122, 124, 126, 128, 130, 132, and 134 respectively use islands 140, 142, 148, 150, 152, 154, 156, 158, 160, 162, 164, 166, 168, 170, 172, and 174. N-channel extended-drain IGFET 104 uses islands 144A and 144B. P-channel extended-drain IGFET 106 similarly uses islands 146A and 146B. In some embodiments, two or more of the IGFETs shown in FIG. 5 and the IGFET variations described above utilize one of the active islands. This occurs, for instance, when two or more of the IGFETs share an element such as a source or drain.

The semiconductor body contains BJT well regions 175A, 175B, 177A, and 177B, IGFET main well regions 180, 182, 184A, 184B, 186A, 186B, 188, 190, 192, 194, 196, 198, 200, 202, 204, and 206, a BJT deep moderately doped n-type well region 207, IGFET deep moderately doped n-type well regions 210 and 212, and an isolating moderately doped p-type well region 216. Electrical contact to the illustrated IGFET main well regions, IGFET deep n well regions 210 and 212, and substrate region 136 is made via additional laterally separated active semiconductor islands (not shown) defined along the upper semiconductor surface by field insulation 138.

Deep n well regions 207, 210, and 212 respectively form isolating pn junctions 217, 220, and 222 with p– substrate region 136. In so doing, deep n wells 207, 210, and 212 extend deeper into the semiconductor body than the other well regions shown in FIG. 5. For this reason, well regions 175A, 175B, 177A, 177B, 180, 182, 184A, 184B, 186A, 186B, 188, 190, 192, 194, 196, 198, 200, 202, 204, 206, and 216 are sometimes referred to here as shallow wells.

BJT shallow well regions 175A and 175B are moderately doped n-type wells that merge into each other to form part of npn BJT 101. BJT shallow well regions 177A and 177B are moderately doped p-type wells that similarly merge into each other to form part of pnp BJT 103. IGFET shallow main well regions 180, 184A, 188, 192, 196, 200, and 204 are p-type wells respectively for n-channel non-native IGFETs 100, 104, 108, 112, 116, 120, and 124. IGFET shallow main well region 186B is a p-type well for p-channel non-native IGFET 106. IGFET shallow main well regions 182, 186A, 190, 194, 198, 202, and 206 are n-type wells respectively for non-native p-channel IGFETs 102, 106, 110, 114, 118, 122, and 126. IGFET shallow main well region 184B is an n-type well for non-native n-channel IGFET 104.

For convenience, FIG. 5 depicts all of the illustrated shallow well regions as extending to the same depth into the semiconductor body. However, the depth of the illustrated p-type shallow wells can be slightly less than, or somewhat greater than the depth of the illustrated n-type shallow wells. Also, certain of the illustrated p-type shallow wells extend deeper into the semiconductor body than others depending on whether each illustrated p-type shallow well merges into p– substrate region 136 or meets a deep n well. Similarly, certain of the illustrated n-type shallow wells extend deeper into the semiconductor body than others depending on whether each illustrated n-type shallow well meets p− substrate region 136 or merges into a deep n well.

In regard to the depth of a doped monosilicon region that merges into a lower monosilicon region of the same conductivity type, the depth of the upper monosilicon region is considered to occur at the location where the concentration of the semiconductor dopant which defines the upper region equals the concentration of the semiconductor dopant which defines the lower region. The depth of an n-type main well region, such as n-type main well 182 or 186A, that merges into a deeper n-type well region, such as deep n well 210 or 212, thus occurs at the location where the concentrations of the n-type semiconductor dopants which define the two n-type wells are the same. When p− substrate region 136 is created from p-type monosilicon of a substantially uniform background dopant concentration, the depth of a p-type well region, such as p-type main well 184A, which merges into substrate region 136 occurs at the location where the p-type well dopant concentration is twice the p-type background dopant concentration.

Merged shallow n well regions 175A and 175B merge into deep n well region 207 so that it forms part of the n-type collector for npn BJT 101. Deep n collector well 207 is deleted in an alternative embodiment (not shown). Shallow n collector wells 175A and 175B then form an isolating pn junction with p− substrate region 136.

Merged shallow p well regions 177A and 177B similarly merge into p− substrate region 136 so that substrate region 136 forms part of the p-type collector for pnp BJT 103. An isolating BJT deep moderately doped n-type well region spaced apart from BJT deep n collector well region 207 can alternatively be provided below shallow p wells 177A and 177B to electrically isolate them from p− substrate region 136 as described below in connection with FIG. 9. As another alternative, deep n collector well 207 for npn BJT 101 can be replaced with a longer deep n well that also extends below shallow wells 177A and 177B to electrically isolate them from substrate region 136 as described below in connection with FIG. 10.

P-type main well region 180 constitutes the body material, or body-material region, for asymmetric high-voltage n-channel IGFET 100 and forms an isolating pn junction 224 with deep n well region 210. See FIG. 5.1. N-type main well region 182 merges into deep n well 210. The combination of n-type main well 182 and deep n well 210 forms the body material, or body-material region, for asymmetric high-voltage p-channel IGFET 102.

In an embodiment (not shown) where deep n well 210 underlies p-type main well region 180 of n-channel IGFET 100 but does not extend below p-channel IGFET 102, p-type main well 180 again forms the body material (region) for n-channel IGFET 100. However, n-type main well 182 then solely constitutes the body material (region) for p-channel IGFET 102 and forms a pn junction with substrate region 136. In an embodiment (also not shown) fully lacking deep n well 210, the combination of p-type main well 180 and p− substrate region 136 forms the body material for n-channel IGFET 100 while n-type main well 182 again constitutes the body material for p-channel IGFET 102 and forms a pn junction with substrate region 136.

P-type main well region 184A merges into p− substrate region 136 as shown in FIG. 5.2. The combination of p-type main well 184A and p− substrate region 136 forms the body material, or body-material region, for extended-drain n-channel IGFET 104. N-type main well region 184B of IGFET 104 forms, as discussed further below, a drain-body pn junction 226 with substrate region 136.

N-type main well region 186A merges into deep n well region 212. The combination of n-type main well 186A and deep n well 212 forms the body material, or body-material region, for extended-drain p-channel IGFET 106. P-type main well region 186B of IGFET 106 forms, as discussed further below, part of a drain-body pn junction 228 with deep n well 212.

P well region 216 is situated below field-insulation region 138 and between n-type main well region 184B of IGFET 104 and deep n well region 212 of IGFET 106. Because IGFETs 104 and 106 operate at very high voltages and are adjacent to each other in the example of FIG. 5.2, p well 216 electrically isolates IGFETs 104 and 106 from each other. P well 216 can often be deleted in embodiments where extended-drain IGFETs 104 and 106 are not adjacent to each other.

The combination of p-type main well region 188 and p− substrate region 136 forms the body material, or body-material region, for symmetric low-voltage low-leakage n-channel IGFET 108. See FIG. 5.3. N-type main well region 190 constitutes the body material, or body-material region, for symmetric low-voltage low-leakage p-channel IGFET 110 and forms an isolating pn junction 230 with substrate region 136.

The body material (region) for symmetric low-voltage low-$V_T$ n-channel IGFET 112 is similarly formed by the combination of p-type main well region 192 and p− substrate region 136. See FIG. 5.4. N-type main well region 194 constitutes the body material (region) for symmetric low-voltage low-$V_T$ p-channel IGFET 114 and forms an isolating pn junction 232 with substrate region 136.

The combination of p-type main well region 196 and p− substrate region 136 forms the body material (region) for symmetric high-voltage nominal-$V_T$ n-channel IGFET 116. See FIG. 5.5. N-type main well region 198 constitutes the body material (region) for symmetric high-voltage nominal-$V_T$ p-channel IGFET 118 and forms an isolating pn junction 234 with substrate region 136.

The body material (region) for symmetric low-voltage nominal-$V_T$ n-channel IGFET 120 is formed by the combination of p-type main well region 200 and p− substrate region 136. See FIG. 5.6. N-type main well region 202 constitutes the body material (region) for symmetric low-voltage nominal-$V_T$ p-channel IGFET 122 and forms an isolating pn junction 236 with substrate region 136.

The combination of p-type main well region 204 and p− substrate region 136 forms the body material (region) for symmetric high-voltage low-$V_T$ n-channel IGFET 124. See FIG. 5.7. N-type main well region 206 constitutes the body material (region) for symmetric high-voltage low-$V_T$ p-channel IGFET 126 and forms an isolating pn junction 238 with substrate region 136.

P− substrate region 136 solely constitutes the body material (region) for each of native n-channel IGFETs 128, 130, 132, and 134. See FIGS. 5.8 and 5.9.

Main well regions 180, 182, 184A, 184B, 186A, 186B, 192, 194, 204, and 206 are all empty retrograde wells. More particularly, p-type main well 180, 192, or 204 of n-channel IGFET 100, 112, or 124 is doped with p-type semiconductor dopant which is also present in that IGFET's S/D zones. The concentration of the p-type dopant (a) locally reaches a subsurface concentration maximum at a subsurface maximum concentration location extending laterally below largely all of each of the channel and S/D zones of IGFET 100, 112, or 124 and (b) decreases by at least a factor of 10, preferably by at least a factor of 20, more preferably by at least a factor of 40, in moving upward from the subsurface maximum concentration location along a selected vertical location through a specified one of that IGFET's S/D zones to the upper semiconductor surface. The subsurface location of the maximum concentration of the p-type dopant in p-type main well 180, 192, or 204 of IGFET 100, 112, or 124 occurs no more than 10 times, preferably no more than 5 times, more preferably no more than 4 times, deeper than the maximum depth of that IGFET's specified S/D zone.

As discussed further below, a p-type halo pocket portion is present along the source of asymmetric IGFET 100. The specified S/D zone for IGFET 100 is typically its drain but can be its source or drain in an variation of IGFET 100 lacking a p-type halo pocket portion along the source. The specified S/D zone can be either of the S/D zones for symmetric IGFET 112 or 114.

Additionally, the concentration of the p-type dopant decreases substantially monotonically, typically by less than a factor of 10, in moving from the subsurface maximum concentration location in p-type empty main well 180, 192, or 204 of n-channel IGFET 100, 112, or 124 along the selected vertical location for IGFET 100, 112, or 124 to its specified S/D zone. Since the subsurface location of the maximum concentration of the p-type dopant in p-type main well 180, 192, or 204 of IGFET 100, 112, or 124 occurs no more than 10 times deeper than the maximum depth of that IGFET's specified S/D zone, the dopant profile below the specified S/D zone of IGFET 100, 112, or 124 is typically non-hypoabrupt. The decrease in the concentration of the p-type dopant is normally substantially inflectionless, i.e., does not undergo any inflection, in moving from the subsurface maximum concentration location for IGFET 100, 112, or 124 along the selected vertical location for IGFET 100, 112, or 124 to its specified S/D zone.

The aforementioned local concentration maximum of the p-type dopant in p-type empty main well region 180, 192, or 204 of n-channel IGFET 100, 112, or 124 arises from the introduction of p-type semiconductor dopant, referred to here as the p-type empty main well dopant, into the semiconductor body. For asymmetric IGFET 100 having a p-type halo pocket portion, the halo pocket is produced by additional p-type semiconductor dopant, referred to here as the p-type source halo (or channel-grading) dopant, introduced into the semiconductor body so as to reach an additional local concentration maximum at a considerably lesser depth than the concentration maximum produced by the p-type empty main well dopant. In order to clearly distinguish these two p-type concentration maxima in p-type empty main well 180, the p-type concentration maximum produced by the p-type empty main well dopant is generally referred to here as the "deep" p-type empty-well concentration maximum in well 180. The p-type concentration maximum resulting from the p-type source halo dopant is, in a corresponding manner, generally referred to here as the "shallow" p-type empty-well concentration maximum in well 180. The p-type source halo dopant may also be referred to here as the p-type source-side halo pocket dopant or simply as the p-type source-side pocket dopant.

The p-type halo pocket of asymmetric n-channel IGFET 100 may reach its drain in a short-channel version of IGFET 100. However, no significant amount of p-type source halo dopant is normally present fully laterally across the drain regardless of whether IGFET 100 is implemented as the illustrated long-channel device or as a short-channel device. There is always an imaginary vertical line which extends through the drain of IGFET 100 and which has no significant amount of the p-type source halo dopant. Accordingly, the presence of the p-type halo pocket portion along the source of IGFET 100 does not prevent it from meeting the criteria that the concentration of the p-type dopant, i.e., the total p-type dopant, in p-type empty main well region 180 decrease by at least a factor of 10 in moving upward from the subsurface location of the deep p-type empty-well concentration maximum along a selected vertical location through a specified one of that IGFET's S/D zones to the upper semiconductor surface and that the concentration decrease of the total p-type dopant along the selected vertical location in p-type empty main well 180 normally be substantially monotonic and substantially inflectionless in moving from the subsurface location of the deep p-type empty-well concentration maximum along the selected vertical location to that IGFET's specified S/D zone.

In addition to meeting the aforementioned p-type well concentration criteria, the concentration of the total p-type dopant in p-type empty main well region 180, 192, or 204 of n-channel IGFET 100, 112, or 124 preferably decreases substantially monotonically in moving from the pn junction for the IGFET's specified S/D zone along the selected vertical location to the upper semiconductor surface. Some pile-up of p-type semiconductor dopant may occasionally occur along the upper surface of the specified S/D zone of IGFET 100, 112, or 124. If so, the concentration of the total p-type dopant in p-type empty main well 180, 192, or 204 decreases substantially monotonically in moving from the pn junction for the specified S/D zone along the selected vertical location to a point no further from the upper semiconductor surface than 20% of the maximum depth of the pn junction for the specified S/D zone.

Similar to the dopant concentration characteristics of p-type empty main well regions 180, 192, and 204, n-type empty main well region 182, 194, or 206 of p-channel IGFET 102, 114, or 126 is doped with n-type semiconductor dopant which is also present in that IGFET's S/D zones. The concentration of the n-type dopant (a) locally reaches a subsurface concentration maximum at a subsurface maximum concentration location extending laterally below largely all of each of the channel and S/D zones of IGFET 102, 114, or 126 and (b) decreases by at least a factor of 10, preferably by at least a factor of 20, more preferably by at least a factor of 40, in moving upward from the subsurface maximum concentration location along a selected vertical location through a specified one of that IGFET's S/D zones to the upper semiconductor surface. The subsurface location of the maximum concentration of the n-type dopant in n-type main well 182, 194, or 206 of IGFET 102, 114, or 126 occurs no more than 10 times, preferably no more than 5 times, more preferably no more than 4 times, deeper than the maximum depth of that IGFET's specified S/D zone.

An n-type halo pocket portion is, as discussed below, present along the source of asymmetric IGFET 102. The specified S/D zone for IGFET 102 is typically its drain but can be its source or drain in an variation of IGFET 102 lacking an n-type halo pocket portion along the source. The specified S/D zone can be either S/D zone for symmetric IGFET 114 or 116.

Also, the concentration of the n-type dopant decreases substantially monotonically, typically by less than a factor of 10, in moving from the subsurface maximum concentration location in n-type empty main well 182, 194, or 206 of p-channel IGFET 102, 114, or 126 along the selected vertical location for IGFET 102, 114, or 126 to its specified S/D zone. Consequently, the dopant profile below the specified S/D zone of IGFET 102, 114, or 126 is typically non-hypoabrupt. The decrease in the concentration of the n-type dopant is normally substantially inflectionless in moving from the subsurface maximum concentration location for IGFET 102, 114, or 126 along the selected vertical location for IGFET 102, 114, or 126 to its specified S/D zone.

The aforementioned local concentration maximum of the n-type dopant in n-type empty main well region 182, 194, or 206 of n-channel IGFET 102, 114, or 126 arises from the introduction of n-type semiconductor dopant, referred to here as the n-type empty main well dopant, into the semiconductor body. For asymmetric IGFET 102 having an n-type halo pocket portion, the n-type halo pocket is produced by additional n-type semiconductor dopant, referred to here as n-type source halo (or channel-grading) dopant, introduced into the semiconductor body so as to reach an additional local concentration maximum at a considerably lesser depth than the concentration maximum produced by the n-type empty main well dopant. In order to clearly distinguish these two n-type concentration maxima in n-type empty main well 182, the n-type concentration maximum produced by the n-type empty main well dopant is generally referred to here as the "deep" n-type empty-well concentration maximum in well 182. The n-type concentration maximum resulting from the n-type source halo dopant is, correspondingly, generally referred to here as the "shallow" n-type empty-well concentration maximum in well 182. The n-type source halo dopant may also be referred to here as the n-type source-side halo pocket dopant or simply as the n-type source-side pocket dopant.

The n-type halo pocket of asymmetric p-channel IGFET 102 may reach its drain in a short-channel version of IGFET 102. However, no significant amount of n-type source halo dopant is normally present fully laterally across the drain regardless of whether IGFET 100 is implemented in long-channel or short-channel form. There is always an imaginary vertical line which extends through the drain of IGFET 102 and which has no significant amount of the n-type source halo dopant. Accordingly, the presence of the n-type halo pocket portion along the source of IGFET 102 does not prevent it from meeting the criteria that the concentration of the n-type dopant, i.e., the total n-type dopant, in n-type empty main well region 182 decrease by at least a factor of 10 in moving upward from the subsurface location of the deep n-type concentration maximum along a selected vertical location through a specified one of that IGFET's S/D zones to the upper semiconductor surface and that the concentration decrease of the total n-type dopant along the selected vertical location in n-type empty main well 180 normally be substantially monotonic and substantially inflectionless in moving from the subsurface location of the deep n-type concentration maximum along the selected vertical location to that IGFET's specified S/D zone.

Besides meeting the aforementioned n-type well concentration criteria, the concentration of the total n-type dopant in n-type empty main well region 182, 194, or 206 of n-channel IGFET 102, 114, or 126 preferably decreases substantially monotonically in moving from the pn junction for the IGFET's specified S/D zone along the selected vertical location to the upper semiconductor surface. Some pile-up of n-type semiconductor dopant may occasionally occur along the top of the specified S/D zone of IGFET 102, 114, or 126. In that case, the concentration of the total n-type dopant in n-type empty main well 182, 194, or 206 decreases substantially monotonically in moving from the pn junction for the specified S/D zone along the selected vertical location to a point no further from the upper semiconductor surface than 20% of the maximum depth of the pn junction for the specified S/D zone.

Because main well regions 180, 182, 192, 194, 204, and 206 are empty wells, there is less total semiconductor dopant in the channel zones of IGFETs 100, 102, 112, 114, 124, and 126 than in the channel zones of otherwise comparable IGFETs that use filled main well regions. As a result, scattering of charge carriers (electrons for n-channel IGFETs and holes for p-channel IGFETs) due to collisions with dopant atoms occurs less in the crystal lattices in the crystal lattices of the channel zones of IGFETs 100, 102, 112, 114, 124, and 126 than in the crystal lattices of the otherwise comparable IGFETs having filled main wells. The mobilities of the charge carriers in the channel zones of IGFETs 100, 102, 112, 114, 124, and 126 are therefore increased. This enables asymmetric IGFETs 100 and 102 to have increased switching speed.

As to empty main well regions 184A, 184B, 186A, and 186B of extended-drain IGFETs 104 and 106, the concentration of the p-type semiconductor dopant in p-type empty main well 184A of n-channel IGFET 104 or p-type empty main well 186B of p-channel IGFET 106 (a) locally reaches a subsurface concentration maximum at a subsurface maximum concentration location in well 184A or 186B and (b) decreases by at least a factor of 10, preferably by at least a factor of 20, more preferably by at least a factor of 40, in moving upward from the subsurface maximum concentration location along a selected vertical location through that well 184A or 186B to the upper semiconductor surface. As discussed further below, the selected vertical location through well 184A for n-channel IGFET 104 is situated to the side of its halo pocket. The selected vertical location through well 186B for p-channel IGFET 106 extends through active island 146A. The concentration decrease of the p-type dopant along the selected vertical location in p-type main well 184A or 186B is normally substantially monotonic. The subsurface location of the maximum concentration of the p-type dopant in p-type main well 184A or 186B of IGFET 104 or 106 occurs no more than 10 times, preferably no more than 5 times, more preferably no more than 4 times, deeper than the maximum depth of that IGFET's source.

The aforementioned local concentration maxima of the p-type dopant in p-type empty main well regions 184A and 186B arise from the introduction of the p-type empty main well dopant into the semiconductor body. The concentration of the p-type dopant in each p-type empty main well 184A or 186B normally reaches an additional local concentration maximum at a considerably lesser depth than the concentration maximum produced by the p-type empty main well dopant in that well 184A or 186B. In order to clearly distinguish the two p-type concentration maxima in each main well 184A or 186B, the p-type concentration maximum produced by the p-type empty main well dopant in well 184A or 186B is generally referred to here as the "deep" p-type empty-well concentration maximum in that well 184A or 186B. The p-type concentration maximum produced by the additional p-type dopant in each main well 184A or 186B is, in a corresponding manner, generally referred to here as the "shallow" p-type empty-well concentration maximum in that well 184A or 186B.

The shallow p-type empty-well concentration maximum in each p-type empty main well region 184A or 186B arises from additional p-type empty-well semiconductor dopant introduced into that p-type empty main well 184A or 186B and extends only partially laterally across that well 184A or 186B. There is always an imaginary vertical line which extends through p-type well 184A or 186B and which has no significant amount of the additional p-type empty-well dopant. Hence, the presence of the additional p-type empty-well dopant in well 184A or 186B does not prevent it from satisfying the p-type empty-well criteria that the concentration of the p-type dopant, i.e., the total p-type dopant, in well 184A or 186B decrease by at least a factor of 10 in moving upward from the subsurface location of the deep p-type empty-well concentration maximum along a selected vertical location through that well 184A or 186B to the upper semiconductor surface and that the concentration decrease of the total p-type dopant along the selected vertical location in well 184A or 186B normally be substantially monotonic.

In a complementary manner, the concentration of the n-type semiconductor dopant in n-type empty main well region 184B of n-channel IGFET 104 or p-type empty main well region 186A of p-channel IGFET 106 similarly (a) locally reaches a subsurface concentration maximum at a subsurface maximum concentration location in empty main well 184B or 186A and (b) decreases by at least a factor of 10, preferably by at least a factor of 20, more preferably by at least a factor of 40, in moving upward from the subsurface maximum concentration location along a selected vertical location through that well 184B or 186A to the upper semiconductor surface. As discussed further below, the selected vertical location through well 184B for n-channel IGFET 104 extends through active island 144A. The selected vertical location through well 186A for p-channel IGFET 106 is situated to the side of its halo pocket. The concentration decrease of the n-type dopant along the selected vertical location in p-type main well 184B or 186A is normally substantially monotonic. The subsurface location of the maximum concentration of the n-type dopant in n-type main well 184B or 186A of IGFET 104 or 106 occurs no more than 10 times, preferably no more than 5 times, more preferably no more than 4 times, deeper than the maximum depth of that IGFET's source. Examples of the vertical locations along which the p-type dopant in p-type well 184A or 186B and the n-type dopant in n-type well 184B or 186A reach these local concentration maxima are presented below in connection with FIGS. 16a and 16b.

The aforementioned local concentration maxima of the n-type dopant in n-type empty main well regions 184B and 186A arise from the introduction of the n-type empty main well dopant into the semiconductor body. The concentration of the n-type dopant in each n-type empty main well 184B or 186A normally reaches an additional local concentration maximum at a considerably lesser depth than the concentration maximum produced by the n-type empty main well dopant in that well 184B or 186A. So as to clearly distinguish the two n-type concentration maxima in each main well 184B or 186A, the n-type concentration maximum produced by the n-type empty main well dopant in each well 184B or 186A is generally referred to here as the "deep" n-type empty-well concentration maximum in that well 184B or 186A. The n-type concentration maximum produced by the additional n-type dopant in each main well 184B or 186S is, correspondingly, generally referred to here as the "shallow" n-type empty-well concentration maximum in that well 184B or 186A.

The shallow n-type empty-well concentration maximum in each n-type empty main well region 184B or 186A arises from additional n-type empty-well semiconductor dopant introduced into that n-type empty main well 184B or 186A and extends only partially laterally across that well 184B or 186A. There is always an imaginary vertical line which extends through n-type well 184B or 186A and which has no significant amount of the additional n-type empty-well dopant. Consequently, the presence of the additional n-type empty-well dopant in well 184B or 186A does not prevent it from satisfying the n-type empty-well criteria that the concentration of the n-type dopant, i.e., the total n-type dopant, in well 184B or 186A decrease by at least a factor of 10 in moving upward from the subsurface location of the deep n-type empty-well concentration maximum along a selected vertical location through that well 184B or 186A to the upper semiconductor surface and that the concentration decrease of the total n-type dopant along the selected vertical location in well 184B or 186A normally be substantially monotonic.

The dash-and-double-dot lines marked "MAX" in FIG. 5.2 indicate the subsurface locations of (a) the p-type deep local concentration maxima in p-type empty main well regions 184A and 186B and (b) the n-type deep local concentration maxima in n-type empty main well regions 184B and 186A. As indicated by these lines, the deep n-type concentration maximum in n-type empty main well 184B of extended-drain n-channel IGFET 104 occurs at approximately the same depth as the deep p-type concentration maximum in that IGFET's p-type empty main well 184A. Likewise, the deep p-type concentration maximum in p-type empty main well 186B of extended-drain p-channel IGFET 106 occurs at approximately the same depth as the deep n-type concentration maximum in n-type empty main well 186A of IGFET 106.

Empty main well regions 184B and 186B respectively serve, as discussed further below, partially or fully as the drains of extended-drain IGFETs 104 and 106. By configuring main wells 184B and 186B as empty retrograde wells, the maximum value of the electric field in each of IGFETs 104 and 106 occurs in the bulk of the monosilicon rather than along the upper semiconductor surface as commonly arises in conventional extended-drain IGFETs. In particular, the maximum value of the electric field in each IGFET 104 or 106 occurs along the pn junction between the drain and body material at, or close to, the subsurface location of the aforementioned local concentration maximum of the main well dopant in well 184B or 186B. As a consequence, impact ionization occurs more in the bulk of the monosilicon, specifically in the bulk of the drain, of IGFET 104 or 106 rather than in the monosilicon along the upper semiconductor surface as commonly arises in conventional extended-drain IGFETs.

By generally shifting impact ionization to the bulk of the monosilicon, fewer charge carriers reach the upper semiconductor surface with sufficient energy to be injected into the gate dielectric layers of extended-drain IGFETs 104 and 106 than into the gate dielectric layers of conventional extended-drain IGFETs in which substantial impact ionization occurs in the monosilicon along the upper semiconductor surface. IGFETs 104 and 106 substantially avoid having their threshold voltages change due to charge injection into their gate dielectric layers. Accordingly, IGFETs 104 and 106 are of considerably enhanced reliability.

Figure 16A:
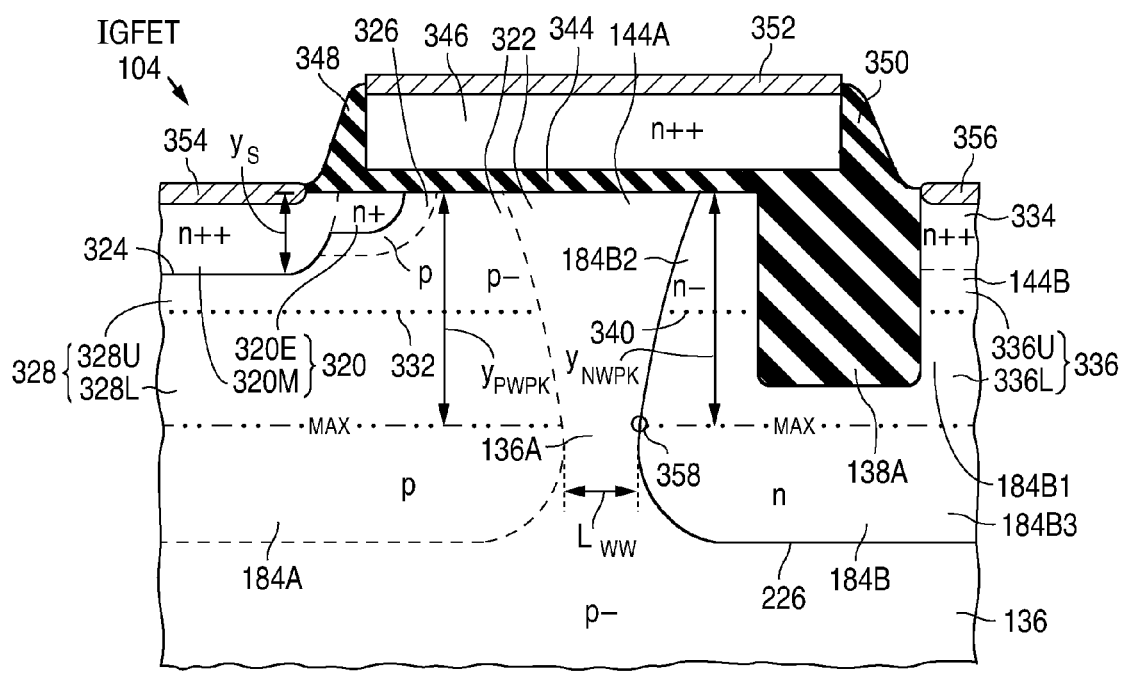
FIGS. 16a and 16b are respective expanded front cross-sectional views of the cores of the extended-drain n-channel and p-channel IGFETs of FIG. 5.2.
Figure 16B:
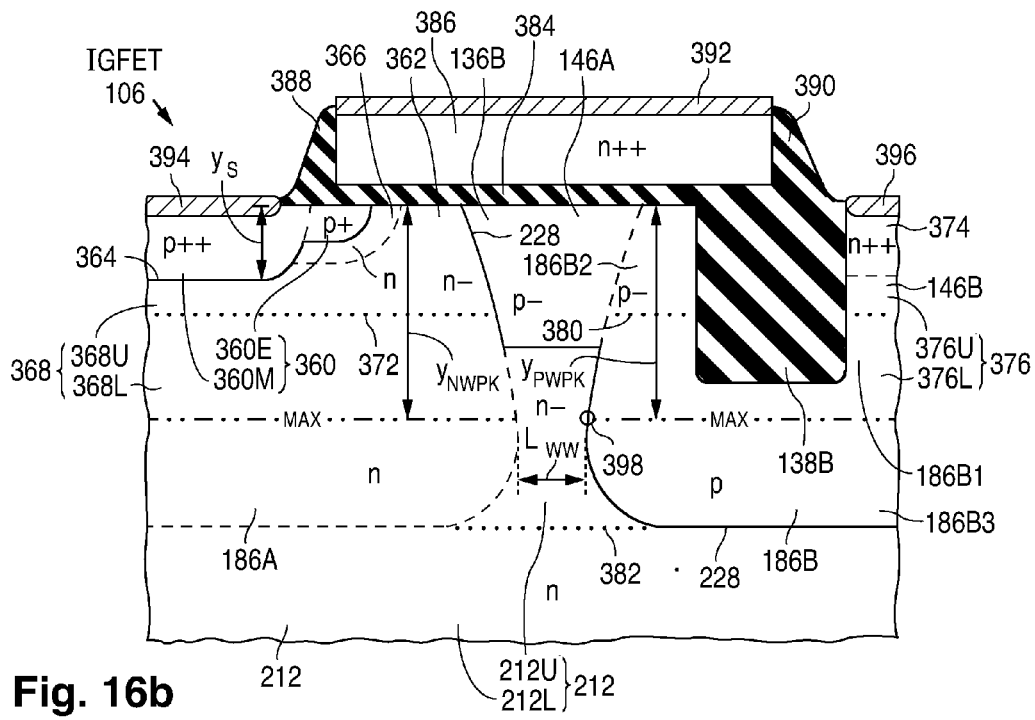

Additionally, empty main well regions 184A and 184B of n-channel IGFET 104 are preferably spaced apart from each other. The minimum spacing $L_{WW}$ between empty main wells 184A and 184B occurs approximately along an imaginary horizontal line extending from the location of the deep p-type concentration maximum in main well 184A to the location of the deep n-type concentration maximum in well 184B because the two concentration maxima occur at approximately the same depth. Empty main well regions 186A and 186B of p-channel IGFET 106 are likewise preferably spaced apart from each other. The minimum spacing $L_{WW}$ between empty main wells 186A and 186B similarly occurs approximately along an imaginary horizontal line extending from the location of the deep n-type concentration maximum in main well 186A to the location of the deep p-type concentration maximum in main well 186B since these two concentration maxima occur at approximately the same depth. The locations of minimum well-to-well spacings $L_{WW}$ for IGFETs are illustrated in FIGS. 16a and 16b discussed below.

The drain-to-source breakdown voltage $V_{BD}$ of extended-drain IGFET 104 or 106 depends on minimum well-to-well spacing $L_{WW}$. In particular, breakdown voltage $V_{BD}$ of IGFET 104 or 106 increases as well-to-well spacing $L_{WW}$ increases up to point at which breakdown voltage $V_{BD}$ reaches a saturation value. The increase in breakdown voltage $V_{BD}$ with spacing $L_{WW}$ is typically in the vicinity of 6 V/μm in a $V_{BD}/L_{WW}$ region of commercial interest. The use of empty retrograde wells 184A and 184B in n-channel IGFET 104 or empty retrograde wells 186A and 186B in p-channel IGFET 106 thus provides a convenient way for controlling breakdown voltage $V_{BD}$ in the $V_{BD}/L_{WW}$ region of commercial interest.

IGFET main well regions 188, 190, 196, 198, 200, and 202 are all filled wells. More specifically, p-type main well 188, 196, or 200 of symmetric n-channel IGFET 108, 116, or 120 contains p-type semiconductor dopant that (a) locally reaches a subsurface concentration maximum at a subsurface location extending laterally below largely all of each of that IGFET's channel and S/D zones and (b) decreases by less than a factor of 10 in moving upward from the subsurface location along any vertical location through each of that IGFET's S/D zones to the upper semiconductor surface. The subsurface location of the maximum concentration of the p-type dopant in p-type main well 188, 196, or 200 of IGFET 108, 116, or 120 occurs no more than 10 times, preferably no more than 5 times, more preferably no more than 4 times, deeper below the upper semiconductor surface than the maximum depth of each of that IGFET's S/D zones.

The foregoing local concentration maxima of the p-type dopant in p-type filled main well regions 188, 196, and 200 arise from the introduction of p-type semiconductor dopant, referred to here as the p-type filled main well dopant, into the semiconductor body. The concentration of the p-type dopant in each p-type filled main well 188, 196, or 200 reaches at least one additional local concentration maximum in that well 188, 196, or 200. Each additional p-type concentration in p-type well 188, 196, or 200 occurs at a considerably lesser depth than the concentration maximum resulting from the p-type filled main well dopant in that well 188, 196, or 200. In order to clearly distinguish the multiple p-type concentration maxima in each filled main well 188, 196, or 200, the p-type concentration maximum produced by the p-type filled main well dopant in well 188, 196, or 200 is generally referred to here as the "deep" p-type filled-well concentration maximum in that well 188, 196, or 200. Each additional p-type concentration maximum in each filled main well 188, 196, or 200 is, in a corresponding manner, generally referred to here as a "shallow" p-type filled-well concentration maximum in that well 188, 196, or 200.

Each p-type filled main well region 188, 196, or 200 normally has at least one shallow p_type filled-well concentration maximum that extends substantially fully laterally across that filled main well 188, 196, or 200. Accordingly, the p-type dopant profile along any imaginary vertical line through each p-type main well 188, 196, or 200 and through the deep p-type filled-well concentration maximum in that well 188, 196, or 200 has at least two local concentration maxima. Each shallow p-type filled-well concentration maximum in each p-type main well 188, 196, or 200 is produced by introduction of additional p-type filled-well semiconductor dopant into that well 188, 196, or 200. The additional p-type filled-well dopant "fills" each p-type main well 188, 196, or 200 substantially across its entire lateral extent so that each main well 188, 196, or 200 is a filled well.

P-type filled main well regions 188, 196, and 200 of symmetric n-channel IGFETs 108, 116, and 120 receive p-type semiconductor dopant, referred to here as the p-type anti-punchthrough ("APT") dopant, as additional p-type filled-well dopant. The maximum concentration of the p-type APT dopant normally occurs more than 0.1 μm below the upper semiconductor surface but not more than 0.4 μm below the upper semiconductor surface. In addition, the maximum concentration of the p-type APT dopant occurs below channel surface depletion regions that extend along the upper semiconductor surface into the channel zones of IGFETs 108, 116, and 120 during IGFET operation. By positioning the p-type APT dopant in this manner, the p-type APT dopant inhibits source-to-drain bulk punchthrough from occurring in IGFETs 108, 116, and 120, especially when their channel lengths are relatively short.

P-type semiconductor dopant, referred to here as the p-type threshold-adjust dopant, is also provided to p-type main filled well regions 188 and 196 of symmetric n-channel IGFETs 108 and 116 as additional p-type filled-well dopant. The maximum concentration of the p-type threshold-adjust dopant occurs at a lesser depth than the maximum concentration of the p-type APT dopant.

With threshold voltage $V_T$ of low-voltage n-channel IGFET 120 being at a nominal positive value, the p-type threshold-adjust dopant causes the positive threshold voltage of low-voltage IGFET 108 to exceed the nominal $V_T$ value of IGFET 120. The increased threshold voltage of low-voltage IGFET 108 enables it to have reduced current leakage in the biased-off state. IGFET 108 is thus particularly suitable for low-voltage applications that require low-off state current leakage but can accept increased threshold voltage.

Low-voltage IGFET 120 of nominal threshold voltage is a companion to low-voltage low-leakage IGFET 108 because both of them receive the p-type APT dopant for inhibiting source-to-drain bulk punchthrough. However, IGFET 120 does not receive the p-type threshold-adjust dopant. Hence, IGFET 120 is especially suitable for low-voltage applications that require moderately low threshold voltage but do not require extremely low off-state current leakage.

Symmetric low-voltage IGFETs 108 and 120 are also companions to symmetric low-voltage low-$V_T$ n-channel IGFET 112 which lacks both the p-type APT dopant and the p-type threshold-adjust dopant. With its low threshold voltage, IGFET 112 is particularly suitable for use in low-voltage situations where IGFETs are always on during circuitry operation. In order to avoid punchthrough and excessive current leakage, IGFET 112 is of appropriately greater channel length than IGFET 120 or 108.

The p-type threshold-adjust dopant sets threshold voltage $V_T$ of symmetric high-voltage IGFET 116 at a nominal value suitable for high-voltage applications. IGFET 116 is a companion to symmetric high-voltage low-$V_T$ n-channel IGFET 124 which lacks both the p-type APT dopant and the p-type threshold-adjust dopant. As with using IGFET 112 in low-voltage situations, the low threshold voltage of IGFET 124 makes it especially suitable for use in high-voltage situations where IGFETs are always on during circuitry operation. IGFET 124 is of appropriately greater channel length than IGFET 116 in order to avoid punchthrough and excessive current leakage.

Analogous to what is said above about p-type filled main well regions 188, 196, and 200 of IGFETs 108, 116, and 120, n-type filled main well region 190, 198, or 202 of symmetric p-channel IGFET 110, 118, or 122 contains n-type semiconductor dopant that (a) locally reaches a subsurface concentration maximum at a subsurface location extending laterally below largely all of each of that IGFET's channel and S/D zones and (b) decreases by less than a factor of 10 in moving upward from the subsurface location along any vertical location through each of that IGFET's S/D zones to the upper semiconductor surface. The subsurface location of the maximum concentration of the n-type dopant in n-type filled main well 190, 198, or 202 of IGFET 110, 118, or 122 occurs no more than 10 times, preferably no more than 5 times, more preferably no more than 4 times, deeper than the maximum depth of each of that IGFET's S/D zones.

The foregoing local concentration maxima of the n-type dopant in n-type filled main well regions 190, 198, and 202 arise from n-type semiconductor dopant, referred to as the n-type filled main well dopant, introduced into the semiconductor body. The concentration of the n-type dopant in each n-type filled main well 190, 198, and 202 reaches at least one additional local concentration maximum in that well 190, 198, and 202. Each additional n-type concentration in n-type well 190, 198, and 202 occurs at a considerably lesser depth than the concentration maximum resulting from the n-type filled main well dopant in that well 190, 198, and 202. So as to clearly distinguish the multiple n-type concentration maxima in each filled main well 190, 198, and 202, the n-type concentration maximum produced by the n-type filled main well dopant in well 190, 198, and 202 is generally referred to here as the "deep" n-type filled-well concentration maximum in that well 190, 198, and 202. Each additional n-type concentration maximum in each filled main well 190, 198, and 202 is, correspondingly, generally referred to here as a "shallow" n-type filled-well concentration maximum in that well 190, 198, and 202.

Each n-type filled main well region 190, 198, and 202 normally has at least one shallow n-type filled well concentration maximum that extends substantially fully laterally across that filled main well 190, 198, and 202. Hence, the n-type dopant profile along any imaginary vertical line through each n-type main well 190, 198, and 202 and through the deep n-type filled-well concentration maximum in that well 190, 198, and 202 has at least two local concentration maxima. Each shallow n-type filled-well concentration maximum in each n-type main well 190, 198, and 202 is produced by introducing additional n-type filled-well semiconductor dopant into that well 190, 198, and 202. The additional n-type filled-well dopant "fills" each n-type main well 190, 198, and 202 substantially across its entire lateral extent so that each main well 190, 198, and 202 is a filled well.

N-type filled main well regions 190, 198, and 202 of symmetric p-channel IGFETs 110, 118, and 122 receive n-type semiconductor dopant, referred to here as the n-type APT dopant, as additional n-type filled-well dopant. The maximum concentration of the n-type APT dopant normally occurs more than 0.1 µm below the upper semiconductor surface but not more than 0.4 µm below the upper semiconductor surface. Further, the maximum concentration of the n-type APT dopant occurs below channel surface depletion regions that extend along the upper semiconductor surface into the channel zones of IGFETs 110, 118, and 122 during IGFET operation. Positioning the n-type APT dopant in this way inhibits source-to-drain bulk punchthrough from occurring in IGFETs 110, 118, and 122, especially when they are of relatively short channel length.

N-type semiconductor dopant, referred to here as the n-type threshold-adjust dopant, is also furnished to n-type filled main well regions 190 and 198 of n-channel IGFETs 110 and 118 as additional n-type filled-well dopant. The maximum concentration of the n-type threshold adjust dopant occurs at a lesser depth than the maximum concentration of the n-type APT dopant.

With threshold voltage $V_T$ of low-voltage p-channel IGFET 122 being at a nominal negative value, the n-type threshold-adjust dopant causes the magnitude of the negative threshold voltage of low-voltage low-leakage IGFET 110 to exceed the magnitude of the nominal $V_T$ value of IGFET 122. The increased $V_T$ magnitude of IGFET 110 enables it to have reduced current leakage in the biased-off state. Hence, IGFET 110 is particularly suitable for low-voltage applications that necessitate low-off state current leakage but can accept threshold voltage of increased magnitude.

Low-voltage IGFET 122 of nominal threshold voltage is a companion to low-voltage IGFET 110 because both of them receive the n-type APT dopant for inhibiting source-to-drain bulk punchthrough. However, IGFET 122 does not receive the n-type threshold-adjust dopant. As a result, IGFET 122 is especially suitable for low-voltage applications that require moderately low $V_T$ magnitude but do not require extremely low off-state current leakage.

Symmetric low-voltage IGFETs 110 and 122 are also companions to symmetric low-voltage low-$V_T$ p-channel IGFET 114 which lacks both the n-type APT dopant and the n-type threshold-adjust dopant. Due to the low magnitude of its threshold voltage, IGFET 114 is particularly suitable for use in low-voltage situations in which IGFETs are always on during circuitry operation. To avoid punchthrough and excessive current leakage, IGFET 114 is of appropriately greater channel length than IGFET 122 or 110.

The n-type threshold-adjust dopant sets threshold voltage $V_T$ of symmetric high-voltage IGFET 118 at a nominal value suitable for high-voltage applications. IGFET 118 is a companion to symmetric high-voltage low-$V_T$ p-channel IGFET 126 which lacks both the n-type APT dopant and the n-type threshold-adjust dopant. Similar to what was said about IGFET 114 for low-voltage situations, the low magnitude of the threshold voltage of IGFET 126 makes it especially suitable for use in high-voltage situations where IGFETs are always on during circuitry operation. IGFET 126 is of appropriately greater channel length than IGFET 118 in order to avoid punchthrough and excessive current leakage.

Symmetric native low-voltage n-channel IGFETs 128 and 130 are suitable for low-voltage applications. In a complementary manner, symmetric native high-voltage n-channel IGFETs 132 and 134 are suitable for high-voltage applications. The low threshold voltages of IGFETs 130 and 134 make them particularly suitable for use in situations where IGFETs are always on during circuitry operation. Native IGFETs 128, 130, 132, and 134 typically have high transconductance along with good matching and noise characteristics.

The following table summarizes the polarities, symmetry types, main well types, and application areas for the nine pairs of illustrated IGFETs where "Comp" means complementary, "Asy" means asymmetric, and "Sym" means symmetric:

| Typical Application Areas | Voltage/current Characteristics | IGFET(s) | Polarity | Symmetry | Main Well(s) |
|---|---|---|---|---|---|
| High-speed input/output stages | High-voltage unidirectional | 100 and 102 | Comp | Asy | Empty |
| Power, high-voltage switching, EEPROM programming, and ESD protection | Extended-voltage unidirectional | 104 and 106 | Comp | Asy | Empty |

-continued

| Typical Application Areas | Voltage/current Characteristics | IGFET(s) | Polarity | Symmetry | Main Well(s) |
|---|---|---|---|---|---|
| Low-voltage digital circuitry with low current leakage | Low-voltage high-$V_T$ bidirectional | 108 and 110 | Comp | Sym | Filled |
| Low-voltage high-speed digital circuitry in always-on situations | Low-voltage low-$V_T$ bidirectional | 112 and 114 | Comp | Sym | Empty |
| Transmission gates in input/output digital stages | High-voltage nominal-$V_T$ bidirectional | 116 and 118 | Comp | Sym | Filled |
| General low-voltage digital circuitry | Low-voltage nominal-$V_T$ bidirectional | 120 and 122 | Comp | Sym | Filled |
| Transmission gates in input/output digital stages in always-on situations | High-voltage low-$V_T$ bidirectional | 124 and 126 | Comp | Sym | Empty |
| General low-voltage class A circuitry | Low-voltage nominal-$V_T$ bidirectional | 128 | N-channel | Sym | None |
| High-speed low-voltage class A circuitry in always-on situations | Low-voltage low-$V_T$ bidirectional | 130 | N-channel | Sym | None |
| General high-voltage class A circuitry | High-voltage nominal-$V_T$ bidirectional | 132 | N-channel | Sym | None |
| High-speed high-voltage class A circuitry in always-on situations | High-voltage low-$V_T$ bidirectional | 134 | N-channel | Sym | None |

In addition providing two types of asymmetric complementary IGFET pairs, the present CBJT/CIGFET structure provides symmetric complementary IGFET pairs in all four combinations of well type and low-voltage/high-voltage operational range. Symmetric complementary IGFETs 108 and 110 and symmetric complementary IGFETs 120 and 122 are low-voltage filled-well devices. Symmetric complementary IGFETs 112 and 114 are low-voltage empty-well devices. Symmetric complementary IGFETs 116 and 118 are high-voltage filled-well devices. Symmetric IGFETs 124 and 126 are high-voltage empty-well devices. The CBJT/CIGFET structure of the present invention thus furnishes a designer of a mixed-signal IC with a broad group of BJTs and IGFETs, including the above-described variations of asymmetric IGFETs 100 and 102 lacking deep n wells and the above-described variations of the non-native symmetric IGFETs having deep n wells, which enable the IC designer to choose an IGFET that very well satisfies each circuitry need in the mixed-signal IC.

A full description of the process for manufacturing the CBJT/CIGFET of the invention is presented in the fabrication process section below. Nonetheless, in completing the basic description of the well regions used in the present CBJT/CIGFET structure, the p-type deep local concentration maxima of p-type empty main well regions 180, 184A, and 186B and the p-type concentration maxima of p-type empty main well regions 192 and 204 are normally defined substantially simultaneously by selectively ion implanting the p-type empty main well dopant, typically boron, into the semiconductor body. Consequently, the p-type deep local concentration maxima of p-type empty main wells 180, 184A, and 186B and the p-type concentration maxima of p-type empty main wells 192 and 204 occur at approximately the same average depth $y_{PWPK}$.

The p-type empty main well maximum dopant concentration at average depth $y_{PWPK}$ in p-type empty main well region 180, 184A, 186B, 192, or 204 is normally $4 \times 10^{17}$-$1 \times 10^{18}$ atoms/cm$^3$, typically $7 \times 10^{17}$ atoms/cm$^3$. Average p-type empty main well maximum concentration depth $y_{PWPK}$ is normally 0.4-0.7 μm, typically 0.5-0.55 μm.

None of empty-well n-channel IGFETs 100, 112, and 124 uses a deep p well region. The p-type empty main well subsurface maximum concentration for n-channel IGFET 100, 112, or 124 is therefore substantially the only local subsurface concentration maximum of the total p-type dopant concentration in moving from the p-type empty main well subsurface maximum concentration location at average p-type empty main well maximum concentration depth $y_{PWPK}$ for IGFET 100, 112, or 124 vertically down to a depth y of at least 5 times, normally at least 10 times, preferably at least 20 times, depth $y_{PWPK}$ for IGFET 100, 112, or 124.

Each empty-well n-channel IGFET 100, 112, or 124 can alternatively be provided in a variation that uses a deep p well region defined with p-type semiconductor dopant, referred to here as the deep p well dopant, whose concentration locally reaches a p-type further subsurface maximum concentration at a further subsurface maximum concentration location extending laterally below largely all of that IGFET's channel zone and normally also below largely all of each of that IGFET's S/D zones but which does not materially affect the essential empty-well nature of that IGFET's p-type empty well region 180, 192, or 204. The local further subsurface maximum concentration location of the deep p well dopant occurs in empty main well 180, 192, or 204 at an average value of depth y greater than p-type average empty main well maximum concentration depth $y_{PWPK}$ in that empty main well 180, 192, or 204.

The average depth of the maximum p-type dopant concentration of the deep p well dopant is normally no greater than 10 times, preferably no greater than 5 times, average p-type empty main well maximum concentration depth $y_{PWPK}$. The deep p well dopant causes the total p-type concentration at any depth y less than $y_{PWPK}$ in empty main well 180, 192, or 204 to be raised no more than 25%, normally no more than 10%, preferably no more than 2%, more preferably no more than 1%, typically no more than 0.5%.

The n-type deep local concentration maxima of n-type empty main well regions 182, 184B, and 186A and the n-type concentration maxima of n-type empty main well regions 194 and 206 are normally defined substantially simultaneously by selectively ion implanting the n-type empty main well dopant, typically phosphorus, into the semiconductor body. Hence, the n-type deep local concentration maxima of n-type empty main wells 182, 184B, and 186A and the n-type concentration maxima of n-type empty main wells 194 and 206 occur at approximately the same average depth $y_{NWPK}$.

The n-type empty main well maximum dopant concentration at average depth $y_{NWPK}$ in n-type empty main well region 182, 184B, 186A, 194 or 206 is normally $3\times10^{17}$-$1\times10^{18}$ atoms/cm$^3$, typically $6\times10^{17}$ atoms/cm$^3$. Average n-type empty main well maximum concentration depth $y_{NWPK}$ is normally 0.4-0.8 µm, typically 0.55-0.6 µm. Hence, average n-type empty main well maximum concentration depth $y_{NWPK}$ in n-type empty main well 182, 184B, 186A, 194 or 206 is typically slightly greater than average p-type empty main well maximum concentration depth $y_{PWPK}$ in p-type empty main well region 180, 184A, 186B, 192, and 204.

Neither of symmetric empty-well p-channel IGFETs 114 and 126 uses a deep n well region in the example of FIG. 5. Deep n well region 210 can, as mentioned above, be deleted in a variation of asymmetric empty-well IGFETs 100 and 102. For p-channel IGFETs 114 and 126 in the present example and for that variation of asymmetric IGFETs 100 and 102, the n-type empty main well subsurface maximum concentration for p-channel IGFET 102, 114, or 126 is substantially the only local subsurface concentration maximum of the total n-type dopant concentration in moving from the n-type empty main well subsurface maximum concentration location at average n-type empty main well maximum concentration depth $y_{NWPK}$ for IGFET 102, 114, or 126 vertically down to a depth y of at least 5 times, normally at least 10 times, preferably at least 20 times, depth $y_{NWPK}$ for IGFET 102, 114, or 126.

Deep n well regions 210 and 212 are normally defined substantially simultaneously by selectively ion implanting n-type semiconductor dopant, referred to here as the deep n well dopant, into the semiconductor body. As a result, deep n wells 210 and 212 reach n-type local concentration maxima at the same average depth $y_{DNWPK}$. The deep n well dopant is typically phosphorus.

The maximum concentration of the deep n well dopant in deep n well regions 210 and 212 occurs considerably deeper into the semiconductor body than the maximum concentration of the n-type empty main well dopant in n-type empty main well regions 182, 184B, 186A, 194, and 206. Average depth $y_{DNWPK}$ of the maximum concentration of the deep n well dopant in deep n wells 210 and 212 is normally no greater than 10 times, preferably no greater than 5 times, average depth $y_{NWPK}$ of the n-type deep local concentration maxima of n-type empty main wells 182, 184B, and 186A and the n-type concentration maxima of n-type empty main wells 194 and 206. More particularly, average deep n well maximum concentration depth $y_{DNWPK}$ is normally 1.5-5.0 times, preferably 2.0-4.0 times, typically 2.5-3.0 times, average n-type empty main well maximum concentration depth $y_{NWPK}$.

Additionally, average depth $y_{DNWPK}$ and the maximum concentration of the deep n well dopant in deep n well regions 210 and 212 are of such values that the presence of the deep n well dopant normally has no more than a minor effect on the total (absolute) n-type concentration in empty main well region 182 of asymmetric p-channel IGFET 102 at any depth y less than average n-type empty main well maximum concentration depth $y_{NWPK}$ and on the total (absolute) n-type concentration in empty main well region 186A of extended-drain p-channel IGFET 106 at any depth y less than $y_{NWPK}$. In particular, the deep n well dopant causes the total n-type concentration at any depth y less than $y_{NWPK}$ in empty main well 182 or 186A to be raised no more than 25%, normally no more than 10%.

More specifically, the presence of the deep n well dopant normally has no significant effect on the total (absolute) n-type concentration in empty main well region 182 of asymmetric p-channel IGFET 102 at any depth y less than average n-type empty main well maximum concentration depth $y_{NWPK}$ and on the total (absolute) n-type concentration in empty main well region 186A of extended-drain p-channel IGFET 106 at any depth y less than $y_{NWPK}$. The total n-type concentration at any depth y less than $y_{NWPK}$ in empty main well 182 or 186A is preferably raised no more than 2%, more preferably no more than 1%, typically no more than 0.5%, due to the deep n well dopant. The same applies to a variation of symmetric p-channel IGFET 114 or 126 provided with a deep n well region below empty main well region 194 or 206.

The deep n well maximum dopant concentration at average depth $y_{DNWPK}$ in deep well region 210 or 212 is normally $1\times10^{17}$-$4\times10^{17}$ atoms/cm$^3$, typically $2\times10^{17}$ atoms/cm$^3$. Average deep n well maximum concentration depth $y_{DNWPK}$ is normally 1.0-2.0 µm, typically 1.5 µm.

The p-type deep local concentration maxima of p-type filled main well regions 188, 196, and 200 are normally defined substantially simultaneously by selectively ion implanting the p-type filled main well dopant, typically boron, into the semiconductor body. For structural simplicity, the concentration maximum of the p-type filled main well dopant is typically arranged to be at approximately the same average depth $y_{PWPK}$ as the concentration maximum of the p-type empty main well dopant. When the p-type empty and filled main well implantations are done with the same p-type dopant using the same dopant-containing particles species at the same ionization charge state, the p-type filled main well implantation is then performed at approximately the same implant energy as the p-type empty-well implantation. The two p-type main well implantations are also normally done at approximately the same implant dosage.

The n-type deep local concentration maxima of n-type filled main well regions 190, 198, and 202 are similarly normally defined substantially simultaneously by selectively ion implanting the n-type filled main well dopant, typically phosphorus, into the semiconductor body. The concentration maximum of the n-type filled main well dopant is, for structural simplicity, typically arranged to be at approximately the same average depth $y_{NWPK}$ as the concentration maximum of the n-type empty main well dopant. In the typical case where the n-type empty and filled main well implantations are done with the same n-type dopant using the same dopant-containing particles species at the same ionization charge state, the n-type filled main well implantation is thereby performed at approximately the same implant energy as the n-type empty-well implantation. The two n-type main well implantations are also normally done at approximately the same implant dosage.

The five well implantations, along with any further p-type or n-type well implantation, are performed after formation of field-insulation region 138 and can generally be done in any order.

Each source/drain zone of asymmetric IGFETs 100 and 102 and the illustrated symmetric IGFETs is typically provided with a vertically graded junction. That is, each source/drain zone of IGFETs 100 and 102 and the illustrated symmetric IGFETs typically includes a very heavily doped main portion and a more lightly doped, but still heavily doped, lower portion that underlies and is vertically continuous with the main portion. The same applies to the sources and the drain contact zones of extended-drain IGFETs 104 and 106. The heavily doped lower portions that provide the vertically graded junction features are, for simplicity in explanation, not described in the following sections on asymmetric high-voltage IGFETs, extended-drain IGFETs, symmetric IGFETs, information generally applicable to all the IGFETs, and fabrication of the present CBJT/CIGFET structure. Nor are these heavily doped lower portions illustrated in the drawings accompanying those five sections. Further information on the vertically graded junctions is provided in U.S. patent application Ser. No. 12/382/793, cited above.

In the course of providing vertically graded junctions for the illustrated IGFETs, the emitters of complementary BJTs 101 and 103 are also typically provided with vertically graded junctions. Although the vertically graded junctions for the emitters may cause the gains (betas) of BJTs 101 and 103 to re reduced slightly, the emitter-base breakdown voltages of BJTs 101 and 103 are advantageously increased.

D. Bipolar Junction Transistors

D1. Structure of Npn Transistor

Figure 6:
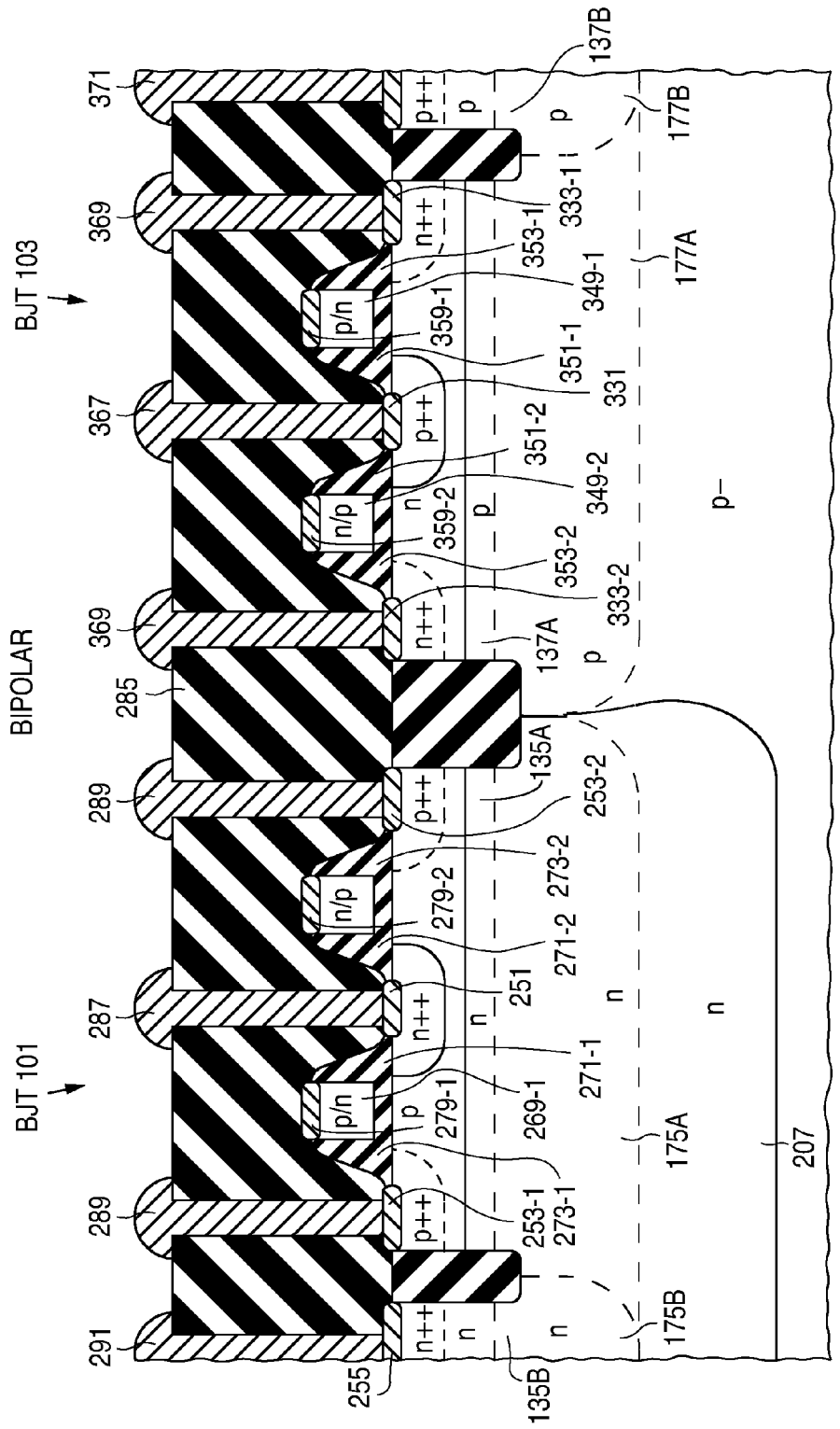
FIG. 6 is a front cross-sectional view of the complementary BJTs of FIG. 5.0 and one level of the overlying electrical interconnection system.
Figure 7:
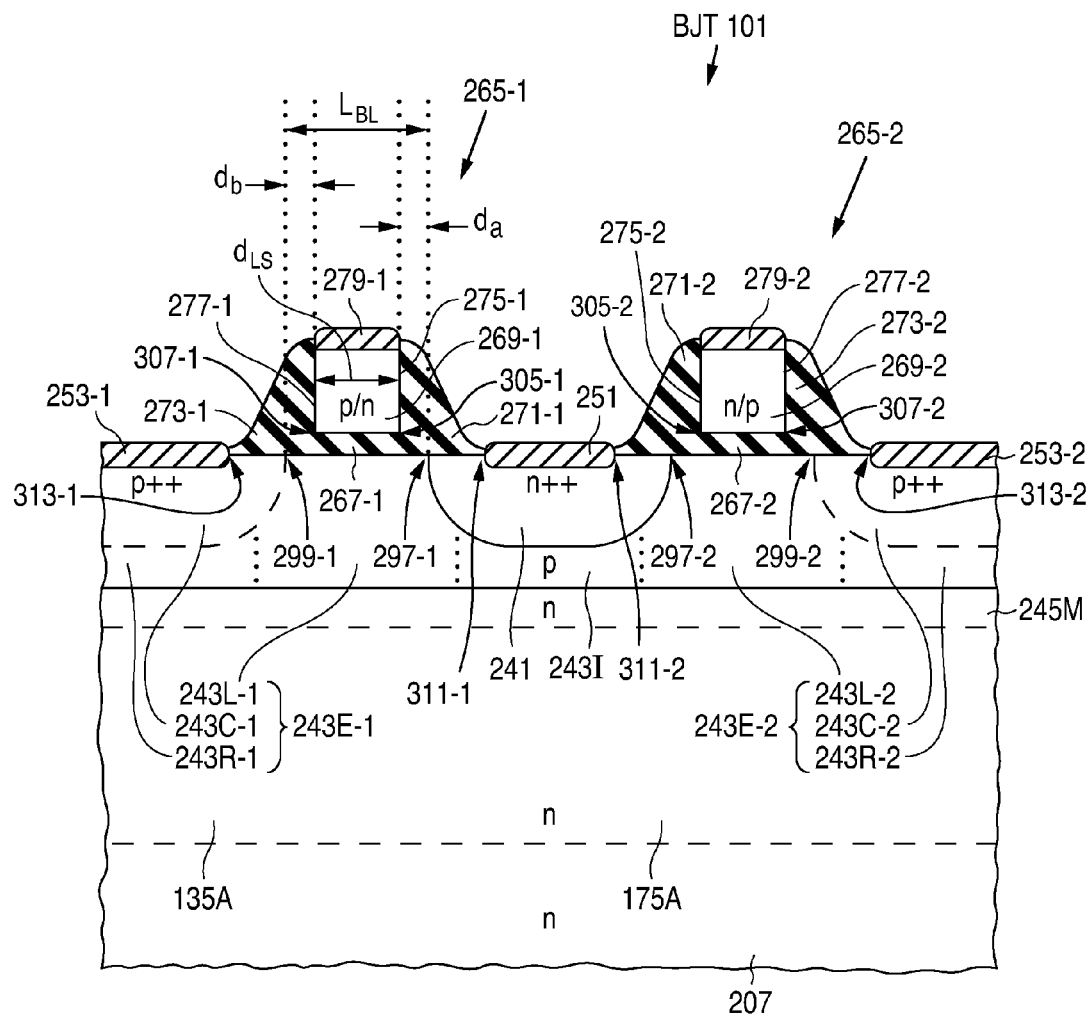
FIG. 7 is an expanded front cross-sectional view of the core of the npn BJT of FIGS. 5.0 and 6.
Figure 8:
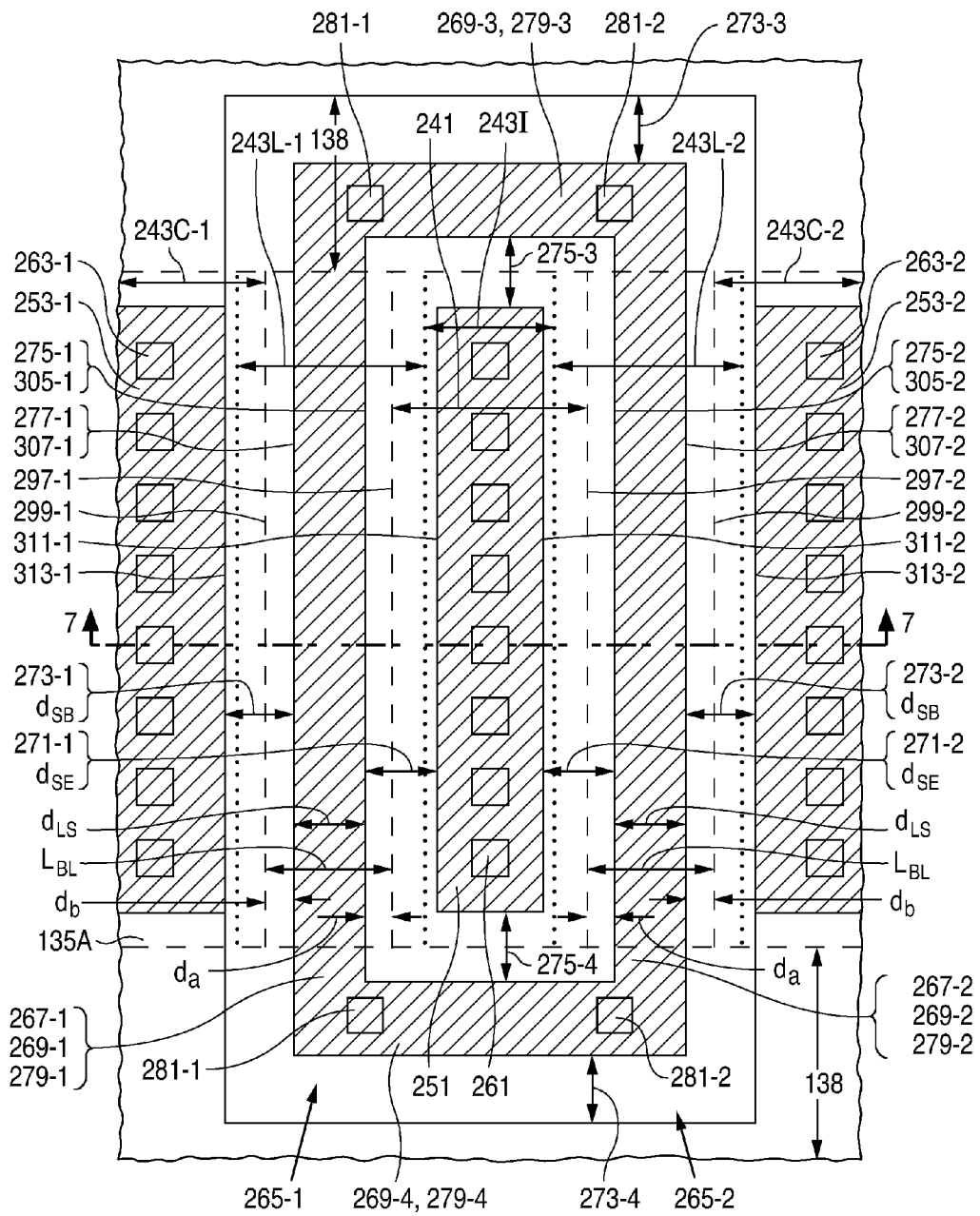
FIG. 8 is an exemplary top view of the portion of the npn BJT shown in FIG. 7. The cross section of FIG. 7 is taken through plane 7-7 in FIG. 8.

The internal structure of vertical BJTs 101 and 103 is now described in connection with FIGS. 5.0 and 6-8. FIG. 6 illustrates an extension of the complementary-BJT ("CBJT") structure of FIG. 5.0 to include one level of the overlying electrical interconnection system for BJTs 101 and 103. Beginning with npn BJT 101, an expanded view of the core of BJT 101 as depicted in FIGS. 5.0 and 6 is shown in FIG. 7. FIG. 8 illustrates a top view of an example of the core of BJT 101 shown in FIG. 7. The longitudinal direction for BJT 101 is the horizontal direction in FIGS. 5.0 and 6-8. The transverse direction for BJT 101 is the vertical direction in FIG. 8 and extends perpendicular to the plane of each of FIGS. 5.0, 6, and 7.

Npn BJT 101 consists of a very heavily doped n-type surface-adjoining emitter 241, a p-type base, and an n-type collector. N++ emitter 241 is situated in active semiconductor island 135A along the upper semiconductor surface. The p-type base and n-type collector of npn BJT 101 are, for convenience, respectively identified here by reference symbols 243 and 245 even though those two reference symbols do not appear in the drawings. P-type base 243 is situated in island 135A and extends between n++ emitter 241 and n-type collector 245.

P-type base 243 consists of a moderately doped intrinsic base portion 243I and an extrinsic base portion constituted with a first extrinsic base portion 243E-1 and a second extrinsic base portion 243E-2. In describing npn BJT 101, the notations "-1" and "-2" at the ends of reference symbols indicate items respectively associated with extrinsic base portions 243E-1 and 243E-2. First extrinsic base portion 243E-1 is formed primarily with a moderately doped first base link portion 243L-1 and a very heavily doped surface-adjoining first base contact portion 243C-1. Second extrinsic base portion 243E-2 is similarly formed primarily with a moderately doped second base link portion 243L-2 and a very heavily doped surface-adjoining second base contact portion 243C-2.

The lateral boundaries between p-type base portions 243I, 243L-1, 243C-1, 243L-2, and 243C-2 are generally indicated in dotted line in FIGS. 5.0 and 6-8. P intrinsic base portion 243I and p base link portions 243L-1 and 243L-2 are vertically curved and, as described below, formed with the same fabrication steps. P++ base contact portions 243C-1 and 243C2 are likewise vertically curved and, as described below, formed with the same fabrication steps. Consequently, the lateral boundaries between base portions 243I, 243L-1, 243C-1, 243L-2, and 243C-2 are somewhat imprecise.

N++ emitter 241 and P base portions 243I, 243L-1, and 243L-2 are generally shaped like rectangles in the top-view example of FIG. 8. The short sides of each such emitter or base rectangle meet field-insulation region 138. P intrinsic base portion 243I is formed by base material that vertically underlies n++ emitter 241 down to collector 245. The minimum distance between emitter 241 and collector 245 occurs in intrinsic base portion 243I and constitutes the base thickness.

P++ base contact portions 243C-1 and 243C-2 extend to the upper semiconductor surface on opposite sides of n++ emitter 241 and p intrinsic base portion 241I. Base contact portions 243C-1 and 243C-2 are also laterally bounded by field insulation 138. P first base link portion 243L-1 extends from intrinsic base portion 243I to first base contact portion 243C-1 on one side of intrinsic base portion 243I. P second base link portion 243L-2 similarly extends from intrinsic base portion 243I to second base contact portion 243C-2 on the opposite side of intrinsic base portion 243I. Consequently, emitter 241 is separated from base contact portion 243C-1 or 243C-2 by base link portion 243L-1 or 243L-2.

In an alternative embodiment, p base link portions 243L-1 and 243L2 are connected together outside the plane of each of FIGS. 5.0, 6, and 7 so as to form a single p base link portion. The connection of base link portions 243L-1 and 243L2 typically occurs both in front of, and behind, the plane of each of FIGS. 5.0, 6, and 7. The single base link portion then laterally surrounds both n++ emitter 241 and p intrinsic base portion 243I. When base link portions 243L-1 and 243L-2 are connected together outside the plane of each of FIGS. 5.0, 6, and 7, p++ base contact portions 243C-1 and 243C-2 similarly are normally connected together outside the plane of each of FIGS. 5.0, 6, and 7 to form a single base contact portion. The connection of base contact portions 243C-1 and 243C-2 likewise typically occurs both in front of, and behind, the plane of each of FIGS. 5.0, 6, and 7. This enables the single base contact portion to laterally surround the single base link portion.

First extrinsic base portion 243E-1 further includes a moderately doped first remaining base portion 243R-1. Second extrinsic base portion 243E-2 similarly further includes a moderately doped second remaining base portion 243R-2. P remaining base portions 243R-1 and 243R-2 respectively underlie base contact portions 243C-1 and 243C-2. As a result, remaining base portions 243R-1 and 243R-2 do not appear in the top view of FIG. 8.

N-type collector 245 consists of a moderately doped main collector portion 245M, a moderately doped lateral collector portion 245L, and a collector plug formed with a moderately doped intermediate collector portion 245I, and a very heavily doped surface-adjoining collector contact portion 245C. N main collector portion 245M is situated in active semiconductor island 135A directly below p-type base 243 and is laterally bounded by field insulation 138. N++ collector contact portion 245C is situated in active semiconductor island 135B along the upper semiconductor surface and is laterally bounded by field insulation 138. N intermediate collector plug portion 245I is situated in island 135B directly below collector contact portion 245C and is likewise laterally bounded by field insulation 138.

N lateral collector portion 245L consists of deep n collector well 207 and shallow n collector well regions 175A and 175B that merge together below field insulation 138. N collector well regions 175A and 175B respectively extend into islands 135A and 135B to respectively merge with main collector portion 245M and intermediate collector portion 245I. This enables the combination of intermediate collector portion 245I and lateral collector portion 245L to serve as a collector link for connecting n main collector portion 245M in island 135A to n++ collector contact portion in island 135B by way of an electrical path below field insulation 138.

Metal silicide layers 251, 253-1, 253-2, and 255 are respectively situated along the tops of n++ emitter 241, p++ base contact portions 243C-1 and 243C-2, and n++ collector contact portion 245C. Silicide layers 251, 253-1, 253-2, and 255 are indicated by slanted shading in FIG. 8. In the case where base contact portions 243C-1 and 243C-2 merge together outside the plane of each of FIGS. 5.0, 6, and 7, base silicide layers 253-1 and 253-2 along the tops of base contact portions 243C-1 and 243C-2 merge together outside the plane of each of FIGS. 5.0, 6, and 7 to form a single base metal silicide layer. Squares 261, 263-1, and 263-2 in FIG. 8 indicate locations for external electrical contacts respectively to silicide layers 251, 253-1, and 253-2.

A first spacing structure 265-1 is situated on the upper semiconductor surface directly above p first base link portion 243L-1 and adjoining parts of n++ emitter 241 and p++ first base contact portion 243C-1. A second spacing structure 265-2 is similarly situated on the upper semiconductor surface directly above p second base link portion 243L-2 and adjoining parts of n++ emitter 241 and p++ second base contact portion 243C-2. Spacing structures 265-1 and 265-2 typically have largely identical cross sections along the plane of FIGS. 5.0, 6, and 7 or along any plane extending through emitter 241 and base 243 parallel to the plane of FIGS. 5.0, 6, and 7. When base contact portions 243C-1 and 243C2 merge together outside the plane of each of FIGS. 5.0, 6, and 7, spacing structures 265-1 and 265-2 merge together outside the plane of each of FIGS. 5.0, 6, and 7 to form a single spacing structure.

Each spacing structure 265-1 or 265-2 consists of an isolating dielectric layer 267-1 or 267-2 and a spacing component formed with a lateral spacing portion 269-1 or 269-2, a first isolating dielectric spacer 271-1 or 271-2, and a second isolating dielectric spacer 273-1 or 273-2. Isolating dielectric layer 267-1 or 267-2, whose thickness is of high gate-dielectric thickness value $t_{GdH}$, lies on the upper semiconductor surface directly above base link portion 243L-1 or 243L-2. Lateral spacing portion 269-1 or 269-2 lies on dielectric layer 267-1 or 267-2.

Isolating dielectric layer 267-1 or 267-2 is laterally coextensive with lateral spacing portion 269-1 or 269-2. As used here in a situation where one region overlies another region, a description of the regions as being "laterally coextensive" means that the lateral boundaries of the two regions are identical as viewed perpendicular to a lateral plane for the two regions. The plane of FIG. 8 is a lateral plane for dielectric layer 267-1 or 267-2 and spacing portion 269-1 or 269-2. Hence, the lateral boundary of dielectric layer 267-1 or 267-2 in FIG. 8 is identical to the lateral boundary of spacing portion 269-1 or 269-2 in FIG. 8.

Lateral spacing portions 269-1 and 269-2 normally consist largely of doped non-monocrystalline silicon ("non-monosilicon"), preferably doped polysilicon. The doping in each non-monosilicon lateral spacing portion 269-1 or 269-2 can be totally net n-type, totally net p-type, or net n-type in at least one part and net p-type in at least one other part. Lateral spacing portions 269-1 and 269-2 can alternatively be formed partially or wholly with other doped non-monosilicon such as doped amorphous silicon or doped multicrystalline silicon. For simplicity, spacing portions 269-1 and 269-2 and other doped non-monosilicon regions preferably formed with doped polysilicon are generally described below as polysilicon regions.

Each polysilicon lateral spacing portion 269-1 or 269-2 is normally shaped like a bar as viewed perpendicular to the upper semiconductor surface—see FIG. 8—and has a pair of opposite transverse lateral sides 275-1 and 277-1 or 275-2 and 277-2. Transverse sides 275-1 and 277-1 of spacing portion 269-1 typically extend largely parallel to each other as indicated in the example of FIG. 8. Transverse sides 275-2 and 277-2 of spacing portion 269-2 likewise typically extend largely parallel to each other as also indicated in the example of FIG. 8. Sides 275-1 and 275-2 are often referred to as emitter-side transverse sides because they are closer to emitter 241 than are sides 277-1 and 277-2. Similarly, sides 277-1 and 277-2 are often referred to as base-contact-side transverse sides because they are respectively closer to base contact portions 243C-1 and 243C-2 than are emitter-side sides 275-1 and 275-2.

Isolating dielectric spacer 271-1 or 271-2, often referred to as an emitter-side isolating dielectric spacer, is situated along emitter-side transverse side 275-1 or 275-2 of lateral spacing portion 269-1 or 269-2 so as to overlie part of base link portion 243L-1 or 243L-2 and part of emitter 241. Isolating dielectric spacer 273-1 or 273-2, often referred to as a base-contact-side isolating dielectric spacer, is situated along base-contact-side transverse side 277-1 or 277-2 of lateral spacing portion 269-1 or 269-2 so as to overlie part of base link portion 243L-1 or 243L-2 and part of base contact portion 243C-1 or 243C-2. Emitter-side isolating dielectric spacer 271-1 or 271-2 and base-contact-side isolating dielectric spacer 273-1 or 273-2 typically have largely identical cross sections along the plane of FIG. 5.0, 6, or 7 or along any plane extending through emitter 241 and base 243 parallel to the plane of FIG. 5.0, 6, or 7. Dielectric spacers 271-1 and 273-1 or 271-2 and 273-2 merge into isolating dielectric layer 267-1 or 267-2.

A metal silicide layer 279-1 or 279-2, which may be considered part of spacing structure 265-1 or 265-2, is situated on top of polysilicon lateral spacing portion 269-1 or 269-2. Metal silicide layers 279-1 and 279-2 are indicated by slanted shading in FIG. 8. Silicide layer 279-1 or 279-2 is largely laterally coextensive with lateral spacing portion 269-1 or 269-2. Since isolating dielectric layer 267-1 or 267-2 is laterally coextensive with spacing portion 269-1 or 269-2, the slanted shading used to indicate the lateral extent of silicide layer 279-1 or 279-2 in FIG. 8 also largely indicates the lateral extents of spacing portion 269-1 or 269-2 and dielectric layer 267-1 or 267-2 in FIG. 8. As further indicated by the slanted shading used for silicide layer 279-1 or 279-2 in the example of FIG. 8, spacing portion 269-1 or 269-2 and silicide layer 279-1 or 279-2 typically extend laterally beyond active semiconductor island 135A so as to partially overlie field-insulation region 138.

The doping in polysilicon lateral spacing portions 269-1 and 269-2 normally causes them to be significantly electrically conductive. Spacing portion 269-1 or 269-2 and overlying metal silicide layer 279-1 or 279-2 form an electrical conductor that carries an electrical potential (voltage). Electrical conductors 269-1/279-1 and 269-2/279-2 are very close to the semiconductor regions of npn BJT 101.

Variation in the potentials of electrical conductors 269-1/279-1 and 269-2/279-2 during the operation of npn BJT 101 could detrimentally affect its performance. For this reason, a reference voltage is provided from a voltage supply (not shown) to silicide layers 279-1 and 279-2. The reference voltage is transmitted through silicide layer 279-1 or 279-2 to spacing portion 269-1 or 269-2 so as to maintain conductor 269-1/279-1 or 269-2/279-2 substantially at the reference voltage during BJT operation. This largely prevents such damage to the performance of BJT 101. Squares 281-1 and 281-2 in FIG. 8 indicate locations for electrical contacts where respective silicide layers 279-1 and 279-2 receive the reference voltage.

Lateral spacing portions 269-1 and 269-2 may be connected together outside the plane of FIG. 5.0, 6, or 7 to form a continuous strip of doped polysilicon. In that event, metal silicide layers 279-1 and 279-2 are normally likewise connected together outside the plane of FIG. 5.0, 6, or 7 to form a continuous strip of metal silicide. FIG. 8 illustrates such an arrangement in which the ends of spacing portions 269-1 and 269-2 are connected together by a pair of doped polysilicon interconnection portions 269-3 and 269-4 to form a generally rectangular polysilicon annulus. The ends of silicide layers 279-1 and 279-2 are then connected together by a pair of metal silicide interconnection layers 279-3 and 279-4 to form a generally rectangular metal silicide annulus which overlies, and is largely laterally coextensive with, the polysilicon annulus formed with lateral spacing portions 269-1 and 269-2 and interconnection portions 269-3 and 269-4.

Either of polysilicon interconnection portions 269-3 or 269-4 may be deleted along with the corresponding one of metal silicide interconnection layers 279-3 and 279-4. In that case, the continuous polysilicon strip formed by lateral spacing portions 269-1 and 269-2 and remaining interconnection layer 269-3 or 269-4 appears generally in the shape of a "U" as viewed perpendicular to the upper semiconductor surface. The overlying continuous metal silicide strip formed with silicide layers 279-1 and 279-2 and remaining silicide interconnection layer 279-3 or 279-4 likewise appears generally in the shape of a "U" as viewed perpendicular to the upper semiconductor surface.

When lateral spacing portions 269-1 and 269-2 are connected together to form a continuous polysilicon strip, emitter-side isolating dielectric spacers 271-1 and 271-2 are normally similarly connected together by dielectric spacing material situated along one side of the doped polysilicon that connects lateral spacing portions 269-1 and 269-2 while base-contact-side isolating dielectric spacers 273-1 and 273-2 are connected together by dielectric spacing material situated along the other side of the interconnecting doped polysilicon. This arrangement is also indicated in FIG. 8 where the ends of emitter-side dielectric spacers 271-1 and 271-2 are connected together by a pair of interconnection dielectric spacers 271-3 and 271-4 to form a generally rectangular annular dielectric spacer. The ends of base-contact-side dielectric spacers 273-1 and 273-2 are similarly connected together by a pair of interconnection dielectric spacers 273-3 and 273-4 to form a generally rectangular annular larger dielectric spacer.

If either of polysilicon interconnection portions 269-3 or 269-4 is deleted, the resultant continuous dielectric spacer strip formed by emitter-side isolating dielectric spacers 271-1 and 271-2 and remaining interconnection dielectric spacer 271-3 or 271-4 appears generally in the shape of a "U" as viewed perpendicular to the upper semiconductor surface. The resultant continuous dielectric spacer strip formed by base-contact-side isolating dielectric spacers 273-1 and 273-2 and remaining interconnection dielectric spacer 273-3 or 273-4 similarly appears generally in the shape of a larger "U" as viewed perpendicular to the upper semiconductor surface.

Referring particularly to FIG. 6, the electrical interconnection system for BJTs 101 and 103 includes a thick first-level dielectric layer 285 situated on top of the structure of FIG. 5.0. First-level dielectric layer 285, which typically consists of multiple sublayers (not separately demarcated), specifically lies on metal silicide layers 251, 253-1, 253-2, 255, 279-1, and 279-2 and on isolating dielectric spacers 271-1, 271-2, 273-1, and 273-2 for npn BJT 101. The upper surface of dielectric layer 285 is largely planar.

An emitter electrode 287 has fingers which extend through vertical openings in first-level dielectric layer 285 to contact emitter silicide layer 251 at contact locations 261 shown in FIG. 8. A base electrode 289 has fingers which extend through vertical openings in dielectric layer 285 to contact base silicide layers 253-1 and 253-2 at contact locations 263-1 and 263-2 depicted in FIG. 8. A collector electrode 291 has fingers which extend through vertical openings in dielectric layer 285 to contact collector silicide layer 255. A lateral-spacing-portion electrode (not shown) has fingers which extend through vertical openings in dielectric layer 285 to contact lateral-spacing-portion silicide layers 279-1 and 279-2 at contact locations 281-1 and 281-2 for providing silicide layers 279-1 and 279-2 with the reference voltage for lateral spacing portions 269-1 and 269-2.

Emitter electrode 287, base electrode 289, collector electrode 291, and the lateral-spacing-portion electrode may consist of metal, typically largely aluminum, or/and doped non-monosilicon, normally largely doped polysilicon. One or more additional electrical interconnection layers are normally situated over the first-level interconnection layer formed with first-level dielectric layer 285, electrodes 287, 289, and 291, and the lateral-spacing-portion electrode.

D2. Control of Base-Link Length in Npn Transistor

Base link portion 243L-1 or 243L-2 has opposite upper transverse edges 297-1 and 299-1 or 297-2 and 299-2 along the upper semiconductor surface. Upper base-link transverse edges 297-1 and 297-2 are sometimes referred to as emitter-side upper edges because they also constitute upper transverse edges of emitter 241. Upper base-link transverse edges 299-1 and 299-2 are sometimes referred to as base-contact-side upper edges because they also respectively constitute upper transverse edges of base contact portions 243C-1 and 243C-2. Base-link length $L_{BL}$ taken along the upper semiconductor surface is the lateral distance between (i) emitter-side upper edge 297-1 or 297-2 of base link portion 243L-1 or 243L-2 and (ii) base-contact-side upper edge 299-1 or 299-2 of base link portion 243L-1 or 243L-2. In the example of FIGS. 5.0 and 6-8, base-link length $L_{BL}$ is measured in the longitudinal (horizontal) direction.

Transverse sides 275-1 and 277-1 or 275-2 and 277-2 of polysilicon lateral spacing portion 269-1 or 269-2 respectively terminate along the bottom of spacing portion 269-1 or 269-2 in opposite lower transverse edges 305-1 and 307-1 or 305-2 or 307-2. Lower spacing-portion transverse edges 305-1 and 305-2 are often referred to as emitter-side lower edges because they are closer to emitter 241 than are lower spacer-portion edges 307-1 and 307-2. Similarly, lower spacing-portion transverse edges 307-1 and 307-2 are often referred to as base-contact-side lower edges because they are respectively closer to base contact portions 243C-1 and 243C-2 than are emitter-side lower spacer-portion edges 305-1 and 305-2. Item $d_{LS}$ is the lateral distance between (a) emitter-side lower edge 305-1 or 305-2 of spacing portion 269-1 or 269-2 and (b) base-contact-side lower edge 307-1 or 307-2 of spacing portion 269-1 or 269-2 in the direction of base-link length $L_{BL}$. Lateral distance $d_{LS}$ is largely the dimension of spacing portion 269-1 or 269-2.

Emitter-side isolating dielectric spacer 271-1 or 271-2 has a lower transverse edge 311-1 or 311-2 along the upper semiconductor surface. Lower dielectric-spacer transverse edges 311-1 and 311-2 are often referred to as remote emitter-side lower edges because (i) they are respectively spaced apart (remote) from lateral spacing portions 269-1 and 269-2 and (ii) they extend along emitter 241. Base-contact-side isolating dielectric spacer 273-1 or 273-2 similarly has a lower transverse edge 313-1 or 313-2 along the upper semiconductor surface. Lower dielectric-spacer transverse edges 313-1 and 313-2 are often referred to as remote base-contact-side lower edges because (i) they are respectively spaced apart from lateral spacing portions 269-1 and 269-2 and (ii) they respectively extend along base contact portions 243C-1 and 243C-2.

Emitter-side spacer thickness $d_{SE}$ is the dimension of emitter-side isolating dielectric spacer 271-1 or 271-2 along the upper semiconductor surface in the direction of base-link length $L_{BL}$. Base-contact-side spacer thickness $d_{SB}$ is the dimension of base-contact-side isolating dielectric spacer 273-1 or 273-2 along the upper semiconductor surface in the direction of base-link length $L_{BL}$. Dielectric-spacer thicknesses $d_{SE}$ and $d_{SB}$ are indicated only in FIG. 8.

The side of emitter-side spacer 271-1 or 271-2 adjoining lateral spacing portion 269-1 includes its emitter-side transverse edge 305-1 or 305-2. Consequently, emitter-side spacer thickness $d_{SE}$ is the lateral distance from emitter-side edge 305-1 or 305-2 of spacing portion 269-1 or 269-2 to remote emitter-side transverse edge 311-1 or 311-2 of emitter-side spacer 271-1 or 271-2. Inasmuch as the side of base-contact-side spacer 273-1 or 273-2 adjoining lateral spacing portion 269-1 similarly includes its base-contact-side transverse edge 307-1 or 307-2, base-contact-side spacer thickness $d_{SB}$ is the lateral distance from base-contact-side edge 307-1 or 307-2 of spacing portion 269-1 or 269-2 to remote base-contact-side transverse edge 313-1 or 313-2 of base-contact-side spacer 273-1 or 273-2.

Item $d_a$ is the lateral distance, or spacing, between (i) emitter-side upper transverse edge 297-1 or 297-2 of base link portion 243L-1 or 243L-2 and (ii) emitter-side lower transverse edge 305-1 or 305-2 of lateral spacing portion 269-1 or 269-2 in the direction of base-link length $L_{BL}$. Item $d_b$ is the lateral distance, or spacing, between (i) base-contact-side upper transverse edge 299-1 or 299-2 of base link portion 243L-1 or 243L-2 and (ii) base-contact-side lower transverse edge 307-1 or 307-2 of spacing portion 269-1 or 269-2 in the direction of base-link length $L_{BL}$. As indicated in FIG. 7, base-link length $L_{BL}$ is the sum of lateral spacing-portion dimension $d_{LS}$ and lateral distances $d_a$ and $d_b$.

As described further below, isolating dielectric spacers 271-1, 271-2, 273-2, and 273-2 are formed in such a way that (i) remote emitter-side lower transverse edges 311-1 and 311-2 of emitter-side spacers 271-1 and 271-2 are respectively largely self-aligned to emitter-side lower transverse edges 305-1 and 305-2 of lateral spacing portions 269-1 and 269-2 and (ii) remote base-contact-side lower transverse edges 313-1 and 313-2 of base-contact-side spacers 273-1 and 273-2 are respectively largely self-aligned to base-contact-side lower transverse edges 307-1 and 307-2 of lateral spacing portions 269-1 and 269-2. This enables (i) remote emitter-side lower dielectric-spacer edges 297-1 and 297-2 to respectively largely conform laterally to emitter-side lower spacing-portion edges 305-1 and 305-2 and (ii) remote base-contact-side lower dielectric-spacer edges 299-1 and 299-2 to respectively largely conform laterally to base-contact-side lower spacing-portion edges 307-1 and 307-2.

N++ emitter 241 is formed in the below-described manner so that their upper emitter transverse edges respectively constituted by emitter-side upper transverse edges 297-1 and 297-2 of base link portions 243L-1 and 243L-2 are respectively self-aligned to remote emitter-side lower transverse edges 311-1 and 311-2 of emitter-side isolating dielectric spacers 271-1 and 271-2. As a result, emitter-side upper base-link edges 297-1 and 297-2 respectively largely conform laterally to remote emitter-side lower dielectric-spacer edges 311-1 and 311-2.

P++ base contact portions 243C-1 and 243C-2 are similarly formed so that their upper base-contact-side transverse edges respectively constituted by base-contact-side upper transverse edges 299-1 and 299-2 of base link portions 243L-1 and 243L-2 are respectively self-aligned to remote base-contact-side lower transverse edges 313-1 and 313-2 of emitter-side isolating dielectric spacers 271-1 and 271-2. Base-contact-side upper base-link edges 299-1 and 299-2 thus respectively largely conform laterally to remote base-contact-side lower dielectric-spacer edges 313-1 and 313-2.

The net result of the foregoing geometrical relationships resulting from the fabrication of npn BJT 101 is that (i) lateral distance $d_a$ from emitter-side upper transverse edge 297-1 or 297-2 of base link portion 243L-1 or 243L-2 to emitter-side lower transverse edge 305-1 or 305-2 of lateral spacing portion 269-1 or 269-2 is largely constant and (ii) lateral distance $d_b$ from base-contact-side upper transverse edge 299-1 or 299-2 of base link portion 243L-1 or 243L-2 to base-contact-side lower transverse edge 307-1 or 307-2 of spacing portion 269-1 or 269-2 is also largely constant. The constancy of emitter-side lateral distance $d_a$ and base-contact-side lateral distance $d_b$ is illustrated in FIG. 8. Accordingly, emitter-side upper edge 297-1 or 297-2 of base link portion 243L-1 or 243L-2 largely conforms laterally to emitter-side lower edge 305-1 or 305-2 of spacing portion 269-1 or 269-2. Also, base-contact-side upper edge 299-1 or 299-2 of base link portion 243L-1 or 243L-2 largely conforms laterally to base-contact-side lower edge 307-1 or 307-2 of spacing portion 269-1 or 269-2.

Inasmuch as (a) emitter-side lateral distance $d_a$ and base-contact-side lateral distance $d_b$ are respectively largely constant and (b) base-link length $L_{BL}$ is the sum of lateral spacing-portion dimension $d_{LS}$ and lateral distances $d_a$ and $d_b$, controlling lateral dimension $d_{LS}$ of lateral spacing portion 269-1 or 269-2 controls base-link length $L_{BL}$ of base link portion 243L-1 or 243L-2. A positive or negative change (increase or decrease) in lateral spacing-portion dimension $d_{LS}$ produces a corresponding positive or negative change in base-link length $L_{BL}$. The change in base-link length $L_{BL}$ largely equals the change in lateral spacing-portion dimension $d_{LS}$ at constant dielectric-spacer thicknesses $d_{SE}$ and $d_{SB}$. Accordingly, base-link length $L_{BL}$ of base link portion 243L-1 or 243L-2 is controlled by lateral spacing portion 269-1 or 269-2.

As described below, lateral dimension $d_{LS}$ of polysilicon lateral spacing portion 269-1 or 269-2 is defined by a critical photoresist masking step also used in defining polysilicon gate electrodes for the illustrated IGFETs. The lateral shapes of the polysilicon gate electrodes, especially their lengths, of the illustrated IGFETs need to be controlled well for the illustrated IGFETs to operate properly. The photoresist mask used in defining the gate electrodes is therefore created in a critical manner according to tight alignment tolerances so as to achieve the requisite shapes for the gate electrodes. Since lateral spacing portions 269-1 and 269-2 are also defined by this critically controlled photoresist mask, the control on lateral dimension $d_{LS}$ of polysilicon lateral spacing portion 269-1 or 269-2 is inherently highly accurate without imposing any further control requirement on the fabrication of npn BJT 101.

Changing emitter-side dielectric-spacer thickness $d_{SE}$ and base-contact-side dielectric spacer $d_{SB}$ normally respectively causes corresponding changes in emitter-side lateral distance $d_a$ and base-contact-side lateral distance $d_b$. This causes base-link length $L_{BL}$ to change. Length $L_{BL}$ of base link portion 243L-1 or 243L-2 is therefore also controlled by emitter-side isolating dielectric spacer 271-1 or 271-2 and base-contact-side dielectric spacer 273-1 or 273-2.

Isolating dielectric spacers 271-1, 271-2, 273-1, and 273-2 are, as described below, formed by a technique independent of photoresist masking. The control on spacer thicknesses $d_{SE}$ and $d_{SB}$ is normally very accurate. Since the control on lateral spacing-portion dimension $d_{LS}$ is also very accurate, the overall control on base-link length $L_{BL}$ is highly accurate. The ability to accurately repeat the characteristics of npn BJT 101 from fabrication lot to fabrication lot is significantly enhanced.

The tighter control on base-link length $L_{BL}$ of base link portion 243L-1 or 243L-2 enables the base resistance of npn BJT 101 to be reduced. The operating characteristics of BJT 101 are thereby further improved.

The largely constant values of emitter-side lateral distance $d_a$ and base-contact-side lateral distance $d_b$ are typically largely equal. Since base-link length $L_{BL}$ includes lateral distances $d_a$ and $d_b$, base-link length $L_{BL}$ is greater than lateral spacing-portion dimension $d_{LS}$. Upper transverse edges 297-1 and 299-2 or 297-2 and 299-2 of base link portion 243L-1 or 243L-1 are thus farther apart than lower transverse edges 305-1 and 307-2 or 305-2 and 307-2 of lateral spacing portion 269-1 or 269-2.

With npn BJT 101 arranged in a common-emitter configuration, BJT 101 turns on when its base-to-emitter voltage $V_{BE}$ reaches a threshold value $V_{BE0}$ of 0.5 V to 0.8 V, typically 0.6 V. Emitter electron current from the emitter electrode flows through emitter silicide layer 251 into n++ emitter 241 and splits into base electron current and collector electron current. The base electron current flows generally laterally through p base link portions 243L-1 and 243L-2 respectively to p++ base contact portions 243C-1 and 243C-2. The base electron current then generally flows vertically upward through base silicide layers 253-1 and 253-2 to the base electrode. The base hole current flows from base 243 to emitter 241.

The collector electron current, which is much greater than the base electron current, flows generally vertically downward through p intrinsic base portion 243I to main collector portion 245M. The collector electron current enters underlying collector well region 175A of n lateral collector portion 245L and flows laterally through it, especially through deep n collector well 207, to collector well region 175B of lateral collector portion 245L. The collector electron current then flows generally vertically upward through the collector plug formed with n intermediate collector portion 245I and n++ collector contact portion 245C and through collector silicide layer 255 to the collector electrode.

D3. Pnp Transistor

Pnp BJT 103 is configured basically the same as npn BJT 101 with the conductivity types reversed subject to the collector function of deep n well 107 in npn BJT 101 being provided by p– substrate 136 in pnp BJT 103. With reference to FIG. 5.0, pnp BJT 103 specifically consists of a very heavily doped p-type surface-adjoining emitter 321, an n-type base, and a p-type collector. P++ emitter 321 is situated in active semiconductor island 137A along the upper semiconductor surface. The n-type base and p-type collector of pnp BJT 103 are, for convenience, respectively identified here by reference symbols 323 and 325 even though those two reference symbols do not appear in the drawings. N-type base 323 is situated in island 137A and extends between p++ emitter 321 and p-type collector 325.

N-type base 323 consists of a moderately doped intrinsic base portion 323I and an extrinsic base portion constituted with a first extrinsic base portion 323E-1 and a second extrinsic base portion 323E-2. As with npn BJT 101, the notations "-1" and "-2" at the ends of reference symbols for pnp BJT 103 indicate items respectively associated with extrinsic base portions 323E-1 and 323E-2. First extrinsic base portion 323E-1 is formed with a moderately doped first base link portion 323L-1, a very heavily doped surface-adjoining first base contact portion 323C-1, and a moderately doped first remaining base portion 323R-1. Second extrinsic base portion 323E-2 is similarly formed with a moderately doped second base link portion 323L-2, a very heavily doped surface-adjoining second base contact portion 323C-2, and a moderately doped second remaining base portion 323R-2.

P-type collector 325 consists of a moderately doped main collector portion 325M, a moderately doped lateral collector portion 325L, and a collector plug formed with a moderately doped intermediate collector portion 325I, and a very heavily doped surface-adjoining collector contact portion 325C. P lateral collector portion 325L is formed with p– substrate 136 and p collector well regions 177A and 177B.

P++ emitter 321, n intrinsic base portion 323I, n base link portions 323L-1 and 323L-2, n++ base contact portions 323C-1 and 323C-2, n remaining base portions 323R-1 and 323R-2, p main collector portion 325M, p collector well regions 177A and 177B, p intermediate collector portion 325I, and p++ collector contact portion 325C of pnp BJT 103 are configured respectively substantially the same and arranged respectively substantially the same relative to one another and relative to field-insulation region 138 and active semiconductor islands 137A and 137B of pnp BJT 103 as identically named, except for the conductivity type, components 241, 243I, 243L-1, 243L-2, 243C-1, 243C-2, 243R-1, 243R-2, 245M, 175A, 175B, 245I, and 245C of npn BJT 101 are configured and arranged relative to one another and relative to field insulation 138 and active semiconductor islands 135A and 135B of npn BJT 101. For n-type collector 325 of pnp BJT 103, p-substrate 136 replaces deep n collector well 207 in collector 245 of npn BJT 101 and is substantially arranged the same relative to shallow p collector well regions 177A and 177B as deep n collector well 207 is arranged relative to shallow n collector well regions 175A and 175B.

Metal silicide layers 331, 333-1, 333-2, and 335 are respectively situated along the tops of p++ emitter 321, n++ base contact portions 323C-1 and 323C-2, and collector contact portion 325C. Subject to the voltage and current polarities being reversed and subject to electrons and holes being reversed, components 321, 323 323I, 323L-1, 323L-2, 323C-1, 323C-2, 323R-1, 323R-2, 325, 325M, 325L, 177A, 177B, 136, 325I, 325C, 331, 333-1, 333-2, and 335 of pnp BJT 103 function and operate respectively substantially the same as components 241, 243, 243I, 243L-1, 243L-2, 243C-1, 243C-2, 243R-1, 243R-2, 245, 245M, 245L, 175A, 175B, 207, 245I, 245C, 251, 253-1, 253-2, and 255 of npn BJT 101.

A first spacing structure 345-1 is situated on the upper semiconductor surface directly above n first base link portion 323L-1 and adjoining parts of p++ emitter 321 and n++ first base contact portion 323C-1. A second spacing structure 345-2 is similarly situated on the upper semiconductor surface directly above n second base link portion 323L-2 and adjoining parts of p++ emitter 321 and n++ second base contact portion 323C-2. Each spacing structure 345-1 or 345-2 consists of an isolating dielectric layer 347-1 or 347-2 and a spacing component formed with a lateral spacing portion 349-1 or 349-2, a first isolating dielectric spacer 351-1 or 351-2, and a second isolating dielectric spacer 353-1 or 353-2. A metal silicide layer 359-1 or 359-2, which may be considered part of spacing structure 345-1 or 345-2, is situated on top of lateral spacing portion 349-1 or 349-2.

Lateral spacing portions 349-1 and 349-2 consist largely of doped non-monosilicon, preferably doped polysilicon. The doping in each non-monosilicon lateral spacing portion 349-1 or 349-2 can be totally net p-type, totally net n-type, or net p-type in at least one part and net n-type in at least one other part. Spacing portions 349-1 and 349-2 can alternatively be formed partially or wholly with other doped non-monosilicon such as doped amorphous silicon or doped multicrystalline silicon. For simplicity, spacing portions 349-1 and 349-2 are generally described below as polysilicon regions.

Isolating dielectric layers 347-1 and 347-2, polysilicon lateral spacing portions 349-1 and 349-2, first isolating dielectric spacers 351-1 and 351-2, second isolating dielectric spacers 353-1 and 353-2, and metal silicide layers 359-1 and 359-2 of pnp BJT 103 are configured respectively substantially the same and arranged respectively substantially the same relative to one another and relative to p++ emitter 321, n intrinsic base portion 323I, n base link portions 323L-1 and 323L-2, and n++ base contact portions 323C-1 and 323C-2 of pnp BJT 103, as identically named, except for the conductivity type, components 267-1, 267-2, 269-1, 269-2, 271-1, 271-2, 273-1, 273-2, 279-1, and 279-2 of npn BJT 101 are configured and arranged relative to one another and relative to components 241, 243I, 243L-1, 243L-2, 243C-1, and 243C-2 of npn BJT 101.

Referring again to FIG. 6, an emitter electrode 367 has fingers extending through vertical openings in first-level dielectric layer 285 to contact emitter silicide layer 331. A base electrode 369 has fingers extending through vertical openings in dielectric layer 285 to contact base silicide layers 333-1 and 333-2. A collector electrode 371 has fingers extending through vertical openings in dielectric layer 285 to contact collector silicide layer 335. A lateral-spacing-portion electrode (not shown) has fingers extending through vertical openings in dielectric layer 285 to contact lateral-spacing-portion silicide layers 359-1 and 359-2 for providing them with a reference voltage to maintain lateral spacing portions 349-1 and 349-2 at a largely constant electrical potential during BJT operation. This reference voltage is normally the same as the reference voltage for lateral spacing portions 269-1 and 269-2 and is thus provided by the same voltage source. Emitter electrode 367, base electrode 369, collector electrode 371, and the lateral-spacing-portion electrode are constituted substantially the same as electrodes 287, 289, and 291 and the lateral-spacing-portion electrode of npn BJT 101.

Polysilicon lateral spacing portions 349-1 and 349-2 of pnp BJT 103 are formed with the same steps, including the critical photoresist masking step used in defining the polysilicon gate electrodes for the illustrated IGFETs, as polysilicon lateral spacing portions 269-1 and 269-2 of npn BJT 101. Accordingly, the control on lateral dimension $d_{LS}$ of polysilicon lateral spacing portion 349-1 or 349-2 of pnp BJT 103 is inherently highly accurate due to the control imposed on the fabrication of the IGFET gate electrodes, especially their lengths, without imposing any further control requirement on the fabrication of pnp BJT 103.

Although not illustrated in any of the drawings, thickness $d_{SE}$ of emitter-side isolating dielectric spacers 351-1 and 351-2 of pnp BJT 103 and thickness $d_{SB}$ of base-contact-side isolating dielectric spacers 353-1 and 353-2 of BJT 103 are respectively defined in the same manner as spacer thicknesses $d_{SE}$ and $d_{SB}$ of npn BJT 101. Dielectric spacers 351-1, 351-2, 353-1, and 353-2 of pnp BJT 103 are formed with the same steps, and thus in the same way independent of photoresist masking, as isolating dielectric spacers 271-1, 271-2, 273-1, and 273-2 of npn BJT 101. The control on spacer thicknesses $d_{SE}$ and $d_{SB}$ of pnp BJT 103 is thus normally very accurate. Consequently, length $L_{BL}$ of base link portion 323-1 or 323-2 of pnp BJT 103 is controlled highly accurately in the same way that base-link length $L_{BL}$ is controlled for npn BJT 101.

With pnp BJT 103 arranged in a common-emitter configuration, BJT 103 turns on when its base-to-emitter voltage $V_{BE}$ reaches a threshold value $V_{BE0}$ of −0.5 V to −0.8 V, typically −0.6 V. Subject to the current and voltage polarities being reversed and subject to electrons and holes being reversed, pnp BJT 103 operates substantially the same as npn BJT 101.

D4. BJT Variations

Figure 9:
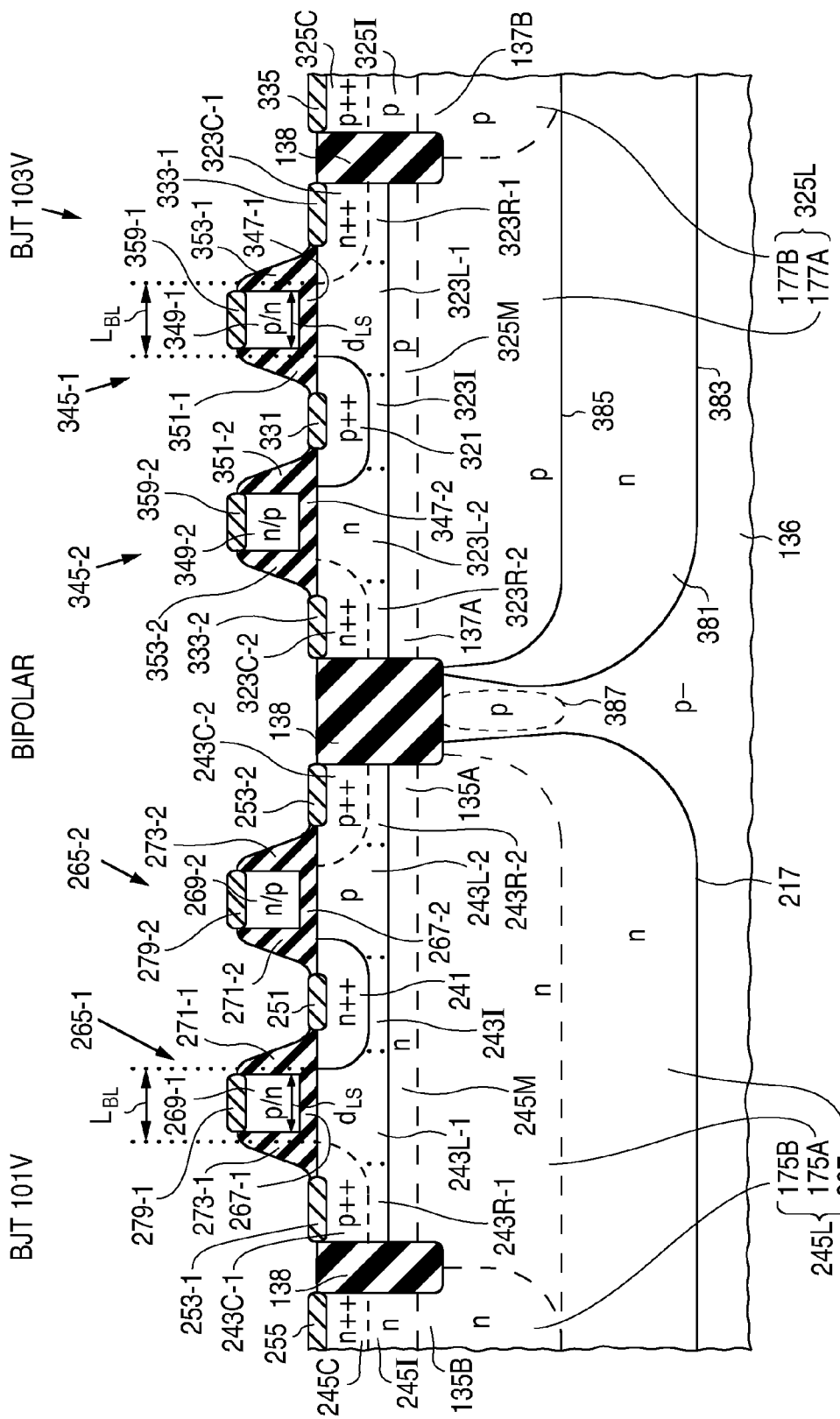
FIGS. 9 and 10 are respective front cross-sectional view of two pairs of variations of the complementary BJTs of FIG. 5.0.

FIG. 9 illustrates a CBJT semiconductor structure that contains a variation 103V of pnp BJT 103. The CBJT structure of FIG. 9 contains npn BJT 101 configured substantially the same as in the CBJT structure of FIG. 5.0. Pnp BJT 103V is configured the same as pnp BJT 103 except as described below.

For electrically isolating pnp BJT 103 from p-substrate region 136, the CBJT structure of FIG. 9 is provided with an isolating deep moderately doped n-type well 381 which surrounds p collector well regions 177A and 177B of BJT 103V up to field-insulation region 138. Isolating deep n well 381 forms one isolating pn junction 383 with p− substrate 136 and another isolating pn junction 385 with p collector well regions 177A and 177B. P lateral collector portion 325L of BJT 103V then consists solely of collector well regions 177A and 177B.

Isolating deep n well 381 for pnp BJT 103 is laterally spaced apart from deep n collector well 207 of npn BJT 101. In order to ensure that deep n wells 207 and 381 are electrically isolated from each other, an isolating moderately doped p-type well region 387 is provided between deep n wells 207 and 381. Isolating p well 387 is situated below field insulation 138 and extends to approximately the same depth as p collector well regions 177A and 177B.

Figure 10:
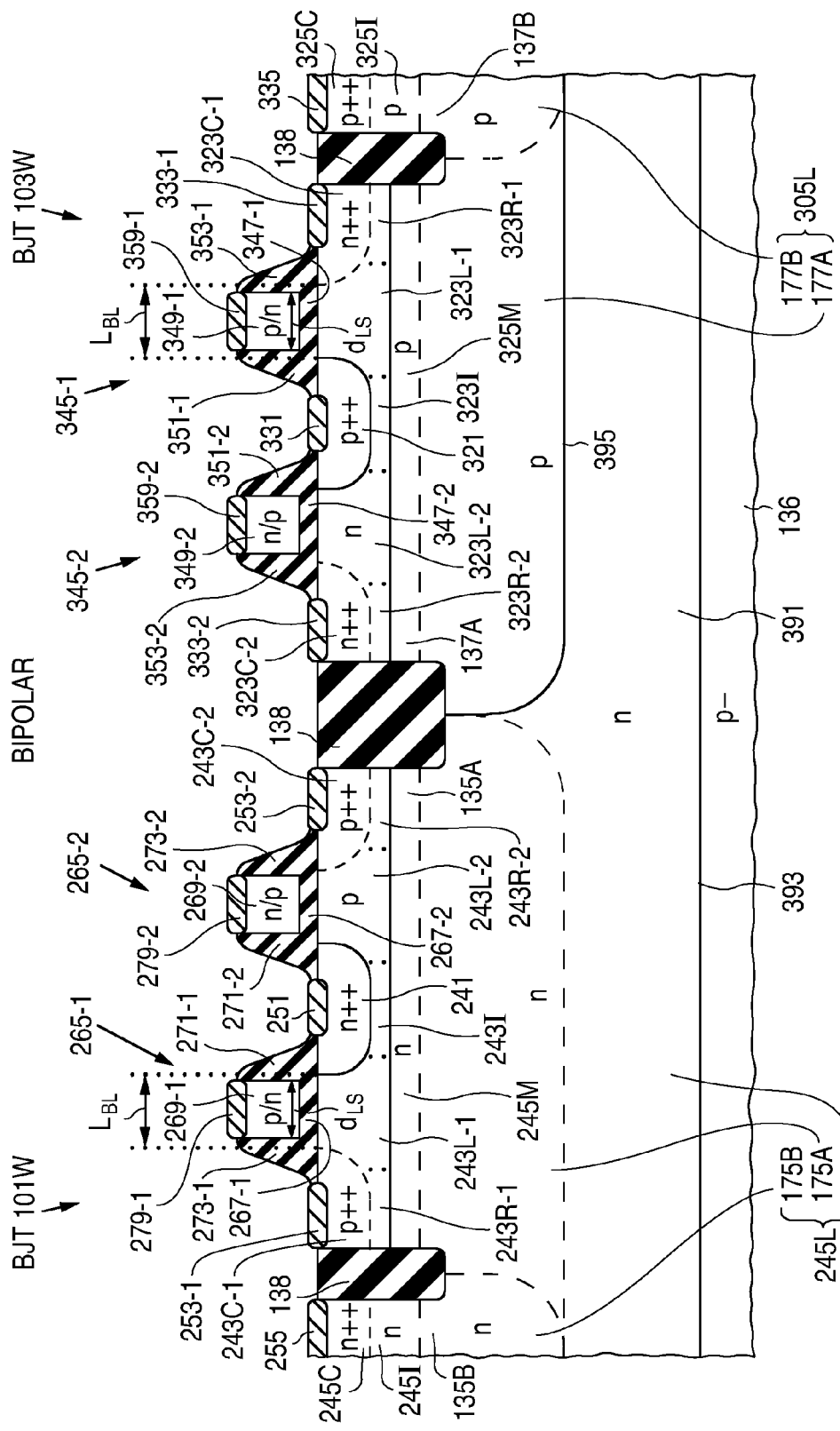

FIG. 10 illustrates a CBJT semiconductor structure that contains a variation 103W of pnp BJT 103. The CBJT structure of FIG. 10 also contains a variation 101W of npn BJT 101. Npn BJT 101W and pnp BJT 103W are configured respectively the same as BJTs 101 and 103 except as described below.

In the CBJT structure of FIG. 10, deep n collector well 207 of npn BJT 101 is replaced with a deep moderately doped n-type well 391 that also extends below p collector well regions 177A and 177B of BJT 103W. Deep n well 391 forms one isolating pn junction 393 with p− substrate 136 and another isolating pn junction 395 with p collector well regions 177A and 177B. As in pnp BJT 103V, p lateral collector portion 325L of pnp BJT 103W consists solely of collector well regions 177A and 177B. N lateral collector portion 345L of npn BJT 101W is now formed with collector well regions 175A and 175B and deep n well 391.

Npn BJT 101 in the CBJT structure of FIG. 9 and npn BJT 101W in the CBJT structure of FIG. 10 operate substantially the same as npn BJT 101 in the CBJT structure of FIGS. 5.0 and 6. Pnp BJT 103V in the CBJT structure of FIG. 9 and pnp BJT 103W in the CBJT structure of FIG. 10 operate the same as pnp BJT 103 in the CBJT structure of FIGS. 5.0 and 6 except that the lateral collector hole current only flows through p collector well regions 177A and 177B of each BJT 103V and 103W.

The CBJT structure of each of FIGS. 9 and 10 is fully compatible with the CBJT structure of FIGS. 5.0 and 6 and can be included in the CBJT/CIGFET structure of FIG. 5 as a substitute for, or in addition to, the CBJT structure of FIGS. 5.0 and 6. The CBJT structure of FIG. 9 or 10 can also be manufactured according to the CBJT/CIGFET semiconductor fabrication process of FIGS. 18a-18c, 18d.0-18w.0, 18d.1-18w.1, 18d.2-18w.2, and 18d.3-18w.3 for manufacturing the CBJT/CIGFET structure of FIG. 5. Base-link length $L_{BL}$ is accurately controlled in the CBJT structure of FIG. 9 or 10 in the same way as in the CBJT structure of FIGS. 5.0 and 6.

Figure 11:
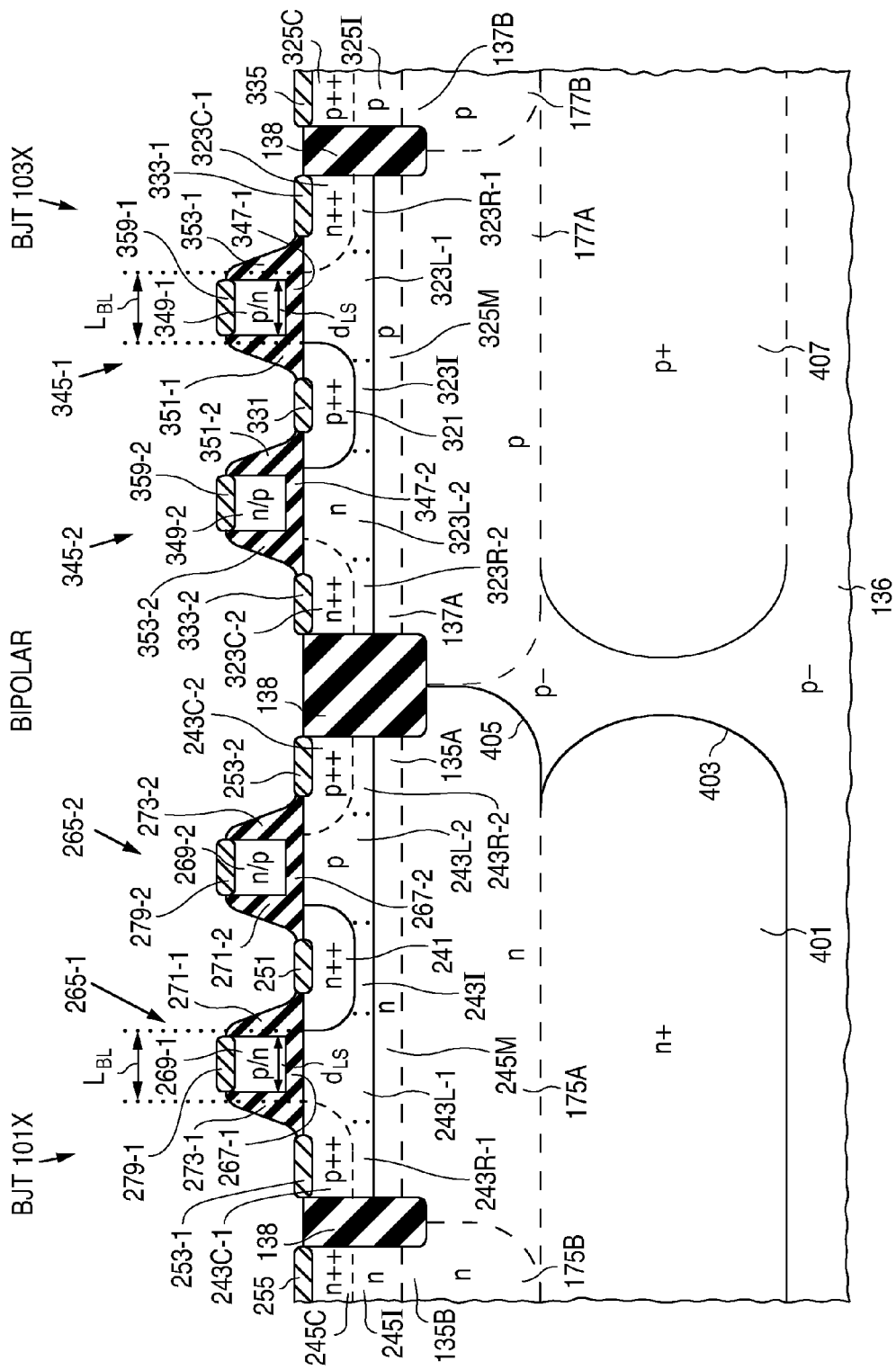
FIG. 11 is a front cross-sectional view of a pair of enhanced versions of the complementary BJTs of FIG. 5.0.
Figure 12:
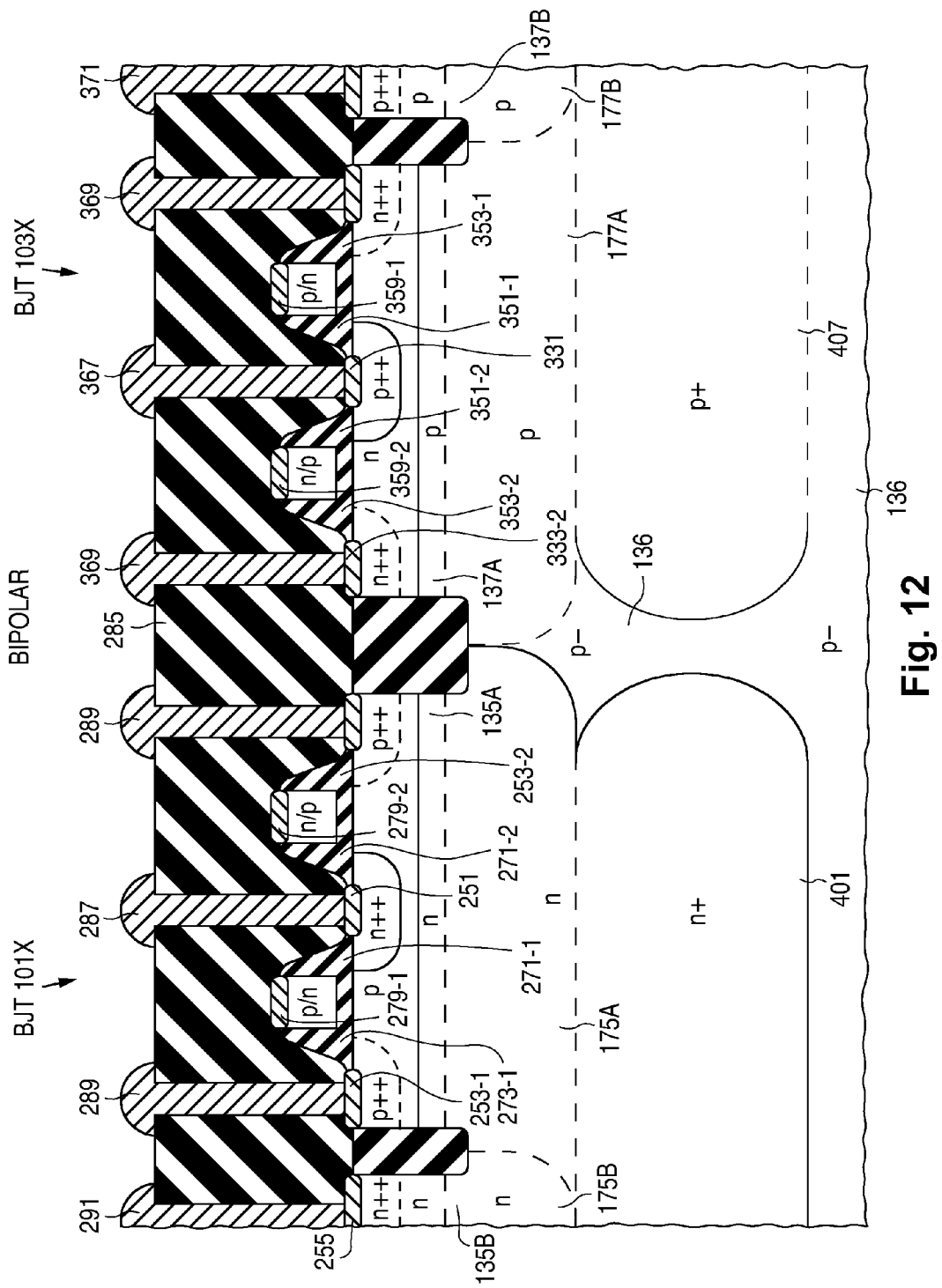
FIG. 12 is a front cross-sectional view of the complementary BJTs of FIG. 11 and one level of the overlying electrical interconnection system.

FIG. 11 illustrates a CBJT semiconductor structure containing variations 101X and 103x of npn BJT 101 and pnp BJT 103, respectively. An extension of the CBJT structure of FIG. 11 to include one level of the overlying electrical interconnection system for npn BJT 101X and pnp BJT 103x is depicted in FIG. 12. BJT 101X and BJT 103X are configured respectively the same as BJTs 101 and 103 except as described below.

A heavily doped n-type deep collector layer 401 extends along the bottoms of n collector wells 175A and 175B of npn BJT 101X as a replacement for deep n well 207 or 391. N+ deep collector layer 401 merges with n collector wells 175A and 175B to form an n-type lateral collector portion that replaces lateral collector portion 245L in npn BJT 101. N+ collector layer 415 forms an isolating pn junction 403 with p– substrate 411 and p– epitaxial substrate region 136. N collector wells 175A and 175B form an isolating pn junction 405 with p– substrate region 136.

A heavily doped p-type deep collector layer 407 similarly extends along the bottoms of p collector wells 177A and 177B of pnp BJT 103X. P+ deep collector layer 407 merges with p collector wells 177A and 177B to form a p-type lateral collector portion that replaces lateral collector portion 325L in pnp BJT 103. N+ deep collector layer 401 and p+ deep collector layer 407 are spaced laterally apart from each other.

Npn BJT 101X and pnp BJT 103X in the CBJT structure of FIGS. 11 and 12 respectively operate fundamentally the same as npn BJT 101 and pnp BJT 103 in the CBJT structure of FIGS. 5.0 and 6. The major operational difference is that deep collector layers 401 and 407 enable the collector current to travel faster in BJTs 101X and 103X.

Figure 13:
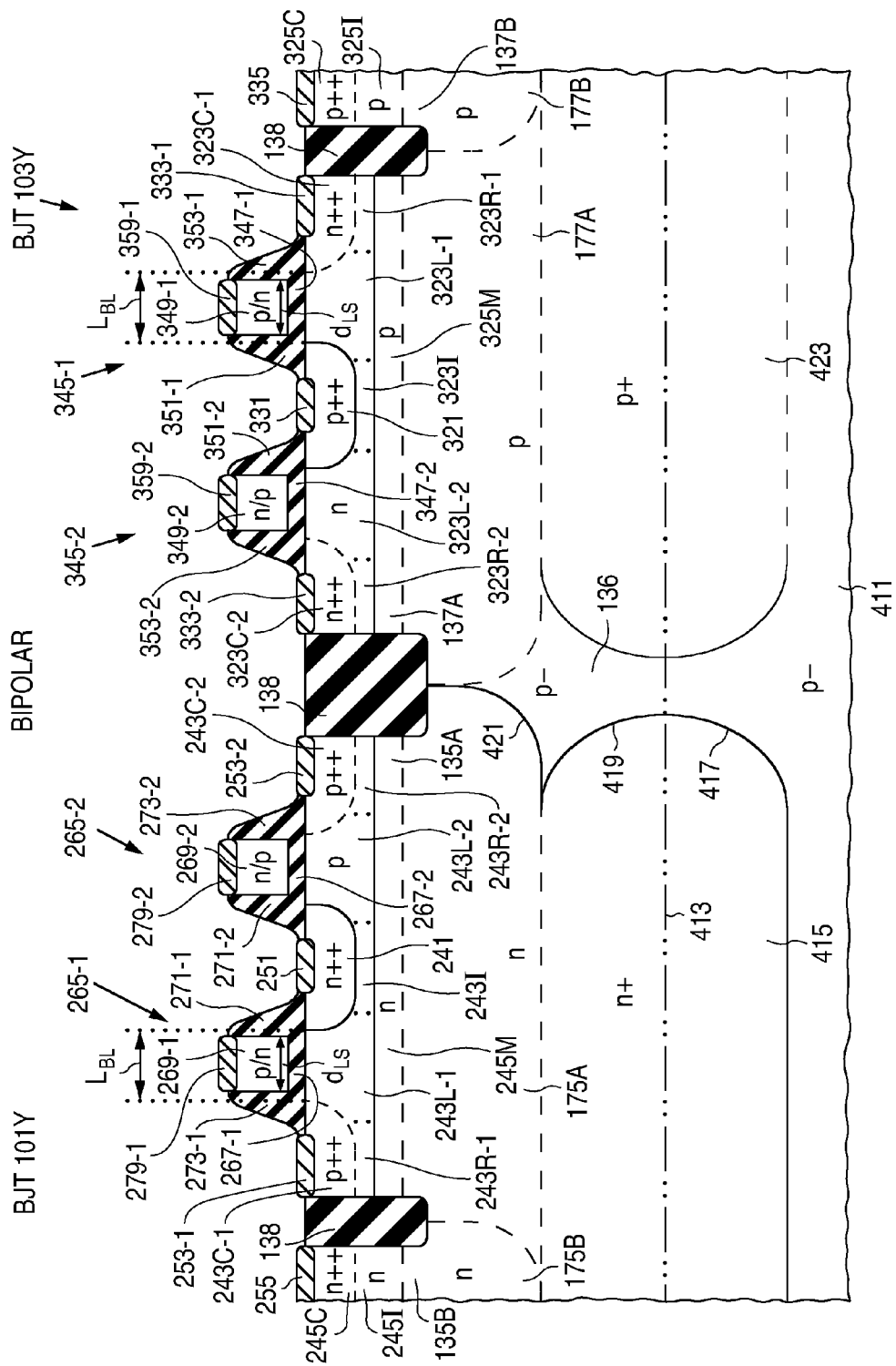
FIG. 13 is a front cross-sectional view of another pair of enhanced versions of the complementary BJTs of FIG. 5.0.

FIG. 13 illustrates a CBJT semiconductor structure containing additional variations 101Y and 103Y of npn BJT 101 and pnp BJT 103, respectively. An extension of the CBJT structure of FIG. 13 to include one level of the overlying electrical interconnection system for npn BJT 101Y and pnp BJT 103Y is presented in FIG. 14. BJT 101Y and BJT 103Y are configured respectively the same as BJTs 101 and 103 except as described below.

Figure 14:
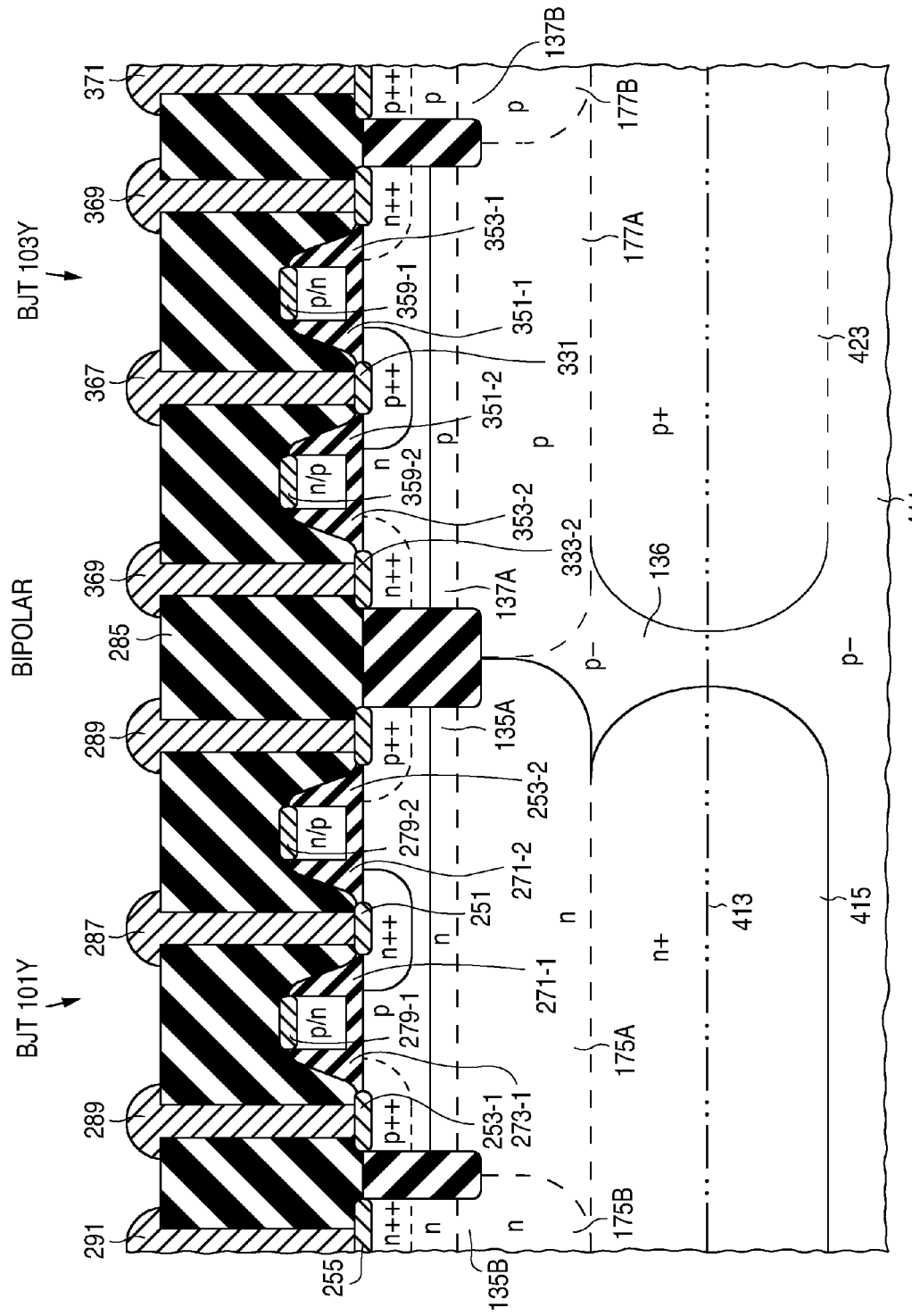
FIG. 14 is a front cross-sectional view of the complementary BJTs of FIG. 13 and one level of the overlying electrical interconnection system.

In the CBJT structure of FIGS. 13 and 14, p– substrate region 136 is an epitaxial layer grown on an underlying monosilicon semiconductor substrate 411 which can be doped p-type or n-type. FIGS. 13 and 14 illustrate an example in which substrate 411 is lightly doped p-type. Item 413 in FIGS. 13 and 14 indicates the metallurgical interface between p– substrate 411 and p– epitaxial substrate region 136.

A heavily doped n-type buried collector layer 415 is provided along metallurgical interface 413 below n collector wells 175A and 175B of npn BJT 101Y as a replacement for deep n well 207 or 391. N+ buried collector layer 415 merges with n collector wells 175A and 175B to form an n-type lateral collector portion that replaces lateral collector portion 245L in npn BJT 101. N+ buried layer 415 forms isolating pn junctions 417 and 419 respectively with p– substrate 411 and p– epitaxial substrate region 136. N collector wells 175A and 175B form an isolating pn junction 421 with p– substrate region 136.

A heavily doped p-type buried collector layer 423 is similarly provided along metallurgical interface 413 below p collector wells 177A and 177B of pnp BJT 103Y. P+ buried collector layer 423 merges with p collector wells 177A and 177B to form a p-type lateral collector portion that replaces lateral collector portion 325L in pnp BJT 103. N+ buried collector layer 415 and p+ buried collector layer 423 are spaced laterally apart from each other.

The CBJT structure of FIGS. 13 and 14 is very similar to the CBJT structure of FIGS. 11 and 12. The principal difference is that deep collector layers 101 and 107 are formed in p– substrate region in the CBJT structure of FIGS. 11 and 12 instead of being provided along an interface between an epitaxial layer and an underlying semiconductor substrate as occurs in the CBJT structure of FIGS. 13 and 14. Accordingly, npn BJT 101Y and pnp BJT 103Y in the CBJT structure of FIGS. 13 and 14 respectively operate largely the same as npn BJT 101X and pnp BJT 103X in the CBJT structure of FIGS. 11 and 12. Npn BJT 101Y and pnp BJT 103Y in the CBJT structure of FIGS. 13 and 14 thus respectively operate fundamentally the same as npn BJT 101 and pnp BJT 103 in the CBJT structure of FIGS. 5.0 and 6. The major operational difference is that buried collector layers 415 and 423 enable the collector current to travel faster in BJTs 101Y and 103Y.

The CBJT structure of FIGS. 11 and 12 or the CBJT structure of FIGS. 13 and 14 can be included in the CBJT/CIGFET structure of FIG. 5 as a substitute for, or in addition to, the CBJT structure of FIGS. 5.0 and 6. Only one of BJTs 101X and 103X is present in a variation of the CBJT structure of FIGS. 11 and 12. Similarly, only one of BJTs 101Y and 103Y is present in a variation of the CBJT structure of FIGS. 13 and 14.

The CBJT structure of FIGS. 11 and 12, or the variation containing only one of BJTs 101X and 103X, can be manufactured according to a variation of the CBJT/CIGFET semiconductor fabrication process of FIGS. 18a-18c, 18d.0-18w.0, 18d.1-18w.1, 18d.2-18w.2, and 18d.3-18w.3 in which steps are added to form n+ deep collector layer 401 and/or p+ deep collector layer 407. The CBJT structure of FIGS. 13 and 14, or the variation containing only one of BJTs 101Y and 103Y, can similarly be manufactured according to a variation of the CBJT/CIGFET semiconductor fabrication process of FIGS. 18a-18c, 18d.0-18w.0, 18d.1-18w.1, 18d.2-18w.2, and 18d.3-18w.3 in which steps are added to form n+ buried collector layer 415 and/or p+ buried collector layer 423 along metallurgical interface 413.

The additional steps for variously creating n+ deep collector layer 401, p+ deep collector layer 407, n+ buried collector layer 415, and p+ buried collector layer 423 do not affect the formation of p base link portions 243L-1 and 243L-2 in npn BJT 101X or 101Y or the formation of n base link portions 323L-1 and 243L-2 in pnp BJT 103X or 103Y. Consequently, base-link length $L_{BL}$ is accurately controlled in the CBJT structure of FIGS. 11 and 12, in the variation containing only one of BJTs 101X and 103X, in the CBJT structure of FIGS. 13 and 14, and in the variation containing only one of BJTs 101Y and 103Y in the same way as in the CBJT structure of FIGS. 5.0 and 6.

E. Asymmetric High-Voltage IGFETs

E1. Structure of Asymmetric High-Voltage N-Channel IGFET

Figure 15:
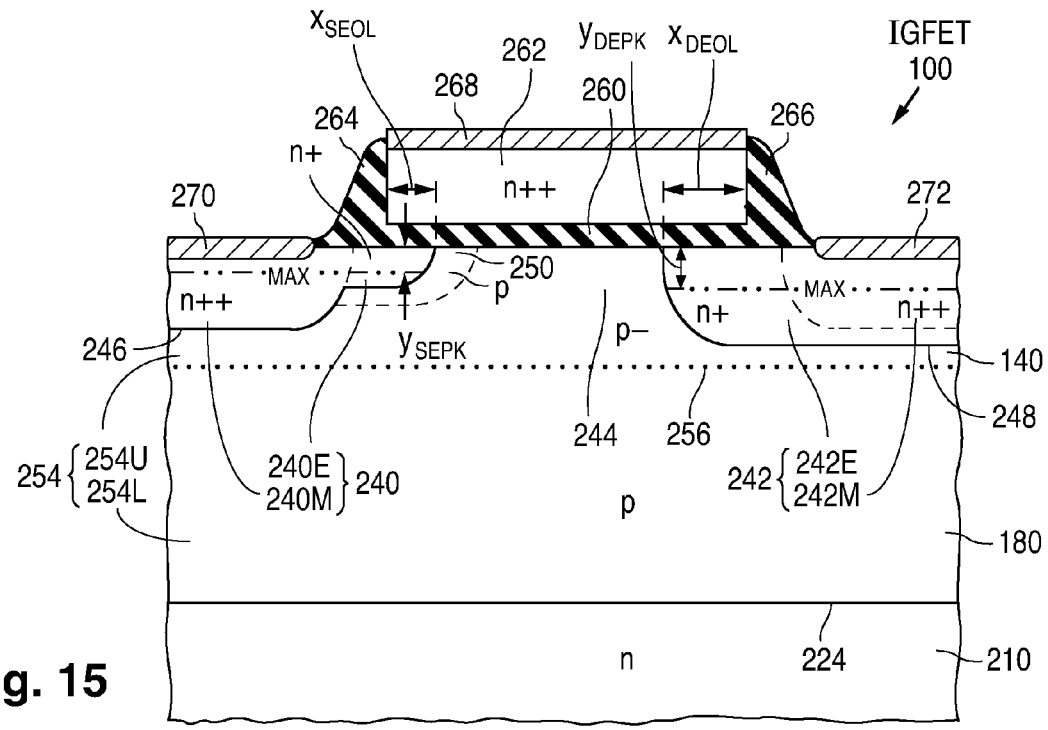
FIG. 15 is an expanded front cross-sectional view of the core of the asymmetric n-channel IGFET of FIG. 5.1.

The internal structure of asymmetric high-voltage empty-well complementary IGFETs 100 and 102 is now described. Beginning with n-channel IGFET 100, an expanded view of the core of IGFET 100 as depicted in FIG. 5.1 is shown in FIG. 15. IGFET 100 has a pair of n-type source/drain (again "S/D") zones 240 and 242 situated in active semiconductor island 140 along the upper semiconductor surface. S/D zones 240 and 242 are often respectively referred to below as source 240 and drain 242 because they normally, though not necessarily, respectively function as source and drain. Source 240 and drain 242 are separated by a channel zone 244 of p-type empty main well region 180 that constitutes the body material for IGFET 100. P-type empty-well body material 180 forms (a) a source-body pn junction 246 with n-type source 240 and (b) a drain-body pn junction 248 with n-type drain 242.

A moderately doped halo pocket portion 250 of p-type empty-well body material 180 extends along source 240 up to the upper semiconductor surface and terminates at a location between source 240 and drain 242. FIGS. 5.1 and 15 illustrate the situation in which source 240 extends deeper than p source-side halo pocket 250. Alternatively, halo pocket 250 can extend deeper than source 240. Halo pocket 250 then extends laterally under source 240. Halo pocket 250 is defined with the p-type source halo dopant.

The portion of p-type empty-well body material 180 outside source-side halo pocket portion 250 constitutes p-type empty-well main body-material portion 254. In moving from the location of the deep p-type empty-well concentration maximum in body material 180 toward the upper semiconductor surface along an imaginary vertical line outside halo pocket portion 250, the concentration of the p-type dopant in empty-well main body-material portion 254 drops gradually from a moderate doping, indicated by symbol "p", to a light doping, indicated by symbol "p−". Dotted line 256 in FIGS. 5.1 and 15 roughly represents the location below which the p-type dopant concentration in main body-material portion 254 is at the moderate p doping and above which the p-type dopant concentration in portion 254 is at the light p− doping. The moderately doped lower part of body-material portion 254 below line 256 is indicated as p lower body-material part 254L in FIG. 15. The lightly doped upper part of body-material portion 254 above line 256 outside p halo pocket 250 is indicated as p− upper body-material part 254U in FIG. 15.

Channel zone 244 (not specifically demarcated in FIG. 5.1 or 15) consists of all the p-type monosilicon between source 240 and drain 242. In particular, channel zone 244 is formed by a surface-adjoining segment of the p− upper part (254U) of main body-material portion 254 and (a) all of p halo pocket portion 250 if source 240 extends deeper than halo pocket 250 as illustrated in the example of FIGS. 5.1 and 15 or (b) a surface-adjoining segment of halo pocket 250 if it extends deeper than source 240. In any event, halo pocket 250 is more heavily doped p-type than the directly adjacent material of the p− upper part (254U) of body-material portion 254 in channel zone 244. The presence of halo pocket 250 along source 240 thereby causes channel zone 244 to be asymmetrically longitudinally graded.

A gate dielectric layer 260 at the $t_{GdH}$ high thickness value is situated on the upper semiconductor surface and extends over channel zone 244. A gate electrode 262 is situated on gate dielectric layer 260 above channel zone 244. Gate electrode 262 extends partially over source 240 and drain 242. Dielectric sidewall spacers 264 and 266 are situated respectively along the opposite transverse sidewalls of gate electrode 262. Metal silicide layers 268, 270, and 272 are respectively situated along the tops of gate electrode 262, main source portion 240M, and main drain portion 242M.

N-type source 240 consists of a very heavily doped main portion 240M and a more lightly doped lateral extension 240E. Although more lightly doped than n++ main source portion 240M, lateral source extension 240E is still heavily doped in sub-μm complementary IGFET applications such as the present one. N-type drain 242 similarly consists of a very heavily doped main portion 242M and a more lightly doped, but still heavily doped, lateral extension 242E. N++ main source portion 240M and n++ main drain portion 242M are normally defined by ion implantation of n-type semiconductor dopant referred to as the n-type main S/D dopant, typically arsenic. External electrical contacts to source 240 and drain 242 are respectively made via main source portion 240M and main drain portion 242M.

Lateral source extension 240E and lateral drain extension 242E terminate channel zone 244 along the upper semiconductor surface. Gate electrode 262 extends over part of each lateral extension 240E or 242E. Electrode 262 normally does not extend over any part of n++ main source portion 240M or n++ main drain portion 242M.

E2. Source/Drain Extensions of Asymmetric High-Voltage N-Channel IGFET

Drain extension 242E of asymmetric high-voltage IGFET 100 is more lightly doped than source extension 240E. However, the n-type doping of each lateral extension 240E or 242E falls into the range of heavy n-type doping indicated by the symbol "n+". Accordingly, lateral extensions 240E and 242E are both labeled "n+" in FIGS. 5.1 and 15. As explained further below, the heavy n-type doping in lateral source extension 240E is normally provided by n-type dopant of higher atomic weight than the n-type dopant used to provide the heavy n-type doping in lateral drain extension 242E.

N+ source extension 240E is normally defined by ion implantation of n-type semiconductor dopant referred to as the n-type shallow source-extension dopant because it is only used in defining comparatively shallow n-type source extensions. N+ drain extension 242 is normally defined by ion implantation of n-type semiconductor dopant referred to as the n-type drain-extension dopant and also as the n-type deep S/D-extension dopant because it is used in defining both comparatively deep n-type source extensions and comparatively deep n-type drain extensions.

N+ lateral extensions 240E and 242E serve multiple purposes. Inasmuch as main source portion 240M and main drain portion 242M are typically defined by ion implantation, extensions 240E and 242E serve as buffers that prevent gate dielectric layer 260 from being damaged during IGFET fabrication by keeping the very high implant dosage of main source portion 240M and main drain portion 242M away from gate dielectric 260. During IGFET operation, lateral extensions 240E and 242E cause the electric field in channel zone 244 to be lower than what would arise if n++ main source portion 240M and n++ main drain portion 242M extended under gate electrode 262. The presence of drain extension 242E inhibits hot carrier injection into gate dielectric 260, thereby preventing gate dielectric 260 from being charged. As a result, threshold voltage $V_T$ of IGFET 100 is highly stable, i.e., does not drift, with operational time.

IGFET 100 conducts current from n+ source extension 240E to n+ drain extension 242E via a channel of primary electrons formed in the depletion region along the upper surface of channel zone 244. In regard to hot carrier injection into gate dielectric layer 260, the electric field in drain 240 causes the primary electrons to accelerate and gain energy as they approach drain 240. Impact ionization occurs in drain 240 to create secondary charge carriers, both electrons and holes, which travel generally in the direction of the local electric field. Some of the secondary charge carriers, especially the secondary electrons, move toward gate dielectric layer 260. Because drain extension 242E is more lightly doped than main drain portion 242M, the primary electrons are subjected to reduced electric field as they enter drain 242. Consequently, fewer hot (energetic) secondary charge carriers are injected into gate dielectric layer 260. Hot carrier damage to gate dielectric 260 is reduced. Also, gate dielectric 260 undergoes reduced charging that would otherwise undesirably cause drift in threshold voltage $V_T$ of IGFET 100.

More particularly, consider a reference n-channel IGFET whose n-type S/D zones each consist of a very heavily doped main portion and a more lightly doped, but still heavily doped, lateral extension. Compared to the situation in which the source and drain extensions of the reference IGFET are at substantially the same heavy n-type doping as in source extension 240E of IGFET 100, the lower n-type doping in drain extension 242E causes the change in dopant concentration across the portion of drain junction 248 along drain extension 242E to be more gradual than the change in dopant concentration across the portion of the drain-to-body pn junction along the drain extension in the reference IGFET. The width of the depletion region along the portion of drain-body junction 248 along drain extension 242E is thereby increased. This causes the electric field in drain extension 242E to be further reduced. As a result, less impact ionization occurs in drain extension 242E than in the drain extension of the reference IGFET. Due to the reduced impact ionization in drain extension 242E, IGFET 100 incurs less damaging hot carrier injection into gate dielectric layer 260.

In addition to being more lightly doped than n+ source extension 240E, n+ drain extension 242E extends significantly deeper than n+ source extension 240E. For an IGFET having lateral S/D extensions which are more lightly doped than respective main S/D portions and which terminate the IGFET's channel zone along the upper semiconductor surface, let $y_{SE}$ and $y_{DE}$ be respectively represent the maximum depths of the S/D extensions. Depth $y_{DE}$ of drain extension 242E of IGFET 100 then significantly exceeds depth $y_{SE}$ of source extension 240E. Drain-extension depth $y_{DE}$ of IGFET 100 is normally at least 20% greater than, preferably at least 30% greater than, more preferably at least 50% greater than, even more preferably at least 100% greater than, its source-extension depth $y_{SE}$. Several factors lead to drain extension 242E extending significantly deeper than source extension 240E.

Source extension 240E and drain extension 242E each reach a maximum (or peak) n-type dopant concentration below the upper semiconductor surface. For an IGFET having lateral S/D extensions which are more lightly doped than respective main S/D portions of the IGFET's S/D zones, which terminate the IGFET's channel zone along the upper semiconductor surface, and which are defined by semiconductor dopant whose maximum (or peak) concentrations occur along respective locations extending generally laterally below the upper semiconductor surface, let $y_{SEPK}$ and $y_{DEPK}$ respectively represent the average depths at the locations of the maximum concentrations of the extension-defining dopants for the S/D extensions. Maximum dopant concentration depths $y_{SEPK}$ and $y_{DEPK}$ for source extension 240E and drain extension 242E of IGFET 100 are indicated in FIG. 15. Depth $y_{SEPK}$ for source extension 240E is normally 0.004- 0.020 µm, typically 0.015 µm. Depth $y_{DEPK}$ for drain extension 242E is normally 0.010-0.030 µm, typically 0.020 µm.

One factor which contributes to drain extension 242E extending significantly deeper than source extension 240E is that, as indicated by the preceding $y_{SEPK}$ and $y_{DEPK}$ values for IGFET 100, the ion implantations for source extension 240E and drain extension 242E are performed so that depth $y_{DEPK}$ of the maximum n-type dopant concentration in drain extension 242E significantly exceeds depth $y_{SEPK}$ of the maximum n-type dopant concentration in source extension 240E. Maximum drain-extension dopant concentration depth $y_{SEPK}$ for IGFET 100 is normally at least 10% greater than, preferably at least 20% greater than, more preferably at least 30% greater than, its maximum source-extension dopant concentration depth $y_{SEPK}$.

Inasmuch as drain extension 242E is more lightly doped than source extension 240E, the maximum total n-type dopant concentration at depth $y_{SEPK}$ in drain extension 242E is significantly less than the maximum total n-type dopant concentration at depth $y_{SEPK}$ in source extension 240E. The maximum total n-type dopant concentration at depth $y_{DEPK}$ in drain extension 242E is normally no more than one half of, preferably no more than one fourth of, more preferably no more than one tenth of, even more preferably no more than one twentieth of, the maximum total n-type dopant concentration at depth $y_{SEPK}$ in source extension 240E. As a result, the maximum net n-type dopant concentration at depth $y_{DEPK}$ in drain extension 242E is significantly less than, normally no more than one half of, preferably no more than one fourth of, more preferably no more than one tenth of, even more preferably no more than one twentieth of, the maximum net n-type dopant concentration at depth $y_{SEPK}$ in source extension 240E. Alternatively stated, the maximum total or net n-type dopant concentration at depth $y_{SEPK}$ in source extension 240E is significantly greater than, normally at least two times, preferably at least four times, more preferably at least 10 times, even more preferably at least 20 times, the maximum total or net n-type dopant concentration at depth $y_{DEPK}$ in drain extension 242E.

Two other factors that contribute to drain extension 242E extending significantly deeper than source extension 240E involve p+ source-side halo pocket portion 250. The p-type dopant in halo pocket 250 impedes diffusion of the n-type shallow source-extension dopant in source extension 240E, thereby reducing source-extension depth $y_{SE}$. The p-type dopant in halo pocket 250 also causes the bottom of source extension 240E to occur at a higher location so as to further reduce source-extension depth $y_{SE}$.

The combination of drain extension 242E extending significantly deeper than, and being more lightly doped than, source extension 240E causes the n-type deep S/D-extension dopant in drain extension 242E to be spread out considerably more vertically than the n-type shallow source extension dopant in source extension 240E. Accordingly, the distribution of the total n-type dopant in drain extension 242E is spread out vertically considerably more than the distribution of the total n-type dopant in source extension 240E.

The current flowing from source to drain through an IGFET such as IGFET 100 or the reference IGFET normally spreads out downward upon entering the drain. Compared to the situation in which the n-type dopant concentrations in the source and drain extensions of the reference IGFET are doped substantially the same and extend to the same depth as source extension 240E, the increased depth of drain extension 242E enables the current flow through drain extension 242E to be more spread out vertically than in the drain extension of the reference IGFET. The current density in drain extension 242E is thus less than the current density in the drain extension of the reference IGFET.

The increased spreading of the total n-type dopant in drain extension 242E causes the electric field in drain extension 242E to be less than the electric field in the drain extension of the reference IGFET. Less impact ionization occurs in drain extension 242E than in the drain extension of the reference IGFET. In addition, impact ionization occurs further away from the upper semiconductor surface in drain extension 242E than in the drain extension of the reference IGFET. Fewer hot carriers reach gate dielectric 260 than the gate dielectric layer of the reference IGFET. As a result, the amount of hot carrier injection into gate dielectric layer 260 of IGFET 100 is reduced further.

Drain extension 242E extends significantly further laterally under gate electrode 262 than does source extension 240E. For an IGFET having lateral S/D extensions which are more lightly doped than respective main S/D portions and which terminate the IGFET's channel zone along the upper semiconductor surface, let $x_{SEOL}$ and $x_{DEOL}$ represent the amounts by which the IGFET's gate electrode respectively overlaps the source and drain extensions. Amount $x_{DEOL}$ by which gate electrode 262 of IGFET 100 overlaps drain extension 242E then significantly exceeds amount $x_{SEOL}$ by which gate electrode 262 overlaps source extension 240E. Gate-electrode overlaps $x_{SEOL}$ and $x_{DEOL}$ are indicated in FIG. 15 for IGFET 100. Gate-to-drain-extension overlap $x_{DEOL}$ of IGFET 100 is normally at least 20% greater, preferably at least 30%, more preferably at least 50% greater, than its gate-to-source-extension overlap $x_{SEOL}$.

The quality of the gate dielectric material near the drain-side edge of gate electrode 262 is, unfortunately, normally not as good as the quality of the remainder of the gate dielectric material. Compared to the situation in which the S/D extensions of the reference IGFET extend the same amount below the gate electrode as source extension 240E extends below gate electrode 262, the greater amount by which drain extension 242E extends below gate electrode 262 enables the current flow through drain extension 242E to be even more spread out vertically than in the drain extension of the reference IGFET. The current density in drain extension 242E is further reduced. This leads to even less impact ionization in drain extension 242E than in the drain extension of the reference IGFET. The amount of hot carrier injection into gate dielectric layer 260 is reduced even more. Due to the reduced doping, greater depth, and greater gate-electrode-to-source-extension overlap of drain extension 242E, IGFET 100 undergoes very little damaging hot carrier injection into gate dielectric 260, thereby enabling the threshold voltage of IGFET 100 to be very stable with operational time.

For an IGFET having main S/D portions respectively continuous with more lightly doped lateral source and drain extensions that terminate the IGFET's channel zone along the upper semiconductor surface, let $y_{SM}$ and $y_{DM}$ represent the respective maximum depths of the main source and drain portions. Depth $y_{DM}$ of main drain portion 242M of IGFET 100 is typically approximately the same as depth $y_{SM}$ of main source portion 240M. Each of depths $y_{SM}$ and $y_{DM}$ for IGFET 100 is normally 0.08-0.20 μm, typically 0.14 μm. Due to the presence of the p-type dopant that defines halo pocket portion 250, main source portion depth $y_{SM}$ of IGFET 100 can be slightly less than its main drain portion depth $y_{DM}$.

Main source portion 240M of IGFET 100 extends deeper than source extension 240E in the example of FIGS. 5.1 and 15. Main source portion depth $y_{SM}$ of IGFET 100 therefore exceeds its source-extension depth $y_{SE}$. In contrast, drain extension 242E extends deeper than main drain portion 242M in this example. Hence, drain-extension depth $y_{DE}$ of IGFET 100 exceeds its main drain portion depth $y_{DM}$. Also, drain extension 242E extends laterally under main drain portion 242M.

Let $y_S$ and $y_D$ respectively represent the maximum depths of the source and drain of an IGFET. Depths $y_S$ and $y_D$ are the respective maximum depths of the IGFET's source-body and drain-body pn junctions, i.e., source-body junction 246 and drain-body junction 248 for IGFET 100. Since main source portion depth $y_{SM}$ of IGFET 100 exceeds its source-extension depth $y_{SE}$ in the example of FIGS. 5.1 and 15, source depth $y_S$ of IGFET 100 equals its main source portion depth $y_{SM}$. On the other hand, drain depth $y_D$ of IGFET 100 equals its drain-extension depth $y_{DE}$ in this example because drain extension depth $y_{DE}$ of IGFET 100 exceeds its main drain portion depth $y_{DM}$.

Source depth $y_S$ of IGFET 100 is normally 0.08-0.20 μm, typically 0.14 μm. Drain depth $y_D$ of IGFET 100 is normally 0.10-0.22 μm, typically 0.16 μm. Drain depth $y_D$ of IGFET 100 normally exceeds its source depth $y_S$ by 0.01-0.05 μm, typically by 0.02 μm. In addition, source-extension depth $y_{SE}$ of IGFET 100 is normally 0.02-0.10 μm, typically 0.04 μm. Drain-extension depth $y_{DE}$ of IGFET 100 is 0.10-0.22, typically 0.16 μm. Accordingly, drain-extension depth $y_{DE}$ of IGFET 100 is typically roughly four times its source-extension depth $y_{SE}$ and, in any event, is typically more than three times its source-extension depth $y_{SE}$.

The presence of halo pocket portion 250 along source 240 causes channel zone 244 to be asymmetrically longitudinally dopant graded as described above. The reduced doping, greater depth, and greater gate-electrode overlap on drain extension 242E than on source extension 240E provide IGFET 100 with further asymmetry. A further explanation of the doping asymmetries of IGFET 100 and the empty-well doping characteristics of body material 180 is presented in U.S. patent application Ser. No. 12/382,793, cited above.

Threshold voltage $V_T$ of n-channel IGFET 100 is 0.5 V to 0.75 V, typically 0.6 V to 0.65 V, at a drawn channel length $L_{DR}$ in the vicinity of 0.3 μm and a gate dielectric thickness of 6-6.5 nm. IGFET 100 is particularly suitable for unidirectional-current applications at a high operational voltage range, e.g., 3.0 V.

E3. Structure of Asymmetric High-Voltage P-Channel IGFET

Asymmetric high-voltage p-channel IGFET 102 is internally configured basically the same as asymmetric high-voltage n-channel IGFET 100, except that the body material of IGFET 102 consists of n-type empty main well region 182 and deep n well region 210 rather than just an empty main well region (180) as occurs with IGFET 100. The conductivity types in the regions of IGFET 102 are generally opposite to the conductivity types of the corresponding regions in IGFET 100.

More particularly, IGFET 102 has a pair of p-type S/D zones 280 and 282 situated in active semiconductor island 142 along the upper semiconductor surface as shown in FIG. 5.1. S/D zones 280 and 282 are often respectively referred to below as source 280 and drain 282 because they normally, though not necessarily, respectively function as source and drain. Source 280 and drain 282 are separated by a channel zone 284 of n-type empty-well body material 182, i.e., portion 182 of total body material 182 and 210. N-type empty-well body material 182 forms (a) a source-body pn junction 286 with p-type source 280 and (b) a drain-body pn junction 288 with p-type drain 282.

A moderately doped halo pocket portion 290 of n-type empty-well body material 182 extends along source 280 up to the upper semiconductor surface and terminates at a location between source 280 and drain 282. FIG. 5.1 illustrates the situation in which source 280 extends deeper than n source-side halo pocket 290. As an alternative, halo pocket 290 can extend deeper than source 280. Halo pocket 290 then extends laterally under source 290. Halo pocket 290 is defined with the n-type source halo dopant.

The portion of n-type empty-well body material 182 outside source-side halo pocket portion 290 constitutes n-type empty-well body-material portion 294. In moving from the location of the deep n-type empty-well concentration maximum in body material 182 toward the upper semiconductor surface along an imaginary vertical line (not shown) outside halo pocket portion 290, the concentration of the n-type dopant in empty-well main body-material portion 294 drops gradually from a moderate doping, indicated by symbol "n", to a light doping, indicated by symbol "n–". Dotted line 296 in FIG. 5.1 roughly represents the location below which the n-type dopant concentration in main body-material portion 294 is at the moderate n doping and above which the n-type dopant concentration in portion 296 is at the light n– doping.

Channel zone 284 (not specifically demarcated in FIG. 5.1) consists of all the n-type monosilicon between source 280 and drain 282. More particularly, channel zone 284 is formed by a surface-adjoining segment of the n– upper part of empty-well main body material 294 and (a) all of n halo pocket portion 290 if source 280 extends deeper than halo pocket 290 as illustrated in the example of FIG. 5.1 or (b) a surface-adjoining segment of halo pocket 290 if it extends deeper than source 280. In any event, halo pocket 290 is more heavily doped n-type than the directly adjacent material of the n– upper part 294 of main body material 182 in channel zone 284. The presence of halo pocket 290 along source 290 thereby causes channel zone 284 to be asymmetrically longitudinally graded.

A gate dielectric layer 300 at the $t_{GdH}$ high thickness value is situated on the upper semiconductor surface and extends over channel zone 284. A gate electrode 302 is situated on gate dielectric layer 290 above channel zone 284. Gate electrode 302 extends partially over source 280 and drain 282. Dielectric sidewall spacers 304 and 306 are situated respectively along the opposite transverse sidewalls of gate electrode 302. Metal silicide layers 308, 310, and 312 are respectively situated along the tops of gate electrode 302, main source portion 280M, and main drain portion 282M.

P-type source 280 consists of a very heavily doped main portion 280M and a more lightly doped lateral extension 280E. P-type drain 282 similarly consists of a very heavily doped main portion 282M and a more lightly doped lateral extension 282E. Although respectively more lightly doped than p++ main source portion 280M and p++ main drain portion 282M, lateral source extension 280E and lateral drain extension 282E are still heavily doped in the present sub-μm CIGFET application. Main source portion 280M and main drain portion 282M are normally defined by ion implantation of p-type semiconductor dopant referred to as the p-type main S/D dopant, typically boron. External electrical contacts to source 280 and drain 282 are respectively made via main source portion 280M and main drain portion 282M.

Lateral source extension 280E and drain extension 282E terminate channel zone 284 along the upper semiconductor surface. Gate electrode 302 extends over part of each lateral extension 280E or 282E. Electrode 302 normally does not extend over any part of p++ main source portion 280M or p++ main drain portion 282M.

E4. Source/Drain Extensions of Asymmetric High-Voltage P-Channel IGFET

Drain extension 282E of asymmetric high-voltage p-channel IGFET 102 is more lightly doped than source extension 280E. However, the p-type doping of each lateral extension 280E or 282E falls into the range of heavy p-type doping indicated by the symbol "p+". Source extension 280E and drain extension 282E are therefore both labeled "p+" in FIG. 5.1.

P+ source extension 280E is normally defined by ion implantation of p-type semiconductor dopant referred to as the p-type shallow source-extension dopant because it is only used in defining comparatively shallow p-type source extensions. P+ drain extension 282E is normally defined by ion implantation of p-type semiconductor dopant referred to as the p-type deep drain-extension dopant and also as the p-type deep S/D-extension dopant because it is used in defining both comparatively deep p-type source extensions and comparatively deep p-type drain extensions. The p-type doping in source extension 280E and drain extension 282E is typically provided by boron.

P+ lateral extensions 280E and 282E serve substantially the same purposes in IGFET 102 as lateral extensions 240E and 242E in IGFET 100. In this regard, IGFET 102 conducts current from p+ source extension 280E to p+ drain extension 282E via a channel of primary holes induced in the depletion region along the upper surface of channel zone 284. The electric field in drain 280 causes the primary holes to accelerate and gain energy as they approach drain 280. Taking note that holes moving in one direction are basically electrons travelling away from dopant atoms in the opposite direction, the holes impact atoms in drain 280 to create secondary charge carriers, again both electrons and holes, which travel generally in the direction of the local electric field. Some of the secondary charge carriers, especially the secondary holes, move toward gate dielectric layer 300. Since drain extension 282E is more lightly doped than main drain portion 282M, the primary holes are subjected to reduced electric field as they enter drain 282. As a result, fewer hot (energetic) secondary charge carriers are injected into gate dielectric layer 300 so as to charge it. Undesirable drift of threshold voltage $V_T$ of IGFET 102 is substantially reduced.

The lighter p-type doping in drain extension 282E than in source extension 280E causes IGFET 102 to incur even less hot carrier injection into gate dielectric layer 300 for the same reasons that IGFET 100 incurs even less damaging hot carrier injection into gate dielectric layer 260 as a result of the lighter n-type doping in drain extension 242E than in source extension 240E. That is, the lighter drain-extension doping in IGFET 102 produces a more gradual change in dopant concentration across the portion of drain junction 288 along drain extension 282E. The width of the depletion region along the portion of drain junction 288 along drain extension 282E is thereby increased, causing the electric field in drain extension 282E to be reduced. Due to the resultant reduction in impact ionization in drain extension 282E, hot carrier injection into gate dielectric layer 300 is reduced.

Each of p+ source extension 280E and p+ drain extension 282E reaches a maximum (or peak) p-type dopant concentration below the upper semiconductor surface. With source extension 280E and drain extension 282E defined by ion implantation, source extension 280E is normally of such a nature that there is an imaginary vertical line (not shown) which extends through source extension 280E and which is sufficiently far away from main source portion 280M that the p-type dopant which defines main source portion 280M does not have any significant effect on the total p-type dopant concentration along that vertical line. As a result, the depth at which the concentration of the p-type shallow source-extension dopant reaches its maximum value along the vertical line largely equals depth $y_{SEPK}$ at the maximum value of the total p-type dopant concentration in source extension 280E. Depth $y_{SEpK}$ for source extension 280E is normally 0.003-0.015 μm, typically 0.006 μm.

Drain extension 282E is likewise normally of such a nature that there is an imaginary vertical line (not shown) which extends through drain extension 282E and which is sufficiently far away from main drain portion 282M that the p-type dopant which defines main drain portion 282M has no significant effect on the total p-type dopant concentration along that vertical line. The depth at which the concentration of the p-type deep S/D-extension dopant reaches its maximum value along the vertical line through drain extension 282E normally largely equals depth $y_{SEPK}$ at the maximum value of the total p-type dopant concentration in drain extension 282E. As with depth $y_{SEPK}$ of the maximum concentration of the p-type shallow p-type source-extension dopant in source extension 280E, depth $y_{DEPK}$ for drain extension 282E is normally 0.003-0.015 μm, typically 0.006 μm.

P+ drain extension 282E extends significantly deeper than p+ source extension 280E even though maximum concentration depth $y_{DEPK}$ for drain extension 282E is normally largely equal to maximum concentration depth $y_{SEpK}$ for source extension 280E. In other words, depth $y_{DE}$ of drain extension 282E of IGFET 102 significantly exceeds depth $y_{SE}$ of source extension 280E. Drain-extension depth $y_{DE}$ of IGFET 102 is normally at least 20% greater than, preferably at least 30% greater than, more preferably at least 50% greater than, even more preferably at least 100% greater than, its source-extension depth $y_{SE}$.

Two primary factors lead to drain extension 282E extending significantly deeper than source extension 280E. Both factors involve n+ source-side halo pocket portion 290. Firstly, the n-type dopant in halo pocket portion 290 slows down diffusion of the p-type shallow source-extension dopant in source extension 280E so as to reduce source-extension depth $y_{SE}$. Secondly, the n-type dopant in halo pocket 290 causes the bottom of source extension 280E to occur at a higher location, thereby further reducing source-extension depth $y_{SE}$. Drain extension 282E can be arranged to extend further deeper than source extension 280E by performing the ion implantations so that depth $y_{DEPK}$ of the maximum p-type dopant concentration in drain extension 282E exceeds depth $y_{SEPK}$ of the maximum p-type dopant concentration in source extension 280E.

In typical implementations of asymmetric IGFETs 100 and 102, the p-type source halo dopant in p halo pocket portion 250 of n-channel IGFET 100 is the same atomic species, normally boron, as the p-type shallow source-extension dopant in p+ source extension 280E of p-channel IGFET 102. Analogously, the n-type source halo dopant in n halo pocket portion 290 of p-channel IGFET 102 is typically the same atomic species, normally arsenic, as the n-type shallow source-extension dopant in n+ source extension 240E of n-channel IGFET 100.

An arsenic atom is considerably larger than a boron atom. As a result, the n-type dopant in halo pocket portion 290 of p-channel IGFET 102 impedes diffusion of the p-type shallow source-extension dopant in source extension 280E considerably more than the p-type dopant in halo pocket portion 250 of n-channel IGFET 100 slows down diffusion of the n-type shallow source-extension dopant in source extension 240E. This enables IGFETs 100 and 102 to have comparable ratios of drain-extension depth $y_{DE}$ to source-extension depth $y_{SE}$ even though maximum concentration depth $y_{DEPK}$ for drain extension 282E of p-channel IGFET 102 is normally largely the same as maximum concentration depth $y_{SEPK}$ for source extension 280E whereas maximum concentration depth $y_{DEPK}$ for drain extension 242E of n-channel IGFET 100 is considerably greater than maximum concentration depth $y_{SEPK}$ for source extension 240E.

The distribution of the p-type deep S/D-extension dopant in drain extension 282E of p-channel IGFET 102 is spread out vertically significantly more than the distribution of the p-type shallow source-extension dopant in source extension 280E. As a result, the distribution of the total p-type dopant in drain extension 282E is spread out vertically significantly more than the distribution of the total p-type dopant in source extension 280E.

The greater depth of drain extension 282E than source extension 280E causes hot carrier injection into gate dielectric layer 300 of IGFET 102 to be further reduced for largely the same reasons that IGFET 100 incurs less hot electron injection into gate dielectric layer 260. In particular, the increased depth of drain extension 282E in IGFET 102 causes the current through drain extension 282E to be more spread out vertically, thereby reducing the current density in drain extension 282E. The increased spreading of the total p-type dopant in drain extension 282E causes the electric field in drain extension 282E to be reduced. The resultant reduction in impact ionization in drain extension 282E produces less hot carrier injection into gate dielectric 300.

Drain extension 282E extends significantly further below gate electrode 302 than does source extension 280E. Consequently, amount $x_{DEOL}$ by which gate electrode 302 of IGFET 102 overlaps drain extension 282E significantly exceeds amount $x_{SEOL}$ by which gate electrode 302 overlaps source extension 280E. Gate-to-drain-extension overlap $x_{DEOL}$ of IGFET 102 is normally at least 20% greater, preferably at least 30% greater, more preferably at least 50% greater, than its gate-to-source-extension overlap $x_{SEOL}$.

The greater overlap of gate electrode 302 over drain extension 282E than over source extension 280E causes hot carrier injection into gate dielectric layer 300 of IGFET 102 to be reduced even further for the same reasons that IGFET 100 incurs even less hot carrier injection into gate dielectric layer 260 as a result of the greater overlap of gate electrode 262 over drain extension 242E than over source extension 240E. That is, the greater amount by which drain extension 282E of IGFET 102 extends below gate electrode 302 enables the current flow through drain extension 282E to be even more spread out vertically. The current density in drain extension 282E is further reduced. The resultant further reduction in impact ionization in drain extension 282E causes even less hot carrier injection into gate dielectric layer 300. Due to the reduced doping, greater depth, and greater gate-electrode-to-source-extension overlap of drain extension 282E, IGFET 102 undergoes very little hot carrier injection into gate dielectric 300. As with IGFET 100, the threshold voltage of IGFET 102 is very stable with operational time.

Depth $y_{DM}$ of main drain portion 282M of IGFET 102 is typically approximately the same as depth $y_{SM}$ of main source portion 280M. Each of depths $y_{SM}$ and $y_{DM}$ for IGFET 102 is normally 0.05-0.15 μm, typically 0.10 μm. Due to the presence of the n-type dopant that defines halo pocket portion 290, main source portion depth $y_{SM}$ of IGFET 102 can be slightly less than its main drain portion depth $y_{DM}$.

Main source portion 280M of IGFET 102 extends deeper than source extension 280E in the example of FIG. 5.1. Main source portion depth $y_{SM}$ of IGFET 102 thus exceeds its source-extension depth $y_{SE}$. In contrast, drain extension 282E extends deeper than main drain portion 282M in this example. Consequently, drain-extension depth $y_{DE}$ of IGFET 102 exceeds its main drain portion depth $y_{DM}$. Also, drain extension 282E extends laterally under main drain portion 282M.

Inasmuch as main source portion depth $y_{SM}$ of IGFET 102 exceeds its source-extension depth $y_{SE}$ in the example of FIG. 5.1, source depth $y_S$ of IGFET 102 equals its main source portion depth $y_{SM}$. On the other hand, drain depth $y_D$ of IGFET 102 equals its drain-extension depth $y_{DE}$ in this example because drain-extension depth $y_{DE}$ of IGFET 102 exceeds its main drain portion depth $y_{DM}$. Source depth $y_S$ of IGFET 102 is normally 0.05-0.15 μm, typically 0.10 μm. Drain depth $y_D$ of IGFET 102 is normally 0.08-0.20 μm, typically 0.14 μm. Drain depth $y_D$ of IGFET 102 thereby normally exceeds its source depth $y_S$ by 0.01-0.10 μm, typically by 0.04 μm. Additionally, source-extension depth $y_{SE}$ of IGFET 102 is normally 0.02-0.10 μm, typically 0.06 μm. Drain-extension depth $y_{DE}$ of IGFET 102 is 0.08-0.20 μm, typically 0.14 μm. Accordingly, drain-extension depth $y_{DE}$ of IGFET 102 is typically more than twice its source-extension depth $y_{SE}$.

IGFET 102 employs deep n well region 210 in the implementation of FIG. 5.1. Inasmuch as average deep n well maximum concentration depth $y_{DNWPK}$ is normally 1.0-2.0 μm, typically 1.5 μm, average depth $y_{DNWPK}$ for IGFET 102 is normally 5-25 times, preferably 8-16 times, typically 10-12 times its drain depth $y_D$.

Subject to the conductivity types being reversed, p-channel IGFET 102 has a longitudinal dopant distribution along the upper semiconductor surface quite similar to the longitudinal dopant distributions along the upper semiconductor surface for n-channel IGFET 100. A further explanation of the doping asymmetries of IGFET 102 and the empty-well doping characteristics of p-type empty-well body material 182 is presented in U.S. patent application Ser. No. 12/382/793, cited above.

Threshold voltage $V_T$ of p-channel IGFET 102 is −0.5 V to −0.7 V, typically −0.6 V, at a drawn channel length $L_{DR}$ in the vicinity of 0.3 μm and a gate dielectric thickness of 6-6.5 nm. As with IGFET 100, IGFET 102 is particularly suitable for unidirectional-current applications at a high operational voltage range, e.g., 3.0 V.

F. Extended-Drain IGFETs

F1. Structure of Extended-Drain N-Channel IGFET

The internal structure of asymmetric extended-drain extended-voltage complementary IGFETs 104 and 106 is described next. Expanded views of the cores of IGFETs 104 and 106 as depicted in FIG. 5.2 are respectively shown in FIGS. 16a and 16b.

Starting with n-channel IGFET 104, it has an n-type first S/D zone 320 situated in active semiconductor island 144A along the upper semiconductor surface as shown in FIGS. 5.2 and 16a Empty main well 184B constitutes an n-type second S/D zone for IGFET 104. S/D zones 320 and 184B are often respectively referred to below as source 320 and drain 184B because they normally, though not necessarily, respectively function as source and drain.

Source 320 and drain 184B are separated by a channel zone 322 of p-type body material formed with p-type empty main well region 184A and p− substrate region 136. P-type empty-well body material 184A, i.e., portion 184A of total body material 184A and 136, forms a source-body pn junction 324 with n-type source 320. Pn junction 226 between n-type empty-well drain 184B and p-substrate region 136 is the drain-body junction for IGFET 104. Empty main well regions 184A and 184B are often respectively described below as empty-well body material 184A and empty-well drain 184B in order to clarify the functions of empty wells 184A and 184B.

N-type source 320 consists of a very heavily doped main portion 320M and a more lightly doped lateral extension 320E. External electrical contact to source 320 is made via n++ main source portion 320M. Although more lightly doped than main source portion 320M, lateral source extension 320E is still heavily doped in the present sub-μm CIGFET application. N+ source extension 320E terminates channel zone 322 along the upper semiconductor surface at the source side of IGFET 104.

N++ main source portion 320M extends deeper than source extension 320E. Accordingly, the maximum depth $y_S$ of source 320 is the maximum depth $y_{SM}$ of main source portion 320M. Maximum source depth $y_S$ for IGFET 104 is indicated in FIG. 16a. Main source portion 320M and source extension 320E are respectively defined with the n-type main S/D and shallow source extension dopants.

A moderately doped halo pocket portion 326 of p-type empty-well body material 184A extends along source 320 up to the upper semiconductor surface and terminates at a location within body material 184A and thus between source 320 and drain 184B. FIGS. 5.2 and 16a illustrate the situation in which source 320, specifically main source portion 320M, extends deeper than p source-side halo pocket 326. Alternatively, halo pocket 326 can extend deeper than source 320. Halo pocket 326 then extends laterally under source 320. Halo pocket 326 is defined with the p-type source halo dopant.

The portion of p-type empty-well body material 184A outside source-side halo pocket portion 326 is indicated as item 328 in FIGS. 5.2 and 16a. In moving from the location of the deep p-type empty-well concentration maximum in body material 184A toward the upper semiconductor surface along a selected imaginary vertical line through channel zone 322 outside halo pocket 326, the concentration of the p-type dopant in empty-well body-material portion 328 drops gradually from a moderate doping, indicated by symbol "p", to a light doping, indicated by symbol "p−". Dotted line 332 (only labeled in FIG. 16a) roughly represents the location below which the p-type dopant concentration in body-material portion 328 is at the moderate p doping and above which the p-type dopant concentration in portion 328 is at the light p− doping. The moderately doped part of body-material portion 328 below line 332 is indicated as p lower body-material part 328L in FIG. 16a. The lightly doped part of body-material portion 328 above line 332 is indicated as p− upper body-material part 328U in FIG. 16a.

The p-type dopant in p-type empty-well body-material portion 328 consists of the p-type empty main well dopant, the p-type background dopant of p− substrate region 136, and (near p halo pocket portion 326) the p-type source halo dopant. The concentration of the p-type background dopant is largely constant throughout the semiconductor body. Since the p-type empty main well dopant in p-type empty-well body material 184A reaches a deep subsurface concentration maximum along a subsurface location at average depth $y_{PWPK}$, the presence of the p-type empty main well dopant in body-material portion 328 causes the concentration of the total p-type dopant in portion 328 to reach a deep local subsurface concentration maximum substantially at the location of the deep subsurface concentration maximum in body material 184A. The deep subsurface concentration maximum in body-material portion 328, as indicated by the left-hand dash-and-double-dot line labeled "MAX" in FIG. 16a, extends laterally below the upper semiconductor surface and likewise occurs at average depth $y_{PWPK}$. The occurrence of the deep subsurface concentration maximum in body-material portion 328 causes it to bulge laterally outward. The maximum bulge in body-material portion 328, and thus in body material 184A, occurs along the location of the deep subsurface concentration maximum in portion 328 of body material 184A.

N-type empty-well drain 184B includes a very heavily doped external contact portion 334 situated in active semiconductor island 144B along the upper semiconductor surface. N++ external drain contact portion 334 is sometimes referred to here as a main drain portion because, similar to main source portion 320M, drain contact portion 334 is very heavily doped, is spaced apart from channel zone 332, and is used in making external electrical contact to IGFET 104. The portion of drain 184B outside n++ external drain contact portion/main drain portion 334 is indicated as item 336 in FIGS. 5.2 and 16a.

In moving from the location of the deep n-type empty-well concentration maximum in drain 184B toward the upper semiconductor surface along a selected imaginary vertical line through island 144B, the concentration of the n-type dopant in drain 184B drops gradually from a moderate doping, indicated by symbol "n", to a light doping, indicated by symbol "n-". Dotted line 340 (only labeled in FIG. 16a) roughly represents the location below which the n-type dopant concentration in empty-well drain portion 336 is at the moderate n doping and above which the n-type dopant concentration in portion 336 is at the light n- doping. The moderately doped part of drain portion 336 below line 340 is indicated as n lower empty-well drain part 336L in FIG. 16a. The lightly doped part of drain portion 336 above line 340 is indicated as n- upper empty-well drain part 336U in FIG. 16a.

The n-type dopant in n-type empty-well drain portion 336 consists of the n-type empty main well dopant and (near n++ drain contact portion 334) the n-type main S/D dopant utilized, as described below, to form drain contact portion 334. Because the n-type empty main well dopant in n-type empty-well drain 184B reaches a deep subsurface concentration maximum at average depth $y_{NWPK}$, the presence of the n-type empty main well dopant in drain portion 336 causes the concentration of the total n-type dopant in portion 336 to reach a deep local subsurface concentration maximum substantially at the location of the deep subsurface concentration maximum in well 184B. The deep subsurface concentration maximum in drain portion 336, as indicated by the right-hand dash-and-double-dot line labeled "MAX" in FIG. 16a, extends laterally below the upper semiconductor surface and likewise occurs at average depth $y_{NWPK}$. The occurrence of the deep subsurface concentration maximum in empty-well drain portion 336 causes it to bulge laterally outward. The maximum bulge in drain portion 336, and therefore in empty-well drain 184B, occurs along the location of the deep subsurface concentration maximum in portion 336 of drain 184B.

A surface-adjoining portion 136A of p- substrate region 136 laterally separates empty-well body material 184A, specifically empty-well body-material portion 328, and empty-well drain 184B, specifically empty-well drain portion 336. Letting $L_{WW}$ represent the minimum separation distance between a pair of complementary (p-type and n-type) empty main wells of an extended drain IGFET such as IGFET 104, FIG. 16a indicates that minimum well-to-well separation distance $L_{WW}$ between empty-well body material 184A and empty-well drain 184B occurs generally along the locations of their maximum lateral bulges. This arises because average depths $y_{PWPK}$ and $y_{NWPK}$ of the deep subsurface concentration maxima in body material 184A and drain 184B are largely equal in the example of FIGS. 5.2 and 16a. A difference between depths $y_{PWPK}$ and $y_{NWPK}$ would typically cause the location of minimum well-to-well separation $L_{WW}$ for IGFET 104 to move somewhat away from the location indicated in FIG. 16a and to be somewhat slanted relative to the upper semiconductor surface rather than being fully lateral as indicated in FIG. 16a.

Well-separating portion 136A is lightly doped because it constitutes part of p- substrate region 136. The deep concentration maximum of the p-type dopant in p-type empty-well body material 184A occurs in its moderately doped lower part (328L). The deep concentration maximum of the n-type dopant in n-type empty-well drain 184B similarly occurs in its moderately doped lower part (336L). Hence, the moderately doped lower part (328L) of p-type body material 184A and the moderately doped lower part (336L) of n-type drain 184B are laterally separated by a more lightly doped portion of the semiconductor body.

Channel zone 322 (not specifically demarcated in FIG. 5.2 or 16a) consists of all the p-type monosilicon between source 320 and drain 184B. In particular, channel zone 322 is formed by a surface-adjoining segment of well-separating portion 136A, a surface-adjoining segment of the p- upper part (328U) of body-material portion 328, and (a) all of p halo pocket portion 326 if source 320 extends deeper than halo pocket 326 as illustrated in the example of FIGS. 5.2 and 16a or (b) a surface-adjoining segment of halo pocket 326 if it extends deeper than source 320. In any event, halo pocket 326 is more heavily doped p-type than the directly adjacent material of the p- upper part (328U) of body-material portion 328 in channel zone 322. The presence of halo pocket 326 along source 320 thereby causes channel zone 322 to be asymmetrically longitudinally graded. The presence of the surface-adjoining segment of well-separating portion 136A in channel zone 322 causes it to be further asymmetrically longitudinally graded.

Drain 184B extends below recessed field insulation 138 so as to electrically connect material of drain 184B in island 144A to material of drain 184B in island 144B. In particular, field insulation 138 laterally surrounds n++ drain contact portion 334 and an underlying more lightly doped portion 184B1 of empty-well drain 184B. A portion 138A of field insulation 138 thereby laterally separates drain contact portion 334 and more lightly doped underlying drain portion 184B1 from a portion 184B2 of drain 184B situated in island 144A. Drain portion 184B2 is continuous with p- well-separating portion 136A and extends up to the upper semiconductor surface. The remainder of drain 184B is identified as item 184B3 in FIG. 16a and consists of the n-type drain material extending from the bottoms of islands 144A and 144B down to the bottom of drain 184B. Since drain 184B extends below field insulation 138 and thus considerably deeper than source 320, the bottom of channel zone 322 slants considerably downward in moving from source 320 to drain 184B.

A gate dielectric layer 344 at the $t_{GdH}$ high thickness value is situated on the upper semiconductor surface and extends over channel zone 322. A gate electrode 346 is situated on gate dielectric layer 344 above channel zone 322. Gate electrode 346 extends partially over source 320 and drain 184B. More particularly, gate electrode 346 extends partially over source extension 320E but not over main source portion 320M. Gate electrode 346 extends over drain portion 184B2 and partway, typically approximately halfway, across field-insulation portion 138A toward drain contact portion 334. Dielectric sidewall spacers 348 and 350 are situated respectively along the opposite transverse sidewalls of gate electrode 346. Metal silicide layers 352, 354, and 356 are respectively situated along the tops of gate electrode 346, main source portion 320M, and drain contact portion 334.

Extended-drain IGFET 104 is in the biased-on state when (a) its gate-to-source voltage $V_{GS}$ equals or exceeds its positive threshold voltage $V_T$ and (b) its drain-to-source voltage $V_{is}$ is at a sufficiently positive value as to cause electrons to flow from source 320 through channel 322 to drain 184B. When gate-to-source voltage $V_{GS}$ of IGFET 104 is less than its threshold voltage $V_T$ but drain-to-source voltage $V_{is}$ is at a sufficiently positive value that electrons would flow from source 320 through channel 322 to drain 184B if gate-to-source voltage $V_{GS}$ equaled or exceeded its threshold voltage $V_T$ so as to make IGFET 104 conductive, IGFET 104 is in the biased-off state. There is no significant flow from source 320 through channel 322 to drain 184B as long as drain-to-source voltage $V_{DS}$ is not high enough to place IGFET 104 in a breakdown condition.

The doping characteristics of empty-well body material 184A and empty-well drain 184B cause the peak magnitude of the electric field in the monosilicon of extended-drain IGFET 104 to occur significantly below the upper semiconductor surface when IGFET 104 is in the biased-off state. During IGFET operation, IGFET 104 undergoes considerably less deterioration due to hot-carrier gate dielectric charging than a conventional extended-drain IGFET in which the peak magnitude of the electric field in the IGFET's monosilicon occurs along the upper semiconductor surface. The reliability of IGFET 104 is increased considerably.

An explanation of how the doping characteristics of empty-well body material 184A and empty-well drain 184B enable the peak magnitude of the electric field in the monosilicon of IGFET 104 to occur significantly below the upper semiconductor surface when IGFET 104 is in the biased-off state is presented in U.S. patent application Ser. No. 12/382/793, cited above. Briefly, empty main well maximum dopant concentration depths $y_{PWPK}$ and $y_{NWPK}$ are of similar values with p-type empty main well maximum concentration depth $y_{PWPK}$ in p-type empty-well body-material 184A typically being slightly greater than n-type empty main well maximum concentration depth $y_{NWPK}$ in n-type empty-well drain 184B.

Both of empty main well maximum dopant concentration depths $y_{PWPK}$ and $y_{NWPK}$ of IGFET 104 are greater than maximum depth $y_S$ of source 320. Each of depths $y_{PWPK}$ and $y_{NWPK}$ is normally at least twice maximum source depth $y_S$ of IGFET 104 but normally no more than 10 times, preferably no more than 5 times, more preferably no more than 4 times, greater than source depth $y_S$ of IGFET 104. For example, each depth $y_{PWPK}$ or $y_{NWPK}$ is typically 2-3 times source depth $y_S$.

Beginning with empty-well body material 184A, the concentration of the p-type empty main well dopant decreases, typically substantially monotonically, by at least a factor of 10, preferably by at least a factor of 20, more preferably by at least a factor of 40, in moving from the location of the maximum concentration of the p-type empty main well dopant at depth $y_{PWPK}$ upward along a selected imaginary vertical line through p-type empty-well body-material portion 328, including the portion of channel zone 322 between halo pocket portion 326 and portion 136A of p-substrate region 136, to the upper semiconductor surface. For example, the concentration of the p-type empty main well dopant typically decreases substantially monotonically by more than a factor of 80, in the vicinity of 100, in moving from the $y_{PWPK}$ location of the maximum concentration of the p-type empty main well dopant upward along the selected vertical line through body-material portion 328 to the upper semiconductor surface. The concentration of the total p-type dopant reaches a maximum largely at depth $y_{PWPK}$ along the selected line and has largely the same variation as the concentration of the p-type empty main well dopant along the vertical line for depth y no greater than $y_{PWPK}$.

Turning to n-type empty-well drain 184B, the concentration of the n-type empty main well dopant similarly decreases, typically substantially monotonically, by at least a factor of 10, preferably by at least a factor of 20, more preferably by at least a factor of 40, in moving from the location of the maximum concentration of the n-type empty main well dopant at depth $y_{NWPK}$ upward along a selected imaginary vertical line through portions 184B3 and 184B2 of empty-well drain 184B to the upper semiconductor surface. For instance, the concentration of the n-type empty main well dopant typically decreases by more than a factor of 80, in the vicinity of 100, in moving from the $y_{NWPK}$ location of the maximum concentration of the n-type empty main well dopant upward along the selected vertical line through portions 184B3 and 184B2 of drain 184B to the upper semiconductor surface. The concentration of the total n-type dopant reaches a maximum at depth $y_{NWPK}$ along the vertical line and varies the same along the vertical line through portions 184B2 and 184B3 of n-type empty-well drain 184B as the concentration of the n-type empty-well dopant.

F2. Operational Physics of Extended-Drain N-Channel IGFET

The foregoing empty-well characteristics enable extended-drain n-channel IGFET 104 to have the following device physics and operational characteristics. When IGFET 104 is in the biased-off state, the electric field in the IGFET's monosilicon reaches a peak value along drain-body junction 226 at a location determined by the proximity of empty well regions 184A and 184B to each other and by the maximum values of (a) concentration $N_T$ of the total p-type dopant in portion 328 of p-type empty-well body material 184A and (b) concentration $N_T$ the total n-type dopant in portions 184B2 and 184B3 of n-type empty-well drain 184B. Because depth $y_{PWPK}$ at the maximum value of concentration $N_T$ of the total p-type dopant in p-type empty-well body-material portion 328 normally approximately equals depth $y_{NWPK}$ at the maximum value of concentration $N_T$ of the total n-type dopant in portions 184B2 and 184B3 of n-type empty-well drain 184B and because empty wells 184A and 184B are closest to each other at depths $y_{PWPK}$ and $y_{NWPK}$, the peak value of the electric field in the monosilicon of IGFET 104 occurs approximately along drain-body junction 226 at depth $y_{NWPK}$. This location is indicated by circle 358 in FIG. 16a. Inasmuch as depth $y_{NWPK}$ is normally at least twice maximum depth $y_S$ of source 320, location 358 of the peak electric field in the monosilicon of IGFET 104 is normally at least twice maximum source depth $y_S$ of IGFET 104 when it is in the biased-off state.

When IGFET 104 is in the biased-on state, electrons flowing from source 320 to drain 184B initially travel in the monosilicon along the upper surface of the portion of channel zone 322 in empty-well body material 184A. Upon entering portion 136A of p-substrate region 136, the electrons move generally downward and spread out. Upon reaching drain 184B, the electron flow becomes distributed across the generally vertical portion of drain-body junction 226 in island 144A. The electron flow is also spread out laterally across portion 184B2 of drain 184B.

The velocities of the electrons, referred to as primary electrons, increase as they travel from source 320 to drain 184B, causing their energies to increase. Impact ionization occurs in drain 184B when highly energetic primary electrons strike atoms of the drain material to create secondary charge carriers, both electrons and holes, which travel generally in the direction of the local electric field. Some of the secondary charge carriers, especially the secondary holes, generated in the bulk region of high electric field travel upward toward the portion of dielectric layer 346 overlying portion 184B2 of drain 184B.

The amount of impact ionization generally increases as the electric field increases and as the current density of the primary electrons increases. The maximum amount of impact ionization occurs where the scalar product of the electric field vector and the primary electron current density vector is highest. By having the peak electric field occur along drain-body junction 226 at depth $y_{NWPK}$, impact ionization in drain 184B is forced significantly downward. The maximum amount of impact ionization in drain 184B normally occurs at a depth greater than maximum source depth $y_S$ of IGFET 104.

Compared to a conventional n-channel extended-drain IGFET of approximately the same size as IGFET 104, considerably fewer secondary charge carriers, especially secondary holes, generated by impact ionization in IGFET 104 reach the upper semiconductor surface with sufficient energy to enter gate dielectric layer 344. Hot carrier charging of gate dielectric 344 is considerably reduced. IGFET 104 thereby incurs much less threshold voltage drift caused by impact-ionization-generated charge carriers lodging in gate dielectric 344. The operating characteristics of IGFET 104 are very stable with operational time. The reliability and lifetime of IGFET 104 are considerably enhanced.

Threshold voltage $V_T$ of n-channel IGFET 104 is normally 0.5 V to 0.7 V, typically 0.6 V, at a drawn channel length $L_{DR}$ in the vicinity of 0.5 µm and a gate dielectric thickness of 6-6.5 nm. Extended-drain IGFET 104 is particularly suitable for power, high-voltage switching, EEPROM programming, and ESD protection applications at an operational voltage range, e.g., 12 V, considerably higher than the typically 3.0-V high-voltage operational range of asymmetric n-channel IGFET 100.

F3. Structure of Extended-Drain P-Channel IGFET

Extended-drain extended-voltage p-channel IGFET 106 is configured similarly to extended-drain extended-voltage n-channel IGFET 104. However, there are some notable differences due to the fact that deep n well 212 of p-channel IGFET does not reach the upper semiconductor surface.

Referring to FIGS. 5.2 and 16b, p-channel IGFET 106 has a p-type first S/D zone 360 situated in active semiconductor island 146A along the upper semiconductor surface. The combination of empty main well region 186B and a surface-adjoining portion 136B of p– substrate region 136 constitutes a p-type second S/D zone 186B/136B for IGFET 106. S/D zones 360 and 186B/136B are often respectively referred to below as source 360 and drain 186B/136B because they normally, though not necessarily, respectively function as source and drain.

Source 360 and drain 186B/136B are separated by a channel zone 362 of n-type body material formed with n-type empty main well region 186A and deep n well region 212. N-type empty-well body material 186A, i.e., portion 186A of total body material 186A and 212, forms a source-body pn junction 364 with p-type source 360. Deep n well 212 and n-type body material 186A form drain-body pn junction 228 with drain 186B/136B. One part of drain-body junction 228 is between deep n well 212 and p-type empty main well region 186B. Empty main well regions 186A and 186B are often respectively described below as empty-well body material 186A and empty-well drain material 186B in order to clarify the functions of empty wells 186A and 186B.

P-type source 360 consists of a very heavily doped main portion 360M and a more lightly doped, but still heavily doped, lateral extension 360E. External electrical contact to source 360 is made via p++ main source portion 360M. P+ source extension 360E terminates channel zone 362 along the upper semiconductor surface at the source side of IGFET 106.

Main source portion 360M extends deeper than source extension 360E. As a result, the maximum depth $y_S$ of source 360 is the maximum depth $y_{SM}$ of main source portion 360M. Maximum source depth $y_S$ for IGFET 106 is indicated in FIG. 16b. Main source portion 360M and source extension 360E are respectively defined with the p-type main S/D and shallow source extension dopants.

A moderately doped halo pocket portion 366 of n-type empty-well body material 186A extends along source 360 up to the upper semiconductor surface and terminates at a location within body material 186A and thus between source 360 and drain 186B/136B. FIGS. 5.2 and 16b illustrate the situation in which source 360, specifically main source portion 360M, extends deeper than n source-side halo pocket 366. As an alternative, halo pocket 366 can extend deeper than source 360. In that case, halo pocket 366 extends laterally under source 360. Halo pocket 366 is defined with the n-type source halo dopant.

The portion of n-type empty-well body material 186A outside source-side halo pocket portion 366 is indicated as item 368 in FIGS. 5.2 and 16b. In moving from the location of the deep n-type empty-well concentration maximum in body material 186A toward the upper semiconductor surface along a selected imaginary vertical line through channel zone 362 outside halo pocket 366, the concentration of the n-type dopant in body-material portion 368 drops gradually from a moderate doping, indicated by symbol "n", to a light doping, indicated by symbol "n-". Dotted line 372 (only labeled in FIG. 16b) roughly represents the location below which the n-type dopant concentration in body-material portion 368 is at the moderate n doping and above which the n-type dopant concentration in portion 368 is at the light n– doping. The moderately doped part of body-material portion 368 below line 372 is indicated as n lower body-material part 368L in FIG. 16b. The lightly doped part of body-material portion 368 above line 372 outside n halo pocket 366 is indicated as n-upper body-material part 368U in FIG. 16b.

The n-type dopant in n-type body-material portion 368 consists of the n-type empty main well dopant and (near n halo pocket portion 366) the n-type source halo dopant that forms halo pocket portion 366. Because the n-type empty main well dopant in n-type empty-well body material 186A reaches a deep subsurface concentration maximum along a subsurface location at average depth $y_{NWPK}$, the presence of the n-type empty main well dopant in body-material portion 368 causes the concentration of the total n-type dopant in portion 368 to reach a deep local subsurface concentration maximum substantially at the location of the deep subsurface concentration maximum in body material 186A. The deep subsurface concentration maximum in body-material portion 368, as indicated by the left-hand dash-and-double-dot line labeled "MAX" in FIG. 16b, extends laterally below the upper semiconductor surface and likewise occurs at average depth $y_{NWPK}$. The occurrence of the deep subsurface concentration maximum in body-material portion 368 causes it to bulge laterally outward. The maximum bulge in body-material portion 368, and thus in body material 186A, occurs along the location of the deep subsurface concentration maximum in portion 368 of body material 186A.

P-type drain 186B/136B, specifically empty-well drain material 186B, includes a very heavily doped external contact portion 374 situated in active semiconductor island 146B along the upper semiconductor surface. P++ external drain contact portion 374 is sometimes referred to here as the main drain portion because, similar to main source portion 360M, drain contact portion 374 is very heavily doped, is spaced apart from channel zone 372, and is used in making external electrical contact to IGFET 106. The portion of empty well 186B outside n++ external drain contact portion/main drain portion 374 is indicated as item 376 in FIGS. 5.2 and 16*b*.

In moving from the location of the deep p-type empty-well concentration maximum in empty well 186B toward the upper semiconductor surface along an imaginary vertical line 378 through island 146A, the concentration of the p-type dopant in drain 186B/136B drops gradually from a moderate doping, indicated by symbol "p", to a light doping, indicated by symbol "p-". Dotted line 380 (only labeled in FIG. 16*b*) roughly represents the location below which the p-type dopant concentration in empty-well drain portion 376 is at the moderate p doping and above which the p-type dopant concentration in portion 376 is at the light p- doping. The moderately doped part of drain portion 376 below line 380 is indicated as p lower empty-well drain part 376L in FIG. 16*b*. The lightly doped part of drain portion 376 above line 380 is indicated as p- upper empty-well drain part 376U in FIG. 16*b*.

The p-type dopant in p-type empty-well drain portion 376 consists of the p-type empty main well dopant, the largely constant p-type background dopant of p- substrate region 136, and (near p++ drain contact portion 374) the p-type main S/D dopant utilized, as described below, to form drain contact portion 374. Since the p-type empty main well dopant in p-type drain 186B/136B reaches a deep subsurface concentration maximum at average depth $y_{PWPK}$, the presence of the p-type empty main well dopant in drain portion 376 causes the concentration of the total p-type dopant in portion 376 to reach a deep local subsurface concentration maximum substantially at the location of the deep subsurface concentration maximum in well 186B. The deep subsurface concentration maximum in drain portion 376, as indicated by the right-hand dash-and-double-dot line labeled "MAX" in FIG. 16*b*, extends laterally below the upper semiconductor surface and likewise occurs at average depth $y_{PWPK}$. The occurrence of the deep subsurface concentration maximum in empty-well drain portion 376 causes it to bulge laterally outward. The maximum bulge in drain portion 376, and thus in empty well 186B, occurs along the location of the deep subsurface concentration maximum in portion 376 of well 186B.

The deep n well dopant used to form deep n well 212 reaches a maximum subsurface dopant concentration at average depth $y_{DNWPK}$ along a location extending laterally below main wells 186A and 186B and the doped monosilicon situated between wells 186A and 186B. Somewhat similar to how the dopant concentration in each well 186A or 186B changes in moving from the location of the maximum well dopant concentration toward the upper semiconductor surface, the concentration of the n-type dopant in deep n well 212 drops gradually from a moderate doping, indicated by symbol "n", to a light doping, indicated by symbol "n-", in moving from the location of the maximum dopant concentration maximum in well 212 toward the upper semiconductor surface along a selected imaginary vertical line extending through the monosilicon situated between main wells 186A and 186B. Dotted line 382 (only labeled in FIG. 16*b*) roughly represents the location below which the n-type dopant concentration in deep n well 212 is at the moderate n doping and above which the n-type dopant concentration in deep n well is at the light n- doping. The moderately doped part of deep n well 212 below line 382 is indicated as n lower well part 212L in FIG. 16*b*. The lightly doped part of deep n well 212 above line 382 is indicated as n- upper well part 212U in FIG. 16*b*.

Empty-well body material 186A, specifically empty-well body-material portion 368, and empty-well drain material 186B, specifically empty-well drain portion 376, are laterally separated by a well-separating portion of the semiconductor body. The well-separating portion for IGFET 106 consists of (a) the lightly doped upper part (212U) of deep n well 212 and (b) overlying drain portion 136B. FIG. 16*b* indicates that minimum well-to-well separation distance $L_{WW}$ between empty-well body material 186A and well 186B occurs generally along the locations of their maximum lateral bulges. This arises because average depths $y_{NWPK}$ and $y_{PWPK}$ of the deep subsurface concentration maxima in body material 186A and well 186B are largely equal in the example of FIGS. 5.2 and 16*b*. A difference between depths $y_{NWPK}$ and $y_{PWPK}$ would typically cause the location of minimum well-to-well separation $L_{WW}$ for IGFET 106 to move somewhat away from the location indicated in FIG. 16*b* and to be somewhat slanted relative to the upper semiconductor surface rather than being fully lateral as indicated in FIG. 16*b*.

Letting the well-separating portion for IGFET 106 be referred to as well-separating portion 212U/136B, drain portion 136B of well-separating portion 212U/136B is lightly doped p-type since portion 136B is part of p- substrate region 136. Part 212U of well-separating portion 212U/136B is lightly doped n-type since part 212U is the lightly doped upper part of deep n well 212. The deep concentration maximum of the n-type dopant in n-type empty-well body material 186A occurs in its moderately doped lower part (368L). The deep concentration of the p-type dopant in p-type empty well 186B similarly occurs in its moderately doped lower part (336L). Hence, the moderately doped lower part (368L) of n-type body material 186A and the moderately doped lower part (376L) of p-type well 186B are laterally separated by a more lightly doped portion of the semiconductor body.

Channel zone 362 (not specifically demarcated in FIG. 5.2 or 16*b*) consists of all the n-type monosilicon between source 360 and drain 186B/136B. In particular, channel zone 362 is formed by a surface-adjoining segment of the n- upper part (368U) of body-material portion 368, and (a) all of n halo pocket portion 366 if source 360 extends deeper than halo pocket 366 as illustrated in the example of FIGS. 5.2 and 16*b* or (b) a surface-adjoining segment of halo pocket 366 if it extends deeper than source 360. In any event, halo pocket 366 is more heavily doped n-type than the directly adjacent material of the n- upper part (368U) of body-material portion 368 in channel zone 362. The presence of halo pocket 366 along source 360 thereby causes channel zone 362 to be asymmetrically longitudinally graded.

Well region 186B of drain 186B/136B extends below recessed field insulation 138 so as to electrically connect material of drain 186B/136B in island 146A to material of drain 186B/136B in island 146B. In particular, field insulation 138 laterally surrounds p++ drain contact portion 374 and an underlying more lightly doped portion 186B1 of drain 186B/136B. A portion 138B of field insulation 138 thereby laterally separates drain contact portion 374 and more lightly doped underlying drain portion 186B1 from a portion 186B2 of well 186B situated in island 146A. Drain portion 186B2 is continuous with lightly doped well-separating portion 212U/136B and extends up to the upper semiconductor surface. The remainder of well 186B is identified as item 186B3 in FIG. 16*b* and consists of the n-type drain material extending from the bottoms of islands 146A and 146B down to the bottom of well 186B.

A gate dielectric layer 384 at the $t_{GdH}$ high thickness value is situated on the upper semiconductor surface and extends over channel zone 362. A gate electrode 386 is situated on gate dielectric layer 384 above channel zone 362. Gate electrode 386 extends partially over source 360 and drain 186B/136B. More particularly, gate electrode 386 extends partially over source extension 360E but not over main source portion 360M. Gate electrode 386 extends over drain portions 136B and 186B2 and partway, typically approximately halfway, across field-insulation portion 138B toward drain contact portion 374. Dielectric sidewall spacers 388 and 390 are situated respectively along the opposite transverse sidewalls of gate electrode 386. Metal silicide layers 392, 394, and 396 are respectively situated along the tops of gate electrode 386, main source portion 360M, and drain contact portion 374.

Extended-drain IGFET 106 is in the biased-on state when (a) its gate-to-source voltage $V_{GS}$ equals or is less than its negative threshold voltage $V_T$ and (b) its drain-to-source voltage $V_{is}$ is at a sufficiently negative value as to cause holes to flow from source 360 through channel 362 to drain 186B/136B. When gate-to-source voltage $V_{GS}$ of IGFET 106 exceeds its threshold voltage $V_T$ but drain-to-source voltage $V_{DS}$ is at a sufficiently negative value that holes would flow from source 360 through channel 362 to drain 186B/136B if gate-to-source voltage $V_{GS}$ equaled or were less than its threshold voltage $V_T$ so as to make IGFET 106 conductive, IGFET 106 is in the biased-off state. There is no significant flow of holes from source 360 through channel 362 to drain 186B/136B as long as drain-to-source voltage $V_{DS}$ is not low enough, i.e., of a sufficiently high negative value, to place IGFET 106 in a breakdown condition.

The doping characteristics of empty-well body material 186A and empty well region 186B of drain 186B/136B are likewise of such a nature that the peak magnitude of the electric field in the monosilicon of IGFET 106 occurs significantly below the upper semiconductor surface when IGFET 106 is in the biased-off state. Consequently, IGFET 104 undergoes considerably less deterioration during IGFET operation due to hot-carrier gate dielectric charging than a conventional extended-drain IGFET whose electric field reaches a maximum in the monosilicon along the upper semiconductor surface. IGFET 106 has considerably enhanced reliability.

The empty-well doping characteristics that cause the peak magnitude of the electric field in the monosilicon of p-channel IGFET 106 to occur significantly below the upper semiconductor surface when IGFET 106 is in the biased-off state are quite similar to the empty-well doping characteristics of n-channel IGFET 104.

An explanation of how the doping characteristics of empty-well body material 186A and empty-well region 184B of drain 186B/136B enable the peak magnitude of the electric field in the monosilicon of IGFET 106 to occur significantly below the upper semiconductor surface when IGFET 106 is in the biased-off state is presented in U.S. patent application Ser. No. 12/382/793, cited above. Briefly, the concentration of the n-type empty well dopant in n-type empty-well body material 186A reaches a maximum concentration largely at average depth $y_{NWPK}$ along a selected imaginary vertical line through body-material portion 368 of body material 186A. The concentration of the p-type empty main well dopant in portions 186B2 and 186B3 of empty well 186B of n-type drain 186B/136B reaches a maximum concentration largely at average depth $y_{PWPK}$ along a selected imaginary vertical line through portions 186B2 and 186B3 of empty well 186B. The dopant concentration maxima largely at roughly equal depths $y_{NWPK}$ and $y_{PWPK}$ in empty-well body material 186A and empty well 186B arise, as mentioned above, from respective ion implantations of the n-type and p-type empty main well dopants.

Both of empty main well maximum dopant concentration depths $y_{NWPK}$ and $y_{PWPK}$ of IGFET 106 are greater than maximum depth $y_S$ of source 360. Each of depths $y_{NWPK}$ and $y_{PWPK}$ is normally at least twice maximum source depth $y_S$ of IGFET 106 but normally no more than 10 times, preferably no more than 5 times, more preferably no more than 4 times, greater than source depth $y_S$ of IGFET 106. Each depth $y_{PWPK}$ or $y_{NWPK}$ is typically 2-4 times source depth $y_S$.

The concentration of the n-type empty main well dopant decreases, typically substantially monotonically, by at least a factor of 10, preferably by at least a factor of 20, more preferably by at least a factor of 40, in moving from the location of the maximum concentration of the n-type empty main well dopant at depth $y_{NWPK}$ upward along the selected vertical line through n-type empty-well body-material portion 368, including the portion of channel zone 362 outside halo pocket portion 366, to the upper semiconductor surface. For example, the concentration of the n-type empty main well dopant typically decreases by more than a factor of 80, in the vicinity of 100, in moving from the $y_{NWPK}$ location of the maximum concentration of the n-type empty main well dopant upward along the selected vertical line through body-material portion 368 to the upper semiconductor surface. The concentration of the total n-type dopant in body-material portion 368 also reaches a maximum largely at depth $y_{NWPK}$ along the vertical line and has largely the same variation as the concentration of the n-type empty main well dopant along the vertical line for depth y no greater than $y_{NWPK}$.

Moving to p-type empty well region 186B of drain 186B/136B, the concentration of the p-type empty main well dopant decreases, typically substantially monotonically, by at least a factor of 10, preferably by at least a factor of 20, more preferably by at least a factor of 40, in moving from the location of the maximum concentration of the p-type empty main well dopant at depth $y_{PWPK}$ upward along the selected vertical line through portions 186B3 and 186B2 of drain 186B/136B to the upper semiconductor surface. For instance, the concentration of the p-type empty main well dopant decreases by more than a factor of 80, in the vicinity of 100, in moving from the $y_{NWPK}$ location of the maximum concentration of the p-type empty main well dopant upward along the selected vertical line through drain portions 186B3 and 186B2 to the upper semiconductor surface. The concentration of the total p-type dopant in portions 186B2 and 186B3 of empty well region 186B along the vertical line and has largely the same variation as the concentration of the p-type empty main well dopant along the vertical line for depth y no greater than $y_{PWPK}$.

F4. Operational Physics of Extended-Drain P-Channel IGFET

Extended-drain p-channel IGFET 106 has very similar device physics and operational characteristics to extended-drain n-channel IGFET 104 subject to the voltage and charge polarities being reversed. The device physics and operation of IGFETS 104 and 106 do not differ significantly due to the fact the portion 136B of p– substrate 136 forms part of p-type drain 186B/136B of IGFET 106 whereas similarly located portion 136A of substrate 136 forms part of the overall p-type body material for IGFET 104. The drain characteristics of IGFET 106 are determined more by the substantial p-type doping in portions 186B2 and 186B3 of empty well region 186B of drain 186B/136B than by the lighter p-type doping in substrate portion 136B.

When IGFET 106 is in the biased-off state, the electric field in the IGFET's monosilicon reaches a peak value along drain-body junction 228 at a location determined by the proximity of empty well regions 186A and 186B to each other and by the maximum values of (a) the concentration of the total n-type dopant in portion 368 of n-type empty-well body material 186A and (b) the concentration of the total p-type dopant in portions 186B2 and 186B3 of p-type empty-well drain material 186B of drain 186B/136B. Because depth $y_{NWPK}$ at the maximum concentration of the total n-type dopant in n-type empty-well body-material portion 368 normally approximately equals depth $y_{NWPK}$ at the maximum concentration of the total p-type dopant in portions 186B2 and 186B3 of p-type drain 186B/136B and because empty wells 186A and 186B are closest to each other at depths $y_{NWPK}$ and $y_{PWPK}$, the peak value of the electric field in the monosilicon of IGFET 106 occurs approximately along drain-body junction 228 at depth $y_{NWPK}$. This location is indicated by circle 398 in FIG. 16b. Since depth $y_{PWPK}$ is normally at least twice maximum depth $y_S$ of source 360, location 398 of the peak electric field in the monosilicon of IGFET 106 is normally at least twice maximum source depth $y_S$ of IGFET 106 when it is in the biased-off state.

Holes moving in one direction essentially constitute electrons moving away from dopant atoms in the opposite direction. Upon placing IGFET 106 in the biased-on state, holes flowing from source 360 to drain 186B/136B initially travel in the monosilicon along the upper surface of the portion of channel zone 362 in empty-well body material 186A. As the holes enter p– substrate portion 136B of drain 186B/136B, they generally move downward and spread out. The holes move downward further and spread out more as they enter portion 186B2 of drain 186B/136B.

The velocities of the holes, referred to as primary holes, increase as they travel from source 360 to drain 186B/136B, causing their energies to increase. Impact ionization occurs in drain 186B/136B when highly energetic charge carriers strike atoms of the drain material to create secondary charge carriers, once again both electrons and holes, which travel generally in the direction of the local electric field. Some of the secondary charge carriers, especially the secondary electrons, generated in the bulk region of high electric field travel upward toward the portion of dielectric layer 386 overlying drain portion 186B2.

The amount of impact ionization generally increases with increasing electric field and with increasing primary hole current density. In particular, the maximum amount of impact ionization occurs generally where the scalar product of the electric field vector and the primary hole current density vector is highest. Because the peak electric field occurs along drain-body junction 228 at depth $y_{PWPK}$, impact ionization in drain 186B/136B is forced significantly downward. The highest amount of impact ionization in drain 186B/136B normally occurs at a depth greater than maximum source depth $y_S$ of IGFET 106.

In comparison to a conventional extended-drain p-channel IGFET of approximately the same size as IGFET 106, considerably fewer secondary charge carriers, especially secondary electrons, generated by impact ionization in IGFET 106 reach gate dielectric layer 384. As a result, gate dielectric 384 incurs considerable less hot carrier charging. Threshold voltage drift resulting from impact-ionization-generated electrons lodging in gate dielectric 386 is greatly reduced in IGFET 106. Its operating characteristics are very stable with operational time. The net result is that IGFET 106 has considerably enhanced reliability and lifetime.

Threshold voltage $V_T$ of p-channel IGFET 106 is normally −0.45 V to −0.7 V, typically −0.55 V to −0.6 V, at a drawn channel length $L_{DR}$ in the vicinity of 0.5 µm and a gate dielectric thickness of 6-6.5 nm. As with extended-drain IGFET 105, extended-drain IGFET 106 is particularly suitable for power, high-voltage switching, EEPROM programming, and ESD protection applications at an operational voltage range, e.g., 12 V, considerably higher than the typically 3.0-V high-voltage operational range of asymmetric p-channel IGFET 102.

G. Symmetric Low-Voltage Low-Leakage IGFETs

Figure 17:
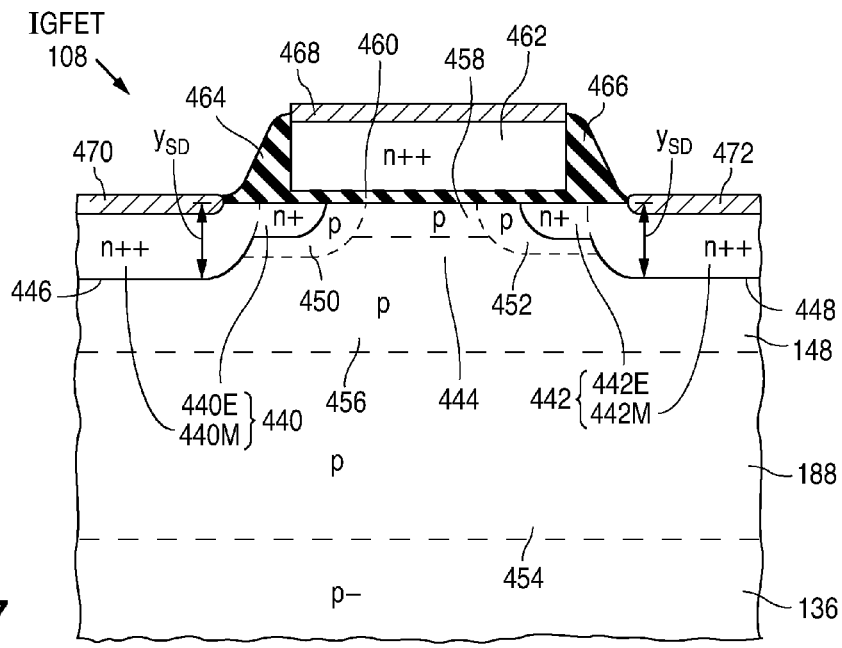
FIG. 17 is an expanded front cross-sectional view of the core of the symmetric low-leakage n-channel IGFET of FIG. 5.3.

Next, the internal structure of the illustrated symmetric IGFETs is described beginning with symmetric low-voltage low-leakage filled-well complementary IGFETs 108 and 110 of increased $V_T$ magnitudes (compared to the nominal $V_T$ magnitudes of respective IGFETs 120 and 122). An expanded view of the core of n-channel IGFET 108 as depicted in FIG. 5.3 is shown in FIG. 17. IGFET 108 has a pair of n-type S/D zones 440 and 442 situated in active semiconductor island 148 along the upper semiconductor surface. S/D zones 440 and 442 are separated by a channel zone 444 of p-type filled main well region 188 which, in combination with p– substrate region 136, constitutes the body material for IGFET 108. P-type body-material filled well 188 forms (a) a first pn junction 446 with n-type S/D zone 440 and (b) a second pn junction 448 with n-type S/D zone 442.

S/D zones 440 and 442 are largely identical. Each n-type S/D zone 440 or 442 consists of a very heavily doped main portion 440M or 442M and a more lightly doped, but still heavily doped, lateral extension 440E or 442E. External electrical contacts to source 440 and drain 442 are respectively made via main source portion 440M and main drain portion 442M. Since S/D zones 440 and 442 are largely identical, n++ main S/D portions 440M and 442M are largely identical. N+ S/D extensions 440E and 442E likewise are largely identical.

Main S/D portions 440M and 442M extend deeper than S/D extensions 440E and 442E. Accordingly, the maximum depth $y_{SD}$ of each S/D zone 440 or 442 is the maximum depth of main S/D portion 440M or 442M. Channel zone 444 is terminated along the upper semiconductor surface by S/D extensions 440E and 442E. Main S/D portions 440M and 442M are defined with the n-type main S/D dopant. S/D extensions 440E and 442E are normally defined by ion implantation of n-type semiconductor dopant referred to as the n-type shallow S/D-extension dopant.

A pair of moderately doped laterally separated halo pocket portions 450 and 452 of p-type body-material filled main well 188 respectively extend along S/D zones 440 and 442 up to the upper semiconductor surface and terminate at respective locations between S/D zones 440 and 442. P halo pockets 450 and 452 are largely identical. FIGS. 5.3 and 17 illustrate the situation in which S/D zones 440 and 442 extend deeper than halo pockets 450 and 452. Alternatively, halo pockets 450 and 452 can extend deeper than S/D zones 440 and 442. Halo pockets 450 and 452 then respectively extend laterally under S/D zones 440 and 442. Ion implantation of p-type semiconductor dopant referred to as the p-type S/D halo dopant, or as the p-type S/D-adjoining pocket dopant, is normally employed in defining halo pockets 450 and 452. The p-type S/D halo dopant reaches a maximum concentration in each halo pocket 450 or 452 at a location below the upper semiconductor surface.

The material of p-type body-material filled main well 188 outside halo pocket portions 450 and 452 consists of a moderately doped main body-material portion 454, a moderately doped intermediate body-material portion 456, and a moderately doped upper body-material portion 458. P main body-material portion 454 overlies p– substrate region 136. P intermediate body-material portion 456 overlies main body-material portion 454. Each of body-material portions 454 and 456 extends laterally below at least substantially all of channel zone 444 and normally laterally below substantially all of each of channel zone 444 and S/D zones 440 and 442. P upper body-material portion 458 overlies intermediate body-material portion 456, extends vertically to the upper semiconductor surface, and extends laterally between halo pocket portions 450 and 452.

P body-material portions 454, 456, and 458 are normally respectively defined by ion implantations of the p-type filled main well, APT, and threshold-adjust dopants. Although body-material portions 454, 456, and 458 are all described here as moderately doped, the p-type filled main well, APT, and threshold-adjust dopants have concentrations that reach maximum values at different average depths. Body-material portions 454, 456, and 458 are often referred to here respectively as p filled-well main body-material portion 454, p APT body-material portion 456, and p threshold-adjust body-material portion 458.

The deep p-type filled-well local concentration maximum produced by the p-type filled main well dopant in filled main well 188 occurs deeper than each of the shallow p-type filled-well local concentration maxima produced by the p-type APT and threshold-adjust dopants in well 188. Also, the local concentration maximum resulting from each of the p-type filled main well, APT, and threshold-adjust dopants extends substantially fully laterally across well 188. Consequently, the p-type APT and threshold-adjust dopants fill the well region otherwise defined by the p-type filled main well dopant at the location of well 188.

The deep filled-well concentration maximum produced by the p-type filled main well dopant in p-type filled-well main body-material portion 454 occurs below channel zone 444 and S/D zones 440 and 442 at a location that extends laterally below at least substantially all of channel zone 444 and normally laterally below substantially all of each of channel zone 444 and S/D zones 440 and 442. The location of the filled-well concentration maximum provided by the p-type filled main well dopant in body-material portion 454 is, as indicated above, normally at approximately the same average depth $y_{PWPK}$ as the concentration maximum of the p-type empty main well dopant and thus normally at an average depth of 0.4-0.8 µm, typically 0.55-0.6 µm.

The shallow filled-well concentration maximum produced by the p-type APT dopant in p-type APT body-material portion 456 occurs at a location that extends laterally across at least substantially the full lateral extent of channel zone 444 and normally laterally across at least substantially the full composite lateral extent of channel zone 444 and S/D zones 440 and 442. The location of the filled-well concentration maximum provided by the p-type APT dopant is typically slightly below the bottoms of channel zone 444 and S/D zones 440 and 442 but can be slightly above, or substantially coincident with, the bottoms of channel zone 444 and S/D zones 440 and 442. As indicated above, the location of the maximum concentration of the p-type APT dopant normally occurs at an average depth of more than 0.1 µm but not more than 0.4 µm. The average depth of the maximum concentration of the p-type APT dopant in body-material portion 456 is typically 0.25 µM.

The shallow filled-well concentration maximum produced by the p-type threshold-adjust dopant in p-type threshold-adjust body-material portion 458 similarly occurs at a location that extends laterally across at least substantially the full lateral extent of channel zone 444 and normally laterally across at least substantially the full composite lateral extent of channel zone 444 and S/D zones 440 and 442. Hence, the location of the filled-well concentration maximum provided by the p-type threshold dopant extends laterally beyond upper body-material portion into halo pocket portions 450 and 452 and S/D zones 440 and 442. The location of the maximum concentration of the p-type threshold-adjust dopant in body-material portion 458 is normally at an average depth of less than 0.1 µm, typically 0.08-0.09 µm. Also, the maximum concentration of the p-type threshold-adjust dopant in main filled well 188 is normally significantly less than the maximum concentrations of the p-type filled main well, APT, and S/D halo dopants in well 188.

Channel zone 444 (not specifically demarcated in FIG. 5.3 or 17) consists of all the p-type monosilicon between S/D zones 440 and 442. In particular, channel zone 444 is formed by threshold-adjust body-material portion 458, an underlying segment of APT body-material portion 456, and (a) all of p halo pocket portion 450 and 452 if S/D zones 440 and 442 extend deeper than halo pockets 450 and 452 as illustrated in the example of FIGS. 5.3 and 17 or (b) surface-adjoining segments of halo pockets 450 and 452 if they extend deeper than S/D zones 440 and 442. Since the maximum concentration of the p-type threshold-adjust dopant in main filled well 188 is normally significantly less than the maximum concentration of the p-type S/D halo dopant in well 188, halo pockets 450 and 452 are more heavily doped p-type than the directly adjacent material of well 188.

A gate dielectric layer 460 at the $t_{GdL}$ low thickness value is situated on the upper semiconductor surface and extends over channel zone 444. A gate electrode 462 is situated on gate dielectric layer 460 above channel zone 444. Gate electrode 462 extends partially over S/D zones 440 and 442. In particular, gate electrode 462 extends over part of each n+ S/D extension 440E or 442E but normally not over any part of either n++ main S/D portion 440M or 442M. Dielectric sidewall spacers 464 and 466 are situated respectively along the opposite transverse sidewalls of gate electrode 462. Metal silicide layers 468, 470, and 472 are respectively situated along the tops of gate electrode 462 and main S/D portions 440M and 442M.

Low-voltage low-leakage p-channel IGFET 110 is configured basically the same as low-voltage low-leakage n-channel IGFET 108 with the conductivity types reversed. Referring again to FIG. 5.3, p-channel IGFET 110 has a pair of largely identical p-type S/D zones 480 and 482 situated in active semiconductor island 150 along the upper semiconductor surface. S/D zones 480 and 482 are separated by a channel zone 484 of n-type filled main well region 190 which constitutes the body material for IGFET 110. N-type body-material filled well 190 forms (a) a first pn junction 486 with p-type S/D zone 480 and (b) a second pn junction 488 with p-type S/D zone 482.

Subject to the body material for p-channel IGFET 110 being formed with a filled main well rather than the combination of a filled main well and underlying material of the semiconductor body as occurs with n-channel IGFET 108, p-channel IGFET 110 is configured the same as n-channel IGFET 108 with the conductivity types reversed. Accordingly, p-channel IGFET 110 contains largely identical moderately doped n-type halo pocket portions 490 and 492, a moderately doped n-type main body-material portion 494, a moderately doped n-type intermediate body-material portion 496, a moderately doped n-type upper body-material portion 498, a gate dielectric layer 500 at the $t_{GdL}$ low thickness value, a gate electrode 502, dielectric sidewall spacers 504 and 506, and metal silicide layers 508, 510, and 512 configured respectively the same as regions 450, 452, 454, 456, 458, 460, 462, 464, 466, 468, 470, and 472 of n-channel IGFET 108. N halo pocket portions 490 and 492 are defined with n-type semiconductor dopant referred to as the n-type S/D halo dopant or as the n-type S/D-adjoining pocket dopant.

N main body-material portion 494 overlies p− substrate region 136 and forms pn junction 230 with it. Also, each p-type S/D zone 480 or 482 consists of a very heavily doped main portion 480M or 482M and a more lightly doped, but still heavily doped, lateral extension 480E or 482E. Main S/D portions 480M and 482M are defined with the p-type main S/D dopant. S/D extensions 480E and 482E are defined with p-type semiconductor dopant referred to as the p-type shallow S/D-extension dopant. All of the comments made about the doping of p-type filled main well 188 of n-channel IGFET 108 apply to n-type filled main well 190 of p-channel IGFET 110 with the conductivity types reversed and with regions 188, 440, 442, 444, 450, 452, 454, 456, and 458 of n-channel IGFET 108 respectively replaced with regions 190, 480, 482, 484, 490, 492, 494, 496, and 498 of p-channel IGFET 110.

P-channel IGFET 110 operates substantially the same as n-channel IGFET 108 with the voltage polarities reversed. The source-to-drain ("S-D") current leakage in the biased-off state of each of IGFETs 108 and 110 is very low due to optimization of the IGFET's dopant distribution and gate dielectric characteristics.

Threshold voltage $V_T$ of each of symmetric low-voltage low-$V_T$ IGFETs 112 and 114 is normally −0.01 V to 0.19 V, typically 0.09 V, at a drawn channel length $L_{DR}$ of 0.3 μm and a gate dielectric thickness of 2 nm. Accordingly, n-channel IGFET 112 is typically an enhancement-mode device whereas p-channel IGFET 114 is typically a depletion-mode device. IGFETs 112 and 114 are particularly suitable for low-voltage analog and digital applications, e.g., an operational range of 1.2 V, which require threshold voltages $V_T$ of reduced magnitude and can accommodate somewhat increased channel length L.

H. Symmetric Low-Voltage Low-Threshold-Voltage IGFETs

Symmetric low-voltage low-$V_T$ empty-well complementary IGFETs 112 and 114 are described with reference only to FIG. 5.4. N-channel IGFET 112 has a pair of largely identical n-type S/D zones 520 and 522 situated in active semiconductor island 152 along the upper semiconductor surface. S/D zones 520 and 522 are separated by a channel zone 524 of p-type empty main well region 192 which, in combination with p− substrate region 136, constitutes the body material for IGFET 112. P-type body-material empty well 192 forms (a) a first pn junction 526 with n-type S/D zone 520 and (b) a second pn junction 528 with n-type S/D zone 522.

Each n-type S/D zone 520 or 522 consists of a very heavily doped main portion 520M or 522M and a more lightly doped, but still heavily doped, lateral extension 520E or 522E. Largely identical n+ S/D extensions 520E and 522E, which terminate channel zone 524 along the upper semiconductor surface, extend deeper than largely identical n++ main S/D portions 520M and 522M. In fact, each S/D-body junction 526 or 528 is solely a pn junction between empty well 192 and S/D extension 520E or 522E.

S/D extensions 520E and 522E are, as described below, normally defined by ion implantation of the n-type deep S/D-extension dopant at the same time as drain extension 242 of asymmetric n-channel IGFET 100. The n-type shallow S/D-extension implantation used to define S/D extensions 440E and 442 of symmetric low-voltage low-leakage n-channel IGFET 108 is, as indicated below, performed more shallowly than the n-type deep S/D-extension implantation. As a result, S/D extensions 520E and 522E of symmetric empty-well IGFET 112, also a low-voltage n-channel device, extend deeper than S/D extensions 440E and 442E of symmetric filled-well IGFET 108.

The p-type dopant in p-type body-material empty main well 192 consists of the p-type empty main well dopant and the substantially constant p-type background dopant of p− substrate region 136. Since the p-type empty main well dopant in empty well 192 reaches a deep subsurface concentration maximum at average depth $y_{PWPK}$, the presence of the p-type empty main well dopant in well 192 causes the concentration of the total p-type dopant in well 192 to reach a deep local subsurface concentration maximum substantially at the location of the deep subsurface concentration maximum in well 192. In moving from the location of the deep p-type empty-well concentration maximum in empty well 192 toward the upper semiconductor surface along an imaginary vertical line through channel zone 524, the concentration of the p-type dopant in well 192 drops gradually from a moderate doping, indicated by symbol "p", to a light doping, indicated by symbol "p−". Dotted line 530 in FIG. 5.4 roughly represents the location below which the p-type dopant concentration in empty well 192 is at the moderate p doping and above which the p-type dopant concentration in well 192 is at the light p− doping.

IGFET 112 does not have halo pocket portions which are situated in p-type empty main well 192, which extend respectively along S/D zones 520 and 522, and which are more heavily doped p-type than adjacent material of well 192. Channel zone 524 (not specifically demarcated in FIG. 5.4), which consists of all the p-type monosilicon between S/D zones 520 and 522, is thus formed solely by a surface-adjoining segment of the p− upper part of well 192.

A gate dielectric layer 536 at the $t_{GdL}$ low thickness value is situated on the upper semiconductor surface and extends over channel zone 524. A gate electrode 538 is situated on gate dielectric layer 536 above channel zone 524. Gate electrode 538 extends over part of each n+ S/D extension 520E or 522E but normally not over any part of either n++ main S/D portion 520M or 522M. Dielectric sidewall spacers 540 and 542 are situated respectively along the opposite transverse sidewalls of gate electrode 538. Metal silicide layers 544, 546, and 548 are respectively situated along the tops of gate electrode 538 and main S/D portions 520M and 522M.

Low-voltage low-$V_T$ p-channel IGFET 114 is configured basically the same as n-channel IGFET 112 with the conductivity types reversed. With reference again to FIG. 5.4, p-channel IGFET 114 has a pair of largely identical p-type S/D zones 550 and 552 situated in active semiconductor island 154 along the upper semiconductor surface. S/D zones 550 and 552 are separated by a channel zone 554 of p-type empty main well region 194 which constitutes the body material for IGFET 114. N-type body-material empty well 194 forms (a) a first pn junction 556 with p-type S/D zone 550 and (b) a second pn junction 558 with p-type S/D zone 552.

Each p-type S/D zone 550 or 552 consists of a very heavily doped main portion 550M or 552M and a more lightly doped, but still heavily doped, lateral extension 550E or 552E. Channel zone 554 is terminated along the upper semiconductor surface by S/D extensions 550E and 552E. Largely identical p+ S/D extensions 550E and 552E extend deeper than largely identical p++ main S/D portions 550M and 552M.

As described below, S/D extensions 550E and 552E are normally defined by ion implantation of the p-type deep S/D-extension dopant at the same time as drain extension 282 of asymmetric p-channel IGFET 102. The p-type shallow S/D- extension implantation used to define S/D extensions 480E and 482 of symmetric low-voltage low-leakage p-channel IGFET 110 is, as indicated below, performed more shallowly than the p-type deep S/D-extension implantation. Consequently, S/D extensions 550E and 552E of symmetric empty-well IGFET 114, also a low-voltage p-channel device, extend deeper than S/D extensions 480E and 482E of symmetric filled-well IGFET 110.

The n-type dopant in n-type body-material empty main well 194 consists solely of the n-type empty main well dopant. Hence, the n-type dopant in empty well 194 reaches a deep subsurface concentration maximum at average depth $y_{NWPK}$. In moving from the location of the n-type empty-well concentration maximum in empty well 194 toward the upper semiconductor surface along an imaginary vertical line through channel zone 554, the concentration of the n-type dopant in well 194 drops gradually from a moderate doping, indicated by symbol "n", to a light doping, indicated by symbol "n−". Dotted line 560 in FIG. 5.4 roughly represents the location below which the n-type dopant concentration in empty well 194 is at the moderate n doping and above which the n-type dopant concentration in well 194 is at the light n− doping.

Subject to the preceding comments, p-channel IGFET 114 further includes a gate dielectric layer 566 at the $t_{GdL}$ low thickness value, a gate electrode 568, dielectric sidewall spacers 570 and 572, and metal silicide layers 574, 576, and 578 configured respectively the same as regions 536, 538, 540, 542, 544, 546, and 548 of n-channel IGFET 112. Analogous to n-channel IGFET 112, p-channel IGFET 114 does not have halo pocket portions. Channel zone 554 (not specifically demarcated in FIG. 5.4), which consists of all the n-type monosilicon between S/D zones 550 and 552, is formed solely by a surface-adjoining segment of the n− upper part of well 194.

Threshold voltage $V_T$ of each of symmetric low-voltage low-$V_T$ IGFETs 112 and 114 is normally −0.01-0.19 V, typically 0.09 V. Accordingly, n-channel IGFET 112 is typically an enhancement-mode device whereas p-channel IGFET 114 is typically a depletion-mode device. This $V_T$ range and typical value are for implementations of IGFETs 112 and 114 at a drawn channel length $L_{DR}$ of 0.3 μm. IGFETs 112 and 114 are particularly suitable for low-voltage analog and digital applications, e.g., an operational range of 1.2 V, which require threshold voltages $V_T$ of reduced magnitude and can accept somewhat increased channel length L.

I. Symmetric High-voltage IGFETs of Nominal Threshold-Voltage Magnitude

Symmetric high-voltage filled-well complementary IGFETs 116 and 118 of nominal $V_T$ magnitude are described with reference only to FIG. 5.5. N-channel IGFET 116 has a pair of largely identical n-type S/D zones 580 and 582 situated in active semiconductor island 156 along the upper semiconductor surface. S/D zones 580 and 582 are separated by a channel zone 584 of p-type filled main well region 196 which, in combination with p− substrate region 136, constitutes the body material for IGFET 116. P-type body-material filled well 196 forms (a) a first pn junction 586 with n-type S/D zone 580 and (b) a second pn junction 588 with n-type S/D zone 582.

Each n-type S/D zone 580 or 582 consists of a very heavily doped main portion 580M or 582M and a more lightly doped, but still heavily doped, lateral extension 580E or 582E. Largely identical n+ lateral S/D extensions 580E and 582E, which terminate channel zone 584 along the upper semiconductor surface, extend deeper than largely identical n++ main S/D portions 580M and 582M.

S/D extensions 580E and 582E are, as described below, normally defined by ion implantation of the n-type deep S/D-extension dopant at the same time as drain extension 242 of asymmetric n-channel IGFET 100 and therefore normally also at the same time as S/D extensions 520E and 522E of symmetric low-voltage low-$V_T$ n-channel IGFET 112. Inasmuch as the n-type shallow S/D-extension implantation used to define S/D extensions 440E and 442 of symmetric low-voltage low-leakage n-channel IGFET 108 is performed more shallowly than the n-type deep S/D-0 extension implantation, S/D extensions 580E and 582E of symmetric high-voltage filled-well IGFET 116 extend deeper than S/D extensions 440E and 442E of symmetric low-voltage filled-well IGFET 108.

IGFET 116 does not have halo pocket portions which are situated in p-type body-material empty main well 196, which extend respectively along S/D zones 580 and 582, and which are more heavily doped p-type than adjacent material of well 196. Subject to this difference, empty well 196 is configured substantially the same as empty well 188 of n-channel IGFET 108. Accordingly, p-type empty well 196 consists of a moderately doped main body-material portion 590, a moderately doped intermediate body-material portion 592, and a moderately doped upper body-material portion 594 configured respectively the same as body-material portions 554, 556, and 558 of empty well 188 of IGFET 108.

As with p body-material portions 454, 456, and 458 of IGFET 108, p body-material portions 590, 592, and 594 of IGFET 116 are respectively defined with the p-type filled main well, APT, and threshold-adjust dopants whose concentrations reach maximum values at different average depths. P body-material portions 590, 592, and 594 therefore have the same dopant concentration characteristics as p body-material portions 454, 456, and 458 of IGFET 108. Body-material portions 590, 592, and 594 are often referred to here respectively as p filled-well main body-material portion 590, p APT body-material portion 592, and p threshold-adjust body-material portion 594. Since IGFET 116 lack halo pocket portions, p threshold-adjust body-material portion 594 extends laterally between S/D zones 580 and 582, specifically between S/D extensions 580E and 582E. Channel zone 584 (not specifically demarcated in FIG. 5.5), which consists of all the p-type monosilicon between S/D zones 580 and 582, is formed solely by a surface-adjoining segment of the p− upper part of well 196.

A gate dielectric layer 596 at the $t_{GdH}$ high thickness value is situated on the upper semiconductor surface and extends over channel zone 584. A gate electrode 598 is situated on gate dielectric layer 596 above channel zone 584. Gate electrode 598 extends over part of each n+ S/D extension 580E or 582E but normally not over any part of either n++ main S/D portion 580M or 582M. Dielectric sidewall spacers 600 and 602 are situated respectively along the opposite transverse sidewalls of gate electrode 598. Metal silicide layers 604, 606, and 608 are respectively situated along the tops of gate electrode 598 and main S/D portions 580M and 582M.

High-voltage p-channel IGFET 118 is configured basically the same as n-channel IGFET 116 with the conductivity types reversed. Referring again to FIG. 5.5, p-channel IGFET 118 has a pair of largely identical p-type S/D zones 610 and 612 situated in active semiconductor island 158 along the upper semiconductor surface. S/D zones 610 and 612 are separated by a channel zone 614 of n-type filled main well region 198 which constitutes the body material for IGFET 118. N-type body-material filled well 198 forms (a) a first pn junction 616 with p-type S/D zone 610 and (b) a second pn junction 618 with p-type S/D zone 612.

Each p-type S/D zone 610 or 612 consists of a very heavily doped main portion 610M or 612M and a more lightly doped, but still heavily doped, lateral extension 610E or 612E. Channel zone 614 is terminated along the upper semiconductor surface by S/D extensions 610E and 612E. Largely identical p+ S/D extensions 610E and 612E extend deeper than largely identical p++ main S/D portions 610M and 612M.

As described below, S/D extensions 610E and 612E are normally defined by ion implantation of the p-type deep S/D-extension dopant at the same time as drain extension 282 of asymmetric p-channel IGFET 102 and thus normally also at the same time as S/D extensions 550E and 552E of symmetric low-voltage low-$V_T$ p-channel IGFET 114. Since the p-type shallow S/D-extension implantation used to define S/D extensions 480E and 482 of symmetric low-voltage low-leakage p-channel IGFET 110 is performed more shallowly than the p-type deep S/D-extension implantation, S/D extensions 610E and 612E of symmetric high-voltage IGFET 118 extend deeper than S/D extensions 480E and 482E of symmetric low-voltage IGFET 110.

Subject to the body material for p-channel IGFET 118 being formed with a filled main well rather than the combination of a filled main well and underlying material of the semiconductor body as occurs with n-channel IGFET 116, p-channel IGFET 118 is configured the same as n-channel IGFET 116 with the conductivity types reversed. Accordingly, p-channel IGFET 118 contains a moderately doped n-type main body-material portion 620, a moderately doped n-type intermediate body-material portion 622, and a moderately doped n-type upper body-material portion 624, a gate dielectric layer 626, a gate electrode 628 at the $t_{GdH}$ high thickness value, dielectric sidewall spacers 630 and 632, and metal silicide layers 634, 636, and 638 configured respectively the same as regions 590, 592, 594, 596, 598, 600, 602, 604, 606, and 608 of n-channel IGFET 116. N main body-material portion 620 overlies p– substrate region 136 and forms pn junction 234 with it.

Threshold voltage $V_T$ of symmetric high-voltage nominal-$V_T$ n-channel IGFET 116 is normally 0.4 V to 0.65 V, typically 0.5 V to 0.55 V, at a drawn channel length $L_{DR}$ in the vicinity of 0.4 μm and a gate dielectric thickness of 6-6.5 nm. Threshold voltage $V_T$ of symmetric high-voltage nominal-$V_T$ p-channel IGFET 118 is normally –0.5 V to –0.75 V, typically –0.6 V to –0.65 V, at a drawn channel length $L_{DR}$ in the vicinity of 0.3 μm and a gate dielectric thickness of 6-6.5 nm. Symmetric IGFETs 116 and 118 are particularly suitable for high-voltage digital applications, e.g., an operational range of 3.0 V.

J. Symmetric Low-Voltage IGFETs of Nominal Threshold-voltage Magnitude

Symmetric low-voltage filled-well complementary IGFETs 120 and 122 of nominal $V_T$ magnitude are described with reference only to FIG. 5.6. IGFETs 120 and 122 are configured respectively similar to low-voltage low-leakage symmetric IGFETs 108 and 110 of increased $V_T$ magnitude except that IGFETs 120 and 122 lack surface-adjoining threshold-adjust body-material portions analogous to p threshold-adjust body-material portion 458 and n threshold-adjust body-material portion 498 which cause off-state current leakage to be reduced in IGFETs 108 and 110 and produce increases in the magnitudes of their threshold voltages. N-channel IGFET 120 is generally configured substantially the same as n-channel IGFET 20 as described in U.S. Pat. No. 6,588,682 cited above. P-channel IGFET 122 is similarly generally configured substantially the same as a p-channel IGFET described in U.S. Pat. No. 6,588,682.

With the preceding comments in mind, n-channel IGFET 120 has a pair of largely identical n-type S/D zones 640 and 642 situated in active semiconductor island 160 along the upper semiconductor surface. S/D zones 640 and 642 are separated by a channel zone 644 of p-type filled main well region 200 which, in combination with p– substrate region 136, constitutes the body material for IGFET 120. P-type body-material filled well 200 forms (a) a first pn junction 646 with n-type S/D zone 640 and (b) a second pn junction 648 with n-type S/D zone 642.

Each n-type S/D zone 640 or 642 consists of a very heavily doped main portion 640M or 642M and a more lightly doped, but still heavily doped, lateral extension 640E or 642E. Largely identical n++ main S/D portions 640M and 642M extend deeper than largely identical n+ source extensions 640E and 642E. Channel zone 644 is terminated along the upper semiconductor surface by S/D extensions 640E and 642E.

S/D extensions 640E and 642E are normally defined by ion implantation of the n-type shallow S/D-extension dopant at the same time as S/D extensions 440E and 442E of symmetric low-voltage low-leakage n-channel IGFET 108. The n-type shallow S/D-extension implantation is, as indicated below, performed more shallowly than the n-type deep S/D-extension implantation used to define both S/D extensions 520E and 522E of symmetric low-voltage low $V_T$ n-channel IGFET 112 and S/D extensions 580E and 582E of symmetric high voltage nominal-$V_T$ n-channel IGFET 116. Consequently, S/D extensions 520E and 522E of symmetric empty-well IGFET 112 and S/D extensions 580 and 582 of symmetric filled-well IGFET 116 extend deeper than S/D extensions 640E and 642E of symmetric filled-well IGFET 120.

A pair of largely identical moderately doped laterally separated halo pocket portions 650 and 652 of p-type body-material filled main well 200 respectively extend along S/D zones 640 and 642 up to the upper semiconductor surface and terminate at respective locations between S/D zones 640 and 642. FIG. 5.6 illustrates the situation in which S/D zones 640 and 642 extend deeper than halo pockets 650 and 652. Halo pockets 650 and 652 can alternatively extend deeper than S/D zones 640 and 642. Halo pockets 650 and 652 then respectively extend laterally under S/D zones 640 and 642. As with halo pocket portions 450 and 452 of IGFET 108, halo pockets 650 and 652 are defined with the p-type S/D halo dopant that reaches a maximum concentration below the upper semiconductor surface.

The material of p-type body-material filled main well 200 outside halo pocket portions 650 and 652 consists of a moderately doped main body-material portion 654 and a moderately doped further body-material portion 656. P body-material portions 654 and 656 are configured respectively the same as p body-material portions 454 and 456 of IGFET 108 except that p further body-material portion 656 extends to the upper semiconductor surface between halo pockets 650 and 652. P body-material portions 654 and 656 are respectively defined with the p-type filled main well dopant and the p-type APT dopant. Accordingly, body-material portions 654 and 656 are often referred to here respectively as p filled-well main body-material portion 654 and p APT body-material portion 656.

Channel zone 644 (not specifically demarcated in FIG. 5.6) consists of all the p-type monosilicon between S/D zones 640 and 642. More particularly, channel zone 644 is formed by a surface-adjoining underlying segment of APT body-material portion 656 and (a) all of p halo pocket portion 650 and 652 if S/D zones 640 and 642 extend deeper than halo pocket 650 and 652 as illustrated in the example of FIG. 5.6 or (b) surface-adjoining segments of halo pockets 650 and 652 if they extend deeper than S/D zones 640 and 642. Because the maximum concentration of the p-type threshold-adjust dopant in main filled well 200 is normally significantly less than the maximum concentration of the p-type S/D halo dopant in well 200, halo pockets 650 and 652 are more heavily doped p-type than the directly adjacent material of well 200.

IGFET 120 further includes a gate dielectric layer 660 of the $t_{GdL}$ low thickness, a gate electrode 662, dielectric sidewall spacers 664 and 666, and metal silicide layers 668, 670, and 672 configured respectively the same as regions 460, 462, 464, 466, 468, 470, and 472 of IGFET 108.

Low-voltage p-channel IGFET 122 of nominal $V_T$ is configured basically the same as n-channel IGFET 120 with the conductivity types reversed. With reference again to FIG. 5.6, p-channel IGFET 122 has a pair of largely identical p-type S/D zones 680 and 682 situated in active semiconductor island 162 along the upper semiconductor surface. S/D zones 680 and 682 are separated by a channel zone 684 of n-type filled main well region 202 which constitutes the body material for IGFET 122. N-type body-material filled well 212 forms (a) a first pn junction 686 with p-type S/D zone 680 and (b) a second pn junction 688 with p-type S/D zone 682.

Subject to the body material for p-channel IGFET 122 being formed with a filled main well rather than the combination of a filled main well and underlying material of the semiconductor body as occurs with n-channel IGFET 120, p-channel IGFET 122 is configured the same as n-channel IGFET 120 with the conductivity types reversed. Hence, p-channel IGFET 122 contains largely identical moderately doped n-type halo pocket portions 690 and 692, a moderately doped n-type main body-material portion 694, a moderately doped n-type further body-material portion 696, a gate dielectric layer 700 at the $t_{GdL}$ low thickness value, a gate electrode 702, dielectric sidewall spacers 704 and 706, and metal silicide layers 708, 710, and 712 configured respectively the same as regions 650, 652, 654, 656, 660, 662, 664, 666, 668, 670, and 672 of n-channel IGFET 120.

N main body-material portion 694 overlies p− substrate region 136 and forms pn junction 236 with it. Also, each p-type S/D zone 680 or 682 consists of a very heavily doped main portion 680M or 682M and a more lightly doped, but still heavily doped, lateral extension 680E or 682E. All of the comments made about the doping of p-type filled main well 200 of n-channel IGFET 120 apply to n-type filled main well 212 of p-channel IGFET 122 with the conductivity types reversed and with regions 200, 640, 640M, 640E, 642, 642M, 642E, 644, 650, 652, 654, and 656 of n-channel IGFET 120 respectively replaced with regions 202, 680, 680M, 680E, 682, 682M, 682E, 684, 690, 692, 694, and 696 of p-channel IGFET 122.

Threshold voltage $V_T$ of symmetric low-voltage nominal-$V_T$ n-channel IGFET 120 is normally 0.25 V to 0.45 V, typically 0.35 V. Threshold voltage $V_T$ of symmetric low-voltage nominal-$V_T$ p-channel IGFET 122 is normally −0.2 V to −0.4 V, typically −0.3 V. These $V_T$ ranges and typical values are for short-channel implementations of IGFETs 120 and 122 at a drawn channel length $L_{DR}$ of 0.13 μm and a gate dielectric thickness o 2 nm. Symmetric IGFETs 120 and 122 are particularly suitable for low-voltage digital applications, e.g., an operational range of 1.2 V.

K. Symmetric High-Voltage Low-Threshold-Voltage IGFETs

Symmetric high-voltage low-$V_T$ empty-well complementary IGFETs 124 and 126 are described with reference only to FIG. 5.7. As explained further below, IGFETs 124 and 126 are configured respectively substantially the same as low-voltage low-$V_T$ IGFETs 112 and 114 except that IGFETs 124 and 126 are of longer channel length and greater gate dielectric thickness so as to be suitable for high-voltage operation.

N-channel IGFET 124 has a pair of largely identical n-type S/D zones 720 and 722 situated in active semiconductor island 164 along the upper semiconductor surface. S/D zones 720 and 722 are separated by a channel zone 724 of p-type empty main well region 204 which, in combination with p− substrate region 136, constitutes the body material for IGFET 124. P-type body-material empty well 204 forms (a) a first pn junction 726 with n-type S/D zone 720 and (b) a second pn junction 728 with n-type S/D zone 722.

Each n-type S/D zone 720 or 722 consists of a very heavily doped main portion 720M or 722M and a more lightly doped, but still heavily doped, lateral extension 720E or 722E. Largely identical n+ lateral S/D extensions 720E and 722E extend deeper than largely identical n++ main S/D portions 720M and 722M. Channel zone 724 is terminated along the upper semiconductor surface by S/D extensions 720E and 722E.

S/D extensions 720E and 722E are normally defined by ion implantation of the n-type deep S/D-extension dopant at the same time as drain extension 242E of asymmetric n-channel IGFET 100 and thus normally also at the same time as S/D extensions 520E and 522E of symmetric low-voltage low-$V_T$ n-channel IGFET 112 and S/D extensions 580 and 582 of symmetric high-voltage nominal-$V_T$ n-channel IGFET 116. As indicated below, the n-type shallow S/D-extension implantation used to define S/D extensions 440E and 442E of symmetric low-voltage low-leakage n-channel IGFET 108 and also normally S/D extensions 640E and 642E of symmetric low-voltage nominal-$V_T$ n-channel IGFET 120 is performed more shallowly than the n-type deep S/D-extension implantation. Consequently, S/D extensions 720E and 722E of symmetric empty-well IGFET 124 extend deeper than both S/D extensions 440E and 442E of symmetric filled-well IGFET 108 and S/D extensions 640E and 642E of symmetric filled-well IGFET 120.

The p-type dopant in p-type body-material empty main well 204 consists of the p-type empty main well dopant and the substantially constant p-type background dopant of p− substrate region 136. Because the p-type empty main well dopant in empty well 204 reaches a deep subsurface concentration maximum at average depth $y_{PWPK}$, the presence of the p-type empty main well dopant in well 204 causes the concentration of the total p-type dopant in well 204 to reach a deep local subsurface concentration maximum substantially at the location of the deep subsurface concentration maximum in well 204. In moving from the location of the deep p-type empty-well concentration maximum in empty well 204 toward the upper semiconductor surface along an imaginary vertical line through channel zone 724, the concentration of the p-type dopant in well 204 drops gradually from a moderate doping, indicated by symbol "p", to a light doping, indicated by symbol "p−". Dotted line 730 in FIG. 5.7 roughly represents the location below which the p-type dopant concentration in empty well 204 is at the moderate p doping and above which the p-type dopant concentration in well 204 is at the light p− doping.

As with IGFET 112, IGFET 124 does not have halo pocket portions. Channel zone 724 (not specifically demarcated in FIG. 5.7), which consists of all the p-type monosilicon between S/D zones 720 and 722, is thereby formed solely by a surface-adjoining segment of the p– upper part of well 204. IGFET 124 further includes a gate dielectric layer 736 at the $t_{GdH}$ high thickness value, a gate electrode 738, dielectric sidewall spacers 740 and 742, and metal silicide layers 744, 746, and 748 configured respectively the same as regions 536, 538, 540, 542, 544, 546, and 548 of n-channel IGFET 112.

High-voltage low-$V_T$ p-channel IGFET 126 is configured basically the same as n-channel IGFET 124 with the conductivity types reversed. Referring again to FIG. 5.7, p-channel IGFET 126 has a pair of largely identical p-type S/D zones 750 and 752 situated in active semiconductor island 166 along the upper semiconductor surface. S/D zones 750 and 752 are separated by a channel zone 754 of p-type empty main well region 206 which constitutes the body material for IGFET 126. N-type body-material empty well 206 forms (a) a first pn junction 756 with p-type S/D zone 750 and (b) a second pn junction 758 with p-type S/D zone 752.

Each n-type S/D zone 750 or 752 consists of a very heavily doped main portion 750M or 752M and a more lightly doped, but still heavily doped, lateral extension 750E or 752E. Largely identical n+ S/D extensions 750E and 752E extend deeper than largely identical n++ main S/D portions 750M and 752M. Channel zone 754 is terminated along the upper semiconductor surface by S/D extensions 750E and 752E.

S/D extensions 750E and 752E are normally defined by ion implantation of the p-type deep S/D-extension dopant at the same time as drain extension 282E of asymmetric p-channel IGFET 102 and thus normally also at the same time as S/D extensions 550E and 552E of symmetric low-voltage low-$V_T$ p-channel IGFET 114 and S/D extensions 610 and 612 of symmetric high-voltage nominal-$V_T$ p-channel IGFET 118. The p-type shallow S/D-extension implantation used to define S/D extensions 480E and 482E of symmetric low-voltage low-leakage p-channel IGFET 110 and also normally S/D extensions 680E and 682E of symmetric low-voltage nominal-$V_T$ p-channel IGFET 122 is, as indicated below, performed more shallowly than the p-type deep S/D-extension implantation. Accordingly, S/D extensions 750E and 752E of symmetric empty-well IGFET 126 extend deeper than both S/D extensions 480E and 482E of symmetric filled-well IGFET 110 and S/D extensions 680E and 682E of symmetric filled-well IGFET 122.

The n-type dopant in n-type body-material empty main well 206 consists solely of the p-type empty main well dopant. Accordingly, the n-type dopant in empty well 206 reaches a deep subsurface concentration maximum at average depth $y_{NWPK}$. In moving from the location of the n-type empty-well concentration maximum in empty well 206 toward the upper semiconductor surface along an imaginary vertical line through channel zone 754, the concentration of the n-type dopant in well 206 drops gradually from a moderate doping, indicated by symbol "n", to a light doping, indicated by symbol "n–". Dotted line 760 in FIG. 5.7 roughly represents the location below which the n-type dopant concentration in empty well 206 is at the moderate n doping and above which the n-type dopant concentration in well 206 is at the light n– doping.

Subject to the preceding comments, p-channel IGFET 126 is configured the same as n-channel IGFET 124 with the conductivity types reversed. Hence, p-channel IGFET 126 further includes a gate dielectric layer 766 at the $t_{GdH}$ high thickness value, a gate electrode 768, dielectric sidewall spacers 770 and 772, and metal silicide layers 774, 776, and 778 configured respectively the same as regions 736, 738, 740, 742, 744, 746, and 748 of n-channel IGFET 124. As with n-channel IGFET 124, p-channel IGFET 126 does not have halo pocket portions. Channel zone 754 (not specifically demarcated in FIG. 5.7), which consists of all the n-type monosilicon between S/D zones 750 and 752, is formed solely by a surface-adjoining segment of the n– upper part of well 206.

Threshold voltage $V_T$ of symmetric high-voltage low-$V_T$ n-channel IGFET 124 is normally –0.1 V to 0.5 V, typically –0.025 V, at a drawn channel length $L_{DR}$ in the vicinity of 0.5 μm and a gate dielectric thickness of 6-6.5 nm. Threshold voltage $V_T$ of symmetric high-voltage low-$V_T$ p-channel IGFET 126 is normally 0.05 V to 0.25 V, typically 0.15 V, likewise at a drawn channel length $L_{DR}$ in the vicinity of 0.5 μm and a gate dielectric thickness of 6-6.5 nm. Symmetric IGFETs 124 and 126 are particularly suitable for high-voltage analog and digital applications, e.g., an operational range of 1.2 V, which require threshold voltages $V_T$ of lower magnitude than high-voltage IGFETs 116 and 118 and which can accommodate increased channel length L.

L. Symmetric Native Low-Voltage N-Channel IGFETs

Symmetric native low-voltage IGFETs 128 and 130, both n channel, are described with reference only to FIG. 5.8. IGFET 128 of nominal $V_T$ magnitude has a pair of largely identical n-type S/D zones 780 and 782 situated in active semiconductor island 168 along the upper semiconductor surface. S/D zones 780 and 782 are separated by a channel zone 784 of p-type body material formed primarily with p– substrate region 136. The p-type body material for IGFET 128 forms (a) a first pn junction 786 with n-type S/D zone 780 and (b) a second pn junction 788 with n-type S/D zone 782.

Each n-type S/D zone 780 or 782 consists of a very heavily doped main portion 780M or 782M and a more lightly doped, but still heavily doped, lateral extension 780E or 782E. Largely identical n++ main S/D portions 780M and 782M extend deeper than largely identical n+ source extensions 780E and 782E. Channel zone 784 is terminated along the upper semiconductor surface by S/D extensions 780E and 782E.

In addition to p– substrate region 136, the body material for IGFET 128 includes a pair of largely identical moderately doped laterally separated halo pocket portions 790 and 792 that respectively extend along S/D zones 780 and 782 up to the upper semiconductor surface and terminate at respective locations between S/D zones 780 and 782. FIG. 5.8 illustrates the situation in which S/D zones 780 and 782 extend deeper than halo pockets 790 and 792. Alternatively, halo pockets 790 and 792 can extend deeper than S/D zones 780 and 782. Halo pockets 790 and 792 then respectively extend laterally under S/D zones 780 and 782.

Channel zone 784 (not specifically demarcated in FIG. 5.8) consists of all the p-type monosilicon between S/D zones 780 and 782. In particular, channel zone 784 is formed by a surface-adjoining segment of p– substrate region 136 and (a) all of p halo pocket portions 790 and 792 if S/D zones 780 and 782 extend deeper than halo pockets 790 and 792 as illustrated in the example of FIG. 5.8 or (b) surface-adjoining segments of halo pockets 790 and 792 if they extend deeper than S/D zones 780 and 782. Since substrate region 136 is lightly doped, halo pockets 790 and 792 are more heavily doped p-type than the directly adjacent material of the body material for IGFET 128.

A gate dielectric layer 796 at the $t_{GdL}$ low thickness value is situated on the upper semiconductor surface and extends over channel zone 784. A gate electrode 798 is situated on gate dielectric layer 796 above channel zone 784. Gate electrode 798 extends over part of each n+ S/D extension 780E or 782E but normally not over any part of either n++ main S/D portion 780M or 782M. Dielectric sidewall spacers 800 and 802 are situated respectively along the opposite transverse sidewalls of gate electrode 798. Metal silicide layers 804, 806, and 808 are respectively situated along the tops of gate electrode 798 and main S/D portions 780M and 782M.

With continued reference to FIG. 5.8, symmetric native low-voltage n-channel IGFET 130 of low $V_T$ magnitude has a pair of largely identical n-type S/D zones 810 and 812 situated in active semiconductor island 170 along the upper semiconductor surface. S/D zones 810 and 812 are separated by a channel zone 814 of p− substrate region 136 which constitutes the p-type body material for IGFET 130. P− body-material substrate region 136 forms (a) a first pn junction 816 with n-type S/D zone 810 and (b) a second pn junction 818 with n-type S/D zone 812.

Each n-type S/D zone 810 or 812 consists of a very heavily doped main portion 810M or 812M and a more lightly doped, but still heavily doped, lateral extension 810E or 812E. Largely identical n+ S/D extensions 810E and 812E extend deeper than largely identical n++ main S/D portions 810M and 812M. Channel zone 814 is terminated along the upper semiconductor surface by S/D extensions 810E and 812E.

IGFET 130 does not have halo pocket portions which are situated in the IGFET's p-type body material, which extend respectively along S/D zones 810 and 812, and which are more heavily doped p-type than adjacent material of the IGFET's p-type body material. Channel zone 814 (not specifically demarcated in FIG. 5.8), which consists of all the p-type monosilicon between S/D zones 810 and 812, is thus formed solely by a surface-adjoining segment of p− substrate region 136.

A gate dielectric layer 826 at the $t_{GdL}$ low thickness value is situated on the upper semiconductor surface and extends over channel zone 814. A gate electrode 828 is situated on gate dielectric layer 826 above channel zone 814. Gate electrode 828 extends over part of each n+ S/D extension 810E or 812E but normally not over any part of either n++ main S/D portion 810M or 812M. Dielectric sidewall spacers 830 and 832 are situated respectively along the opposite transverse sidewalls of gate electrode 828. Metal silicide layers 834, 836, and 838 are respectively situated along the tops of gate electrode 828 and main S/D portions 810M and 812M.

Threshold voltage $V_T$ of symmetric native low-voltage nominal-$V_T$ n-channel IGFET 128 is normally 0.2 V to 0.45 V, typically 0.3 V to 0.35 V, at a drawn channel length $L_{DR}$ of 0.3 μm and a gate dielectric thickness of 2 nm. Threshold voltage $V_T$ of symmetric native low-voltage low-$V_T$ n-channel IGFET 130 is normally −0.15 V to 0.1 V, typically −0.03 V at a drawn channel length $L_{DR}$ of 1 μm and a gate dielectric thickness of 2 nm. Symmetric native IGFETs 128 and 130 are particularly suitable for low-voltage analog and digital applications, e.g., an operational range of 1.2 V.

M. Symmetric Native High-Voltage N-Channel IGFETs

Symmetric native high-voltage IGFETs 132 and 134, both n channel, are described with reference only to FIG. 5.9. IGFET 132 of nominal $V_T$ magnitude has a pair of largely identical n-type S/D zones 840 and 842 situated in active semiconductor island 172 along the upper semiconductor surface. S/D zones 840 and 842 are separated by a channel zone 844 of p-type body material formed primarily with p− substrate region 136. The p-type body material for IGFET 132 forms (a) a first pn junction 846 with n-type S/D zone 840 and (b) a second pn junction 848 with n-type S/D zone 842. Each n-type S/D zone 840 or 842 consists of a very heavily doped main portion 840M or 842M and a more lightly doped, but still heavily doped, lateral extension 840E or 842E.

IGFET 132 further includes a pair of largely identical moderately doped laterally separated halo pocket portions 850 and 852, a gate dielectric layer 856 at the $t_{GdH}$ high thickness value, a gate electrode 858, dielectric sidewall spacers 860 and 862, and metal silicide layers 864, 866, and 868. As can be seen by comparing FIGS. 5.8 and 5.9, the only structural difference between native n-channel IGFETs 132 and 128 is that IGFET 132 is of greater gate dielectric thickness than IGFET 128 so that IGFET 132 can operate across a greater voltage range than IGFET 128. Accordingly, regions 840, 842, 844, 850, 852, 856, 858, 860, 862, 864, 866, and 868 of IGFET 132 are configured respectively the same as regions 780, 782, 784, 790, 792, 796, 798, 800, 802, 804, 806, and 808 of IGFET 128.

With continued reference to FIG. 5.9, symmetric native high-voltage n-channel IGFET 134 has a pair of largely identical n-type S/D zones 870 and 872 situated in active semiconductor island 174 along the upper semiconductor surface. S/D zones 870 and 872 are separated by a channel zone 874 of p− substrate region 136 which constitutes the p-type body material for IGFET 134. P− body-material substrate region 136 forms (a) a first pn junction 876 with n-type S/D zone 870 and (b) a second pn junction 878 with n-type S/D zone 872. Each n-type S/D zone 870 or 872 consists of a very heavily doped main portion 870M or 872M and a more lightly doped, but still heavily doped, lateral extension 870E or 872E.

IGFET 134 further includes a gate dielectric layer 886 at the $t_{GdH}$ high thickness value, a gate electrode 888, dielectric sidewall spacers 890 and 892, and metal silicide layers 894, 896, and 898. A comparison of FIGS. 5.8 and 5.9 shows that the only structural difference between native n-channel IGFETs 134 and 130 is that IGFET 134 is of greater gate dielectric thickness than IGFET 130 so that IGFET 134 can operate across a greater voltage range than IGFET 130. Hence, regions 870, 872, 874, 886, 888, 890, 862, 894, 896, and 898 of IGFET 134 are configured respectively the same as regions 810, 812, 814, 826, 828, 830, 832, 834, 836, and 838 of IGFET 130.

Threshold voltage $V_T$ of symmetric native high-voltage nominal-$V_T$ n-channel IGFET 132 is normally 0.5 V to 0.7 V, typically 0.6 V, at a drawn channel length $L_{DR}$ in the vicinity of 0.3 μm and a gate dielectric thickness of 6-6.5 nm. Threshold voltage $V_T$ of symmetric native high-voltage low-$V_T$ n-channel IGFET 134 is normally −0.3 V to −0.05 V, typically −0.2 V to 0.15 V, at a drawn channel length $L_{DR}$ in the vicinity of 1.0 μm and a gate dielectric thickness of 6-6.5 nm. Symmetric native IGFETs 132 and 134 are particularly suitable for high-voltage analog and digital applications, e.g., an operational range of 3.0 V.

N. Dopant Distributions in Symmetric IGFETs

The illustrated symmetric IGFETs all have symmetric longitudinally graded dopant distributions. Symmetric n-channel IGFETs 112 and 124 which respectively utilize p-type empty main well regions 192 and 204 have vertical S/D dopant distributions similar to the vertical dopant distribution through drain 242 of asymmetric n-channel IGFET 100. Symmetric p-channel IGFETs 114 and 126 which respectively utilize n-type empty main well regions 194 and 206 have vertical S/D dopant distributions similar to the vertical dopant distribution through drain 282 of asymmetric p-channel IGFET 102.

Each symmetric n-channel IGFETs 108, 116, or 120 which employs p-type main well 188, 196, or 200 has a vertical dopant distributions in which the concentration of the total p-type dopant decreases by less than a factor of 10 in moving upward from maximum well concentration depth $y_{PWPK}$ along an imaginary vertical line through each of that IGFET's S/D zones to the upper semiconductor surface. Depth $y_{PWPK}$ for p-type main well 188, 196, or 200 of IGFET 108, 116, or 120 occurs no more than 10 times, preferably no more than 5 times, more preferably no more than 4 times, deeper below the upper semiconductor surface than maximum depth $y_{SD}$ of each of that IGFET's S/D zones.

Each symmetric p-channel IGFETs 110, 118, or 122 which employs n-type main well 190, 198, or 202 similarly has a vertical dopant distributions in which the concentration of the total n-type dopant decreases by less than a factor of 10 in moving upward from maximum well concentration depth $y_{NWPK}$ along an imaginary vertical line through each of that IGFET's S/D zones to the upper semiconductor surface. Depth $y_{PWPK}$ for p-type main well 190, 198, or 202 of IGFET 110, 118, or 122 occurs no more than 10 times, preferably no more than 5 times, more preferably no more than 4 times, deeper below the upper semiconductor surface than maximum depth $y_{SD}$ of each of that IGFET's S/D zones.

Further information on the dopant distributions in the illustrated symmetric IGFETs, including the illustrated native IGFETs, is presented in U.S. patent application Ser. No. 12/382,793, cited above.

O. Information Generally Applicable to All of Present BJTs and IGFETs

Letting BJTs 101, 101W, 101Y, 103, 103V, 103W, and 103Y be collectively referred to as the illustrated BJTs, lateral spacing portions 269-1, 269-2, 349-1, and 349-2 of the illustrated BJTs can alternatively be formed with material other than doped non-monosilicon. For instance, lateral spacing portions 269-1, 269-2, 349-1, and 349-2 can be formed with substantially intrinsic non-monosilicon such as substantially intrinsic polysilicon, substantially intrinsic amorphous silicon, or substantially intrinsic multicrystalline silicon. Lateral spacing portions 269-1, 269-2, 349-1, and 349-2 can also be formed with refractory metal.

The gate electrodes of the illustrated n-channel IGFETs preferably all consist of polysilicon doped very heavily n-type in the example of FIG. 5. Alternatively, the gate electrodes of the illustrated n-channel IGFETs can be formed with other electrically conductive material such as refractory metal, metal silicide, or polysilicon doped sufficiently p-type as to be electrically conductive. In the example of FIG. 5, the gate electrodes of the illustrated p-channel IGFETs all preferably consist of polysilicon doped very heavily p-type. The gate electrodes of the illustrated p-channel IGFETs can alternatively be formed with other electrically conductive material such as refractory metal, metal silicide, or polysilicon doped sufficiently n-type as to be electrically conductive. Each such refractory metal or metal silicide is chosen to have an appropriate work function for achieving suitable values of threshold voltage $V_T$.

The combination of each gate electrode 262, 302, 346, 386, 462, 502, 538, 568, 598, 628, 662, 702, 738, 768, 798, 828, 858, or 888 and overlying metal silicide layer 268, 308, 352, 392, 468, 508, 544, 574, 604, 634, 668, 708, 744, 774, 804, 834, 864, or 894 can be viewed as a composite gate electrode. The metal silicide layers, including metal silicide layers 251, 253-1, 253-2, 255, 279-1, 279-2, 331, 333-1, 333-2, 335, 351-1, and 351-2 of the illustrated BJTs, typically consist of cobalt silicide. Nickel silicide or platinum silicide can alternatively be used for the metal silicide layers.

Each of isolating dielectric spacers 271-1, 271-2, 273-1, 273-2, 351-1, 351-2, 353-1, and 353-2 of the illustrated BJTs and gate sidewall spacers 264, 266, 304, 306, 348, 350, 388, 390, 464, 466, 504, 506, 540, 542, 570, 572, 600, 602, 630, 632, 664, 666, 704, 706, 740, 742, 770, 772, 800, 802, 830, 832, 860, 862, 890, and 892 of the illustrated IGFETs is, for convenience, shown in FIG. 5 as cross-sectionally shaped generally like a right triangle with a curved hypotenuse as viewed in the direction of the transistor's width. Such a spacer shape is referred to here as a curved triangular shape. The isolating dielectric spacers and gate sidewall spacers may have other shapes such as "L" shapes. The shapes of the isolating dielectric spacers and gate sidewall spacers may be modified significantly during transistor fabrication.

To improve the IGFET characteristics, the gate sidewall spacers are preferably processed as described in U.S. patent application Ser. No. 12/382,977, cited above. Because the isolating dielectric spacers of the illustrated BJTs are formed with the same steps as the gate dielectric spacers, the isolating dielectric spacers are also processed in that way. In particular, the isolating dielectric spacers and gate sidewall spacers are initially created to be of curved triangular shape. Prior to formation of the metal silicide layers, the isolating dielectric spacers and gate sidewall spacers are modified to be of L shape in order to facilitate the formation of the metal silicide layers. The isolating dielectric spacers and gate sidewall spacers are then L-shaped in the semiconductor structure of FIG. 5.

A depletion region (not shown) extends along the upper surface of the channel zone of each illustrated IGFET during IGFET operation. The surface depletion region of each illustrated high-voltage IGFET has a maximum thickness normally less than 0.05 μm, typically in the vicinity of 0.03 μm. The maximum thickness of the surface depletion region of each extended-drain IGFET 104 or 106 is normally less than 0.06 μm, typically in the vicinity of 0.04 μm. The maximum thickness of the surface depletion region of each illustrated low-voltage IGFET is normally less than 0.04 μm, typically in the vicinity of 0.02 μm.

P. Fabrication of Complementary-BJT/Complementary-IGFET Semiconductor Structure

P1. General Fabrication Considerations

FIGS. 18*a*-18*c*, 18*d*.0-18*w*.0, 18*d*.1-18*w*.1, 18*d*.2-18*w*.2, and 18*d*.3-18*w*.3 (collectively "FIG. 18") illustrate a semiconductor process in accordance with the invention for manufacturing a CBJT/CIGFET semiconductor structure containing complementary BJTs 101 and 103 and all of the illustrated IGFETs, i.e., complementary asymmetric high-voltage IGFETs 100 and 102, complementary extended-drain IGFETs 104 and 106, symmetric non-native n-channel IGFETs 108, 112, 116, 120, and 124, respectively corresponding symmetric non-native p-channel IGFETs 110, 114, 118, 122, and 126, and symmetric native n-channel IGFETs 128, 116, 132, and 134. In order to facilitate pictorial illustration of the present fabrication process, manufacturing steps for long-channel versions of the illustrated IGFETs are depicted in FIG. 18.

Figure 18A:
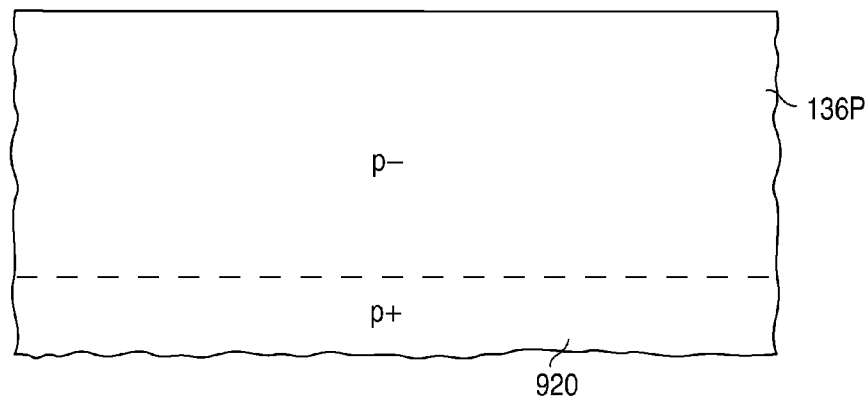
Figure 18B:
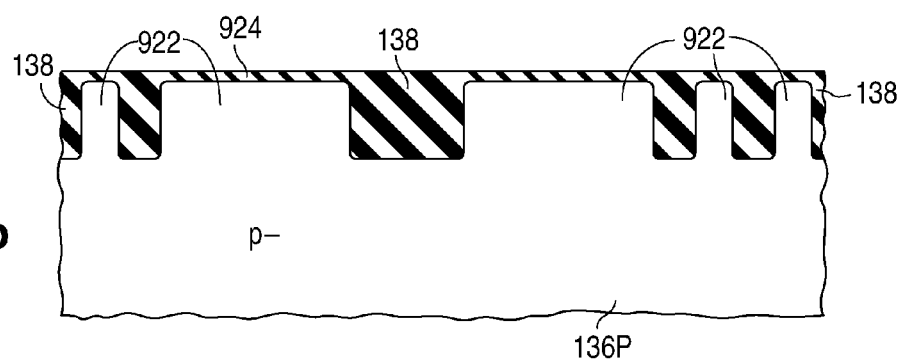
Figure 18C:
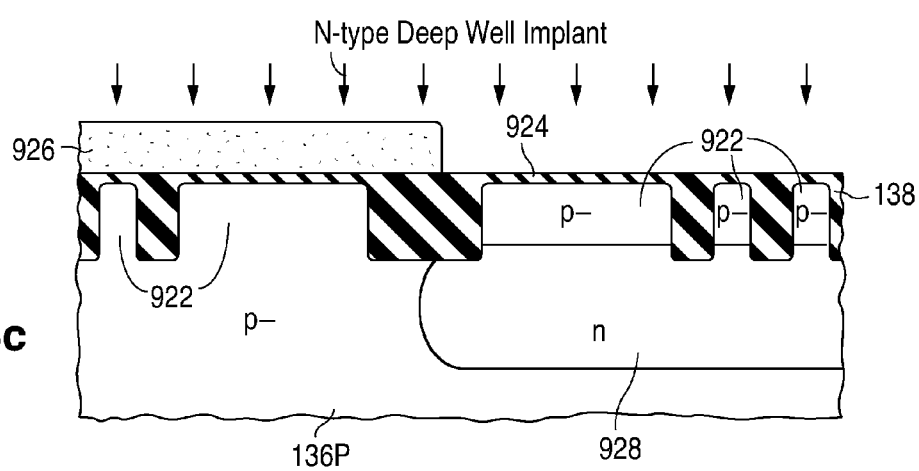

The steps involved in the fabrication of the illustrated BJTs and IGFETs up through the formation of deep n wells, including deep n wells 207, 210, and 212, are generally shown in FIGS. 18*a*-18*c*. FIGS. 18*d*.0-18*w*.0 illustrate later steps specifically leading to BJTs 101 and 103 as shown in FIG. 5.1. FIGS. 18*d*.1-18*w*.1 illustrate later steps specifically leading to asymmetric high-voltage IGFETs 100 and 102 as depicted in FIG. 5.1. FIGS. 18*d*.2-18*w*.2 illustrate later steps specifically leading to extended-drain IGFETs 104 and 106 as shown in FIG. 5.2. FIGS. 18*d*.3-18*w*.3 illustrate later steps specifically leading to symmetric low-voltage low-leakage IGFETs 108 and 110 as depicted in FIG. 5.3.

FIG. 18 does not illustrate leading later steps specifically leading to any of symmetric non-native IGFETs 112, 114, 116, 118, 120, 122, 124, and 126 or any of symmetric native n-channel IGFETs 128, 130, 132, and 134 as variously shown in FIGS. 5.4-5.9. However, a description of the later steps specifically leading to symmetric IGFETs 112, 114, 116, 118, 120, 122, 124, 126, 128, 130, 132, and 134 is presented in U.S. patent application Ser. No. 12/382,793, cited above. In this regard, none of symmetric IGFETs 112, 114, 116, 118, 120, 122, 124, 126, 128, 130, 132, and 134 receives any significant amount of semiconductor dopant during the steps for ion implanting the p-type and n-type base dopants for BJTs 101 and 103.

The semiconductor fabrication process of FIG. 18 is, more specifically, a semiconductor fabrication platform that provides a capability for manufacturing many types of semiconductor devices in addition to BJTs 101 and 103 and the illustrated IGFETs. For instance, any of npn BJT 101W, pnp BJT 103V, and pnp BJT 103W may be manufactured according to the semiconductor fabrication platform of FIG. 18.

A short-channel version of each illustrated symmetric long-channel IGFET may be manufactured simultaneously according to the fabrication steps employed in manufacturing the illustrated symmetric long-channel IGFET. The short-channel versions of IGFETs 108, 110, 112, 114, 116, and 118 are of lesser channel length than long-channel IGFETs 108, 110, 112, 114, 116, and 118 but are otherwise of generally the same intermediate IGFET appearances as shown in FIG. 18. The simultaneous fabrication of BJTs 101 and 103, any of BJTs 101W, 103V, and 103W, the illustrated symmetric long-channel IGFETs, and their short-channel versions is implemented with masking plates (reticles) having patterns for the BJTs and for both the long-channel and short-channel IGFETs.

Resistors, capacitors, and inductors can be readily provided with the semiconductor fabrication platform of FIG. 18. The resistors can be both of the monosilicon type and the polysilicon type. Diodes can be provided without increasing the number of steps needed to fabricate the illustrated IGFETs and BJTs.

The semiconductor fabrication platform of FIG. 18 includes a capacity for selectively providing deep n wells of which deep n wells 207, 210, 212, 381, and 391 are examples. The presence or absence of a deep n well at a particular location in the present CBJT/CIGFET structure depends on whether a masking plate used in defining the deep n wells does, or does not, have a pattern for a deep n well at that location. Pnp BJT 103V having isolating deep n well 381 can be simultaneously created according to the fabrication steps utilized to create pnp BJT 103 lacking an isolating deep n well by configuring the deep n well masking plate to define a deep n well at the location for deep n well 381. A similar change in the deep n well masking plate is made to convert deep n collector well 207 for npn BJT 101 into deep n well 391 for npn BJT 101W and pnp BJT 103W. If an npn BJT with slowed response is desired, a slowed-response variation of npn BJT 101 lacking deep n collector well 207 can be simultaneously created according to the fabrication steps employed to create BJT 101 by configuring the deep n well masking plate to avoid defining a deep n well at the location for that variation of BJT 101.

Taking note that asymmetric IGFETs 100 and 102 utilize deep n well 210, a version of each asymmetric IGFET 100 or 102 lacking a deep n well can be simultaneously created according to the fabrication steps employed to create IGFET 100 or 102 having deep n well 210 by configuring the deep n well masking plate to avoid defining a deep n well at the location for the version of IGFET 100 or 102 lacking the deep n well. In a complementary manner, the fabrication steps used to create each illustrated non-native symmetric IGFET lacking a deep n well can be simultaneously employed to provide it in a version having a deep n well by configuring the deep n well masking plate to define a deep n well at the location for that version of the illustrated symmetric IGFET. This also applies to the short-channel versions of the illustrated symmetric IGFETs.

The fabrication of any one of the illustrated BJTs and IGFETs including any of their variations described above can be deleted from any particular implementation of the semiconductor fabrication platform of FIG. 18. In that event, any step used in fabricating such a deleted BJT or IGFET can be deleted from that implementation of the present semiconductor fabrication platform to the extent that the step is not used in fabricating any other BJT or IGFET being manufactured in the platform implementation.

Ions of a semiconductor dopant implanted into the semiconductor body impinge on the upper semiconductor surface generally parallel to an impingement axis. For generally non-perpendicular ion impingement on the upper semiconductor surface, the impingement axis is at a tilt angle $\alpha$ to the vertical, i.e., to an imaginary vertical line extending generally perpendicular to the upper (or lower) semiconductor surface, more specifically to an imaginary vertical line extending perpendicular to a plane extending generally parallel to the upper (or lower) semiconductor surface. Inasmuch as the isolating dielectric layer of the BJTs and the gate dielectric layers of the IGFETs extend laterally generally parallel to the upper semiconductor surface, tilt angle $\alpha$ can alternatively be described as being measured from an imaginary vertical line extending generally perpendicular to the isolating dielectric layer of a BJT or the gate dielectric layer of an IGFET.

The range of an ion-implanted semiconductor dopant is generally defined as the distance that an ion of the dopant-containing species travels through the implanted material in moving from the point on the implantation surface at which the ion enters the implanted material to the location of the maximum concentration of the dopant in the implanted material. When a semiconductor dopant is ion implanted at a non-zero value of tilt angle $\alpha$, the implantation range exceeds the depth from the implantation surface to the location of the maximum concentration of the dopant in the implanted material. The range of an ion-implanted semiconductor dopant is alternatively defined as the average distance that ions of the dopant-containing species travel through the implanted material before stopping. The two definitions for the implantation range typically yield largely the same numerical result.

Aside from the halo pocket ion implantation steps and some of the S/D-extension ion implantation steps, all of the ion implantation steps in the semiconductor fabrication platform of FIG. 18 are performed roughly perpendicular to the upper (or lower) semiconductor surface. More particularly, some of the roughly perpendicular ion implantation steps are performed virtually perpendicular to the upper semiconductor surface, i.e., at substantially a zero value of tilt angle α. The value of tilt angle α is substantially zero in each ion implantation described below for which no value, or range of values is given for tilt angle α.

The remainder of the roughly perpendicular ion implantation steps are performed with tilt angle α set at a small value, typically 7°. This small deviation from perpendicularity is used to avoid undesirable ion channeling effects. For simplicity, the small deviation from perpendicularity is generally not indicated in FIG. 18.

Angled ion implantation refers to implanting ions of a semiconductor dopant at a significant non-zero value of tilt angle α. For angled ion implantation, tilt angle α is normally at least 15°. Depending on whether an IGFET has one halo pocket portion or a pair of halo pocket portions, angled ion implantation is generally employed to provide an IGFET with semiconductor dopant for each such halo pocket portion. Angled ion implantation is also sometimes employed to provide certain of the IGFETs with S/D extensions. Tilt angle α is normally constant during each particular angled ion implantation but can sometimes be varied during an angled implantation.

As viewed perpendicular to a plane extending generally parallel to the upper (or lower) semiconductor surface, the image of the tilt angle's impingement axis on that plane is at an azimuthal angle β to the longitudinal direction of each IGFET and thus at azimuthal angle β to one of the semiconductor body's principal lateral directions. Each ion implantation at a non-zero value of tilt angle α is normally performed at one or more non-zero values of azimuthal angle β. This applies to both the angled ion implantations and the tilted implantations performed at a small value, again typically 7°, of tilt angle α to avoid ion channeling.

Most of the ion implantations at a non-zero value of tilt angle α are normally performed at one or more pairs of different values of azimuthal angle β. Each pair of values of azimuthal angle β normally differs by approximately 180°. Approximately the same dosage of the ion-implanted semiconductor dopant is normally provided at each of the two values of each of the pairs of azimuthal-angle values.

Only one pair of azimuthal-angle values differing by approximately 180° is needed if the longitudinal directions of all the IGFETs in a group of IGFETs receiving semiconductor dopant during a tilted ion implantation extend in the same principal lateral direction of the semiconductor body. In that case, one half of the total implant dosage can be supplied at one of the azimuthal-angle values, and the other half of the total implant dosage is supplied at the other azimuthal-angle value. One choice for the two azimuthal-angle values is 0° and 180° relative to the semiconductor body's principal lateral direction extending parallel to the longitudinal directions of the IGFETs.

Four different values of azimuthal angle β, i.e., two pairs of different azimuthal-angle values, can be employed for a tilted ion implantation simultaneously performed on a group of IGFETs whose longitudinal directions variously extend in both of the semiconductor body's principal lateral directions. Each consecutive pair of values of azimuthal angle β then normally differs by approximately 90°. In other words, the four values of azimuthal angle β are $β_0$, $β_0+90°$, $β_0+180°$, and $β_0+270°$ where $β_0$ is a base azimuthal-angle value ranging from 0° to just under 90°. For instance, if base value $β_0$ is 45°, the four values of azimuthal angle β are 45°, 135°, 225°, and 315°. Ion implanting at four azimuthal-angle values with 90° angular increments is referred to as a four-quadrant implant. Approximately one fourth of the total implant dosage is supplied at each of the four azimuthal-angle values.

Tilted ion implantation, including angled ion implantation for which tilt angle α is normally at least 15°, can be done in various other ways. If an angled ion implantation is simultaneously performed on a group of asymmetric IGFETs laid out to have the same orientation so as to provide each asymmetric IGFET in the group only with a source extension or only with a source-side halo pocket portion, the angled implantation can be done at as little as a single value, e.g., 0°, of azimuthal angle β. Tilted ion implantation can also be done as the semiconductor body is rotated relative to the source of the semiconductor dopant so that azimuthal angle β varies with time. For instance, azimuthal angle β can vary with time at a variable or constant rate. The implant dosage is then typically provided to the semiconductor body at variable or a constant rate.

While tilted ion implantation can be done in different ways in different tilted implantation steps, each tilted implantation simultaneously performed on a group of IGFETs subsequent to defining the shapes of their gate electrodes is preferably done at four azimuthal-angle values of $β_0$, $β_0+90°$, $β_0+180°$, and $β_0+270°$ with approximately one fourth of the total implant dosage supplied at each azimuthal-angle value. The tilted implantation characteristics of IGFETs oriented one way on the semiconductor body are respectively substantially the same as the tilted ion implantation characteristics of like-configured IGFETs that may be oriented another way in another way on the semiconductor body. This makes it easier for an IC designer to design an IC manufactured according to an implementation of the semiconductor fabrication platform of FIG. 18.

In each ion implantation performed after the gate-electrode shapes are defined and used to introduce a semiconductor dopant through one or more openings in a photoresist mask into one or more selected parts of the semiconductor body, the combination of the photoresist mask, the gate electrodes (or their precursors), and any material situated along the sides of the gate electrodes serves as a dopant-blocking shield to ions of the dopant impinging on the semiconductor body. Material situated along the sides of the gate electrodes may include dielectric sidewall spacers situated along at least the transverse sides of the gate electrodes.

If base azimuthal-angle value $β_0$ is greater than zero, the material below the gate electrode largely receives some ions impinging at one corresponding one of the four $β_0$, $β_0+90°$, $β_0+180°$, and $β_0+270°$ values and other ions impinging at a corresponding adjacent one of the four $β_0$, $β_0+90°$, $β_0+180°$, and $β_0+270°$ values. The total dosage of ions received by the material below the gate electrode is approximately:

$$N'=N'_1(\sin β_0+\cos β_0) \qquad (1)$$

The maximum dose $N'_{max}$ of ions received by the material below the gate electrode occurs when base azimuthal-angle value $β_0$ is 45°. Using Eq. 1, maximum dose $N'_{max}$ is $\sqrt{2} N'_1$. Inasmuch as $\sqrt{2}$ is approximately 1.4, maximum dose $N'_{max}$ is only about 40% higher than one quadrant dose $N_1$. For simplicity, dosage N' of ions received by material below the gate electrode is, except as otherwise indicated, approximated herein as a one quadrant dose $N'_1$ even though actual dosage N' varies from $N'_1$ to approximately $1.4N'_1$ depending on base azimuthal-angle value $β_0$.

The dopant-containing particle species of the n-type semiconductor dopant utilized in each of the n-type ion implantations in the fabrication process of FIG. 18 consists of the specified n-type dopant in elemental form except as otherwise indicated. In other words, each n-type ion implantation is performed with ions of the specified n-type dopant element rather than with ions of a chemical compound containing the dopant element. The dopant-containing particle species of the p-type semiconductor dopant employed in each of the p-type ion implantations variously consists of the p-type dopant, normally boron, in elemental or chemical compound form. Hence, each p-type ion implantation is normally performed with boron ions or with ions of a boron-containing chemical compound such as boron difluoride. The ionization charge state during each ion implantation is single ionization of the positive type except as otherwise indicated.

The n-type and p-type dopants diffuse both laterally and vertically during elevated-temperature operations, i.e., temperature significantly greater than room temperature. Lateral and vertical diffusion of the dopants used to define the source/drain zones and the halo pocket portions is generally indicated in FIG. 18. Upward vertical diffusion of the dopants that define the empty main well regions is shown in FIG. 18 because upward diffusion of those dopants is important to achieving the benefits of using empty main well regions in the present CBJT/CIGFET structure. For simplicity in illustration, downward and lateral diffusion of the empty main well dopants is not indicated in FIG. 18. Nor does FIG. 18 generally indicate diffusion of any of the other well dopants.

Each anneal or other operation described below as being performed at elevated temperature includes a ramp-up segment and a ramp-down segment. During the ramp-up segment, the temperature of the then-existent semiconductor structure is increased from a low value to the indicated elevated temperature. The temperature of the semiconductor structure is decreased from the indicated elevated temperature to a low value, during the ramp-down segment. The time period given below for each anneal or other high-temperature operation is the time at which the semiconductor structure is at the indicated elevated temperature. No time period at the indicated elevated temperature is given for a spike anneal because the ramp-down segment begins immediately after the ramp-up segment ends and the temperature of the semiconductor structure reaches the indicated elevated temperature.

In some of the fabrication steps in FIG. 18, openings extend through a photoresist mask above the active semiconductor regions for two IGFETs. When the two IGFETs are formed laterally adjacent to each other in the exemplary cross sections of FIG. 18, the two photoresist openings are illustrated as a single opening in FIG. 18 even though they may be described below as separate openings.

The letter "P" at the end of a reference symbol appearing in the drawings of FIG. 18 indicates a precursor to a region which is shown in FIG. 5 and which is identified there by the portion of the reference symbol preceding "P". The letter "P" is dropped from the reference symbol in the drawings of FIG. 18 when the precursor has evolved sufficiently to largely constitute the corresponding region in FIG. 5.

The cross-sectional views of FIGS. 18*d*.1-18*w*.1, 18*d*.2-18*y*.2, 18*d*.3-18*y*.3, 18*d*.4-18*y*.4, and 18*d*.5-18*y*.5 include many situations in which part of the semiconductor structure is substantially the same in two consecutive cross-sectional views due to the presence of an item, such as a photoresist mask in the later view, that substantially prevents any change from occurring in that part of the semiconductor structure in going from the earlier view to the later view. In order to simplify the illustration of FIG. 18, the later view in each of these situations is often provided with considerably reduced labeling.

P2. Well Formation

The starting point for the fabrication process of FIG. 18 is a monosilicon semiconductor body typically consisting of a heavily doped p-type substrate 920 and an overlying lightly doped p-type epitaxial layer 136P. See FIG. 18*a*. P+ substrate 920 is a semiconductor wafer formed with <100> monosilicon doped with boron to a concentration of $4 \times 10^{18}$-$5 \times 10^{18}$ atoms/cm$^3$ for achieving a typical resistivity of approximately 0.015 ohm-cm. For simplicity, substrate 920 is not shown in the remainder of FIG. 18. Alternatively, the starting point can simply be a p-type substrate lightly doped substantially the same as p− epitaxial layer 136P.

Epitaxial layer 136P consists of epitaxially grown <100> monosilicon lightly doped p-type with boron to a concentration of approximately $4 \times 10^{14}$ atoms/cm$^3$ for achieving a typical resistivity of 30 ohm-cm. The thickness of epitaxial layer 136P is typically 5.5 μm. When the starting point for the fabrication process of FIG. 18 is a lightly doped p-type substrate, item 136P is the p− substrate.

Field-insulation region 138 is provided along the upper surface of p− epitaxial layer (or p-substrate) 136P as shown in FIG. 18*b* so as to define a group of laterally separated active monosilicon semiconductor islands 922 that include the active semiconductor islands for all of the illustrated BJTs and IGFETs. The active islands for the illustrated BJTs and IGFETs are not individually indicated in FIG. 18*b*. Additional ones (also not separately indicated in FIG. 18*b*) of active islands 922 are used to provide electrical contact to IGFET main well regions 180, 182, 184A, 186A, 188, 190, 192, 194, 196, 198, 200, 202, 204, and 206, IGFET deep n well regions 210 and 212, and substrate region 136.

Field insulation 138 is preferably created according to a trench-oxide technique but can be created according to a local-oxidation technique. The depth of field insulation is normally 0.35-0.55 μm, typically 0.45 μm. In providing field insulation 138, a thin screen insulating layer 924 of silicon oxide is thermally grown along the upper surface of epitaxial layer 136P.

A photoresist mask 926 having openings above the locations for deep n wells 207, 210, and 212 and any other deep n wells is formed on screen oxide layer 924 as shown in FIG. 18*c*. The deep n well dopant is ion implanted at a moderate dosage through the openings in photoresist 926, through the uncovered sections of screen oxide 924, and into vertically corresponding portions of the underlying monosilicon to define a group of laterally separated deep n-type well regions 928, one of which is shown in FIG. 18*c*. Photoresist 926 is removed. Deep n well regions 928, which are situated below the upper semiconductor surface and extend upward into selected ones of active islands 922, respectively constitute precursors to deep n well regions 207, 210, and 212 and any other deep n wells.

The dosage of the deep n well dopant is normally $1 \times 10^{13}$-$1 \times 10^{14}$ ions/cm$^2$, typically $1.5 \times 10^{13}$ ions/cm$^2$. The deep n well dopant normally consists of phosphorus or arsenic. For the typical case in which phosphorus constitutes the deep n well dopant, the implantation energy is normally 1,000-3,000 kiloelectron volts ("keV"), typically 1,500 keV.

An initial rapid thermal anneal ("RTA") is performed on the resultant semiconductor structure to repair lattice damage and place the atoms of the implanted deep n well dopant in energetically more stable states. The initial RTA is performed in a non-reactive environment at 900-1050° C., typically 950-1000° C., for 5-20 s, typically 10 s. The deep n well dopant diffuses vertically and laterally during the initial RTA. This dopant diffusion is not indicated in FIG. 18.

In the remainder of the process of FIG. 18, the CBJT/CIGFET structure at each processing stage is illustrated with four FIGS. "18*z*.0", "18*z*.1", "18*z*.2", and "18*z*.3" where "z" is a letter varying from "d" to "w". Each FIG. 18*z*.0 illustrates additional processing done to create BJTs 101 and 103. Each FIG. 18z.1 illustrates additional processing done to create asymmetric high-voltage IGFETs 100 and 102. Each FIG. 18z.2 illustrates additional processing done to create asymmetric extended-drain IGFETs 104 and 106. Each FIG. 18z.3 illustrates additional processing done to create symmetric low-voltage low-leakage IGFETs 108 and 110. Each group of four FIGS. 18z.0-18z.3 is, for convenience, collectively referred to below as "FIG. 18z" where "z" varies from "d" to "w". For instance, FIGS. 18d.0-18d.3 are collectively referred to as "FIG. 18d".

A photoresist mask 930 having openings above island 135B for npn BJT 101, above island 142 for asymmetric p-channel IGFET 102, and above the locations for n-type empty main well regions 184B and 186A of extended-drain IGFETs 104 and 106 is formed on screen oxide layer 924 as depicted in FIG. 18d. The edge of photoresist mask 930 that defines the side of empty main well 184B closest to p-type empty main well region 184A of IGFET 104 is critically controlled to control separation distance $L_{WW}$ between empty wells 184A and 184B. The edge of photoresist 930 that defines the side of empty main well 186A closest to p-type empty main well region 186B of IGFET 106 is critically controlled to control separation distance $L_{WW}$ between empty wells 186A and 186B.

The n-type empty main well dopant (or n-type collector/empty main well dopant) is ion implanted at a moderate dosage through the openings in photoresist 930, through the uncovered sections of screen oxide 924, and into vertically corresponding portions of the underlying monosilicon to define (a) an n precursor 175B to shallow collector well region 175B of BJT 101, (b) an n precursor 182P to empty main well region 182 of IGFET 102, and (c) n precursors 184BP and 186AP to respective empty main well regions 184B and 186A of IGFETs 104 and 106. Photoresist 930 is removed. Precursor shallow n well 175BP extends into, but only partway through, precursor 207P to deep n collector well region 207. N precursor empty main wells 182P and 186AP respectively extend into, but only partway through, precursors 210P and 212P to deep n well regions 210 and 212.

The dosage of the n-type empty main well dopant is normally $1 \times 10^{13}$-$5 \times 10^{13}$ ions/cm$^2$, typically $2.5 \times 10^{13}$-$3 \times 10^{13}$ ions/cm$^2$. The n-type empty main well dopant normally consists of phosphorus or arsenic. For the typical case in which phosphorus constitutes the n-type empty main well dopant, the implantation energy is normally 350-500 keV, typically 425-450 keV.

The concentration of the n-type empty main well dopant in n precursor empty main well regions 182P, 184BP, and 186AP reaches respective local maxima along largely the same respective locations as in n-type final empty main well regions 182, 184B, and 186A. The n-type empty main well dopant concentration in each of precursor empty main wells 182P, 184BP, and 186AP varies vertically in roughly a Gaussian manner.

In moving from the location of the n-type empty main well dopant concentration maximum in each of precursor empty main wells 182P, 184BP, and 186AP toward the upper semiconductor surface, the n-type empty main well dopant concentration drops gradually from a moderate doping, indicated by symbol "n", to a light doping, indicated by symbol "n–". Dotted lines 296P, 340P, and 372P in FIG. 18d basically constitute respective precursors to dotted lines 296, 340, and 372 in FIG. 5. Each precursor dotted line 296P, 340P, or 372P thus roughly represents the location below which the n-type empty main well dopant concentration in corresponding precursor empty main well 182P, 184BP, or 186AP is at the moderate n doping and above which the n-type empty main well dopant concentration in precursor well 182P, 184BP, or 186AP is at the light n-doping.

N precursor empty main well regions 182P, 184BP, and 186AP for IGFETs 100 and 104 do not reach the upper semiconductor surface at this point in the fabrication process. Three isolated surface-adjoining portions 136P1, 136P2, and 136P3 of p– epitaxial layer 136P are thus respectively present in islands 142, 144B, and 146A respectively above n precursor empty main wells 182P, 184BP, and 186AP. Isolated p–epitaxial-layer portion 136P3 also extends laterally over precursor deep n well region 212P. Isolated p– epitaxial-layer portions 136P1-136P3 are all separated from the underlying remainder of epitaxial layer 136P by the combination of field insulation 138 and n-type monosilicon.

The two regions of p– monosilicon formed by segments of (a) isolated epitaxial-layer portion 136P1 in island 142 and (b) the part of isolated epitaxial-layer portion 136P3 overlying n precursor empty main well 186AP in island 146A become n– monosilicon of respective empty main wells 182 and 186A in the final CBJT/CIGFET structure. In addition, the two regions of p-monosilicon formed by isolated epitaxial portion 136P2 in island 144B and the (non-isolated) part of epitaxial layer 136P situated in island 144A above n precursor empty main well 184BP become n-monosilicon of empty main well 184B in the final CBJT/CIGFET structure. These four regions of p– monosilicon thus need to be converted to n– monosilicon. As described below, the four p-monosilicon regions are normally converted to n– monosilicon by upward diffusion of part of the n-type empty main well dopant from n precursor empty main well regions 182P, 184BP, and 186AP during subsequent fabrication steps, primarily steps performed at elevated temperature.

A separate n-type doping operation can also be performed to convert the preceding four p– monosilicon regions to n–monosilicon if, for example, there is uncertainty that each of the four p-monosilicon regions would be converted fully to n–monosilicon via upward diffusion of part of the n-type empty main well dopant during subsequent elevated-temperature fabrication steps. Before removing photoresist 930, an n-type semiconductor dopant, referred to as the n-type compensating dopant, can be ion implanted at a low dosage through the uncovered sections of screen oxide 924 and into the underlying monosilicon to convert the four p– monosilicon regions to n– monosilicon.

If it is desired that any of the four p– monosilicon regions not receive the n-type compensating dopant, an additional photoresist mask (not shown) having openings above selected ones of (a) island 142 and (b) the locations for n-type empty main well regions 184B and 186A can be formed on screen oxide layer 924. The n-type compensating dopant is then ion implanted at a low dosage through the openings in the additional photoresist mask and into the semiconductor body after which the additional photoresist is removed. In either case, the dosage of the n-type compensating dopant should generally be as low as reasonable feasible so as to maintain the empty-well nature of final main well regions 182, 184B, and 186A.

Precursor shallow n collector well region 175BP for BJT 101 likewise does not reach the upper semiconductor surface at this point in the fabrication process. Another isolated surface-adjoining portion 136P11 of p– epitaxial layer 136P is therefore present in island 135 above precursor shallow n collector well 175BP. P– monosilicon portion 136P11 is converted into n intermediate collector portion 245I and n++ collector contact portion 245C in the final CBJT/CIGFET structure. Unlike the preceding four p– monosilicon regions, this conversion occurs as the result of later n-type ion implantations into p– monosilicon portion 136P11.

A photoresist mask 932 having openings above 135B for pnp BJT 103, above island 140 for asymmetric n-channel IGFET 100, and above the locations for p-type empty main well regions 184A and 186B of extended-drain IGFETs 104 and 106 is formed on screen oxide layer 924. See FIG. 18e. The edge of photoresist mask 932 that defines the side of empty main well 184A closest to n-type empty main well region 184B of IGFET 104 is critically controlled to control separation distance $L_{WW}$ between empty wells 184A and 184B. The edge of photoresist 932 that defines the side of empty main well 186B closest to n-type empty main well region 186A of IGFET 106 is critically controlled to control separation distance $L_{WW}$ between empty wells 186A and 186B.

The p-type empty main well dopant (or p-type collector/empty main well dopant) is ion implanted at a moderate dosage through the openings in photoresist 932, through the uncovered sections of screen oxide 924, and into vertically corresponding portions of the underlying monosilicon to define (a) an n precursor 177BP to shallow collector well region 177B of BJT 103, (b) a p precursor 180P to empty main well region 180 of IGFET 100, and (c) p precursors 184AP and 186BP to respective empty wells 184A and 186B of IGFETs 104 and 106. Photoresist 932 is removed. P precursor empty main well regions 180P and 186BP respectively extend into, but only partway through, precursor deep n well regions 210P and 212P.

The dosage of the p-type empty main well dopant is normally $1\times10^{13}$-$5\times10^{13}$ ions/cm$^2$, typically $2.5\times10^{13}$-$3\times10^{13}$ ions/cm$^2$. The p-type empty main well dopant normally consists of boron in elemental form or in the form of boron difluoride. For the typical case in which elemental boron constitutes the p-type empty main well dopant, the implantation energy is normally 100-225 keV, typically 150-175 keV.

The concentration of the p-type empty main well dopant in p precursor empty main well regions 180P, 184AP, and 186BP reaches respective local maxima along largely the same respective locations as in p-type final empty main well regions 180, 184A, and 186B. The n-type empty main well dopant concentration in each of precursor empty main wells 180P, 184AP, and 186BP varies vertically in roughly a Gaussian manner.

In moving from the location of the p-type empty main well dopant concentration maximum in each of precursor empty main wells 180P, 184AP, and 186BP toward the upper semiconductor surface, the p-type empty main well dopant concentration drops gradually from a moderate doping, indicated by symbol "p", to a light doping, indicated by symbol "p-". Dotted lines 256P, 332P, and 380P in FIG. 18e basically constitute respective precursors to dotted lines 256, 332, and 380 in FIG. 5. Each precursor dotted line 256P, 332P, or 380P therefore roughly represents the location below which the p-type empty main well dopant concentration in corresponding precursor empty main well 180P, 184AP, or 186BP is at the moderate n doping and above which the p-type empty main well dopant concentration in precursor well 180P, 184AP, or 186BP is at the light p-doping.

P precursor empty main well regions 180P, 184AP, and 186BP for IGFETs 102 and 106 do not reach the upper semiconductor surface at this point in the fabrication process. Two additional surface-adjoining portions 136P5 and 136P6 of p–epitaxial layer 136P are therefore respectively present in islands 140 and 146B respectively above p precursor empty main wells 180P and 186BP. P precursor shallow well region 177BP for BJT 103 likewise does not reach the upper semiconductor surface at this point in the fabrication process. A further isolated surface-adjoining portion 136P12 of p– epitaxial layer 136P is therefore present in island 137 above p precursor shallow well 177BP.

A photoresist mask 934 having openings above islands 135A and 135B for npn BJT 101 and above island 150 for symmetric p-channel IGFET 110 is formed on screen oxide layer 924 as depicted in FIG. 18f. The n-type filled main well dopant (or n-type collector/filled main well dopant) is ion implanted at a moderate dosage through the openings in photoresist 934, through the uncovered sections of screen oxide 924, and into vertically corresponding portions of the underlying monosilicon to define (a) an n precursor 175AP to shallow collector well region 175A of BJT 101 and (b) an n precursor 494P to filled-well main body-material portion 494 of IGFET 110. Precursor shallow n collector well 175AP extends into, but only partway through, precursor deep n collector well region 207P. The n-type filled main well dopant also enters precursor shallow n collector well region 175B so as to increase its n-type doping. The n-type filled main well implantation is normally done at the same conditions and with the same n-type dopant as the n-type empty main well implantation.

With photoresist mask 934 still in place, the n-type APT dopant (or n-type collector/APT dopant) is ion implanted at a moderate dosage through the openings in photoresist 934, through the uncovered sections of screen oxide 924, and into vertically corresponding portions of the underlying monosilicon to define (a) an n precursor 245MP to main collector portion 245M of npn BJT 101, (b) an n precursor 245IP to intermediate collector portion 245I of BJT 101, and (c) an n precursor 496P to intermediate body-material portion 496 of p-channel IGFET 110. Photoresist 934 is now removed. Isolated p– epitaxial-layer portion 136P11 is thereby converted to n precursor intermediate collector portion 245IP.

Precursor n main collector portion 245MP and precursor n intermediate collector portion 245IP respectively overlie shallow n collector well regions 175AP and 175BP. N precursor intermediate body-material portion 496P overlies n precursor filled-well main body-material portion 494P. Each of n precursor body-material portions 494P and 496P normally extends laterally below the intended location for substantially all of each of channel zone 484 and S/D zones 480 and 482 of IGFET 110.

The dosage of the n-type APT dopant is normally $1\times10^{12}$-$6\times10^{12}$ ions/cm$^2$, typically $3\times10^{12}$ ions/cm$^2$. The n-type APT dopant normally consists of phosphorus or arsenic. For the typical case in which phosphorus constitutes the n-type APT dopant, the implantation energy is 75-150 keV, typically 100-125 keV. The n-type APT implantation can be performed with photoresist 934 prior to the n-type filled main well implantation.

A photoresist mask 936 having openings above islands 137A and 137B for pnp BJT 103 and above island 148 for symmetric n-channel IGFET 108 is formed on screen oxide layer 924. See FIG. 18g. The p-type filled main well dopant (or p-type collector/filled main well dopant) is ion implanted at a moderate dosage through the openings in photoresist 936, through the uncovered sections of screen oxide 924, and into vertically corresponding portions of the underlying monosilicon to define (a) an n precursor 177AP to shallow collector well region 177A of BJT 103 and (b) a p precursor 454P to filled-well main body-material portion 454 of IGFET 108. The p-type filled main well dopant also enters precursor shallow n collector well region 177B so as to increase its p-type doping. The p-type filled main well implantation is normally done at the same conditions and with the same p-type dopant as the p-type empty main well implantation.

With photoresist mask 936 still in place, the p-type APT dopant (or p-type collector/APT dopant) is ion implanted at a moderate dosage through the openings in photoresist 936, through the uncovered sections of screen oxide 924, and into vertically corresponding portions of the underlying monosilicon to define (a) a p precursor 325MP to main collector portion 325M of pnp BJT 103, (b) a p precursor 325IP to intermediate collector portion 325I of BJT 103, and (c) a p precursor 456P to intermediate body-material portion 456 of IGFET 108. Photoresist 936 is now removed. As a result, isolated p− epitaxial portion 136P12 is converted to p precursor intermediate collector portion 325IP.

Precursor p main collector portion 325MP and precursor p intermediate collector portion 325IP respectively overlie shallow p collector well regions 177AP and 177BP. P precursor intermediate body-material portion 456P overlies p precursor filled-well main body-material portion 454P. Each of p precursor body-material portions 454P and 456P normally extends laterally below the intended location for substantially all of each of channel zone 444 and S/D zones 440 and 442 of IGFET 108.

The dosage of the p-type APT dopant is normally $4 \times 10^{12}$–$1.2 \times 10^{13}$ ions/cm$^2$, typically $7 \times 10^{12}$ ions/cm$^2$. The p-type APT dopant normally consists of boron in elemental form or in the form of boron difluoride. For the typical case in which elemental boron constitutes the p-type APT dopant, the implantation energy is 50-125 keV, typically 75-100 keV. The p-type APT implantation can be performed with photoresist 936 prior to the p-type filled main well implantation.

None of the remaining semiconductor dopants introduced into the semiconductor body significantly go into precursor deep n collector well 207P or into precursor deep n wells 210P and 212P (or into any other precursor deep n well). Since the initial RTA caused the atoms of the deep n well dopant to go into energetically more stable states, precursor deep n wells 207P, 210P, and 212P are respectively substantially final deep n wells 207, 210, and 212 and are so indicated in the remaining drawings of FIG. 18.

A photoresist mask 938 having an opening above island 150 for symmetric p-channel IGFET 110 is formed on screen oxide layer 924 as depicted in FIG. 18h. The n-type threshold-adjust dopant is ion implanted at a light-to-moderate dosage through the opening in photoresist 938, through the uncovered section of screen oxide 924, and into a vertically corresponding portion of the underlying monosilicon to define an n precursor 498P to upper body-material portion 498 of IGFET 110. Photoresist 938 is removed. N precursor upper body-material portion 498P overlies n precursor intermediate body-material portion 496P. N precursor body-material portions 494P, 496P, and 498P form an n precursor 190P to filled well region 190 of IGFET 110.

The dosage of the n-type threshold-adjust dopant is normally $1 \times 10^{12}$–$6 \times 10^{12}$ ions/cm$^2$, typically $3 \times 10^{12}$ ions/cm$^2$. The n-type threshold-adjust dopant normally consists of arsenic or phosphorus. For the typical case in which arsenic constitutes the n-type threshold-adjust dopant, the implantation energy is 60-100 keV, typically 80 keV.

A photoresist mask 940 having an opening above island 148 for symmetric n-channel IGFET 108 is formed on screen oxide layer 924. See FIG. 18i. The p-type threshold-adjust dopant is ion implanted at a light-to-moderate dosage through the opening in photoresist 940, through the uncovered section of screen oxide 924, and into the underlying monosilicon to define a p precursor 458P to upper body-material portions 458 of IGFET 108. Photoresist 940 is removed. P precursor upper body-material portion 458P overlies p precursor intermediate body-material portion 456P. P precursor body-material portions 454P, 456P, and 458P form a p precursor 188P to filled well region 188 of IGFET 108.

The dosage of the p-type threshold-adjust dopant is normally $2 \times 10^{12}$–$8 \times 10^{12}$ ions/cm$^2$, typically $4 \times 10^{12}$ ions/cm$^2$. The p-type threshold-adjust dopant normally consists of boron in elemental form or in the form of boron difluoride. For the typical case in which elemental boron constitutes the p-type threshold-adjust dopant, the implantation energy is normally 15-35 keV, typically 25 keV.

Tilt angle $\alpha$ is normally approximately 7° for the n-type APT, p-type APT, and p-type threshold-adjust implantations. Tilt angle $\alpha$ is approximately 0° for the remainder of the preceding implantations. Each of the preceding implantations is performed at only one value of azimuthal angle $\beta$, i.e., each of them is a single-quadrant implantation. Azimuthal angle $\beta$ is 30°-35° for the n-type APT, p-type APT, and p-type threshold-adjust implantations and approximately 0° for the remainder of the preceding implantations.

P3. Base Formation

A photoresist mask 939 having openings above island 135A for npn BJT 101 and above island 137B for pnp BJT 103 is formed on screen oxide layer 924 as depicted in FIG. 18j. P-type semiconductor dopant, referred to here as the p-type base dopant, is ion implanted at a moderate dosage through the openings in photoresist 939, through the uncovered sections of screen oxide 924, and into vertically corresponding portions of the underlying monosilicon to define a p precursor 243P to p-type base 243 of BJT 101. P precursor base 243P overlies precursor n main collector portion 245MP. The p-type base dopant also enters precursor p intermediate collector portion 325IP so as to increase its p-type doping. Photoresist 939 is removed.

The dosage of the p-type base dopant is normally $1 \times 10^{13}$–$5 \times 10^{13}$ ions/cm$^2$, typically $2 \times 10^{13}$–$4 \times 10^{13}$ ions/cm$^2$. The p-type base dopant normally consists of boron in elemental form or in the form of boron difluoride. For the typical case in which boron constitutes the p-type base dopant, the implantation energy is normally 40-120 keV, typically 60-80 keV. Tilt angle $\alpha$ is substantially 0° for the p-type base implantation.

A photoresist mask 941 having openings above island 137A for pnp BJT 103 and above island 135B for npn BJT 101 is formed on screen oxide layer 924. See FIG. 18k. N-type semiconductor dopant, referred to here as the n-type base dopant, is ion implanted at a moderate dosage through the openings in photoresist 939, through the uncovered sections of screen oxide 924, and into vertically corresponding portions of the underlying monosilicon to define an n precursor 323P to n-type base 323 of BJT 103. N precursor base 323P overlies precursor p main collector portion 325MP. The n-type base dopant also enters precursor n intermediate collector portion 245IP so as to increase its n-type doping. Photoresist 941 is removed.

The dosage of the n-type base dopant is normally $1 \times 10^{13}$–$5 \times 10^{13}$ ions/cm$^2$, typically $2 \times 10^{13}$–$4 \times 10^{13}$ ions/cm$^2$. The n-type base dopant normally consists of arsenic or phosphorus. For the typical case in which the n-type base dopant consists of phosphorus, the implantation energy is normally 80-240 keV, typically 160-180 keV. Tilt angle $\alpha$ is substantially 0° for the n-type base implantation.

P4. Formation of Lateral Spacing Portions and Gate Electrodes

The upper semiconductor surface is exposed by removing screen oxide layer 924 and cleaned, typically by a wet chemical process. A sacrificial layer (not shown) of silicon oxide is thermally grown along the upper semiconductor surface to prepare the upper semiconductor surface for gate dielectric formation. The thickness of the sacrificial oxide layer is typically at least 10 nm. The sacrificial oxide layer is subsequently removed. The cleaning operation and the formation and removal of the sacrificial oxide layer remove defects and/or contamination along the upper semiconductor surface to produce a high-quality upper semiconductor surface.

A comparatively thick gate-dielectric-containing dielectric layer 942 is provided along the upper semiconductor surface as depicted in FIG. 18*l*. Portions of thick dielectric layer 942 are at the lateral locations for, and later constitute portions of, (a) isolating dielectric layers 267-1 and 267-2 for npn BJT 101, (b) isolating dielectric layers 347-1 and 347-2 for pnp BJT 103, and (c) the gate dielectric layers at the high gate dielectric thickness $t_{GdH}$, i.e., gate dielectric layers 260 and 300 of asymmetric IGFETs 100 and 102, gate dielectric layers 344 and 384 of extended-drain IGFETs 104 and 106, and the gate dielectric layers of the illustrated high-voltage symmetric IGFETs. To allow for subsequent increase in the thickness of the sections of dielectric layer 942 at the lateral locations for the $t_{GdH}$ high-thickness gate dielectric layers, the thickness of layer 942 is slightly less, typically 0.2 nm less, than the intended $t_{GdH}$ thickness.

Thick dielectric layer 942 is normally thermally grown. The thermal growth is performed in a wet oxidizing environment at 900-1100° C., typically 1000° C., for 30-90 s, typically 45-60 s. Layer 942 normally consists of substantially pure silicon oxide for which the wet oxidizing environment is formed with oxygen and hydrogen.

The high-temperature conditions of the thermal growth of thick dielectric layer 942 serves as an anneal which repairs lattice damage caused by the implanted p-type and n-type main well dopants and places atoms of the implanted p-type and n-type main well dopants in energetically more stable states. As a result, precursor well region 216P substantially becomes isolating p well region 216. Precursor filled-well main body-material portion 454P becomes p filled-well main body-material portions 454 of IGFET 108. Precursor filled-well main body-material portion 494P becomes n filled-well main body-material portion 494 of IGFET 110.

The high temperature of the thermal growth of thick dielectric layer 942 also causes the p-type and n-type well, APT, threshold-adjust, and base dopants, especially the main well dopants, to diffuse vertically and laterally. FIG. 18*l* only indicates the upward diffusion of the empty main well dopants. As a result of the upward diffusion of the empty main well dopants, precursor empty main well regions 180P, 182P, 184AP, 184BP, 186AP, and 186BP expand upward toward the upper semiconductor surface.

Precursor empty main wells 180P, 182P, 184AP, 184BP, 186AP, and 186BP may reach the upper semiconductor surface during the thick-dielectric-layer thermal growth if it is sufficiently strong. However, precursor empty wells 180P, 182P, 184AP, 184BP, 186AP, and 186BP typically expand upward only partway to the upper semiconductor surface during the thick-dielectric-layer thermal growth. This situation is illustrated in FIG. 18*l*. Due to the upward expansion of precursor empty wells 180P, 182P, 184AP, 184BP, 186AP, and 186BP, isolated p– epitaxial-layer portions 136P1-136P3, 136P5, and 136P6 shrink in size vertically.

A photoresist mask (not shown) having openings above islands 148 and 150 for symmetric low-voltage IGFETs 108 and 110 is formed on thick dielectric layer 942. The uncovered material of dielectric layer 942 is removed to expose islands 148 and 150. Referring to FIG. 18*m*, item 942R is the remainder of thick gate-dielectric-containing dielectric layer 942.

A thin layer (not shown) of silicon is also removed along the upper surface of each of islands 148 and 150 for symmetric low-voltage IGFETs 108 and 110 in order to compensate for non-ideal silicon-oxide-to-silicon selectivity of the etching process. This ensures complete removal of the gate dielectric material at the removal locations. Additional defects and/or contamination, e.g., contamination caused by the photoresist, present along the upper surfaces of islands 148 and 150 are removed in the course of removing the thin silicon layers. The photoresist is subsequently removed.

A comparatively thin gate-dielectric-containing dielectric layer 944 is provided along the upper semiconductor surface above islands 148 and 150 for symmetric low-voltage IGFETs 108 and 110 and thus at the respective lateral locations for their gate dielectric layers 344 and 384. Again see FIG. 18*m*. Portions of thin dielectric layer 944 later respectively constitute gate dielectric layers 344 and 384.

Thin dielectric layer 944 is normally created by a combination of thermal growth and plasma nitridization. The thermal growth of thin dielectric layer 944 is initiated in a wet hydrogen/oxygen oxidizing environment at 800-1000° C., typically 900° C., for 10-20 s, typically 15 s. Layer 944 then consists of substantially pure silicon oxide for which the wet oxidizing environment is formed with oxygen and hydrogen.

Nitrogen is normally incorporated into thin dielectric layer 944 by a plasma nitridization operation performed subsequent to the wet-oxidizing thermal oxide growth primarily for preventing boron in p++ gate electrode 502 of symmetric low-voltage p-channel IGFET 110 from diffusing into its channel zone 484. Layer 944 is thereby converted into a combination of silicon, oxygen, and nitrogen. The plasma nitridization operation is normally performed so that nitrogen constitutes 6-12%, preferably 9-11%, typically 10%, of layer 944 by mass.

An intermediate RTA is performed on the semiconductor structure in oxygen at 800-1000° C., typically 900° C., for 10-20 s, typically 15 s. Due to the oxygen, the thickness of thin dielectric layer 944 increases slightly by thermal growth during the intermediate RTA. The thickness of dielectric layer 944 now substantially equals low gate dielectric thickness $t_{GdL}$, i.e., 1-3 nm, preferably 1.5-2.5 nm, typically 2 nm for 1.2-V operation of the illustrated low-voltage IGFETs.

The thickness of thick gate-dielectric-containing dielectric remainder 942R increases slightly by thermal growth during the thermal growth of thin dielectric layer 944. Due to reduced oxygen penetration to the upper surfaces of islands 140, 142, 144A, 144B, 146A, 146B, 156, 158, 164, 166, 172, and 174 covered with thick dielectric remainder 942R, the increase in the thickness of dielectric remainder 942R is considerably less than the thickness of thin dielectric layer 944. This relatively small increase in the thickness of thick dielectric remainder 942R is not shown in FIG. 18.

Thick dielectric remainder 942R receives nitrogen during the plasma nitridization operation. Because thick dielectric remainder 942R is thicker than thin dielectric layer 944, thick dielectric remainder 942R has a lower percentage by mass of nitrogen than thin dielectric layer 944. At the end of the thermal growth of thin dielectric layer 942 and the subsequent plasma nitridization, the thickness of thick dielectric remainder 942R substantially equals the $t_{GdH}$ high-thickness gate dielectric thickness value, i.e., normally 4-8 nm, preferably 5-7 nm, typically 6-6.5 nm for 3.0-V operation of the illustrated high-voltage IGFETs, including asymmetric IGFETs 100 and 102. The percentage by mass of nitrogen in thick dielectric layer 942R approximately equals the percentage by mass of nitrogen in thin dielectric layer 944 multiplied by the ratio of low dielectric thickness value $t_{GdL}$ to high dielectric thickness value $t_{GdH}$.

The high temperature of the thermal growth of thin dielectric layer 944 acts as an anneal which causes the implanted p-type and n-type well, APT, threshold-adjust, and base dopants to diffuse further vertically and laterally. With the thermal growth of thin dielectric layer 944 performed at a lower temperature, and for a considerably shorter time period, than the thermal growth of thick dielectric layer 942, the well, APT, threshold-adjust, and base dopants diffuse considerably less during the thin-dielectric-layer thermal growth than during the thick-dielectric-layer thermal growth. Only the upward diffusion of the empty main well dopants during the thin-dielectric-layer thermal growth is indicated in FIG. 18m.

Precursors 269-1P, 269-2P, 349-1P, and 349-2P to respective lateral spacing portions 269-1, 269-2, 349-1, and 349-2 for BJTs 101 and 103 are now formed on the partially completed CBJT/CIGFET structure of FIG. 18m. See FIG. 18n. Precursors 262P, 302P, 346P, 386P, 462P, and 502P to respective gate electrodes 262, 302, 346, 386, 462, and 502 of IGFETs 100, 102, 104, 106, 108, and 110 are simultaneously formed on the partially completed CBJT/CIGFET structure.

More particularly, precursor lateral spacing portions 269-1P, 269-2P, 349-1P, and 349-2P for BJTs 101 and 103 are formed on thick gate-dielectric-containing dielectric remainder 942R above selected segments of islands 135A and 137A. Precursor gate electrodes 262P and 302P for asymmetric high-voltage IGFETs 100 and 102 are formed on thick dielectric remainder 942R respectively above selected segments of islands 140 and 142. Precursor gate electrode 346P for extended-drain n-channel IGFET 104 is formed on thick dielectric remainder 942R and part of field-insulation portion 138A so as to overlie a selected segment of island 144A without extending over island 144B. Precursor gate electrode 386P for extended-drain p-channel IGFET 106 is similarly formed on thick dielectric remainder 942R and part of field-insulation portion 138B so as to overlie a selected segment of island 146A without extending over island 146B. Precursor gate electrodes 462P and 502P for symmetric low-voltage IGFETs 108 and 110 are formed on thin gate-dielectric-containing dielectric layer 944 respectively above segments of islands 148 and 150.

Precursor lateral spacing portions 269-1P, 269-2P, 349-1P, and 349-2P and precursor gate electrodes 262P, 302P, 346P, 386P, 462P, and 502P are created by depositing a layer of largely undoped (intrinsic) polysilicon on dielectric remainder 942R and then patterning the polysilicon layer using a suitable critical photoresist mask (not shown). Portions (not shown) of the lateral-spacing-portion/gate-electrode polysilicon layer can be used for polysilicon resistors. Each such resistor portion of the polysilicon layer typically overlies field insulation 138. The thickness of the polysilicon layer is 160-200 nm, typically 180 nm.

Importantly, the thickness of the polysilicon layer is chosen to be sufficiently great that no significant amount of semiconductor dopant is subsequently ion implanted through, or otherwise passes through, through gate electrodes 262P, 302P, 346P, 386P, 462P, and 502P into the underlying monosilicon. As a result, lateral spacing portions 269-1P, 269-2P, 349-1P, and 349-2P are sufficiently thick to prevent any significant amount of semiconductor dopant from subsequently passing through them and damaging respectively underlying base link portions 243L-1, 243L-2, 323L-1, and 323L-2.

The polysilicon layer is patterned so that the space between precursor polysilicon lateral spacing portions 269-1P and 269-2P overlies the intended location for n++ emitter 241 of npn BJT 101. The space between precursor lateral spacing portions 369-1P and 369-2 similarly overlies the intended location for p++ emitter 321 of pnp BJT 103. The dimension $d_{LS}$ of each precursor lateral spacing portion 269-1P, 269-2P, 369-1P, or 369-2 in the direction of base link length $L_{BL}$ for BJT is determined by the patterning achieved with the critical photoresist mask used in defining the precursor lateral spacing portions and can be controlled well.

In addition, precursor polysilicon gate electrodes 262P, 302P, 462 P, and 502P respectively overlie the intended locations for channel zones 244, 284, 444, and 484 of non-extended-drain IGFETs 100, 102, 108, and 110. Precursor polysilicon gate electrode 346P for extended-drain n-channel IGFET 104 overlies the intended location for channel zone 322, including the intended location for the channel-zone segment of portion 136A of p– substrate region 136 (see FIG. 16a), and extends over the intended location for portion 184B2 of empty main well region 184B partway across field-insulation portion 138A toward the intended location for portion 184B1 of empty main well 184B. Precursor polysilicon gate electrode 386P for extended-drain n-channel IGFET 106 overlies the intended locations for channel zone 362 and portion 136B of p– substrate region 136 (see FIG. 16b) and extends over the intended location for portion 186B2 of empty main well region 186B partway across field-insulation portion 138B toward portion 186B1 of empty main well 186B.

The portions of thick dielectric remainder 942R underlying precursor lateral spacing portions 269-1P, 269-2P, 349-1P, and 349-2P respectively constitute isolating dielectric layers 267-1, 267-2, 347-1, and 347-2 for BJTs 101 and 103. The portions of thick dielectric remainder 942R underlying precursor gate electrodes 262P, 302P, 346P, and 386P of IGFETs 100, 102, 104, and 106 respectively constitute their gate dielectric layers 260, 300, 344, and 384. The portions of thin dielectric layer 944 underlying precursor gate electrodes 462P and 502P of low-voltage IGFETs 108 and 110 respectively constitute their gate dielectric layers 460 and 500. The gate dielectric material formed with the gate dielectric layers of the illustrated IGFETs generally respectively separates the precursor gate electrodes of the illustrated IGFETs from the doped monosilicon intended to be their respective channel zones.

All portions of thick dielectric remainder 942R not covered by precursor lateral spacing portions and precursor gate electrodes, including precursor lateral spacing portions 269-1P, 269-2P, 349-1P, and 349-2P and precursor gate electrodes 262P, 302P, 346P, 386P, 462P, and 502P, are removed in the course of removing the photoresist used in patterning the polysilicon layer. Segments of islands 135A and 137A situated to the sides of precursor lateral spacing portions 269-1P, 269-2P, 349-1P, and 349-2P are thereby exposed. Islands 135B and 137B are also exposed. Segments of islands 140, 142, 144A, 144B, 146A, 146B, 148, and 150 situated to the sides of precursor gate electrodes 262P, 302P, 346P, 386P, 462P, and 502P are likewise exposed.

A thin sealing dielectric layer 946 is thermally grown along the exposed surfaces of precursor lateral spacing portions 269-1P, 269-2P, 349-1P, and 349-2P for BJTs 101 and 103 and along the exposed surfaces of precursor gate electrodes 262P, 302P, 346P, 386P, 462P, and 502P of IGFETs 100, 102, 104, 106, 108, and 110. Again see FIG. 18n. A thin dielectric surface layer 948 simultaneously forms along the exposed segments of islands 135A, 137A, 140, 142, 144A, 144B, 146A, 146B, 148, and 150 and along islands 135B and 137B. The thermal growth of dielectric layers 946 and 948 is performed at 900-1050° C., typically 950-1000° C., for 5-25 s, typically 10 s. Sealing dielectric layer 946 has a thickness of 1-3 nm, typically 2 nm.

The high temperature of the thermal growth of dielectric layers 946 and 948 acts as a further anneal which causes additional vertical and lateral diffusion of the implanted p-type and n-type well, APT, threshold-adjust, and base dopants. With the thermal growth of dielectric layers 946 and 948 done for a considerably shorter time period than the thermal growth of thick dielectric layer 942, the well, APT, threshold-adjust, and base dopants diffuse considerably less during the thermal growth of dielectric layers 946 and 948 than during the thick-dielectric-layer thermal growth. None of the additional dopant diffusion caused by the thermal growth of dielectric layers 946 and 948 is indicated in FIG. 18*n*.

FIG. 18*l* illustrates an example in which the top of each of precursor empty main well regions 180P, 182P, 184AP, 184BP, 186AP, and 186BP is below the upper semiconductor surface at the end of the thermal growth of dielectric layers 946 and 948. However, precursor empty main wells 180P, 182P, 184AP, 184BP, 186AP, and 186BP may reach the upper semiconductor by the end of the thermal growth of dielectric layers 946 and 948.

P5. Formation of Source/Drain Extensions and Halo Pocket Portions

A photoresist mask 950 having an opening above island 148 for symmetric n-channel IGFET 108 is formed on dielectric layers 946 and 948 as shown in FIG. 18*o*. The n-type shallow S/D-extension dopant is ion implanted at a high dosage through the openings in photoresist 950, through the uncovered sections of surface dielectric 948, and into vertically corresponding portions of the underlying monosilicon to define a pair of laterally separated largely identical n+ precursors 440EP and 442EP to respective S/D extensions 440E and 442E of IGFET 108.

The n-type shallow S/D-extension implantation is a four-quadrant implant with tilt angle α equal to approximately 7° and with base azimuthal-angle value $β_0$ equal to 20°-25°. The dosage of the n-type shallow S/D-extension dopant is normally $1×10^{14}$-$1×10^{15}$ ions/cm$^2$, typically $5×10^{14}$ ions/cm$^2$. Approximately one fourth of the n-type shallow S/D-extension implant dosage is implanted at each azimuthal-angle value. The n-type shallow S/D-extension dopant normally consists of arsenic or phosphorus. For the typical case in which arsenic constitutes the n-type shallow S/D-extension dopant, the implantation energy is normally 6-15 keV, typically 10 keV.

With photoresist mask 950 still in place, the p-type S/D halo dopant is ion implanted in a significantly angled manner at a moderate dosage through the openings in photoresist 950, through the uncovered sections of surface dielectric layer 948, and into vertically corresponding portions of the underlying monosilicon to define a pair of laterally separated largely identical p precursors 450P and 452P to respective halo pocket portions 450 and 452 of IGFET 108. Again see FIG. 18*o*. Photoresist 950 is removed.

P precursor halo pocket portions 450P and 452P respectively extend deeper than n+ precursor S/D extensions 440EP and 442EP. Due to the angled implantation of the p-type S/D halo dopant, p precursor halo pockets 450P and 452P of IGFET 108 extend laterally partway under its precursor gate electrode 462P respectively beyond its n+ precursor S/D extensions 440EP and 442EP.

Tilt angle α for the angled p-type S/D halo implantation is at least 15°, normally 20-45°, typically 30°. The dosage of the p-type S/D halo dopant is normally $1×10^{13}$-$5×10^{13}$ ions/cm$^2$, typically $2.5×10^{13}$ ions/cm$^2$. The angled p-type S/D halo implantation is a four-quadrant implant with base azimuthal-angle value $β_0$ equal to approximately 30°. Approximately one fourth of the p-type S/D halo implant dosage is implanted at each azimuthal-angle value. The p-type S/D halo dopant normally consists of boron in elemental form or in the form of boron difluoride. For the typical case in which elemental boron constitutes the p-type S/D halo dopant, the implantation energy is 50-100 keV, typically 75 keV. The p-type S/D halo implantation can be performed with photoresist 950 prior to the n-type shallow S/D-extension implantation.

A photoresist mask 952 having an opening above the location for drain extension 242E of asymmetric n-channel IGFET 100 is formed on dielectric layers 946 and 948 as shown in FIG. 18*p*. Photoresist mask 952 is critically aligned to precursor gate electrode 262P of IGFET 100. The n-type deep S/D-extension dopant is ion implanted in a significantly angled manner at a high dosage through the opening in photoresist 952, through the uncovered section of surface dielectric 948, and into a vertically corresponding portion of the underlying monosilicon to define an n+ precursor 242EP to drain extension 242E of IGFET 100. Photoresist 952 is removed.

Tilt angle α for the angled n-type deep S/D-extension implantation is at least 15°, normally 20-45°, typically 30°. As a result, precursor drain extension 242EP of asymmetric IGFET 100 extends significantly laterally under its precursor gate electrode 262P.

The n-type deep S/D-extension implantation is a four-quadrant implant with base azimuthal-angle value $β_0$ equal to 20°-25°. The dosage of the n-type deep S/D-extension dopant is normally $2×10^{13}$-$1×10^{14}$ ions/cm$^2$, typically $5×10^{13}$-$6×10^{13}$ ions/cm$^2$. Approximately one fourth of the n-type deep S/D-extension implant dosage is implanted at each azimuthal-angle value. The n-type deep S/D-extension dopant normally consists of phosphorus or arsenic. For the typical case in which phosphorus constitutes the n-type deep S/D-extension dopant, the implantation energy is normally 15-45 keV, typically 30 keV.

A photoresist mask 954 having openings above the location for source extension 240E of asymmetric n-channel IGFET 100 and above the location for source extension 320E of extended-drain n-channel IGFET 104 is formed on dielectric layers 946 and 948. See FIG. 18*q*. Photoresist mask 954 is critically aligned to precursor gate electrodes 262P and 346P of IGFETs 100 and 104. The n-type shallow source-extension dopant is ion implanted at a high dosage through the openings in critical photoresist 954, through the uncovered sections of surface dielectric 948, and into vertically corresponding portions of the underlying monosilicon to define (a) an n+ precursor 240EP to source extension 240E of IGFET 100 and (b) an n+ precursor 320EP to source extension 320E of IGFET 104. Tilt angle α is approximately 7° for the n-type shallow source-extension implantation.

The n-type shallow source-extension dopant is normally arsenic which is of greater atomic weight than phosphorus normally used as the n-type deep S/D-extension dopant. Taking note that precursor source extension 240EP and precursor drain extension 242EP of asymmetric IGFET 100 are respectively defined with the n-type shallow source-extension implant and the angled n-type deep S/D-extension implant, the implantation parameters (including the tilt and azimuthal parameters of the n-type deep S/D-extension implant) of the steps used to perform these two n-type implants are chosen such that the maximum concentration of the n-type deep S/D-extension dopant in precursor drain extension 242EP is less than, normally no more than one half of, preferably no more than one fourth of, more preferably no more than one tenth of, even more preferably no more than one twentieth of, the maximum concentration of the n-type shallow source-extension dopant in precursor source extension 240EP. Alternatively stated, the maximum concentration of the n-type shallow source-extension dopant in precursor source extension 240EP is significantly greater than, normally at least two times, preferably at least four times, more preferably at least 10 times, even more preferably at least 20 times, the maximum concentration of the n-type deep S/D-extension dopant in precursor drain extension 242EP.

The maximum concentration of the n-type shallow source-extension dopant in precursor source extension 240EP of asymmetric IGFET 100 occurs normally along largely the same location as in final source extension 240E and thus normally along largely the same location as the maximum concentration of the total n-type dopant in source extension 240E. The maximum concentration of the n-type deep S/D-extension dopant in precursor drain extension 242EP of IGFET 100 similarly occurs normally along largely the same location as in final drain extension 242E and thus normally along largely the same location as the maximum concentration of the total n-type dopant in final drain extension 242E.

The energy and other implantation parameters of the n-type shallow source-extension implant and the n-type deep S/D-extension implant, including the tilt and azimuthal parameters of the angled n-type deep S/D-extension implant, are controlled so that the location of the maximum concentration of the n-type deep S/D-extension dopant in precursor drain extension 242EP occurs significantly deeper than the location of the maximum concentration of the n-type shallow source-extension dopant in precursor source extension 240EP. In particular, the location of the maximum concentration of the n-type deep S/D-extension dopant in precursor drain extension 242EP normally occurs at least 10% deeper, preferably at least 20% deeper, more preferably at least 30% deeper, than the location of the maximum concentration of the n-type shallow source-extension dopant in precursor source extension 240EP.

The range needed for the n-type deep S/D-extension implantation is considerably greater than the range needed for the n-type shallow source-extension implantation because (a) the maximum concentration of the n-type deep S/D-extension dopant in precursor drain extension 242EP is deeper than the maximum concentration of the n-type shallow source-extension dopant in precursor source extension 240EP and (b) the n-type deep S/D-extension implantation is performed at a higher value of tilt angle $\alpha$ than the n-type shallow source-extension implantation. As a result, precursor drain extension 242EP extends deeper, normally at least 20% deeper, preferably at least 30% deeper, more preferably at least 50% deeper, even more preferably at least 100% deeper, than precursor source extension 240EP.

With the n-type shallow source-extension implantation being performed nearly perpendicular to a plane extending generally parallel to the upper semiconductor surface (typically at approximately 7° for tilt angle $\alpha$), precursor source extension 240EP of asymmetric IGFET 100 normally does not extend significantly laterally under precursor gate electrode 262P. Inasmuch as the angled implantation of the n-type deep S/D-extension dopant used to form precursor drain extension 242EP causes it to extend significantly laterally under precursor gate electrode 262P, precursor drain extension 242P extends significantly further laterally under precursor gate electrode 262P than does precursor source extension 240EP. The amount by which precursor gate electrode 262P overlaps precursor drain extension 242EP therefore significantly exceeds the amount by which precursor gate electrode 262P overlaps precursor source extension 240EP. The overlap of precursor gate electrode 262P on precursor drain extension 242EP is normally at least 10% greater, preferably at least 15% greater, more preferably at least 20% greater, than the overlap of precursor gate electrode 262P on precursor source extension 240EP.

The n-type shallow source-extension implantation is a four-quadrant implant with base azimuthal-angle value $\beta_0$ equal to 20°-25°. Subject to meeting the above conditions for the differences between precursor source extension 240EP and precursor drain extension 242EP of $1 \times 10^{14}$-$1 \times 10^{15}$ IGFET 100, the dosage of the n-type shallow source-extension dopant is normally 1 ions/cm$^2$, typically $5 \times 10^{14}$ ions/cm$^2$. Approximately one fourth of the n-type shallow source-extension implant dosage is implanted at each azimuthal-angle value. For the typical case in which arsenic constitutes the n-type shallow source-extension dopant, the implantation energy is normally 3-15 keV, typically 10 keV.

With critical photoresist mask 954 still in place, the p-type source halo dopant is ion implanted in a significantly angled manner at a moderate dosage through the openings in photoresist 954, through the uncovered sections of surface dielectric layer 948, and into vertically corresponding portions of the underlying monosilicon to define (a) a p precursor 250P to halo pocket portion 250 of asymmetric IGFET 100 and (b) a p precursor 326P to halo pocket portion 326 of extended-drain IGFET 104. Again see FIG. 18q. Photoresist 954 is removed.

P precursor halo pocket portions 250P and 326P respectively extend deeper than n+ precursor source extensions 240EP and 320EP of IGFETs 100 and 104. Due to the angled implantation of the p-type source halo dopant, p precursor halo pocket 250P of IGFET 100 extends laterally partway under its precursor gate electrode 262P and beyond its n+ precursor source extension 240EP. P precursor halo pocket 326P of IGFET 104 similarly extends laterally partway under its precursor gate electrode 346P and beyond its n+ precursor source extension 320EP.

Tilt angle $\alpha$ for the angled p-type source halo implantation is at least 15°, normally 20°-45°, typically 30°. The angled p-type source halo implantation is a four-quadrant implant with base azimuthal-angle value $\beta_0$ equal to approximately 45°. The dosage of the p-type source halo dopant is normally $1 \times 10^{13}$-$5 \times 10^{13}$ ions/cm$^2$, typically $2.5 \times 10^{13}$ ions/cm$^2$. Approximately one fourth of the p-type source halo implant dosage is implanted at each azimuthal-angle value. The p-type source halo dopant normally consists of boron in the form of boron difluoride or in elemental form. For the typical case in which boron in the form of boron difluoride constitutes the p-type source halo dopant, the implantation energy is 50-100 keV, typically 75 keV. The p-type source halo implantation can be performed with photoresist 954 prior to the n-type shallow source-extension implantation.

A photoresist mask 956 having an opening above island 150 for symmetric p-channel IGFET 110 is formed on dielectric layers 946 and 948 as shown in FIG. 18r. The p-type shallow S/D-extension dopant is ion implanted at a high dosage through the opening in photoresist 956, through the uncovered sections of surface dielectric 948, and into vertically corresponding portions of the underlying monosilicon to define a pair of laterally separated largely identical p+ precursors 480EP and 482EP to respective S/D extensions 480E and 482E of IGFET 110.

The p-type shallow S/D-extension implantation is a four-quadrant implant with tilt angle $\alpha$ equal to approximately 7° and with base azimuthal-angle value $\beta_0$ equal to 20°-25°. The dosage of the p-type shallow S/D-extension dopant is normally $5\times10^{13}$-$5\times10^{14}$ ions/cm$^2$, typically $1\times10^{14}$ $2\times10^{14}$ ions/cm$^2$. Approximately one fourth of the p-type shallow S/D-extension implant dosage is implanted at each azimuthal-angle value. The p-type shallow S/D-extension dopant normally consists of boron in the form of boron difluoride or in elemental form. For the typical case in which boron in the form of boron difluoride constitutes the p-type shallow S/D-extension dopant, the implantation energy is normally 2-10 keV, typically 5 keV.

With photoresist mask 956 still in place, the n-type S/D halo dopant is ion implanted in a significantly angled manner at a moderate dosage through the opening in photoresist 956, through the uncovered sections of surface dielectric layer 948, and into vertically corresponding portions of the underlying monosilicon to define a pair of laterally separated largely identical n precursors 490P and 492P to respective halo pocket portions 490 and 492 of IGFET 110. Again see FIG. 18*r*. Photoresist 956 is removed.

N precursor halo pocket portions 490P and 492P respectively extend deeper than p+ precursor S/D extensions 480EP and 482EP. Due to the angled implantation of the n-type S/D halo dopant, n precursor halo pockets 490P and 492P of IGFET 110 extend laterally partway under its precursor gate electrode 502P respectively beyond its p+ precursor S/D extensions 480EP and 482EP.

Tilt angle α for the angled n-type S/D halo implantation is at least 15°, normally 20°-45°, typically 30°. The angled n-type S/D halo implantation is a four-quadrant implant with base azimuthal-angle value $\beta_0$ equal to approximately 45°. The dosage of the n-type S/D halo dopant is normally $1\times10^{13}$-$5\times10^{13}$ ions/cm$^2$, typically $2.5\times10^{13}$ ions/cm$^2$. Approximately one fourth of the n-type S/D halo implant dosage is implanted at each azimuthal-angle value. The n-type S/D halo dopant normally consists of arsenic or phosphorus. For the typical case in which arsenic constitutes the n-type S/D halo dopant, the implantation energy is 100-200 keV, typically 150 keV. The n-type S/D halo implant can be performed with photoresist 956 prior to the p-type shallow S/D-extension implant.

A photoresist mask 958 having an opening above the location for drain extension 282E of asymmetric p-channel IGFET 102 is formed on dielectric layers 946 and 948 as shown in FIG. 18*s*. Photoresist mask 958 is critically aligned to precursor gate electrode 302P of IGFET 102.

The p-type deep S/D-extension dopant is ion implanted in a slightly tilted manner at a high dosage through the opening in photoresist 958, through the uncovered section of surface dielectric 948, and into a vertically corresponding portion of the underlying monosilicon to define a p+ precursor 282EP to drain extension 282E of IGFET 102.

Tilt angle α for the p-type deep S/D-extension implantation is approximately 7°. Due to implantation of the p-type deep S/D-extension dopant at a small value of tilt angle α, precursor drain extension 282EP of asymmetric IGFET 102 extends slightly laterally under its precursor gate electrode 302P. Photoresist 958 is removed.

The p-type S/D-extension implantation can alternatively be performed in a significantly tilted manner, including at a tilt sufficient to constitute angled implantation. In light of this, the arrows representing the p-type S/D-extension implant in FIG. 18*s* are illustrated as slanted to the vertical but not slanted as much as arrows representing an ion implant performed in significantly tilted manner such as the n-type deep S/D-extension implant of FIG. 18*s*.

The p-type deep S/D-extension implantation is a four-quadrant implant with base azimuthal-angle value $\beta_0$ equal to approximately 20°-25°. The dosage of the p-type deep S/D-extension dopant is normally $2\times10^{13}$-$2\times10^{14}$ ions/cm$^2$, typically $8\times10^{13}$ ions/cm$^2$. Approximately one fourth of the p-type deep S/D-extension implant dosage is implanted at each azimuthal-angle value. The p-type deep S/D-extension dopant normally consists of boron in the form of boron difluoride or in elemental form. For the typical case in which boron in the form of boron difluoride constitutes the p-type deep S/D-extension dopant, the implantation energy is normally 5-20 keV, typically 10 keV.

A photoresist mask 960 having openings above the location for source extension 280E of asymmetric p-channel IGFET 102 and above the location for source extension 360E of extended-drain p-channel IGFET 106 is formed on dielectric layers 946 and 948. See FIG. 18*t*. Photoresist mask 960 is critically aligned to precursor gate electrodes 302P and 386P of IGFETs 102 and 106. The p-type shallow source extension dopant is ion implanted at a high dosage through the openings in critical photoresist 960, through the uncovered sections of surface dielectric 948, and into vertically corresponding portions of the underlying monosilicon to define (a) a p+ precursor 280EP to source extension 280E of IGFET 102 and (b) a p+ precursor 360EP to source extension 360E of IGFET 106.

The p-type shallow source-extension implantation is normally performed with the same p-type dopant, boron, as the slightly tilted p-type deep S/D-extension implantation. These two p-type implantations are also normally performed with the same p-type dopant-containing particle species, either boron difluoride or elemental boron, at the same particle ionization charge state.

The p-type shallow source-extension implantation is a four-quadrant implant with tilt angle α equal to approximately 7° and with base azimuthal-angle value $\beta_0$ equal to 20°-25°. Because the p-type shallow source-extension implantation is thus performed nearly perpendicular to a plane extending generally parallel to the upper semiconductor surface, precursor source extension 280EP of asymmetric p-channel IGFET 102 only extends extend slightly laterally under precursor gate electrode 302P.

The dosage of the p-type shallow source-extension dopant is normally $2\times10^{13}$-$2\times10^{14}$ ions/cm$^2$, typically $8\times10^{13}$ ions/cm$^2$. Approximately one fourth of the p-type shallow source-extension implant dosage is implanted at each azimuthal-angle value. For the typical case in which boron in the form of boron difluoride constitutes the p-type shallow source-extension dopant, the implantation energy is normally 5-20 keV, typically 10 keV.

The p-type deep S/D-extension implantation is also a four-quadrant implant with tilt angle α equal to approximately 7° and with base azimuthal-angle value $\beta_0$ equal to 20°-25°. Examination of the foregoing implantation dosage and energy information indicates that the p-type shallow source-extension implantation and the p-type deep S/D-extension implantation employ the same typical values of implantation dosage and energy. Since these two p-type implantations are normally performed with the same atomic species of p-type semiconductor dopant and with the same p-type dopant-containing particle species at the same particle ionization charge state, the two p-type implantations are typically performed at the same conditions. Consequently, depth $y_{DEPK}$ of the maximum concentration of the p-type deep S/D-extension dopant in precursor drain extension 282EP of asymmetric p-channel IGFET 102 is typically the same as depth $y_{SEPK}$ of the maximum concentration of the p-type shallow source-extension dopant in precursor source extension 280EP.

The p-type implanted deep S/D-extension dopant and the p-type implanted shallow source-extension dopant undergo thermal diffusion during later steps performed at elevated temperature. Thermal diffusion of an ion-implanted semiconductor dopant causes it to spread out but normally does not significantly vertically affect the location of its maximum concentration. The maximum concentration of the p-type shallow source-extension dopant in precursor source extension 280EP of p-channel IGFET 102 thus normally vertically occurs along largely the same location as in final source extension 280E and thus normally vertically occurs along largely the same location as the maximum concentration of the total p-type dopant in source extension 280E. The maximum concentration of the p-type deep S/D-extension dopant in precursor drain extension 282EP of IGFET 102 similarly normally vertically occurs along largely the same location as in final drain extension 282E and thus normally vertically along largely the same location as the maximum concentration of the total p-type dopant in final drain extension 282E. For these reasons, depth $y_{DEPK}$ of the maximum concentration of the p-type deep S/D-extension dopant in final drain extension 282E of IGFET 102 is typically the same as depth $y_{SEPK}$ of the maximum concentration of the p-type shallow source-extension dopant in final source extension 280E.

With critical photoresist mask 960 still in place, the n-type source halo dopant is ion implanted in a significantly angled manner at a moderate dosage through the openings in photoresist 960, through the uncovered sections of surface dielectric layer 948, and into vertically corresponding portions of the underlying monosilicon to define (a) an n precursor 290P to halo pocket portion 290 of asymmetric IGFET 102 and (b) an n precursor 366P to halo pocket portion 366 of extended-drain IGFET 106. Again see FIG. 18t. Photoresist 960 is removed.

N precursor halo pocket portions 290P and 366P respectively extend deeper than p+ precursor source extensions 280EP and 360EP of IGFETs 102 and 106. Due to the angled implantation of the n-type source halo dopant, n precursor halo pocket 290P of IGFET 102 extends laterally partway under its precursor gate electrode 302P and beyond its p+ precursor source extension 280EP. P precursor halo pocket 366P of IGFET 106 similarly extends laterally partway under its precursor gate electrode 386P and beyond its p+ precursor source extension 360EP.

Tilt angle α for the angled n-type source halo implantation is at least 15°, normally 20°-45°, typically 30°. The angled n-type source halo implantation is a four-quadrant implant with base azimuthal-angle value $\beta_0$ equal to approximately 45°. The dosage of the n-type source halo dopant is normally $2 \times 10^{13}$-$8 \times 10^{14}$ ions/cm$^2$, typically approximately $4 \times 10^{13}$ ions/cm$^2$. Approximately one fourth of the n-type source halo implant dosage is implanted at each azimuthal-angle value. The n-type source halo dopant normally consists of arsenic or phosphorus. For the typical case in which arsenic constitutes the n-type source halo dopant, the implantation energy is 75-150 keV, typically 125 keV. The n-type source halo implant can be performed with photoresist 960 prior to the p-type shallow source-extension implant.

Photoresist masks 950, 952, 954, 956, 958, and 960 used for defining lateral S/D extensions and halo pocket portions can be employed in any order. If none of the lateral S/D extensions or halo pocket portions defined by a particular one of photoresist masks 950, 952, 954, 956, 958, and 960 is present in any IGFET made according to an implementation of the semiconductor fabrication platform of FIG. 18, that mask and the associated implantation operation(s) can be deleted from the platform implementation.

An additional RTA is performed on the resultant semiconductor structure to repair lattice damage caused by the implanted p-type and n-type S/D-extension and halo pocket dopants and to place the atoms of the S/D-extension and halo pocket dopants in energetically more stable states. The additional RTA is performed in a non-reactive environment at 900-1050° C., typically 950-1000° C., for 10-50 s, typically 25 s.

The additional RTA causes the S/D-extension and halo pocket dopants to diffuse vertically and laterally. The well, APT, threshold-adjust, and base dopants especially the empty main well dopants, diffuse further vertically and laterally during the additional RTA. The remainder of FIG. 18 only indicates the upward diffusion of the empty main well dopants. If precursor empty main well regions 180P, 182P, 184AP, 184BP, 186AP, and 186BP did not reach the upper semiconductor surface by the end of the thermal growth of dielectric layers 946 and 948, precursor empty main well regions 180P, 182P, 184AP, 184BP, 186AP, and 186BP normally reach the upper semiconductor surface by the end of the additional RTA. This situation is indicated in the remainder of FIG. 18.

Precursor main collector portion 245MP is now substantially n main collector portion 245M of npn BJT 101. Precursor shallow collector well regions 175AP and 175BP are now substantially respective shallow n collector well regions 175A and 175B for BJT 101. Precursor main collector portion 325MP is now substantially p main collector portion 325M of pnp BJT 103. Precursor shallow collector well regions 177AP and 177BP are now substantially respective shallow p collector wells for BJT 103.

Isolated p− epitaxial-layer portions 136P1-136P3, 136P5, and 136P6 shrink to zero and do not appear in the remainder of FIG. 18. P− epitaxial layer 136P substantially becomes p−substrate region 136. For extended-drain n-channel IGFET 104, surface-adjoining portion 136A of p-substrate region 136 laterally separates p precursor empty main well region 184AP and n precursor empty main well region 184BP. For extended-drain p-channel IGFET 106, surface-adjoining portion 136B of p− substrate region 136 is situated between n precursor empty main well region 186AP, p precursor empty main well region 186BP, and deep n well 212.

P6. Formation of Spacers, Emitters, Contact Portions, and Main Source/Drain Portions Isolating dielectric spacers 271-1, 273-1, 271-2, 273-2, 351-1, 353-2, 351-2, and 353-2 are formed along the transverse sidewall of precursor polysilicon lateral spacing portion 269-1P, 269-2P, 349-1P, and 349-2P for BJTs 101 and 103 as shown in FIG. 18u. Gate sidewall spacers 264, 266, 304, 306, 348, 350, 388, 390, 464, 466, 504, and 506 are simultaneously formed along the transverse sidewalls of precursor polysilicon gate electrodes 262P, 302P, 346P, 386P, 462P, and 502P of IGFETs 100, 102, 104, 106, 108, and 110.

The isolating dielectric spacers for BJTs 101 and 103 and the gate sidewall spacers of IGFETs 100, 102, 104, 106, 108, and 110 are preferably formed to be of curved triangular shape according to the procedure described in U.S. patent application Ser. No. 12/382,977, cited above. In brief, a dielectric liner layer (not shown) of tetraethyl orthosilicate is deposited on dielectric layers 946 and 948. Further dielectric material is deposited on the liner layer. The portions of the further dielectric material not intended to constitute the isolating dielectric spacers and the gate sidewall spacers are then removed, primarily by anisotropic etching conducted generally perpendicular to the upper semiconductor surface. Sealing dielectric layer 962 in FIG. 18u indicates the resulting combination of sealing layer 946 and the overlying material of the liner layer. Surface dielectric layer 964 indicates the resulting combination of surface layer 948 and the overlying material of the liner layer.

Sidewall spacers (not shown) are simultaneously provided along any portion of the gate-electrode polysilicon layer designated to be a polysilicon resistor.

Let the lateral side of each emitter-side isolating dielectric spacer 271-1, 271-2, 351-1, or 351-2 opposite emitter-side transverse lateral side 275-1, 275-2, 355-1, or 355-2 of precursor lateral spacing portion 269-1P, 269-2P, 349-1P, or 349-2P be referred to as the "outside" of that emitter-side spacer 271-1, 271-2, 351-1, or 351-2. See FIGS. 7 and 8. Similarly, let the lateral side of each base-contact-side isolating dielectric spacer 273-1, 273-2, 353-1, or 353-2 opposite base-contact-side transverse lateral side 277-1, 277-2, 357-1, or 357-2 of precursor lateral spacing portion 269-1P, 269-2P, 349-1P, or 349-2P be referred to as the "outside" of that base-contact-side spacer 273-1, 273-2, 353-1, or 353-2.

Forming the isolating dielectric spacers and the gate sidewall spacers in the preceding way enables the thickness of emitter-side isolating dielectric spacer 271-1, 271-2, 351-1, or 351-2 to be largely constant in the transverse direction along any lateral plane passing through the precursor lateral spacing portions. Consequently, the outside of each emitter-side spacer 271-1, 271-2, 351-1, or 351-2 largely conforms to emitter-side transverse lateral side 275-1, 275-2, 355-1, or 355-2 of precursor lateral spacing portion 269-1P, 269-2P, 349-1P, or 349-2P along any lateral plane passing through the precursor lateral spacing portions. Simply stated, the outside of each emitter-side spacer largely conforms to the emitter-side lateral side of its precursor lateral spacing portion.

Similarly, the thickness of base-side isolating dielectric spacer 273-1, 273-2, 353-1, or 353-2 is largely constant in the transverse direction along any lateral plane passing through the precursor lateral spacing portions. The outside of each base-contact-side spacer 273-1, 273-2, 353-1, or 353-2 thus largely conforms to base-contact-side transverse lateral side 277-1, 277-2, 357-1, or 357-2 of precursor lateral spacing portion 269-1P, 269-2P, 349-1P, or 349-2P along any lateral plane passing lateral through the precursor lateral spacing portions. Likewise simply stated, the outside of each base-contact-side spacer largely conforms to the base-contact-side lateral side of its precursor lateral spacing portion.

In addition, the thickness of emitter-side isolating dielectric spacer 271-1, 271-2, 351-1, or 351-2 along a lateral plane passing through the precursor lateral spacing portions at the height of the top of surface dielectric layer 964 is approximately final emitter-side spacer thickness $d_{SE}$ along the upper semiconductor surface. The thickness of base-contact-side isolating dielectric spacer 273-1, 273-2, 353-1, or 353-2 along the lateral plane at the height of the top of surface dielectric layer 964 is approximately final base-contact-side spacer thickness $d_{SB}$ along the upper semiconductor surface. Emitter-side spacer thickness $d_{SE}$ and base-contact-side spacer thickness $d_{SB}$ are therefore largely constant in the transverse direction. Spacer thicknesses $d_{SE}$ and $d_{SB}$ are normally the same.

A photoresist mask 970 having openings (a) above the space between emitter-side isolating dielectric spacers 271-1 and 271-2 for npn BJT 101, i.e., above the intended location for emitter 241 (b), above island 135B for BJT 101, (c) above the space between field-insulation region 138 and base-contact-side isolating dielectric spacer 353-1 for pnp BJT 103, i.e., above the intended location for first base contact portion 323C-1, and (d) above the space between field insulation 138 and base-contact-side isolating dielectric spacer 353-2 for BJT 103, i.e., above the intended location for second base contact portion 323C-2, is formed on dielectric layers 962 and 964, the isolating dielectric spacers, and the gate sidewall spacers. See FIG. 18v. Photoresist mask 970 also has openings above islands 140, 144A, 144B, and 148 for n-channel IGFETs 100, 104, and 108.

The n-type main S/D dopant (or the n-type emitter-collector-base/main S/D dopant) is ion implanted at a very high dosage through the openings in photoresist 970, through the uncovered sections of surface dielectric layer 964, and into vertically corresponding portions of the underlying monosilicon to define (a) n++ emitter 241 of npn BJT 101, (b) n++ collector contact portion 245C of BJT 101, (c) n++ base contact portions 323C-1 and 323C-2 of pnp BJT 103, (d) n++ main source portion 240M and n++ main drain portion 242M of asymmetric n-channel IGFET 100, (e) n++ main source portion 320M and n++ drain contact portion 334 of extended-drain n-channel IGFET 104, and (f) n++ main S/D portions 440M and 442M of symmetric n-channel IGFET 108.

In addition, the n-type main S/D dopant enters precursor lateral spacing portions 269-1P and 269-2P for npn BJT 101 and precursor lateral spacing portions 349-1P and 349-2P for pnp BJT 103. The n-type main S/D dopant also enters precursor gate electrodes 262P, 346P, and 462P of n-channel IGFETs 100, 104, and 108, thereby converting precursor electrodes 262P, 346P, and 462P respectively into n++ gate electrodes 262, 346 and 462. Photoresist 970 is removed.

The dosage of the n-type main S/D dopant is normally $2 \times 10^{15} - 2 \times 10^{16}$ ions/cm$^2$, typically $7 \times 10^{15}$ ions/cm$^2$. The n-type main S/D dopant normally consists of arsenic or phosphorus. For the typical case in which arsenic constitutes the n-type main S/D dopant, the implantation energy is normally 50-100 keV, typically 60-70 keV.

Precursor polysilicon lateral spacing portions 269-1P, 269-2P, 349-1P, and 349-2P and isolating dielectric spacers 271-1, 273-1, 271-2, 273-2, 351-1, 353-1, 351-2, and 353-2 together serve as a dopant-blocking shield for largely preventing the n-type main S/D dopant from being ion implanted into the underlying monosilicon. More particularly, the combination of precursor lateral spacing portions 269-1P and 269-2P, emitter-side spacers 271-1 and 271-2 and base-contact-side spacers 273-1 and 273-2 acts as a dopant-blocking shield that substantially prevents the n-type main S/D dopant from being implanted into the intended locations of p base link portions 243L-1 and 243L-2 of npn BJT 101.

The presence of emitter-side spacers 271-1 and 271-2 in the dopant-blocking shield for npn BJT 101 causes the transverse sides of n++ emitter 241 of BJT 101 to largely respectively conform to the outsides of emitter-side spacers 271-1 and 271-2 along any lateral plane through the precursor lateral spacing portions. This type of conformance is often termed "self alignment". Since the outside of each emitter-side spacer 271-1 or 271-2 largely conforms to the emitter-side lateral side of precursor lateral spacing portion 269-1P or 269-2P, the transverse edges of emitter 241 along the upper semiconductor surface largely respectively conform to the emitter-side lateral sides of precursor spacing portions 269-1P and 269-2P.

The combination of precursor lateral spacing portions 349-1P and 349-2P, base-contact-side spacers 353-1 and 353-2, and emitter-side spacers 351-1 and 351-2 acts as a dopant-blocking shield that substantially prevents the n-type main S/D dopant from being implanted into the intended locations of n base link portions 323L-1 and 323L-2 of pnp BJT 103. The presence of base-contact-side spacers 353-1 and 353-2 in this shield causes the emitter-side transverse sides of n++ base contact portions 323C-1 and 323C-2 of BJT 103 to largely respectively conform, i.e., to be respectively self aligned to, to the outsides of base-contact-side spacers 353-1 and 353-2 along any lateral plane through the precursor lateral spacing portions. Because the outside of each base-contact-side spacer 353-1 or 353-2 largely conforms to the base-contact-side lateral side of precursor lateral spacing portion 349-1P or 349-2P, the emitter-side transverse edges of base contact portions 323C-1 and 323C-2 along the upper semiconductor surface largely respectively conform to the base-contact-side lateral sides of precursor spacing portions 349-1P and 349-2P.

An initial spike anneal is normally performed on the resultant semiconductor structure at this point to repair lattice damage caused by the implanted n-type main S/D dopant and to place the atoms of the n-type main S/D dopant in energetically more stable states. The spike anneal is done by raising the temperature of the semiconductor structure to 1000-1200° C., typically 1100° C. Significant diffusion of the implanted p-type and n-type dopants normally occurs during the initial spike anneal because the spike-anneal temperature is quite high. The spike anneal also causes the n-type main S/D dopant in lateral spacing portions 269-1, 269-2, 349-1, and 349-2 of BJTs 101 and 103 and in the gate electrodes of the illustrated n-channel IGFETs to spread out.

With the initial spike anneal completed, the portion of precursor base 243P below n++ emitter 241 substantially constitutes p intrinsic base portion 243I of npn BJT 101. The portion of precursor intermediate collector portion 245IP below n++ collector contact portion 245C substantially constitutes n intermediate collector portion 245I of BJT 101.

The portions of precursor regions 240EP, 242EP, and 250P outside n++ main S/D portions 240M and 242M of asymmetric n-channel IGFET 100 now respectively substantially constitute its n+ source extension 240E, its n+ drain extension 242E, and its p source-side halo pocket portion 250. The portion of p precursor empty main well region 180P, now p-type empty-well body material 180, outside source 240, drain 242, and halo pocket portion 250 substantially constitutes p-type empty-well main body-material portion 254 of IGFET 100. Precursor dotted line 256P is now substantially dotted line 256 which demarcates generally where the p-type doping in main body-material portion 254 drops from moderate to light in moving upward.

The portions of precursor regions 320EP and 326P outside n++ main source portion 320M of extended-drain n-channel IGFET 104 respectively substantially constitute its n+ source extension 320E and its p source-side halo pocket portion 326. The portion of p precursor empty main well region 184AP, now p-type empty-well body material 184A, outside halo pocket portion 326 substantially constitutes p body-material portion 328 of IGFET 104. The portion of n precursor empty main well region 184BP, now drain 184B, outside n++ external drain contact portion 334 substantially constitutes n empty-well drain portion 336 of IGFET 104. Precursor dotted lines 332P and 340P are now substantially respective dotted lines 332 and 340 which respectively demarcate generally where the net dopings in body-material portion 328 and drain portion 336 drop from moderate to light in moving upward.

The portions of precursor regions 440EP, 442EP, 450P, and 452P outside n++ main S/D portions 440M and 442M of symmetric n-channel IGFET 108 respectively substantially constitute its n+ S/D extensions 440E and 442E and its halo pocket portions 450 and 452. The portions of p precursor body-material portions 456P and 458P outside S/D zones 440 and 442 and halo pockets 450 and 452 substantially constitute p body-material portions 456 and 458 of IGFET 108. The portion of p precursor filled main well region 188P outside S/D zones 440 and 442 substantially constitutes p-type filled main well region 188 formed with p body-material portions 454, 456, and 458.

The source-body and drain-body junctions of n-channel IGFETs 100, 104, and 108 can be vertically graded to reduce the junction capacitances by implanting n-type semiconductor dopant, referred to here as the n-type junction-grading dopant, through the openings in photoresist mask 970 while it is in place. The n-type junction-grading dopant is implanted at a greater range and a lower dosage that the n-type main S/D dopant. Either the n-type main or junction-grading S/D implantation can be performed first. In either case, the initial spike anneal also repairs lattice damage caused by the implanted n-type junction-grading S/D dopant and places the atoms of the n-type junction-grading S/D dopant in energetically more stable states.

The n-type junction-grading dopant enters n-doped parts of BJTs 101 and 103. N-type emitter 241 of npn BJT 101 then consists of a very heavily doped main portion and a more lightly doped lower portion. This may cause the gain of BJT 101 to be reduced slightly but increases its base-emitter breakdown voltage. The presence of the n-type junction-grading dopant normally has no significant effect on pnp BJT 103.

A photoresist mask 972 having openings (a) above the space between emitter-side isolating dielectric spacers 351-1 and 351-2 for pnp BJT 103, i.e., above the intended location for emitter 321 (b), above island 137B for BJT 103, (c) above the space between field-insulation region 138 and base-contact-side isolating dielectric spacer 273-1 for npn BJT 101, i.e., above the intended location for first base contact portion 243C-1, and (d) above the space between field insulation 138 and base-contact-side isolating dielectric spacer 273-2 for BJT 101, i.e., above the intended location for second base contact portion 243C-2, is formed on dielectric layers 962 and 964, the isolating dielectric spacers, and the gate sidewall spacers as indicated in FIG. 18w. Photoresist mask 972 also has openings above islands 142, 146A, 146B, and 150 for p-channel IGFETs 102, 106, and 110.

The p-type main S/D dopant (or the p-type emitter-collector-base/main S/D dopant) is ion implanted at a very high dosage through the openings in photoresist 972, through the uncovered sections of surface dielectric layer 964, and into vertically corresponding portions of the underlying monosilicon to define (a) p++ emitter 321 of pnp BJT 103, (b) p++ collector contact portion 325C of BJT 103, (c) p++ base contact portions 243C-1 and 243C-2 of npn BJT 101, (d) p++ main source portion 280M and n++ main drain portion 282M of asymmetric p-channel IGFET 102, (e) p++ main source portion 360M and p++ drain contact portion 374 of extended-drain p-channel IGFET 106, and (f) p++ main S/D portions 480M and 482M of symmetric p-channel IGFET 110.

Additionally, the p-type main S/D dopant enters precursor lateral spacing portions 269-1P and 269-2P for npn BJT 101 and precursor lateral spacing portions 349-1P and 349-2P for pnp BJT 103. Each precursor lateral spacing portions 269-1P, 269-2P, 349-1P, or 349-2P is thereby converted into final lateral spacing portion 269-1, 269-2, 349-1, or 349-2 of mixed conductivity types. The n-type main S/D dopant also enters precursor gate electrodes 302P, 386P, and 502P of p-channel IGFETs 102, 106, and 110, thereby converting precursor electrodes 302P, 386P, and 502P respectively into p++ gate electrodes 302, 386, and 502. Photoresist 972 is removed.

The dosage of the p-type main S/D dopant is normally $2\times10^{15}$-$2\times10^{16}$ ions/cm$^2$, typically approximately $7\times10^{15}$ ions/cm$^2$. The p-type main S/D dopant normally consists of boron in elemental form or in the form of boron difluoride. For the typical case in which the p-type main S/D dopant is boron, the implantation energy is normally 2-10 keV, typically 5 keV.

The shapes of final polysilicon lateral spacing portions 269-1, 269-2, 349-1, and 349-2 are respectively largely the same as their precursor shapes during the earlier n-type main S/D implantation. Accordingly, the transverse edges of emitter 241 of npn BJT 101 along the upper semiconductor surface largely respectively conform to the emitter-side lateral sides of spacing portions 269-1P and 269-2P. Also, the emitter-side transverse edges of base contact portions 323C-1 and 323C-2 of pnp BJT 103 along the upper semiconductor surface largely respectively conform to the base-contact-side lateral sides of spacing portions 349-1P and 349-2P.

Turning to what happens as a result of the p-type main S/D implantation, lateral spacing portions 269-1, 269-2, 349-1, and 349-2 and isolating dielectric spacers 271-1, 273-1, 271-2, 273-2, 351-1, 353-1, 351-2, and 353-2 together serve as a dopant-blocking shield for largely preventing the p-type main S/D dopant from being ion implanted into the underlying monosilicon. In particular, the combination of lateral spacing portions 269-1 and 269-2, base-contact-side spacers 273-1 and 273-2, and emitter-side spacers 271-1 and 271-2 acts as a dopant-blocking shield that substantially prevents the p-type main S/D dopant from being implanted into the intended locations of p base link portions 243L-1 and 243L-2 of npn BJT 101.

The presence of base-contact-side spacers 273-1 and 273-2 in the preceding dopant-blocking shield for npn BJT 101 shield causes the emitter-side transverse sides of p++ base contact portions 243C-1 and 243C-2 of BJT 101 to largely respectively conform to, i.e., be self aligned to, the outsides of base-contact-side spacers 273-1 and 273-2 along any lateral plane through the lateral spacing portions. Inasmuch as the outside of each base-contact-side spacer 273-1 or 273-2 largely conforms to the base-contact-side lateral side of lateral spacing portion 269-1 or 269-2, the emitter-side transverse edges of base contact portions 243C-1 and 243C-2 along the upper semiconductor surface largely respectively conform to the base-contact-side lateral sides of spacing portions 269-1 and 269-2. As indicated above, base link length $L_{BL}$ of base link portion 243L-1 or 243L-2 of npn BJT 101 extends from the associated transverse edge of emitter 242 to base contact portion 243C-1 or 243C-2. Accordingly, base link length $L_{BL}$ of base link portion 243L-1 or 243L-2 of BJT 101 varies largely linearly with dimension $d_{LS}$ of lateral spacing portion 269-1 or 269-2 in the direction of base link length $L_{BL}$.

The same is true for pnp BJT 103 in a complementary manner. The combination of lateral spacing portions 349-1 and 349-2, emitter-side spacers 351-1 and 351-2, and base-contact-side spacers 353-1 and 353-2 acts as a dopant-blocking shield that substantially prevents the p-type main S/D dopant from being implanted into the intended locations of p base link portions 3233L-1 and 323L-2. The presence of emitter-side spacers 351-1 and 351-2 in this shield causes the transverse sides of p++ emitter 321 to largely respectively conform, i.e., be self aligned to, to the outsides of emitter-side spacers 351-1 and 351-2 along any lateral plane through the lateral spacing portions. Since the outside of each emitter-side spacer 351-1 or 351-2 largely conforms to the emitter-side lateral side of lateral spacing portion 349-1P or 349-2P, the transverse edges of emitter 321 along the upper semiconductor surface largely respectively conform to the emitter-side lateral sides of spacing portions 349-1P and 349-2P. Taking note of the definition of base link length $L_{BL}$, the net result is that base link length $L_{BL}$ of base link portion 323L-1 or 323L-2 of BJT 103 varies largely linearly with dimension $d_{LS}$ of lateral spacing portion 349-1 or 349-2 in the direction of base link length $L_{BL}$.

As mentioned above, dimension dLS of the lateral spacing portions is determined by the patterning achieved with the photoresist mask used in defining the lateral spacing portions and can be controlled highly accurately. This enables base link length $L_{BL}$ to be controlled very accurately.

Any portion of the gate-electrode polysilicon layer designated to be a polysilicon resistor is typically doped with n-type or p-type semiconductor dopant during one or more of the above-mentioned doping steps performed subsequent to deposition of the gate-electrode polysilicon layer. For instance, a polysilicon resistor portion can be doped with the n-type main S/D dopant or the p-type main S/D dopant.

A further spike anneal is now performed on the resultant semiconductor structure to repair lattice damage caused by the implanted p-type main S/D dopant and to place the atoms of the p-type main S/D dopant in energetically more stable states. The further spike anneal is done by raising the temperature of the semiconductor structure to 900-1200° C., typically 1100° C. Significant diffusion of the implanted p-type and n-type dopants normally occurs during the further spike anneal because the further spike-anneal temperature is quite high. The further spike anneal also causes the p-type main S/D dopant in lateral spacing portions 269-1, 269-2, 349-1, and 349-2 of BJTs 101 and 103 and in the gate electrodes of the illustrated p-channel IGFETs to spread out.

The atoms of the element (arsenic or phosphorus) used as the n-type main S/D dopant are larger than the atoms of boron, the element used as the p-type main S/D dopant. Consequently, the n-type main S/D implant is likely to cause more lattice damage than the boron p-type main S/D implant. To the extent that the initial spike anneal performed directly after the n-type main S/D implantation does not repair all the lattice damage caused by the n-type main S/D implant, the further spike anneal repairs the reminder of the lattice damage caused by the n-type main S/D implant. Additionally, boron diffuses faster, and thus farther for a given amount of elevated-temperature diffusion impetus, than either element used as the n-type main S/D dopant. By performing the p-type main S/D implant and associated spike anneal after performing the n-type main S/D implant and associated spike anneal, undesired diffusion of the p-type main S/D dopant is avoided without incurring significant undesired diffusion of the n-type main S/D dopant.

Upon completion of the further spike anneal, the portion of precursor base 243P between (a) the combination of p intrinsic base portion 243I and n++ emitter 241 and (b) p++ base contact portion 243C-1 or 243C-2 constitutes base link portion 243L-1 or 243L-2 for npn BJT 101. The portion of precursor base 243P below base contact portion 243C-1 or 243C-2 constitutes remaining base portion 243R-1 or 243R-2 for BJT 101.

The portion of precursor base 323P below p++ emitter 321 constitutes n intrinsic base portion 323I for pnp BJT 103. The portion of precursor base 323P between (a) the combination of n intrinsic base portion 323I and p++ emitter 321 and (b) n++ base contact portion 323C-1 or 323C-2 constitutes base link portion 323L-1 or 323L-2 for BJT 103. The portion of precursor base 323P below base contact portion 323C-1 or 323C-2 constitutes remaining base portion 323R-1 or 323R-2 for BJT 103. The portion of precursor intermediate collector portion 325IP below p++ collector contact portion 325C constitutes p intermediate collector portion 325I of BJT 103.

The portions of precursor regions 280EP, 282EP, and 290P outside p++ main S/D portions 280M and 282M of asymmetric p-channel IGFET 102 now respectively constitute its p+ source extension 280E, its p+ drain extension 282E, and its n source-side halo pocket portion 290. The portion of n precursor empty main well region 182P, now n-type empty-well body material 182, outside source 280, drain 282, and halo pocket portion 290 constitutes n-type empty-well main body-material portion 294 of IGFET 102. Precursor dotted line 296P is now dotted line 296 which demarcates the where the p-type doping in main body-material portion 294 drops from moderate to light in moving upward.

The portions of precursor regions 360EP and 366P outside p++ main source portion 360M of extended-drain p-channel IGFET 106 respectively constitute its p+ source extension 360E and its n source-side halo pocket portion 366. The portion of n precursor empty main well region 186AP, now n-type empty-well body material 186A, outside halo pocket portion 366 constitutes n body-material portion 368 of IGFET 106. The portion of p precursor empty main well region 186BP, now drain 186B, outside p++ external drain contact portion 374 constitutes n empty-well drain portion 376 of IGFET 106. Precursor dotted lines 372P and 380P are now respective dotted lines 372 and 380 which respectively demarcate where the net dopings in body-material portion 368 and drain portion 376 drop from moderate to light in moving upward.

The portions of precursor regions 480EP, 482EP, 490E, and 492E outside p++ main S/D portions 480M and 482M of symmetric p-channel IGFET 110 respectively constitute its n+ S/D extensions 480E and 482E and its halo pocket portions 490 and 492. The portions of n precursor body-material portions 496P and 498P outside S/D zones 480 and 482 and halo pockets 490 and 492 constitute p body-material portions 496 and 498 of IGFET 110. The portion of n precursor filled main well region 190P outside S/D zones 480 and 482 constitutes n-type filled main well region 190 formed with n body-material portions 494, 496, and 498.

The source-body and drain-body junctions of p-channel IGFETs 102, 104, and 106 can be vertically graded to reduce the junction capacitances by implanting p-type semiconductor dopant, referred to here as the p-type junction-grading dopant, through the openings in photoresist mask 972 while it is in place. The p-type junction-grading dopant is implanted at a greater range and a lower dosage that the p-type main S/D dopant. Either the p-type main or junction-grading S/D implantation can be performed first. In either case, the further spike anneal also repairs lattice damage caused by the implanted p-type junction-grading S/D dopant and places the atoms of the p-type junction-grading S/D dopant in energetically more stable states.

The p-type junction-grading dopant enters p-doped parts of BJTs 101 and 103. This has no significant effect on npn BJT 101. P-type emitter 321 of pnp BJT 103 then consists of a very heavily doped main portion and a more lightly doped lower portion. This may cause the gain of BJT 103 to be reduced slightly but increases its base-emitter breakdown voltage+

P7. Final Processing

The exposed parts of dielectric layers 962 and 964 are removed. A capping layer (not shown) of dielectric material, typically silicon oxide, is formed on top of the structure. A final anneal, typically an RTA, is performed on the semiconductor structure to obtain the desired final dopant distributions and repair any residual lattice damage.

Using (as necessary) a suitable photoresist mask (not shown), the capping material is removed from selected areas of the structure. In particular, the capping material is removed from the areas above the islands for BJTs 101 and 103 to expose emitters 241 and 321, base contact portions 243C-1, 243C-2, 323C-1, and 323C-2, collector contact portions 245C and 325C, and lateral spacing portions 269-1, 269-2, 349-1, and 349-2. The capping material is also removed from the areas above the islands for IGFETs 100, 102, 104, 106, 108, and 110 to expose gate electrodes 262, 302, 346, 386, 462, and 502, main source portions 240M, 280M, 320M, 360M, main drain portions 242M and 282M, drain contact portions 334 and 374, and main S/D portions 440, 442, 480, and 482. The capping material is typically retained over most of any portion of the gate-electrode polysilicon layer designated to be a polysilicon resistor so as to prevent metal silicide from being formed along the so-capped part of the polysilicon portion during the next operation. In the course of removing the capping material, the gate sidewall spacers are preferably converted to L shapes as described in U.S. patent application Ser. No. 12/382,977, cited above.

The metal silicide layers of BJTS 101 and 103 and IGFETs 100, 102, 104, 106, 108, and 110 are respectively formed along the upper surfaces of the underlying polysilicon and monosilicon regions. This typically entails depositing a thin layer of suitable metal, typically cobalt, on the upper surface of the structure and performing a low-temperature step to react the metal with underlying silicon. The unreacted metal is removed. A second low-temperature step is performed to complete the reaction of the metal with the underlying silicon and thereby form the metal silicide layers of BJTs 101 and 103 and the illustrated IGFETs.

The metal silicide formation completes the basic fabrication of asymmetric BJTS 101 and 103 and IGFETs 100, 102, 104, 106, 108, and 110. The resultant CBJT/CIGFET structure appears as shown in FIG. 5.

Referring to FIG. 6 specifically in connection with BJTs 101 and 103, first-level dielectric layer 285 is formed on top of the structure of FIG. 5. Dielectric layer 285 normally consists of multiple sublayers (not separately demarcated) provided in such a way the upper surface of dielectric layer 285 is largely planar. Using a suitable photoresist mask (not shown), openings are etched through dielectric layer 285 down to the metal silicide layers, including metal silicide layers 279-1, 279-2, 359-1, and 359-2 along the tops of later spacing portions 269-1, 269-2, 349-1, and 349-2. Metal is deposited into the openings to contact the metal silicide layers. The metal along the top of dielectric layer 285 is patterned using a photoresist mask (not shown) to produce a CBJT/CIGFET which includes the structure of FIG. 6.

P7. Formation of BJT Variations

The following operations are incorporated in the fabrication process of FIG. 18 to create the variation of FIG. 11 containing npn BJT 101X and pnp BJT 103X. Between the stages of FIGS. 18b and 18 and thus subsequent to forming field-isolation region 138 but prior to the various well implantations, a photoresist mask (not shown) having an opening above the location for n+ deep collector layer 401 is formed on screen oxide layer 924. An n-type semiconductor dopant, referred to here as the n-type high-dosage deep collector layer dopant, is ion implanted at a high dosage through the opening in the photoresist mask, through the uncovered section of screen oxide 924, and into the vertically corresponding portion of the underlying monosilicon to define n+ deep collector layer 401. The implantation energy is sufficiently high that deep collector layer 401 will later extend along the bottoms of n collector well regions 175A and 175B of npn BJT 101X. The photoresist is removed.

A second photoresist mask (also not shown) having an opening above the location for p+ deep collector layer 407 is formed on screen oxide layer 924. A p-type semiconductor dopant, referred to here as the p-type high-dosage deep collector layer dopant, is ion implanted at a high dosage through the openings in the second photoresist mask, through the uncovered section of screen oxide 924, and into the vertically corresponding portion of the underlying monosilicon to define p+ deep collector layer 407. The implantation energy is sufficiently high that deep collector layer 407 will later extend along the bottoms of p collector well regions 177A and 177B of pnp BJT 103X. The second photoresist is removed.

Either of the high-dosage deep collector layer implantations can be performed first. After the two high-dosage deep collector layer implantations are completed and the two photoresist masks are removed, a thermal anneal, typically an RTA, is performed on the semiconductor structure to repair lattice damage and place the atoms of the implanted high-dosage deep collector layer dopants in energetically more stable states. The processing then reverts to the stage of FIG. 18c for creation of deep n well regions 928 except that the formation of deep n collector well 207 is deleted. The formation of a selected one of high-dosage deep collector layers 401 and 407 can be deleted to produce the variation having only one of BJTs 101X and 103X.

The variation of FIG. 13 containing npn BJT 101Y and pnp BJT 103Y is fabricated in the following manner. The starting point is lightly doped p-type monosilicon semiconductor substrate 411. A photoresist mask (not shown) is formed on the upper surface of p− substrate 411. The photoresist mask has an opening at the intended location for n+ buried collector layer 415. An n-type semiconductor dopant, referred to here as the n-type buried layer dopant, is introduced through the mask opening into substrate 411 at a high dosage. The photoresist is removed.

A second photoresist mask (likewise not shown) is formed on the upper surface of p-substrate 411. The second photoresist mask has an opening at the intended location for p+ buried collector layer 423. A p-type semiconductor dopant, referred to here as the p-type buried layer dopant, is introduced through the mask opening into substrate 411 at a high dosage. The second photoresist is removed.

Either of the buried layer implantations can be performed first. Subsequent to the buried layer implantations and the removal of the two photoresist masks, the upper surface of p− substrate 411 is suitably cleaned to expose its monosilicon. P-substrate region 136 is epitaxial grown on the exposed silicon of substrate 411. During the formation of p− substrate region 411 as an epitaxial layer, the n-type and p-type buried layer dopants diffuse up into epitaxial layer to form n+ buried collector layer 415 and p+ buried collector layer 423. The remainder of the fabrication of the CBJT/CIGFET structure containing BJTs 101Y and 103Y is normally performed in the same way that the CBJT/CIGFET of FIG. 5 is fabricated except that the formation of deep n collector well 207 is deleted.

P− substrate 411 can be part of a larger semiconductor body containing, e.g., an underlying more heavily doped monosilicon region. Instead of being lightly p doped, substrate 411 can be lightly n doped. The formation of a selected one of buried collector layers 415 and 423 can be deleted to produce the variation having only one of BJTs 101Y and 103Y.

Q. Other Variations

While the invention has been described with reference to particular embodiments, this description is solely for the purpose of illustration and is not to be construed as limiting the scope of the invention claimed below. For instance, silicon in the semiconductor body or/and in lateral spacing portions and gate electrodes can be replaced with other semiconductor materials. Replacement candidates include germanium, a silicon-germanium alloy, and Group 3a-Group 5a alloys such as gallium arsenide. The composite gate electrodes formed with the doped polysilicon gate electrodes and the respectively overlying metal silicide layers can be replaced with gate electrodes consisting substantially fully of refractory metal or substantially fully of metal silicide, e.g., cobalt silicide, nickel silicide, or platinum silicide with dopant provided in the silicide gate electrodes to control their work functions.

The lateral spacing portions and gate electrodes have been described above as preferably consisting of doped polysilicon but alternatively consisting of another type of doped non-monosilicon such as doped amorphous silicon or doped multicrystalline silicon. Even when the lateral spacing portions and the gate electrodes consist of doped polysilicon, the precursors to the lateral spacing portions and gate electrodes can be deposited as amorphous silicon or another type of non-monosilicon other than polysilicon. The elevated temperatures during the elevated temperature steps following the deposition of the precursor lateral spacing portions and precursor gate electrodes cause the silicon in the lateral spacing portions and gate electrodes to be converted to polysilicon.

Additionally, the non-monosilicon in the lateral spacing portions need not be significantly doped with semiconductor dopants. Instead of letting the n-type and p-type dopants pass through openings in photoresist masks 970 and 972 and enter the lateral spacing portions, photoresist masks 970 and 972 can be configured so that they largely overlie the lateral spacing portions.

The gate dielectric layers of the illustrated IGFETs can alternatively be formed with materials, such as hafnium oxide, of high dielectric constant. In that event, the $t_{GdL}$ low and $t_{GdH}$ high values of gate dielectric thickness are typically somewhat higher. Since isolating dielectric layers 267-1 and 267-2 for npn BJT 101 and isolating dielectric layers 347-1 and 347-2 for pnp BJT 103 are formed according to the same steps as the gate dielectric layers, isolating dielectric layers 267-1, 267-2, 347-1, and 347-2 then consist of the same alternative material as the gate dielectric layers.

In an alternative where the n-type deep S/D-extension dopant is the same n-type dopant as the n-type shallow source-extension dopant, an anneal may be optionally performed between (i) the stage of FIG. 18p for the n-type deep S/D-extension implantation and (ii) the stage of FIG. 18q for the n-type shallow source-extension implantation in order to cause the n-type deep S/D-extension dopant to diffuse without causing the n-type shallow source-extension dopant to diffuse because its implantation has not yet been performed.

Any of the variations described in U.S. patent application Ser. No. 12/382/793, can be applied to the configuration and fabrication of the present CBJT/CIGFET structure. Various modifications may thus be made by those skilled in the art without departing from the true scope of the invention as defined in the appended.

We claim:

1. A method of fabricating a bipolar junction transistor ("BJT") together with complementary insulated-gate field-effect transistors ("IGFETs") on a common semiconductor substrate, the method comprising:

using IGFET source/drain (S/D) implants of opposite doping types to respectively define emitter and extrinsic base regions of the BJT;

wherein patterning of a masking layer used to define lengths of gate electrodes for the IGFETs is used at least in part to define a given minimum lateral base link length separation between the S/D implant defined emitter and extrinsic base regions.

2. The method of claim 1, wherein the base link length separation is also defined at least in part by patterning of a dielectric layer used to form spacers for the IGFETs.

3. The method of claim 2, wherein the masking layer is a masking layer used to define lengths of polysilicon electrodes for the IGFETs.

4. The method of claim 3, wherein the masking layer is a photoresist layer.

5. The method of claim 1, wherein the masking layer is a masking layer used to define lengths of polysilicon electrodes for the IGFETs.

6. The method of claim 1, wherein the masking layer is a photoresist layer.

7. A method of fabricating a bipolar junction transistor ("BJT") together with complementary insulated-gate field-effect transistors ("CIGFETs") on a common semiconductor substrate, the method comprising:
   forming n+ emitter and n+ collector contact portions of the BJT using common steps used to form n+ source/drain (S/D) zones of an n-channel IGFET;
   forming a p+ base contact portion using common steps used to form p+ S/D zones of a p-channel IGFET;
   forming an n main collector portion using common steps used to form an n well region of the p-channel IGFET; and
   defining a given minimum lateral base link length separation between the n+ emitter and the p+ base contact portion at least in part by patterning a photoresist masking layer in a common step with patterning the photoresist masking layer to define gate electrodes of at least one of the n-channel and p-channel IGFETs.

8. The method of claim 7, wherein the base link separation is further defined at least in part by patterning a dielectric layer in a common step with patterning the dielectric layer to form spacers for the at least one of the n-channel and p-channel IGFETs.

9. A method of fabricating a bipolar junction transistor ("BJT") together with complementary insulated-gate field-effect transistors ("CIGFETs") on a common semiconductor substrate, the method comprising:
   forming n+ emitter and n+ collector contact portions of the BJT using common steps used to form n+ source/drain (S/D) zones of an n-channel IGFET;
   forming a p+ base contact portion using common steps used to form p+S/D zones of a p-channel IGFET;
   forming an n main collector portion using common steps used to form an n well region of the p-channel IGFET; and
   defining a given minimum lateral base link length separation between the n+ emitter and the p+ base contact portion at least in part by patterning a dielectric layer in a common step with patterning the dielectric layer to form spacers for at least one of the n-channel and p-channel IGFETs.

* * * * *